US011411182B1

(12) United States Patent
Masuda et al.

(10) Patent No.: US 11,411,182 B1
(45) Date of Patent: Aug. 9, 2022

(54) MIXED POWDER FOR ORGANIC ELECTROLUMINESCENCE DEVICE AND METHOD OF PRODUCING THE SAME, METHOD OF FABRICATING ORGANIC ELECTROLUMINESCENCE DEVICE USING THE MIXED POWDER, METHOD OF SELECTING COMPOUNDS FOR THE MIXED POWDER, AND COMPOSITION FOR VACUUM VAPOR DEPOSITION

(71) Applicant: IDEMITSU KOSAN CO., LTD., Tokyo (JP)

(72) Inventors: Tetsuya Masuda, Sodegaura (JP); Hiroyuki Iwabuchi, Sodegaura (JP); Masato Nakamura, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 0 days.

(21) Appl. No.: 17/519,770

(22) Filed: Nov. 5, 2021

(30) Foreign Application Priority Data

Jun. 25, 2021 (JP) ............................ JP2021-105558

(51) Int. Cl.
*H01L 29/08* (2006.01)
*H01L 51/00* (2006.01)
(Continued)

(52) U.S. Cl.
CPC ...... *H01L 51/0008* (2013.01); *H01L 51/5004* (2013.01); *H01L 51/5016* (2013.01); *H01L 51/56* (2013.01); *H01L 2251/552* (2013.01)

(58) Field of Classification Search
CPC ........................ H01L 51/0008; H01L 51/5004
See application file for complete search history.

(56) References Cited

U.S. PATENT DOCUMENTS

| | | | |
|---|---|---|---|
| 11,069,861 | B2 | 7/2021 | Maeda et al. |
| 2004/0142098 | A1 | 7/2004 | Ghosh et al. |

(Continued)

FOREIGN PATENT DOCUMENTS

| | | | |
|---|---|---|---|
| JP | 2004-228088 | A | 8/2004 |
| WO | WO-2021/015266 | A1 | 1/2021 |

*Primary Examiner* — Caleb E Henry
(74) *Attorney, Agent, or Firm* — Foley & Lardner LLP

(57) ABSTRACT

A mixed powder for an organic electroluminescence device, including a first organic compound and a different second organic compound, wherein the mixed powder is solid at normal temperature and pressure, and the following formulas (1) and (2) are satisfied: $0<MOL2/(MOL1+MOL2)\leq 0.2$ . . . (1) and $-20°\ C.\leq T1-T2\leq 40°\ C.$ . . . (2), wherein MOL1 [mol %] is a molar concentration of the first organic compound, MOL2 [mol %] is a molar concentration of the second organic compoundb, T1 [° C.] is a temperature of the first organic compound when $P1/M1^{1/2}=0.04\times\{MOL1/(MOL1+MOL2)\}$ is satisfied, T2 [° C.] is a temperature of the second organic compound when $P2/M2^{1/2}=0.04\times\{MOL2/(MOL1+MOL2)\}$ is satisfied, M1 [kg/mol] is the molecular weight of the first organic compound, P1 [Pa] is a vapor pressure of the first organic compound, M2 [kg/mol] is the molecular weight of the second organic compound, P2 [Pa] is a vapor pressure of the second organic compound.

14 Claims, 4 Drawing Sheets

(51) Int. Cl.
*H01L 51/56* (2006.01)
*H01L 51/50* (2006.01)

(56) References Cited

U.S. PATENT DOCUMENTS

| | | | | |
|---|---|---|---|---|
| 2017/0200899 | A1* | 7/2017 | Kim | H01L 51/0059 |
| 2019/0074446 | A1* | 3/2019 | Xia | C07C 255/34 |
| 2021/0320251 | A1* | 10/2021 | Nakano | H01L 51/0061 |

* cited by examiner

MIXED POWDER FOR ORGANIC ELECTROLUMINESCENCE DEVICE AND METHOD OF PRODUCING THE SAME, METHOD OF FABRICATING ORGANIC ELECTROLUMINESCENCE DEVICE USING THE MIXED POWDER, METHOD OF SELECTING COMPOUNDS FOR THE MIXED POWDER, AND COMPOSITION FOR VACUUM VAPOR DEPOSITION

TECHNICAL FIELD

The invention relates to a mixed powder for an organic electroluminescence device and a method of producing the same, a method of fabricating an organic electroluminescence device using the mixed powder, a method of selecting compounds for the mixed powder, and a composition for vacuum vapor deposition.

BACKGROUND ART

Vacuum vapor deposition process is generally used as a method of forming an organic layer constituting organic electroluminescence devices (hereinafter also referred to as "organic EL devices"), and for forming a mixed layer composed of a plurality of components, co-vapor deposition process in which each component is vaporized from a separate vapor deposition source (crucible) and depositions of the components are performed simultaneously is used conventionally.

In the co-vapor deposition process, since independent temperature control or the like is possible for each vapor deposition source, a mixture ratio in a vapor-deposited film is easily adjusted by controlling the vaporization amount of each material. In addition, even when a continuous vapor deposition is conducted to a plurality of substrates, a film formation with a constant mixing ratio is possible. On the other hand, since a plurality of vapor deposition sources are used, fabrication process becomes complicated, and there are problems such as an increase in manufacturing burden and cost.

As a technique for solving the above-mentioned problem, a vapor deposition technique in which a film is formed by vaporizing a so-called premix material, in which a plurality of materials (organic compounds) are mixed in advance, from a single vapor deposition source is attracting attention. As an example of the premix technique, a technique in which an emitting layer of an organic EL device is formed by using a solid compacted pellet of organic material including a mixture of at least one organic host and one organic dopant is disclosed in Patent Document 1, for example, and the following invention is disclosed in Patent Document 2:

1. A mixture (hereinafter, also referred to as "mixture A") containing a first compound and a second compound, wherein the first compound contains at least one of a first ring structure represented by the following general formula (11) and a second ring structure represented by the following general formula (12); the second compound is a compound represented by the following general formula (21) or a compound represented by the following general formula (22); and in the mixture, a total mass $M_T$ of the first compound and the second compound and a mass $M_2$ of the second compound satisfy a relationship of the following equation (Equation 1).

$$0.1 \leq (M_2/M_T) \times 100 \quad \text{(Equation 1)}$$

(11)

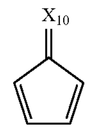

(12)

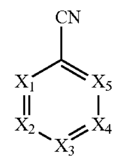

The first ring structure represented by the general formula (11) is fused with a ring structure of at least one of a substituted or unsubstituted aromatic hydrocarbon ring including 6 to 50 ring carbon atom and a substituted or unsubstituted heterocycle including 5 to 50 ring atoms in the molecule of the first compound, and the structure represented by $=X_{10}$ is represented by the following general formula (11a), (11b), (11c), (11d), (11e), (110, (11g), (11h), (11i), (11j), (11k), or (11m).

(11a)

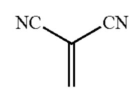

(11b)

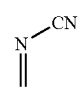

(11c)

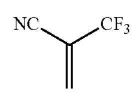

(11d)

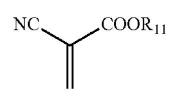

(11e)

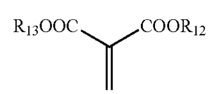

(11f)

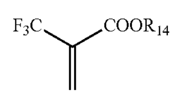

(11g)

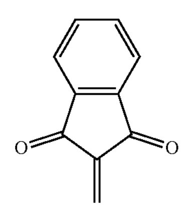

(11h)

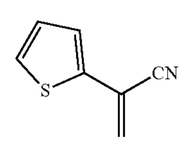

-continued (11i)

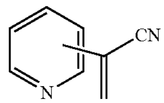

(11j)

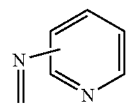

(11k)

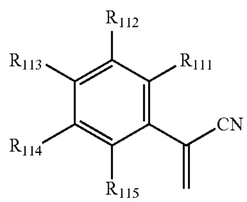

(11m)

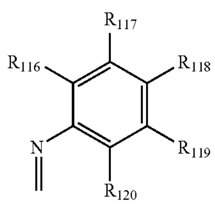

In the general formulas (11a), (11b), (11c), (11d), (11e), (110, (11g), (11h), (11i), (11j), (11k), or (11m), $R_{11}$ to $R_{14}$ and $R_{111}$ to $R_{120}$ are independently a hydrogen atom, a halogen atom, a hydroxyl group, a cyano group, a substituted or unsubstituted alkyl group including 1 to 50 carbon atoms, a substituted or unsubstituted alkyl halide group including 1 to 50 carbon atoms, a substituted or unsubstituted cycloalkyl group including 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted aryl group including 6 to 50 ring carbon atoms, or a substituted or unsubstituted heterocyclic group including 5 to 50 ring atoms.

In the general formula (12), $X_1$ to $X_5$ are independently a nitrogen atom, a carbon atom which bonds with $R_{15}$, or a carbon atom which bonds with another atom in the molecule of the first compound, at least one of $X_1$ to $X_5$ is a carbon atom which bonds with another atom in the molecule of the first compound, $R_{15}$ is selected from the group consisting of a hydrogen atom, a halogen atom, a cyano group, a substituted or unsubstituted alkyl group including 1 to 50 carbon atoms, a substituted or unsubstituted alkyl halide group including 1 to 50 carbon atoms, a substituted or unsubstituted cycloalkyl group including 3 to 50 ring carbon atoms, a substituted or unsubstituted aryl group including 6 to 50 ring carbon atoms, a substituted or unsubstituted heterocyclic group including 5 to 50 ring atoms, a group represented by —Si($R_{901}$)($R_{902}$)($R_{903}$), a group represented by —O—($R_{904}$), a group represented by -S-($R_{905}$), a group represented by —N($R_{906}$)($R_{907}$), a substituted or unsubstituted alkenyl group including 2 to 50 carbon atoms, a substituted or unsubstituted aralkyl group including 7 to 50 carbon atoms, a carboxy group, a substituted or unsubstituted ester group, a substituted or unsubstituted carbamoyl group, a nitro group, and a substituted or unsubstituted siloxanyl group, and when a plurality of $R_{15}$'s is present, the plurality of $R_{15}$'s may be the same as of different from each other.

(21)

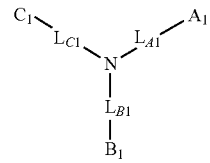

(22)

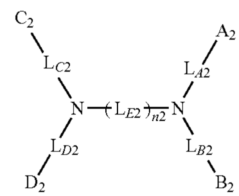

In the general formulas (21) and (22), $L_{A1}$, $L_{B1}$, $L_{C1}$, $L_{A2}$, $L_{B2}$, $L_{C2}$, and $L_{D2}$ are independently a single bond, a substituted or unsubstituted arylene group including 6 to 50 ring carbon atoms, or a substituted or unsubstituted divalent heterocyclic group including 5 to 50 ring atoms, n2 is 1, 2, 3, or 4, when n2 is 1, $L_{E2}$ is a substituted or unsubstituted arylene group including 6 to 50 ring carbon atoms, or a substituted or unsubstituted divalent heterocyclic group including 5 to 50 ring atoms, when n2 is 2, 3, or 4, a plurality of $L_{E2}$'s is the same as or different from each other, when n2 is 2, 3, or 4, a plurality of $L_{E2}$'s form a substituted or unsubstituted monocycle by bonding with each other, form a substituted or unsubstituted fused ring by bonding with each other, or do not bond with each other, $L_{E2}$ which do not form the monocycle and do not form the fused ring is a substituted or unsubstituted arylene group including 6 to 50 ring carbon atoms or a substituted or unsubstituted divalent heterocyclic group including 5 to 50 ring atoms, and $A_1$, $B_1$, $C_1$, $A_2$, $B_2$, $C_2$, and $D_2$ are independently a substituted or unsubstituted aryl group including 6 to 50 ring carbon atoms, a substituted or unsubstituted heterocyclic group including 5 to 50 ring atoms, or —Si($R'_{901}$)($R'_{902}$)($R'_{903}$), and $R'_{901}$, $R'_{902}$, and $R'_{903}$ are independently a substituted or unsubstituted aryl group including 6 to 50 ring carbon atoms, when a plurality of $R'_{901}$'s is present, the plurality of $R'_{901}$'s is the same as or different from each other, when a plurality of $R'_{902}$'s is present, the plurality of $R'_{902}$'s is the same as or different from each other, and when a plurality of $R'_{903}$'s is present, the plurality of $R'_{903}$'s is the same as or different from each other.

In the first compound and the second compound, $R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted heterocyclic group including 5 to 50 ring atoms, when a plurality of $R_{901}$'s is present, the plurality of $R_{901}$'s is the same as or different from each other, when a plurality of $R_{902}$'s is present, the plurality of $R_{902}$'s is the same as or different from each other, and when a plurality of $R_{903}$'s is present, the plurality of $R_{903}$'s is the same as or different from each other, when a plurality of $R_{904}$'s is present, the plurality of $R_{904}$'s is the same as or different from each other, when a plurality of $R_{905}$'s is present, the plurality of $R_{905}$'s is the same as or different from each other, when a plurality of $R_{906}$'s is present, the plurality of $R_{906}$'s is the same as or different from each other, and when a plurality of $R_{907}$'s is present, the plurality of $R_{907}$'s is the same as or different from each other.

2. An organic electroluminescence device containing an anode, a cathode, and an organic layer containing a first compound and a second compound, wherein the first compound contains at least one of a first ring structure represented by the general formula (11) and a second ring structure represented by the general formula (12), and the second compound is a compound represented by the general formula (21) ora compound represented by the general formula (22), and a total mass $W_T$ of the first compound and the second compound and a mass $W_2$ of the second compound satisfy a relationship of the following equation (Equation 2) in the organic layer.

$$0.1 \leq (W_2/W_T) \times 100 \quad \text{(Equation 2)}$$

Related Art Documents

Patent Documents

[Patent Document 1] JP 2004-228088 A

[Patent Document 2] WO 2021/015266 A1

SUMMARY OF INVENTION

An object of the invention is, in a vapor deposition process using a mixed material in which one component has a certain smaller content, to provide a mixed powder that enables a vapor deposition with a suppressed fluctuation in component ratio in a mixed film during a film formation.

Although the premix technique can overcome the disadvantages in the co-vapor deposition process described above, there is a problem that it is difficult to form a vapor-deposited film having a desired mixing ratio as compared with the co-vapor deposition process, and that, when performing a continuous vapor deposition on a plurality of substrates, it is difficult to obtain a constant quality since a fluctuation of mixing ratio occurs in each substrate. The inventors have found that such a problem is more pronounced in a system where there is a difference in component content ratio i.e., one component has a bigger content ratio and the other one has a smaller content ratio such as a premix material containing a host compound and a dopant compound. Since a vapor deposition process is continuously carried out for several weeks to several months at the actual fabrication site of an organic EL device, it is important that mixed films be produced at a stable ratio over a long period of time. That is, the above-mentioned problem in the premix technique is an important problem to be solved.

In the premix technique in which plural compounds are vaporized from a single vapor deposition source, in order to reflect a mixing ratio of a raw material mixture into a vapor-deposited film, an idea can be given in which compounds having the same or similar vaporization amount in a predetermined vapor deposition condition are combined. In other words, the idea is that when a premix material in which compounds having similar vapor deposition characteristics (in particular, vaporization rate at a predetermined temperature and vacuum degree) are mixed with each other is used, even when vapor deposition is continued using the same vapor deposition source (i.e., at the same temperature), vapor-deposited films having a desired mixing ratio can be obtained over a long period of time.

However, according to the study of the inventors, it has been found that this idea does not necessarily work as assumed. In particular, it is difficult to obtain vapor-deposited films having a desired mixing ratio over a long period of time when the above idea is applied to a system having a difference in component content ratio such as a mixed material containing a host material and a dopant material described above.

The inventors considered the cause of the problem as follows. Hereinafter, for simplicity, a binary system including a host compound and a dopant compound will be described as an example (note that the invention is not limited to a binary system, and is not limited to a system of a compound generally referred to as a host compound or a dopant compound).

In the above binary system in which a mixing ratio of the dopant compound in the premix material is small to a certain extent (for example, 20 mol % or less), when materials having similar vapor deposition characteristics are employed as a host compound and a dopant compound, these compounds vaporize ata similar vaporization rate, and therefore, in an initial stage of a continuous vapor deposition process, vapor-deposited films containing more content of dopant compound than a desired ratio are obtained. On the other hand, from the middle of the process, since the dopant compound in the premix material is depleted earlier than the host material, vapor-deposited films having significantly less content of dopant compound than a desired ratio are obtained. As a result, the yield in the fabrication process is significantly reduced, which means that such a premix material does not withstand practical use.

The inventors have found that, in a system in which a mixing ratio of one compound is small to a certain extent as in this example, an use of a premix material in which compounds having similar vapor deposition characteristics are combined as in the above-mentioned idea rather hinders a formation of vapor-deposited films having a desired mixing ratio over a long period of time.

As a result of further studies based on the above findings, the inventors have found that, in a system in which one component has a certain smaller content, the above-mentioned problem can be solved by daring to combine compounds having different vapor deposition characteristics. Specifically, the inventors have found that a vapor deposition with a suppressed fluctuation in component ratio in a mixed film during a film formation becomes possible by satisfying a predetermined relationship in consideration of a vapor deposition characteristics and a mixing ratio of each compound, and the inventors have completed the invention.

As an exapmle of a prior art, the invention disclosed in Patent Document 1 is related to a mixed material of a host compound and a dopant compound, and it is just for simplificating a manufacturing process of an organic EL device by simply premixing the compounds. That is, the invention of Patent Document 1 is not a tecnique that focuses on a vapor deposition characteristics of each compounds, and in the first place, it does not even recognize the above-mentioned specific problem in a system in which one component has a certain smaller content.

According to the invention, the following mixed powder and the like can be provided.

1. A mixed powder for an organic electroluminescence device, comprising a first organic compound and a second organic compound, wherein the mixed powder is solid at normal temperature and pressure, and the following formulas (1) and (2) are satisfied:

$$0 < MOL2/(MOL1+MOL2) \leq 0.2 \quad (1)$$

$$-20^\circ\ C. \leq T1-T2 \leq 40^\circ\ C. \quad (2)$$

wherein in the formulas (1) and (2),

MOL1 [mol %] is a molar concentration of the first organic compound in the mixed powder, MOL2 [mol %] is a molar concentration of the second organic compound in the mixed powder, T1 [° C.] is a temperature of the first organic compound when $P1/M1^{1/2}=0.04\times\{MOL1/(MOL1+MOL2)\}$ is satisfied, T2 [° C.] is a temperature of the second organic compound when $P2/M2^{1/2}=0.04\times\{MOL2/(MOL1+MOL2)\}$ is satisfied, M1 [kg/mol] is the molecular weight of the first organic compound, P1 [Pa] is a vapor pressure of the first organic compound obtained by simultaneous thermogravimetry and differential thermal analysis at an arbitrary temperature, M2 [kg/mol] is the molecular weight of the second organic compound, P2 [Pa] is a vapor pressure of the second organic compound obtained by simultaneous thermogravimetry and differential thermal analysis at an arbitrary temperature, provided that the first organic compound and the second organic compound are different compounds.

2. A method of fabricating an organic electroluminescence device comprising a cathode, an anode, and one or two or more organic layers disposed between the cathode and the anode, the organic layers comprising an emitting layer; comprising:

heating and vaporizing a mixed powder from a vapor deposition source to deposite at least one layer of the one or two or more organic layers, wherein the mixed powder comprises a first organic compound and a second organic compound, the mixed powder is solid at normal temperature and pressure, and the following formulas (1) and (2) are satisfied for the mixed powder:

$$0<MOL2/(MOL1+MOL2)\leq 0.2 \quad (1)$$

$$-20^\circ\ C.\leq T1-T2\leq 40^\circ\ C. \quad (2)$$

wherein in the formulas (1) and (2),

MOL1 [mol %] is a molar concentration of the first organic compound in the mixed powder, MOL2 [mol %] is a molar concentration of the second organic compound in the mixed powder, T1 [° C.] is a temperature of the first organic compound when $P1/M1^{1/2}=0.04\times\{MOL1/(MOL1+MOL2)\}$ is satisfied, T2 [° C.] is a temperature of the second organic compound when $P2/M2^{1/2}=0.04\times\{MOL2/(MOL1+MOL2)\}$ is satisfied, M1 [kg/mol] is the molecular weight of the first organic compound, P1 [Pa] is a vapor pressure of the first organic compound obtained by simultaneous thermogravimetry and differential thermal analysis at an arbitrary temperature, M2 [kg/mol] is the molecular weight of the second organic compound, P2 [Pa] is a vapor pressure of the second organic compound obtained by simultaneous thermogravimetry and differential thermal analysis at an arbitrary temperature, provided that the first organic compound and the second organic compound are different compounds.

3. A method of selecting a first organic compound and a second organic compound comprised in a mixed powder which is solid at normal temperature and pressure, and is for an organic electroluminescence device, comprising:

selecting the first organic compound and the second organic compound so as to satisfy the following formulas (1) and (2):

$$0<MOL2/(MOL1+MOL2)\leq 0.2 \quad (1)$$

$$-20^\circ\ C.\leq T1-T2\leq 40^\circ\ C. \quad (2)$$

wherein in the formulas (1) and (2),

MOL1 [mol %] is a molar concentration of the first organic compound in the mixed powder, MOL2 [mol %] is a molar concentration of the second organic compound in the mixed powder, T1 [° C.] is a temperature of the first organic compound when $P1/M1^{1/2}=0.04\times\{MOL1/(MOL1+MOL2)\}$ is satisfied, T2 [° C.] is a temperature of the second organic compound when $P2/M2^{1/2}=0.04\times\{MOL2/(MOL1+MOL2)\}$ is satisfied, M1 [kg/mol] is the molecular weight of the first organic compound, P1 [Pa] is a vapor pressure of the first organic compound obtained by simultaneous thermogravimetry and differential thermal analysis at an arbitrary temperature, M2 [kg/mol] is the molecular weight of the second organic compound, P2 [Pa] is a vapor pressure of the second organic compound obtained by simultaneous thermogravimetry and differential thermal analysis at an arbitrary temperature.

4. A method for producing a mixed powder for an organic electroluminescence device, the mixed powder comprising a first organic compound and a second organic compound, and the mixed powder being solid at normal temperature and pressure, comprising;

mixing the first organic compound and the second organic compound so as to satisfy the following formulas (1) and (2):

$$0<MOL2/(MOL1+MOL2)\leq 0.2 \quad (1)$$

$$-20^\circ\ C.\leq T1-T2\leq 40^\circ\ C. \quad (2)$$

wherein in the formulas (1) and (2),

MOL1 [mol %] is a molar concentration of the first organic compound in the mixed powder, MOL2 [mol %] is a molar concentration of the second organic compound in the mixed powder, T1 [° C.] is a temperature of the first organic compound when $P1/M1^{1/2}=0.04\times\{MOL1/(MOL1+MOL2)\}$ is satisfied, T2 [° C.] is a temperature of the second organic compound when $P2/M2^{1/2}=0.04\times\{MOL2/(MOL1+MOL2)\}$ is satisfied, M1 [kg/mol] is the molecular weight of the first organic compound, P1 [Pa] is a vapor pressure of the first organic compound obtained by simultaneous thermogravimetry and differential thermal analysis at an arbitrary temperature, M2 [kg/mol] is the molecular weight of the second organic compound, P2 [Pa] is a vapor pressure of the second organic compound obtained by simultaneous thermogravimetry and differential thermal analysis at an arbitrary temperature, provided that the first organic compound and the second organic compound are different compounds.

5. A composition for a vapor deposition process, comprising a first organic compound and a second organic compound, wherein the following formulas (1) and (2) are satisfied:

$$0<MOL2/(MOL1+MOL2)\leq 0.2 \quad (1)$$

$$-20^\circ\ C.\leq T1-T2\leq 40^\circ\ C. \quad (2)$$

wherein in the formulas (1) and (2),

MOL1 [mol %] is a molar concentration of the first organic compound in the mixed powder, MOL2 [mol %] is a molar concentration of the second organic compound in the mixed powder, T1 [° C.] is a temperature of the first organic compound when $P1/M1^{1/2}=0.04\times\{MOL1/(MOL1+MOL2)\}$ is satisfied, T2 [° C.] is a temperature of the second organic compound when $P2/M2^{1/2}=0.04\times\{MOL2/(MOL1+MOL2)\}$ is satisfied, M1 [kg/mol] is the molecular weight of the first organic compound, P1 [Pa] is a vapor pressure of the first organic compound obtained by simultaneous thermogravimetry and differential thermal analysis at an arbitrary temperature, M2 [kg/mol] is the molecular weight of the second organic compound, P2 [Pa] is a vapor pressure of the second organic compound obtained by simultaneous thermogravimetry and differential thermal analysis at an arbitrary temperature, provided that the first organic compound and the second organic compound are different compounds.

According to the invention, a mixed powder can be obtained, which enables a vapor deposition with a suppressed fluctuation in component ratio in a mixed film during a film formation in a vapor deposition process using a mixed material in which one component has a certain smaller content.

MODE FOR CARRYING OUT INVENTION

[Mixed Powder]

Figure 1:
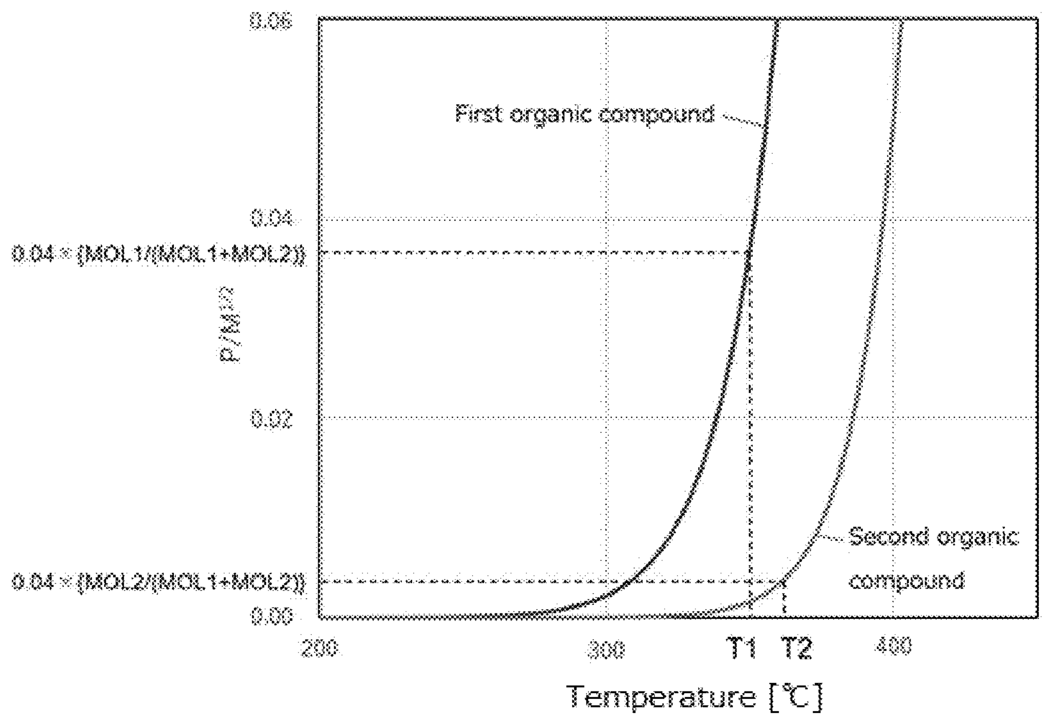
FIG. 1 is a diagram showing a vapor deposition characteristics curve of each component in an example of a mixed powder according to an aspect of the invention.

The mixed powder according to an aspect of the invention contains a first organic compound (hereinafter, also referred to as a "first component") and a second organic compound (hereinafter, also referred to as a "second component"), wherein the mixed powder is solid at normal temperature and pressure, and the following formula (relational expression) (1) is satisfied:

$$0<MOL2/(MOL1+MOL2)\leq 0.2 \quad (1)$$

wherein in the formula (1), MOL1 [mol %] is a molar concentration of the first organic compound in the mixed powder, MOL2 [mol %] is a molar concentration of the second organic compound in the mixed powder.

Also the following formula (2) is satisfied for the mixed powder;

$$-20^\circ\ C.\leq T1-T2\leq 40^\circ\ C. \quad (2)$$

wherein the formula (2), T1 [° C.] is a temperature of the first organic compound when $P1/M1^{1/2}=0.04\times\{MOL1/(MOL1+MOL2)\}$ is satisfied, T2 [° C.] is a temperature of the second organic compound when $P2/M2^{1/2}=0.04\times\{MOL2/(MOL1+MOL2)\}$ is satisfied, M1 [kg/mol] is the molecular weight of the first organic compound, P1 [Pa] is a vapor pressure of the first organic compound obtained by simultaneous thermogravimetry and differential thermal analysis at an arbitrary temperature, M2 [kg/mol] is the molecular weight of the second organic compound, and P2 [Pa] is a vapor pressure of the second organic compound obtained by simultaneous thermogravimetry and differential thermal analysis at an arbitrary temperature.

When performing a vapor deposition using a mixed powder having the above constitution, it becomes possible to hold a balance of a vaporization amount of the first component and the second component for a long time. In particular, when the material is continuously heated to form films sequentially on a plurality of substrates, the film formation can be performed at a stable component ratio from the beginning to the end of the vapor deposition process. As a result, an occurrence of defective products and a loss of raw materials can be minimized. In addition, a yield can be improved and productivity can be increased. Note that the above effect is not intended to be an effect in which a film formation at a constant ratio for all substrates subjected to a continuous vapor deposition process becomes posisble. Even when the mixed powder according to an aspect of the invention is used, it is possible that a component ratio may somewhat varies, particularly in a final stage of the process. However, it means that the mixed powder according to an aspect of the invention enables to greatly increase a time ratio where a film forming at a stable content ratio is possible.

Hereinafter, the technical significance of the above formulas (1) and (2) will be described.

<Formula (1)>

The formula (1) means that a content of one component of the mixed material is small to a certain degree. The proportion of the second component to the sum of the first component and the second component, i.e., MOL2/(MOL1+MOL2) is greater than 0 and 0.2 or less, and may be, for example, 0.15 or less, 0.10 or less, or 0.05 or less. MOL2/(MOL1+MOL2) may be, for example, 0.001 or more, or 0.005 or more. MOL2/(MOL1+MOL2) can also be expressed by the following formulas (1-1) to (1-3).

$$0<MOL2/(MOL1+MOL2)\leq 0.15 \quad (1\text{-}1)$$

$$0<MOL2/(MOL1+MOL2)\leq 0.10 \quad (1\text{-}2)$$

$$0<MOL2/(MOL1+MOL2)\leq 0.05 \quad (1\text{-}3)$$

The proportion of the first component to the sum of the first and second components, i.e., MOL1/(MOL1+MOL2) is 0.80 or more and less than 1.00, and may be, for example, 0.85 or more, 0.90 or more, 0.95 or more, or 0.99 or more. MOL1/(MOL1+MOL2) may be, for example, 0.999 or less, or 0.995 or less. MOL1/(MOL1+MOL2) can also be expressed by the following formulas (1-11) to (1-15).

$$0.80 \leq MOL1/(MOL1+MOL2) < 1.00 \quad (1\text{-}11)$$

$$0.85 \leq MOL1/(MOL1+MOL2) < 1.00 \quad (1\text{-}12)$$

$$0.90 \leq MOL1/(MOL1+MOL2) < 1.00 \quad (1\text{-}13)$$

$$0.95 \leq MOL1/(MOL1+MOL2) < 1.00 \quad (1\text{-}14)$$

$$0.99 \leq MOL1/(MOL1+MOL2) < 1.00 \quad (1\text{-}15)$$

<Formula (2)>

Thermogravimetric analysis of an organic compound shows an amount of mass change (loss) [kg] with respect to temperature change, and the mass loss speed (rate) [kg/min] can be derived by taking into account the time [min] therein. Since the mass loss rate represents a mass of vaporization (vapor deposition) per unit time, it can be used as an index in the vapor deposition characteristics of the organic compound. However, in the invention, molar vapor deposition rate [mol/min] is used as an index of vapor deposition characteristics in order to make the index less dependent on a molecular weight of a compound.

Here, it is known that the relation represented by the following formula (A1) holds between mass loss rate m, vapor pressure (saturated vapor pressure) P, and molecular weight M of an organic compound. Since the mass loss rate m is proportional to $P \times M^{1/2}$, the molar deposition rate m/M is proportional to $P \times M^{1/2}/M$ which is $P/M^{1/2}$. That is, it is understood that the molar deposition rate can be evaluated by $P/M^{1/2}$. The unit of $P/M^{1/2}$ is $[Pa/(kg/mol)^{1/2}]$.

$$m = P\sqrt{\frac{M}{2\pi RT}} \quad (A1)$$

In the formula (A1), each symbol represents the following:

m: Mass loss rate $[kg/(s \cdot m^2)]$ ($(s \cdot m^2)$ means time (s)×vapor deposition area on a substrate surface ($m^2$).)

P: Saturated vapor pressure [Pa]

M: Molecular weight [kg/mol] of a organic compound

R: Gas constant [J/(mol·K)]

T: Temperature [K]

One of the features of the invention is that $P/M^{1/2}$ obtained based on the thermogravimetric analysis, which is proportional to the molar vapor deposition rate is used as an index of the vapor deposition characteristics, and the relationship between a mixing ratio (molar ratio) of two components used in the mixed powder and the ratio of $P/M^{1/2}$ is focused on. Specifically, the invention is based on a technical idea that, in a system in which a mixing ratio of one compound is small to a certain extent or less, by bringing a mixing ratio (molar ratio) of two components in the mixed powder and a ratio of $P/M^{1/2}$ of the two components close to each other, it becomes possible to maintain a balance of vaporization amounts of the two components in a vapor deposition process (particularly in a continuous vapor deposition process) fora long time. The above-mentioned formula (2) shows this idea.

The relationship between the above technical idea and the formula (2) will be described below with reference to a specific example.

As an example of the mixed powder according to an aspect of the invention, a mixed powder containing a first component (a larger amount component) and a second component (a smaller amount component) is assumed, and vapor deposition characteristics curves of temperature and $P/M^{1/2}$ shown in FIG. 1 are assumed as vapor deposition characteristics of each. The molar ratio of the two components in this example is 9:1, i.e., MOL2/(MOL1+MOL2) is 0.1. Correspondingly, when the proportion of the ratio of $P/M^{1/2}$ of the two components is also close to 9:1, the balance of vaporization amounts (vapor deposition amounts) is maintained for a long time. The formula (2) expresses this condition from the point of view of temparature.

That is, the formula (2) focuses on the difference between a temperature T1 when $P/M^{1/2}$ of the first component becomes a specific value (0.04×{MOL1/(MOL1+MOL2)}) which corresponds to the molar ratio thereof (MOL1/(MOL1+MOL2)) and a temperature T2 when $P/M^{1/2}$ of the second component becomes a specific value (0.04×{MOL2/(MOL1+MOL2)}) which corresponds to the molar ratio thereof (MOL2/(MOL1+MOL2)), and indicates that the above-mentioned effects can be sufficiently exhibited when the temperature difference (T1−T2) is within a predetermined range (note that when (T1−T2) is 0° C., the ratio of the molar vapor deposition rate of the first component to the molar vapor deposition rate of the second component at temperature T1=T2 is exactly the same as the molar ratio of the two components, i.e., 9:1.).

In this example, as shown in FIG. 1, since the difference between T1 and T2, i.e., (T1−T2) is −10° C. which is within a predetermined range, when performing a vapor deposition with putting the mixed powder into a vapor deposition source, a balance of the vaporization amounts of these two components can be maintained for a long time.

"0.04" is a constant which is set in consideration of conditions such as molecular weight of a compound and vapor pressure normally employed in a vapor deposition process using an organic compound.

Here, the reason why the difference between T1 and T2, i.e., (T1−T2) is set to "−20° C.≤T1−T2≤40° C." will be described below.

As described above, a balance of vaporization amounts of two components can be maintained for a long time when T1 and T2 are similar or within a range approximating to a certain extent. As a result of further study by the inventors, it has been found that, particularly when trying to reduce a difference in a molar ratio of two components in a mixed powder and a vapor-deposited film, that is, when considering an improvement in a reproducibility of a component ratio, a better result can be obtained in the case where T1 is higher than T2 to a certain extent, compared with the case where T1 and T2 are the same. Although the reason for this is not necessarily clear, it is considered to be related to the fact that the second component (small amount component) is less exposed to the outside and less likely to vaporize than the first component, and so on. In consideration of this, conditions are set so that the first component is slightly less likely to vaporize, i.e., a modification is made to obtain the above value range.

As a different idea from the invention, an idea that it is preferable to match the molar vapor deposition rates of the compounds at an arbitrary temperature irrespective of a mixing ratio of a mixed powder may be possible. That is, the idea is that a combination of compounds in which the vapor deposition characteristic curves overlap or are very close to each other is preferable. In such an idea, a combination in which the vapor deposition characteristic curves are deviated like the first component and the second component shown in FIG. 1 is not preferable.

The difference between T1 and T2, i.e., (T1−T2) is, for example, −15° C. or more, -10° C. or more, −5° C. or more, 0° C. or more, or 5° C. or more, and is, for example, 35° C. or less, 30° C. or less, 25° C. or less, 20° C. or less, or 15° C. or less.

In one embodiment, the difference between T1 and T2, i.e., (T1−T2) is −10° C. or more and 30° C. or less, −5° C. or more and 25° C. or less, or 0° C. or more and 20° C. or less.

In one embodiment, the difference between T1 and T2, i.e., (T1-T2) may be expressed as the following formulas (2-1) to (2-2).

$$0° \text{ C.} \leq T1-T2 \leq 40° \text{ C.} \tag{2-1}$$

$$5° \text{ C.} \leq T1-T2 \leq 40° \text{ C.} \tag{2-2}$$

Within such a range as described above, it is possible to reduce a difference in a molar ratio of two components in a mixed powder and a vapor-deposited film, and to improve the reproducibility of the component ratio.

(Method of Measurement and Calculation of T1 and T2)

The temperature T1 at which $P/M^{1/2}$ of the first component is 0.04×{MOL1/(MOL1+MOL2)} and the temperature T2 at which $P/M^{1/2}$ of the second component is 0.04×{MOL2/(MOL1+MOL2)} are obtained by reading from the vapor deposition characteristics curves between temperature and $P/M^{1/2}$ of the respective compounds. The specific methods are shown below.

The vapor deposition characteristics curves between temperature and $P/M^{1/2}$ of the compounds of the first component and the second component are obtained by the following methods.

(Simultaneous Thermogravimetry and Differential Thermal Analysis)

A simultaneous thermogravimetry and differential thermal analysis equipment is used to measure an amount of weight loss when the temperature is changed under vacuum. A simultaneous thermogravimetry and differential thermal analysis (TG-DTA) is a method for continuously measuring a mass change of a sample when the sample is heated, and is utilized for detecting a physical change accompanied by a mass change such as sublimation and evaporation.

The measurement is performed under the following measurement conditions.

(Measurement Conditions)

Equipment: Simultaneous thermogravimetry and differential thermal analysis equipment Sample container: Aluminum nitride pan Sample mass: 3 to 10 mg Temperature rise rate: 3° C./min Measurement range: 35° C. or more and 500° C. or less Vacuum degree: $1\times10^{-3}$ Pa or less (Conversion to Vapor Deposition Characteristics Curves of Temperature and $P/M^{1/2}$)

$P/M^{1/2}$ at each temperature is calculated from the mass loss rate (kg/s) at each temperature obtained by the simultaneous thermogravimetry and differential thermal analysis, using the conversion expression of the following formula (A11).

$$\frac{P}{\sqrt{M}} = \frac{\sqrt{2\pi RT}}{MA} \cdot \frac{d\Delta W}{dT} \cdot \frac{dT}{dt} \tag{A11}$$

In the formula (A11), each symbol represents the following:

P: Saturated vapor pressure [Pa]

A: Area [$m^2$] of the vaporization surface in the sample container

ΔW: Mass loss [kg] of the organic compound in the sample container

T: Temperature [K] of the vaporization surface in the sample container t: Time [s]

M: Molecular weight [kg/mol] of the organic compound

R: Gas constant [J/(mol·K)]

By using the calculated $P/M^{1/2}$ as the vertical axis and the temperature as the horizontal axis, vapor deposition characteristics curve between temperature and $P/M^{1/2}$ of the compound is obtained.

Strictly theoretically, condensation coefficient a can affect the saturated vapor pressure P. However, in this measurement, the condensation coefficient a is considered to be 1 because diffusion is sufficiently promoted in the measurement temperature range of the material. Therefore, the condensation coefficient a does not appear in the formula (A1).

(Extrapolation of Vapor Deposition Characteristics Curve of Temperature and $P/M^{1/2}$)

The vapor deposition characteristics curve between temperature and $P/M^{1/2}$ obtained as described above are extrapolated by the following methods, when necessary, when T1 and T2 are calculated.

The resulting deposition characteristic curve is fitted by an exponential function of the following formula (A12).

$$\frac{P}{\sqrt{M}} = \frac{1}{\sqrt{M}} \cdot \text{Exp}(C_1) \cdot \text{Exp}\left(-\frac{C_2}{T}\right) \tag{A12}$$

In the formula (A12), P, M, and T are as described in the formula (A11).

Take the temperature on the horizontal axis and the natural logarithm of the saturated vapor pressure on the vertical axis, and the intercept $C_1$ and the slope $C_2$ in the formula (2) are calculated by the least-squares method for an arbitrary range in which the linearity is highest. The resulting $C_1$, $C_2$ and the formula (A12) can be used to obtain $P/M^{1/2}$ at an arbitrary temperature.

(First Organic Compound (First Component) and Second Organic Compound (Second Component))

The compound structure of the first organic compound and the second organic compound is not particularly limited, and any organic compound can be used as long as they are different compounds from each other and satisfying the above-described conditions.

The expression "the first organic compound and the second organic compound are different compounds from each other" includes a case in which their chemical structural formulas (skeletons) are different from each other, and a case in which their chemical structural formulas (skeletons) are the same but contain a different isotope. The "isotope" means an atom having the same in their atomic number but different in the number of neutrons. For example, benzene ($C_6H_6$) and deuterated benzene ($C_6D_6$) are different components from each other.

In the case where their chemical structural formulas (skeletons) are the same but contain a different isotope, the compounds are also different in a case where just the number or position of the isotope is different from each other. For example, even in deuterated benzene, $C_6H_5D_1$ and $C_6D_6$ are compounds different from each other because the number of isotopes is defferent. For example, even among compounds represented by $C_6H_4D_2$, a compound having deuterium atoms at positions 1 and 2 of a benzene ring and a compound having deuterium atoms at positions 1 and 3 of a benzene ring are compounds different from each other because the position of isotopes is different.

In one embodiment, the first component and the second component are organic semiconductor materials, e.g., a material for an organic EL device, a material for an organic transistor, or a material for an organic solar cell.

As a material for an organic EL device, a material described below in [Method of fabricating organic EL device] can be used, and for example, an luminescent compound (a dopant material in an emitting layer), an organic compound that disperses the luminescent compound and transports an electric charge to the luminescent compound (a host material in an emitting layer), hole-transporting compound, electron-transporting compound and the like can be given.

As the dopant material in an emitting layer, a fluorescent emitting compound which emits fluorescence and a phosphorescent emitting compound which emits phosphorescence can be used, and as the emitting color, blue, green and red can be given. In one embodiment, the dopant material is a blue phosphorescent emitting material.

As the host material in an emitting layer, organic compounds appropriate for the dopant material are preferable, and a host material for a phosphorescent emitting device, a host material for a blue phosphorescent emitting device and the like can be given.

In one embodiment, the first component is a host material for an emitting layer, and the second component is a dopant material for an emitting layer.

In one embodiment, the first component is a host material for an fluorescent emitting layer, and the second component is a dopant material (a fluorescent emitting compound) for an fluorescent emitting layer.

In one embodiment, the first component is a hole-injecting material, and the second component is a hole-transporting material.

In one embodiment, the first component is a host material for an fluorescent emitting layer, and the second component is a host material for an fluorescent emitting layer.

In one embodiment, a phosphorescent emitting compound is not contained in the mixed powder.

In one embodiment, a heavy metal complex is not contained in the mixed powder.

In one embodiment, the second component is a fluorescent emitting compound that emits fluorescence with a main peak wavelength of 500 nm or less. As such compounds, a “blue fluorescent emitting material” described below in [Method of fabricating organic EL device] can be used.

The method for measuring the main peak wavelength of a compound is described as follows. A sample of 5 μmol/L toluene solution of the compound to be measured is prepared, placed in a quartz cell, and the emission spectrum (vertical axis: emission intensity, horizontal axis: wavelength) of this sample is measured at room temperature (300 K). The emission spectrum can be measured by a spectrofluorometer (Device name: F-7000) manufactured by Hitachi High-Technology Science Corporation. In the emission spectrum, the peak wavelength of the emission spectrum where the emission intensity is the maximum is defined as the main peak wavelength.

In one embodiment, the first component and the second component are not a phosphorescent compound which emits phosphorescence.

In one embodiment, the first component is a host material for the emitting layer and the second component is a dopant material for the emitting layer. It is preferable that the triplet energy $T_1$ (H1) of the first component and the triplet energy $T_1$ (D1) of the second component satisfy the following relation (mathematical formula 1).

$$T_1(D1)>T_1(H1) \qquad \text{(mathematical formula 1)}$$

The method of measuring a triplet energy $T_1$ is described as follows.

A compound to be measured is dissolved in EPA (diethylether: isopentane: ethanol=5:5:2 (volume ratio)) in a concentration of $10^{-5}$ mol/L or higher and $10^{-4}$ mol/L or lower, and this solution is put in a quartz cell as a measurement sample. For this measurement sample, phosphorescent spectrum (the vertical axis: phosphorescence emission intensity, the horizontal axis: wavelength) is measured at a low temperature (77 [K]), a tangent line is drawn to the rising edge on the short wavelength side of this phosphorescence spectrum, and the energy quantity calculated through the following conversion expression (F1) based on the wavelength value $\lambda_{edge}$ [nm] of the intersection point between the tangent line and the horizontal axis is defined as the triplet energy $T_1$.

$$T_1[eV]=1239.85/\lambda_{edge} \qquad \text{Conversion expression (F1)}$$

The tangent to the rise of the phosphorescence spectrum close to the short-wavelength region is drawn as follows. While moving on a curve of the phosphorescence spectrum from the short-wavelength region to the maximum spectral value closest to the short-wavelength region among the maximum spectral values, a tangent is checked at each point on the curve toward the long-wavelength of the phosphorescence spectrum. An inclination of the tangent is increased along the rise of the curve (i.e., a value of the ordinate axis is increased). A tangent drawn ata point of the maximum inclination (i.e., a tangent at an inflection point) is defined as the tangent to the rise of the phosphorescence spectrum close to the short-wavelength region.

The maximum with peak intensity being 15% or less of the maximum peak intensity of the spectrum is not included in the above-mentioned maximum closest to the short-wavelength region. The tangent drawn at a point of the maximum spectral value being closest to the short-wavelength region and having the maximum inclination is defined as a tangent to the rise of the phosphorescence spectrum close to the short-wavelength region.

For phosphorescence measurement, a spectrophotofluorometer body F-4500 (manufactured by Hitachi High-Technologies Corporation) is usable. Any device for phosphorescence measurement is usable. A combination of a cooling unit, a low temperature container, an excitation light source and a light-receiving unit may be used for phosphorescence measurement.

In one embodiment, one or more compounds selected from each of the following groups (Group 2A) to (Group 33A) may also be independently used as the first organic compound and the second organic compound. Note that the first organic compound and the second organic compound in this specification are not limited to one or more compounds independently selected from each of the following groups (Group 2A) to (Group 33A), and may not be one or more compounds independently selected from each of the following groups (Group 2A) to (Group 33A).

(Group 2A)

bis(phenylamino)biphenyl; rubrene; bis(phenylamino)biphenyl; TBP; OP31; tris(quinolinato)aluminum; coumarin 545T (Group 4A)

Alq3; NPB; TBADN; DCJTP; rubrene; OP31; DPQA; DBzR (Group 5A)

tris(methylphenylphenylamino)triphenylamine; tetrafluorotetracyanoquinodimethane; bathophenanthroline; tris(carbazolyl)triphenylamine; factris(phenylpyridine)iridium; zinc phthalocyanine; fullerene C60

(Group 6A)

tris(methylphenylphenylamino)triphenylamine; tetrafluorotetracyanoquinodimethane; bathophenanthroline; tris(carbazolyl)triphenylamine; factris(phenylpyridine)iridium; zinc phthalocyanine; fullerene C60

(Group 9A)

quaternaphthalene; binaphthalenyl(naphthyl)benzene; ternaphthalene; binaphthalenyl(naphthyl)benzene; binaphthalenyl(naphthyl)benzene; quaternaphthalene; quaternaphthalene; quaternaphthalene; quaternaphthalene; ternaphthaleyl (naphthyl)benzene; [bis(isopropylnaphthaleyl)]biphenyl; (ternaphthaleyl)biphenyl; ternaphthaleyl(naphthyl)benzene; ternaphthaleyl(naphthyl)benzene; diphenylphenanthrene; tetraphenylphenanthrene; dimethylbis(methylphenyl) phenanthrene; bis(trifluoromethyl)bis(trifluoromethylphenyl)phenanthrene; dimethoxybis(methoxyphenyl) phenanthrene; diphenylbis(biphenylyl)phenanthrene; diphenylbis(methylphenyl)phenanthrene; dimethyl(biphenylyl)phenanthrene; methylphenylmethylphenyl(biphenylyl)phenanthrene; di(naphthyl)phenanthrene; di(pyridyl) phenanthrene; di(tert-butyldiphenylphenanthrene; distyrylphenanthrene; cyanophenanthrene; bis(diphenylvinyl)phenanthrene; binaphthalenyl(phenanthrenyl)benzene; di(phenanthrenyl)naphthalene; bis(diphenylphenanthrenyl) naphthalene; [di(phenanthrenyl)]binaphthalene; (binaphthalenyl)phenanthrene; di(phenanthrenyl)benzene; di(phenanthrenyl)naphthalene; naphthyl(phenanthrenyl) phenanthrene; naphthyl(phenanthrenyl)phenanthrene; diphenyl(naphthyl(phenanthrenyl))phenanthrene; naphthyl (phenanthrenyldiphenyl)phenanthrene; phenyl(phenanthrenyl)naphthalene; (diphenyl)[di(phenanthrenyl)]naphthalene; naphthyl(phenanthrenylphenyl)phenanthrene; [di (phenanthrenyl)]biphenyl; (naphthyl)[di(phenanthrenyl)] benzene; (naphthyl)[di(phenanthrenyl)]benzene; tris (phenanthrenyl)naphthalene; [(phenyl)naphthaleyl] phenylphenanthrene; [(phenyl)naphthaleyl](naphthyl) phenanthrene; (binaphthalenyl(naphthyl)phenanthrene; (binaphthalenyl)(phenanthrenyl)phenanthrene; [di(naphthyl)]biphenanthrene; [(naphthyl)]terphenanthrene; [(phenyl)phenanthrenyl](phenanthrenyl)benzene; (diphenylbinaphthalenyl)(naphthyl)phenanthrene; [di(naphthyl) diphenyl]biphenanthrene; [di(naphthyl)diphenyl] biphenanthrene; (binaphthalenyl)(naphthyl)phenanthrene; [(naphthyl)phenyl](naphthyl)phenanthrene; [(binaphthalenyl)(phenanthrenyl)biphenyl; [(phenanthrenyl)phenyl] (naphthylphenylphenanthrene; bis[(phenanthrenyl)phenyl] naphthalene; bis[(phenanthrenyl)phenyl]naphthalene; bis [(phenanthrenyl)phenyl]naphthalene; bis[(phenanthrenyl) phenyl]naphthalene; bis[(phenanthrenyl)phenyl] phenanthrene; bis[(phenanthrenyl)phenyl]naphthalene; bis [(phenanthrenyl)phenyl]naphthalene; bis[(phenanthrenyl) phenyl]naphthalene; (binaphthalenyl)[(biphenylyl) phenanthrenyl]benzene; (naphthyl)[(phenanthrenyl) naphthaleyl]benzene; [(phenanthrenyl)naphthaleyl] (phenanthrenyl)benzene; (binaphthalenyl)(phenanthrenyl) benzene; (binaphthalenyl)(phenanthrenyl)benzene; [(phenanthrenyl)naphthaleyl](phenanthrenyl)benzene; (binaphthalenyl)(phenanthrenyl)benzene; (binaphthalenyl) (phenanthrenyl)benzene; [(phenanthrenyl)naphthaleyl] (phenanthrenyl)benzene; (binaphthalenyl)(phenanthrenyl) benzene; (binaphthalenyl)(phenanthrenyl)benzene; (binaphthalenyl)(phenanthrenyl)benzene; [(phenanthrenyl) naphthaleyl](phenanthrenyl)benzene; [(phenyl)naphthaleyl] (phenanthrenyl)benzene; ethyl[ethyl(binaphthalenyl)] (phenanthrenyl)benzene; [(phenyl)binaphthalenyl] phenanthrene; [bis(phenanthrenyl)]binaphthalene; [(benzophenanthrenyl)(phenanthrenyl)binaphthalene; (benzochrysenyl){[(tert-butyldimethylsilyl) phenanthrenylmaphthaleyl}benzene; [phenyl(phenanthrenyl)]binaphthalene; [(phenanthrenyl)phenyl]binaphthalene; (ternaphthaleyl)phenanthrene; [bis(phenanthrenyl)]binaphthalene; [bis(phenanthrenyl)]binaphthalene; [phenanthrenyl (phenanthrenyl)]binaphthalene; [bis(phenanthrenyl)]binaphthalene; (ternaphthaleyl)phenanthrene; (ternaphthaleyl) phenanthrene; (ternaphthaleyl)phenanthrene; [bis (phenanthrenyl)]binaphthalene; {bis[(trimethylsilyl) phenanthrenyl]}binaphthalene; [bis(phenanthrenyl)] biphenyl; [naphthyl(phenanthrenyl)]biphenyl; [phenanthrenyl(phenanthrenyl)]biphenyl; [bis(phenanthrenyl)]biphenyl; [bis(phenanthrenyl)]biphenyl; [(phenanthrenyl(naphthyl)]biphenyl; [dimethylbis(phenanthrenyl)]biphenyl; [dimethylphenanthrenyl(methylphenanthrenyl)] biphenyl; [bis(diisopropylphenanthrenyl)]biphenyl; [phenanthrenyl(trimethylsilylnaphthaleyl)]biphenyl; [difluorobis(phenanthrenyl)]biphenyl; [dicyanobis(phenanthrenyl)]biphenyl; [(phenanthrenyl)[(naphthyl)phenyl]]binaphthalene; [biphenylyl(phenanthrenyl)]binaphthalene; [(phenanthrenyl)phenyl](phenanthrenyl)binaphthalene; [(phenanthrenyl)phenyl](phenanthrenyl)binaphthalene; [[(phenanthrenyl)phenyl]phenyl]binaphthalene; di(naphthyl)chrysene; di(naphthyl)chrysene; (naphthyl(naphthyl) chrysene; di(phenanthrenyl)chrysene; (naphthyl) (phenanthrenyl)chrysene; (naphthyl)(phenanthrenyl) chrysene; bis[(naphthyl)phenyl]chrysene; bis[(naphthyl) phenyl]chrysene; [(naphthyl)phenyl][(naphthyl)phenyl] chrysene; (naphthyl)[(naphthyl)phenyl]chrysene; [(naphthyl)phenyl](phenylnaphthaleyl)chrysene; [(naphthyl)phenyl](naphthyl)chrysene; bis(phenylnaphthaleyl) chrysene; bis[(biphenylyl)phenyl]chrysene; bis(phenylnaphthaleyl)chrysene; (phenylnaphthaleyl) [(phenylnaphthaleyl)phenyl]chrysene; bis [(benzophenanthrenyl)phenyl]chrysene; [(naphthyl)phenyl] [(naphthyl)phenyl]chrysene; bis[(naphthyl)phenyl] chrysene; bis[(naphthyl)phenyl]chrysene; phenyl [(phenanthrenyl)naphthaleyl]chrysene; bis (phenylchrysenyl)naphthalene; di(naphthyl)chrysene; (naphthyl)(naphthyl)chrysene; di(naphthyl)chrysene; (naphthyl)(phenanthrenyl)chrysene; di(phenanthrenyl)chrysene; (naphthyl)(phenanthrenyl)chrycene; diphenyldi(naphthyl) chrysene; phenyl(naphthyl(naphthyl)chrysene; phenyldi (naphthyl)chrysene; phenyl(phenanthrenyl)(naphthyl) chrysene; (isopropyl)di(phenanthrenyl)chrysene; di(naphthyl(phenanthrenyl))chrysene; phenyldi(phenanthrenyl)chrysene; (phenanthrenyl)(naphthyl)picene; [(biphenylyl)naphthaleyl]chrysene; (chrysenyl)[(phenanthrenyl)naphthaleyl]benzene; [chrysenyl(phenanthrenyl)]binaphthalene; bis(chrysenyl)biphenyl; (phenyl)[(cyclohexylchrysenyl) phenyl]binaphthalene; (phenyl)[(chrysenyl)phenyl]binaphthalene; (picenyl){(phenanthrenyl)phenyl}naphthalene; diphenylbenzophenanthrene; di(naphthyl)benzophenanthrene; bis(phenylnaphthaleyl)benzophenanthrene; bis(phenylnaphthaleyl)benzophenanthrene; (phenylnaphthaleyl)(naphthyl)benzophenanthrene; [(naphthyl)phenyl](naphthyl)benzophenanthrene; bis[(naphthyl)phenyl]benzophenanthrene; bis[(naphthyl)phenyl]benzophenanthrene; (benzophenanthrenyl)(phenanthrenyl)benzene; [(naphthyl)phenyl][(naphthyl)phenyl]benzophenanthrene; (benzophenanthrenyl)(phenanthrenyl)benzene; diphenylbenzophenanthrene; di(naphthyl)benzophenanthrene; (benzophenanthrenyl)(phenanthrenyl)biphenyl; di(naphthyl)benzophenanthrene; (naphthylphenyl)(phenanthrenyl)benzophenanthrene; di(naphthyl)benzochrysene; di(naphthyl)benzochrysene; (benzophenanthrenyl)(naphthylphenanthrenyl)benzene; (benzochrysenyl)(phenylnaphthaleyl)benzene; [benzochrysenyl(benzophenanthrenyl)]binaphthalene; [benzophenanthrenyl(naphthyl)]biphenyl; [benzophenanthrenyl(benzophenanthrenyl)]biphenyl; [(phenanthrenyl)phenyl](benzophenanthrenyl)naphthalene; [phenanthrenyl(benzochrysenyl)]binaphthalene; [di(benzochrysenyl)]biphenyl; diphenylbenzochrysene; bis[(naphthyl)phenyl]benzochrysene; bis[(naphthyl)phenyl]benzochrysene; di(naphthyl)benzochrysene; bis(phenylnaphthaleyl)benzochrysene; diphenylhelicene; di(naphthyl)helicene; di(naphthyl)helicene; di(naphthyl)(fluoranthenyl)benzene; diphenyl[(naphthyl)phenyl]fluoranthene; bis[(naphthyl)phenyl]fluoranthene; phenyl(phenanthrenyl)fluoranthene; naphthyltetraphenylfluoranthene; phenanthrenyltetraphenylfluoranthene; diphenyl[(naphthyl)phenyl]fluoranthene; diisopropyldiphenyl[(naphthyl)phenyl]fluoranthene; diphenyl[(phenanthrenyl)phenyl]fluoranthene; di(naphthyl)fluoranthene; (naphthyl)((naphthyl)phenyl)fluoranthene; (naphthyl)bis[(naphthyl)phenyl]fluoranthene; (naphthyl)(phenanthrenyl)fluoranthene; (naphthyl)(naphthyl)fluoranthene; (biphenylyl)(naphthyl)fluoranthene; [(phenyl)biphenylyl](naphthyl)fluoranthene; [(phenyl)biphenylyl](naphthyl)fluoranthene; (biphenylyl)(terbenzenyl)fluoranthene; di(fluoranthenyl)naphthalene; [(benzofluoranthenyl)naphthaleyl][(naphthyl)phenyl]phenanthrene; diphenyldi(fluoranthenyl)naphthalene; {[(benzofluoranthenyl)biphenylyl]}[(benzofluoranthenyl)phenyl]naphthalene; [benzofluoranthenyl(phenanthrenyl)]biphenyl; [di(fluoranthenyl)]binaphthalene; [(fluoranthenyl)phenyl](phenanthrenyl)naphthalene; [(phenanthrenyl)phenyl](fluoranthenyl)naphthalene; [di(fluoranthenyl)]biphenyl; {[(phenanthrenyl)phenyl](fluoranthenyl)}binaphthalene; (benzofluoranthenyl)(phenanthrenyl)benzene; (benzofluoranthenyl)(phenanthrenyl)triphenylene; di(naphthyl)(benzofluoranthenyl)benzene; (benzofluoranthenyl)(naphthyl)benzene; bis[(naphthyl)phenyl]benzofluoranthene; (phenanthrenyl)benzofluoranthene; tetraphenylbenzofluoranthene; tetraphenyldibenzofluoranthene; diphenyl[(naphthyl)phenyl]benzofluoranthene; diphenyl[(naphthyl)phenyl]benzofluoranthene; diphenyl[(phenanthrenyl)phenyl]benzofluoranthene; diphenylbenzofluoranthene; bis[(phenyl)biphenylyl]diphenylbenzofluoranthene; (phenyldiphenyl)benzofluoranthene; (diphenyl)benzofluoranthenylphenylnaphthalene; di(naphthyl)diphenylbenzofluoranthene; (biphenylyl)(diphenyl)[(naphthyl)phenyl]benzofluoranthene; bis(biphenylyl)(diphenyl)benzofluoranthene; di(methylstyryl)triphenylene; distyryltriphenylene; tri(methylstyryl)triphenylene; tristyryltriphenylene; diphenyltriphenylene; (naphthylphenyl)triphenylene; diphenyltriphenylene; hexaphenyltriphenylene; triphenyltriphenylene; tris(biphenylyl)triphenylene; tetraphenyltriphenylene; (triphenylenyl(phenanthrenyl)diphenylphenanthrene; naphthyl(phenanthrenyl)triphenylene; (biphenanthrenyl)triphenylene; bis(triphenylenyl)binaphthalene; [(triphenylenyl)phenyl](phenanthrenyl)naphthalene; [bis(triphenylenyl)]biphenyl; [bis(triphenylenyl)]biphenyl; {[(triphenylenyl)]phenylphenyl}binaphthalene; [(naphthyl)phenyl][(naphthyl)phenyl]naphthoquinoline; bis(naphthyl)azabenzochrysene; diphenyldiazodibenzophenanthrene; bis(phenylnaphthaleyl)acenaphthopyrazine; bis(phenylnaphthaleyldiazabenzofluoranthene; diphenylazabenzofluoranthene; iridium(III)bis(phenylquinolyl)acetylacetonate; iridium(III)tris(phenylisoquinolyl); iridium(III)bis((tert-butylphenyl)isoquinolyl)acetylacetonate; iridium(III)bis(diphenylquinoxalyl)acetylacetonate; iridium(III)bis(diphenyltetrahydroquinoxalyl)acetylacetonate; iridium(III)bis(diphenylpyrazine)acetylacetonate; osmium(IV)bispriphenylmethyltriazolylmethylpyridyl]bis(methyldiphenylphosphonate); ruthenium(V)bis[dipyridyl](phenylpyridyl); platinum(II)bis[(thienyl)pyridyl]; iridium(III)bis[(benzothiophenyl]pyridine]acetylacetonate; iridium(III)bis(phenylbenzothiazole)acetylacetonate; iridium(III)tris(diphenylquinoxalyl); iridium(III)bis(phenylphenanthrydiyl)acetylacetonate; iridium(III)bis((biphenylyl)pyridine)acetylacetonate; iridium(III)bis(phenylisoquinolyl)(acetylhydroxycyclohexenone); platinum(II)bis[phenylenebis(ditert-butylsalicylideneimine]; iridium(III)tris(difluorodibenzoquinolyl)acetylacetonate; platinum(II)(octaethylporphyrin); iridium(III)tris[(fluoro)phenylpyridyl]; iridium(III)bis[(fluoro)phenylpyridyl]acetylacetonate; iridium(III)tris[(difluorophenyl)pyridyl]; iridium(III)tris[(fluorophenylmethoxpyridyl]; iridium(III)bis[(fluorophenyl)pyridyl][(difluorophenyl)pyridyl]; iridium(III)tris[(difluorophenylmethoxpyridyl]; iridium(III)tris[(fluorophenyldiphenylaminopyridyl]; iridium(III)tris[(fluorophenyldimethylaminopyridyl]acetylacetonate; iridium(III)tris[(difluorophenylmethylpyridyl]; platinum(II)[di(pyridyl)benzil](biphenylone]; iridium(III)tris[(methylphenylpyridyl]; iridium(III)tris[(methylphenylpyridyl]; iridium(III)bis[phenylisoquinolyl]acetylacetonate; iridium(III)bis[phenylpyridyl]acetylacetonate; iridium(III)bis[(bis(trifluoromethyl)phenyl)pyridyl](carboxylatepyridinium); iridium(III)bis[(difluorophenyl)pyridyl](carboxylatepyridinium); iridium(III)bis[(difluorophenyl)pyridyl][(trifluoromethyl(pyridinyltriazole); iridium(III)tris[phenylpyridyl]; iridium(III)bis[phenylisoquinolyl]acetylacetonate; iridium(III)bis[(difluorophenyl)pyridyl][tetrakis(pyrazolyl)boron]; iridium(III)tris[phenylmethyldihydrobenzoimidazole]; iridium(III)tris[(dibenzofuranylmethylimidazoline]; iridium(III)tris[(dimethylfluorenylpyrazole]; platinum(II)bis(phenylpyridine); iridium(III)tris[(trifluorophenyl)pyridyl]; iridium(III)bis[(thienyl)pyridyl]acetylacetonate; iridium(III)bis(phenylbenzooxazole)acetylacetonate; iridium(III)bis[(naphthyl)benzooxazole]acetylacetonate; iridium(III)bis[(benzothiazolyldimethylaminocoumaryl]acetylacetonate; iridium(III)bis[(naphthyl)isoquinolyl]acetylacetonate; iridium(III)bis[(naphthyl)isoquinolyl]acetylacetonate; iridium(III)bis[(pyridyl)isoquinolyl]acetylacetonate; iridium(III)bis(phenylisoquinolyl)(phenylpyridyl); iridium(III)tris[(thienyl)isoquinolyl]

(Group 10A)

[di(carbazolyl)]biphenyl; [dimethyldi(carbazolyl)]biphenyl; [diphenyldi(carbazolyl)]biphenyl; di(carbazolyl)benzene; tri(carbazolyl)benzene; di(carbazolyl)triphenylsilylbenzene; tris[(carbazolyl)phenyl]amine; tris[(carbazolyl)phenyl]benzene; tris{[methylphenyl(phenyl)amino]phenyl}amine; tris{[naphthyl(phenyl)amino]phenyl}amine; [bis(tribenzoazepinyl)]biphenyl; [dimethylbis(tribenzoazepinyl)]biphenyl; bis(tribenzoazepinyl)benzene; tris(tribenzoazepinyl)benzene;

tris[(tribenzoazepinyl)phenyl]amine; tris[(tribenzoazepinyl)phenyl]benzene; diphenylbis[(carbazolyl)phenyl]silane; diphenylbis[(carbazolyl)phenyl]methane; di(carbazolyl)quaterbenzene; di(carbazolyl)quaterbenzene; di(carbazolyl)quaterbenzene; bis[(carbazolyl)phenyl]tetraphenylbenzene; bis[(carbazolyl)phenyl]tetraphenylbenzene; [di(carbazolyl)]biphenyl; bis(tert-butylindole-$d_5$)benzene-$d_4$; di(carbazolyl-$d_8$)benzene-$d_4$; [di(carbazolyl-$d_8$)]biphenyl; diphenylbis{[bis(methylphenyl)amino]phenyl}biphenyldiamine; tris[(naphthylphenylamino)phenyl]amine; diphenyldi(naphthyl)biphenyldiamine; tris(phenylbenzoimidazolyl)benzene; tris(phenylimidazopyridinyl)benzene; tris((methylphenyl)imidazopyridinyl)benzene; tris((biphenylyl)imidazopyridinyl)benzene; tris(methylbenzoimidazolyl)triazine; tris(phenylbenzoimidazolyl)triazine; aluminum(III)tris(quinolinolato); aluminum(III)bis(methylquinolinolato)(biphenylol); aluminum(III)bis(methylquinolinolato)(phenylnaphthalenol); aluminum(III)bis(methylquinolinolato)(triphenylsilanol); aluminum(III)tris[(hydroxyphenyl)phenylimidazopyridinol]; gallium(III)tris[(hydroxphenyl)phenylimidazopyridinol]; aluminum(III)tris[(triphenylimidazolyl)phenol]; palladium(II)bis(phenylpyridyl); platinum(II)bis(phenylpyridyl); iridium(III)tris(phenylpyrazolyl); iridium(III)bis(phenylpyrazolyl)(phenylpyridyl); palladium(II)bis(phenylpyrazolyl); platinum(II)[diphenylbis(phenylpyridinyl)methane]; platinum(II){diphenylbis[(difluorophenyl)pyridinyl]methane]; palladium(II)[bis(phenylpyridinyl)propane]; palladium(II)[diphenylbis(phenylpyridinyl)methane]; platinum(II)[bis(phenylpyridinyl)methane]; platinum(II){bis[(isoquinolinyl)naphthaleyl)]methane}; platinum(II){bis[(isoquinolinyl)benzene]one}; platinum(II)[bis(phenylpyridinyl)methane]; platinum(II)[bis(bipyridinyl)one}; platinum(II)(diphenylquinoquinoline)}; platinum(II)[phenyl(phenylpyridinyl)quinoline]; platinum(II){bis[(benzothiophenyl)pyridinyl]methylene]; platinum(II){{bis[(methyl)indolyl]pyridinyl}methane]; platinum(II)[bis(phenylisoquinolinyl)methane]; platinum(II){bis[(methoxyphenyl)isoquinolinyl]methane]; platinum(II)[bis(phenacylpyridine)]platinum(II)[bis((hydroxyphenyl)pyridine)]platinum(II){bis[(hydroxybenzylidene)]benzene}; platinum(II)[(diphenylphenanthrolinediyl)bis(phenol)]; platinum(II)[[(phenylpropanyl)isoquinolinediyl](phenylpropanyl)isoquinoline]; platinum(II)[[(phenylpropanyl)isoquinolinediyl](phenylpropanyl)isoquinoline]; platinum(II)[(methylenebispyridinediyl)methylenebispyridine]; platinum(II)[[(pyridylpropanyl)pyridine)diyl](phenylpropanyl)benzene]; platinum(II)[[(isoquinolylpropanyl)isoquinoline)diyl]((naphthalene)propanyl)naphthalene]; platinum(II)[(quinoquinolinediyl)(phenylpropanyl)benzene]; platinum(II)[tetrazahexacyclodotriacontapentadecaene]; platinum(II)[[((pyrazyl)propanyl)pyrazine)diyl](phenylpropanyl)benzene]; platinum(II)[bis(phenylpyridinyl)aniline]; platinum(II){[(naphthyl)pyridinyl](phenylpyridinyl)propane); platinum(II){(phenylpyridinyl)[(benzoimidazolyl)pyridinyl]propane); platinum(II)[bis(phenylisoquinolinyl)aniline]; platinum(II)[bis(phenylbiisoquinolinyl)aniline]; platinum(II)[bis((naphthyl)pyridinyl)aniline]; platinum(II)[bis((thienyl)pyridinyl)aniline]; platinum(II)[bis(phenylpyridinyl)ethene]; platinum(II)[bis(phenylpyridinyl)one]; platinum(II)[bis((pyridyl)phenyl)aniline]; platinum(II)[bis(difluorobipyridinatoyl)propane]; platinum(II)[(difluorobipyridinatoyl){(trifluoromethylpyrazolyl)pyridinatoyl}propane]platinum(II){bis[(cyanophenyl)pyridinyl]propane]; platinum(II)[(difluorobipyridinatoyl)(pyridinecarboxylateyl)propane]; platinum(II){[(phenylpyrazolyl)[(dibenzofuranyl)pyrazolyl]propane]; platinum(II)[bis(phenylpyridinyl)propane]; platinum(II){[bis(biphenylyl)pyridinyl]propane); iridium(III)bis[(dimethylphenyl)isobutylquinoline]acetylacetonate; iridium(III)bis[(quinolyl)isobutylbenzene]acetylacetonate; iridium(III)bis[(quinolyl)diisobutylbenzene]acetylacetonate; iridium(III)bis[(quinolyl)dimethylbenzene]acetylacetonate; iridium(III)tris[phenylisoquinoline]; iridium(III)bis[phenylisoquinoline]acetylacetonate; iridium(III)bis[(naphthyl)quinoline](tetramethyloxalatoheptenone); iridium(III)bis[(naphthyl)quinoline](phenylpyridine); iridium(III)bis(phenylpyridine) [(naphthyl)quinoline]; iridium(III)bis((thienyl)quinoline) (phenyloxalatobutenone); iridium(III)bis[(pyridinyl)quinoline](phenylpyrazine); iridium(III)bis(biquinoline)acetylacetonate; iridium(III)bis(phenylbenzoquinoline)acetylacetonate; iridium(III)bis[(naphthyl)quinoline](phenylbenzooxazole); iridium(III)bis(phenylquinoline)acetylacetonate; iridium(III)bis[(methylphenyl)quinoline]acetylacetonate; iridium(III)bis(benzoacridine)acetylacetonate; iridium(III)bis[(naphthyl)quinoline)acetylacetonate; iridium(III)bis[(pyrenyl)quinoline]acetylacetonate; iridium(III)bis[(biphenylyl)quinoline]acetylacetonate; iridium(III)bis[(phenanthrenyl)quinoline]acetylacetonate; iridium(III)bis[(methylphenyl)quinoline]acetylacetonate; iridium(III)bis[phenylquinoline]acetylacetonate; iridium(III)tris(phenylquinoline); iridium(III)bis(phenylisoquinoline)acetylacetonate; iridium(III)bis[(naphthyl)isoquinoline]acetylacetonate; iridium(III)tris{[(trifluoromethyl)phenyl]pyrazole}; iridium(III)tris[(difluorophenyl)pyridine]; iridium(III)tris[(tert-butylphenyl)pyridine]; iridium(III)tris[(thienyl)pyridine]; iridium(III)tris[(pyridyl)benzothiophene]; iridium(III)tris[(tert-butylphenyl)isoquinoline]; iridium(III)tris[(thienyl)isoquinoline]; iridium(III)tris[(dimethylfluorenyl)isoquinoline]; iridium(III)bis[(difluorophenyl)pyridine][tetra(pyrazolyl)borane]; iridium(III)bis[(difluorotrifluoromethylphenyl)pyridine](pyridinecarboxylate); iridium(III)bis(phenylpyridine)acetylacetonate; iridium(III)tris(phenylbenzooxazole); iridium(III)bis(phenylquinoline)acetylacetonate; iridium(III)bis[(pyridyl)benzothiophene]acetylacetonate; iridium(III)bis(phenylisoquinoline)acetylacetonate; iridium(III)bis[(pyridyl)naphthalene]acetylacetonate; europium(IV)trisphienyl)trifluoroxylatobutenoneHphenanthroline); iridium(III)tris[(naphthyl)isoquinoline]; terbium(IV)trisacetylacetonate(phenanthroline); dysprosium(IV)tris[trifluoroxylatophenylbutenone](benzo[h]quinoline); platinum(II)[bis(phenylpyridinyl)propane[; platinum(II){bis[(difluorophenyl)pyridinyl[propane}; platinum(II){bis[(trifluoromethylpyrazolyl)pyridinyl[propane}; platinum(II){bis[(trifluoromethylpyrazolyl)pyridinyl[fluorene}; bis(diphenylethenyl)biphenyl; diphenylanthracene; di(naphthyl)anthracene; tetrakis(biphenylyl)pyrene; octakis(methylphenyl)pyrenetetraamine; dimethylquinacridone; rubrene; coumarin; {[(tetrahydrabenzoquinolizine)yl[ethenylmethylpyranylidene}propanedinitrile (Group 12A)

diphenyl(triphenylenyl)triazine; diphenyl(triphenylenyl)pyridine; (triphenylenyl)diphenylpyrimidine; (pyridinyl)(triphenylenyl)biphenyl; di(pyridinyl)(triphenylenyl)benzene; (pyridinyl)(pyridinyl)(triphenylenyl)benzene; di(pyridinyl)(triphenylenyl)benzene; (pyridinyl)phenyl(triphenylenyl)triazine; (pyridinyl)(triphenylenyl)pyrimidine; phenyl(triphenylenyl)pyrimidine; (pyridinyl)(triphenylenyl)benzene; phenyl(triphenylenyl)triazine; (diphenylpyridinyl)(triphenylenyl)benzene; (diphenylpyridinyl)(triphenylenyl)

benzene; (diphenyltriazinyl)(triphenylenyl)benzene; di(pyridinyl)(triphenylenyl)biphenyl; di(pyridinyl)(triphenylenyl)biphenyl; (pyridinyl)(pyridinyl)(triphenylenyl)biphenyl; [di(pyridinyl)triazinyl](triphenylenyl)benzene; phenyl[(triphenylenyl)phenyl]pyrimidine; phenyl [(triphenylenyl)phenyl]triazine; (diphenylpyridinyl) (triphenylenyl)benzene; [(triphenylenyl)phenyl] diphenylpyrimidine; [(triphenylenyl)phenyl] diphenyltriazine; di(pyridinyl)(triphenylenyl)biphenyl; di(pyridinyl)(triphenylenyl)biphenyl; (pyridinyl)(pyridinyl) (triphenylenyl)biphenyl; [di(pyridinyl)triazinyl](triphenylenyl)benzene; phenyl[(triphenylenyl)phenyl]pyrimidine; phenyl[(triphenylenyl)phenyl]triazine; (triphenylenyl)(diphenylpyridinyl)biphenyl; (triphenylenyl)(diphenylpyrimidineyl)biphenyl; (triphenylenyl)(diphenyltriazinyl)biphenyl; (triphenylenyl)(pyridinyl)terbenzene; (triphenylenyl) (pyridinyl)terbenzene; (triphenylenyl)(pyridinyl)(pyridinyl) terbenzene; (triphenylenyl)[di(pyridinyl)triazinyl]biphenyl; (triphenylenyl)(phenylpyrimidineyl)biphenyl; (triphenylenyl)(phenyltriazinyl)biphenyl; (triphenylenyl)(diphenylpyridinyl)biphenyl; (triphenylenyl)(diphenylpyrimidineyl)biphenyl; (triphenylenyl)(diphenyltriazinyl) biphenyl; (triphenylenyl)di(pyridinyl)terbenzene; (triphenylenyl)di(pyridinyl)terbenzene; (triphenylenyl) (pyridinyl)(pyridinyl)terbenzene; (triphenylenyl)[di(pyridinyl)triazinyl]biphenyl; (triphenylenyl)(phenylpyrimidineyl) biphenyl; (triphenylenyl)(phenyltriazinyl)biphenyl; (diphenylpyridinyl)(triphenylenyl)biphenyl; (diphenylpyrimidineyl)(triphenylenyl)biphenyl; (diphenyltriazinyl)(triphenylenyl)biphenyl; di(pyridinyl)(triphenylenyl)terbenzene; di(pyridinyl)(triphenylenyl)terbenzene; (pyridinyl) (pyridinyl)(triphenylenyl)terbenzene; [di(pyridinyl) triazinyl](triphenylenyl)biphenyl; (phenylpyrimidineyl) (triphenylenyl)biphenyl; (phenyltriazinyl)(triphenylenyl) biphenyl; (diphenylpyridinyl)(triphenylenyl)biphenyl; (diphenylpyrimidineyl)(triphenylenyl)biphenyl; (diphenyltriazinyl)(triphenylenyl)biphenyl; di(pyridinyl)(triphenylenyl)terbenzene; di(pyridinyl)(triphenylenyl)terbenzene; (pyridinyl)(pyridinyl)(triphenylenyl)terbenzene; (di(pyridinyl)triazinyl)(triphenylenyl)biphenyl; (phenylpyrimidineyl) (triphenylenyl)biphenyl; (phenyltriazinyl)(triphenylenyl)biphenyl; (diphenylpyridinyl)(triphenylenyl)biphenyl; (diphenylpyrimidineyl)(triphenylenyl)biphenyl; (diphenyltriazinyl)(triphenylenyl)biphenyl; di(pyridinyl)(triphenylenyl)terbenzene; di(pyridinyl)(triphenylenyl)terbenzene; (pyridinyl)(pyridinyl)(triphenylenyl)terbenzene; [di(pyridinyl)triazinyl](triphenylenyl)biphenyl; (phenylpyrimidineyl) (triphenylenyl)biphenyl; (phenyltriazinyl)(triphenylenyl)biphenyl; (diphenylpyridinyl)(triphenylenyl)terbenzene; (diphenylpyrimidineyl)(triphenylenyl)terbenzene; (diphenyltriazinyl)(triphenylenyl)terbenzene; di(pyridinyl)(triphenylenyl)quaterbenzene; di(pyridinyl)(triphenylenyl)quaterbenzene; (pyridinyl)(pyridinyl)(triphenylenyl) quaterbenzene; [di(pyridinyl)triazinyl](triphenylenyl) terbenzene; (phenylpyrimidineyl)(triphenylenyl)terbenzene; (phenyltriazinyl)(triphenylenyl)terbenzene; (diphenylpyridinyl)(triphenylenyl)terbenzene; (diphenylpyrimidineyl)(triphenylenyl)terbenzene; (diphenyltriazinyl)(triphenylenyl)terbenzene; di(pyridinyl)(triphenylenyl) quaterbenzene; di(pyridinyl)(triphenylenyl)quaterbenzene; (pyridinyl)(pyridinyl)(triphenylenyl)quaterbenzene; [di (pyridinyl)triazinyl](triphenylenyl)terbenzene; (phenylpyrimidineyl)(triphenylenyl)terbenzene; (phenyltriazinyl)(triphenylenyl)terbenzene; (diphenylpyridinyl) (phenyltriphenylenyl)biphenyl; (diphenylpyrimidineyl) (triphenylenyl)terbenzene; (triphenylenyl) (diphenyltriazinyl)terbenzene; [di(pyridinyl)triazinyl] (triphenylenyl)terbenzene; [(triphenylenyl)biphenylyl] terpyridine; [(triphenylenyl)biphenylyl]terpyridine; (phenyltriphenylenyl)diphenyltriazine; (methyltriphenylenyl)diphenyltriazine; (phenyltriphenylenyl)(pyridinyl)biphenyl; (phenyltriphenylenyl)di(pyridinyl)benzene; (methyltriphenylenyl)(pyridinyl)(pyridinyl)benzene; (diphenyltriphenylenyl)(pyridinyl)phenyltriazine; (pyridinyl)(phenyltriphenylenyl)pyrimidine; phenyl(phenyltriphenylenyl)pyrimidine; (diphenylpyridinyl)(methyltriphenylenyl)benzene; (diphenylpyrimidineyl) (diphenyltriphenylenyl)benzene; di(pyridinyl) (phenyltriphenylenyl)biphenyl; (pyridinyl)(pyridinyl) (methyltriphenylenyl)biphenyl; (diphenylpyridinyl) (phenyltriphenylenyl)benzene; di(pyridinyl)(triphenylenyl) biphenyl; [di(pyridinyl)triazinyl](phenyltriphenylenyl) benzene; di(pyridinyl)(phenyltriphenylenyl)terbenzene; [di (pyridinyl)triazinyl](phenyltriphenylenyl)biphenyl; (phenyltriphenylenyl)di(pyridinyl)terbenzene; [di(pyridinyl)triazinyl](dimethyltriphenylenyl)biphenyl; (diphenylpyridinyl)(phenyltriphenylenyl)biphenyl; (diphenylpyrimidineyl)(methyltriphenylenyl)biphenyl; (diphenyltriazinyl)(phenyltriphenylenyl)biphenyl; (diphenyltriazinyl)(dimethyltriphenylenyl)terbenzene; (diphenyl triazinyl)(methyltriphenylenyl)terbenzene; di(pyridinyl) (phenyltriphenylenyl)terbenzene;(diphenyltriazinyl)(phenyltriphenylenyl)biphenyl; (diphenyltriazinyl)(phenyltriphenylenyl)biphenyl; phenyl(diphenylpyridinyl)bi(carbazole); phenyl(diphenylpyridinyl)bi(carbazole); (biphenylyl)(diphenylpyridinyl)bi(carbazole); (terphenylyl)(diphenylpyridinyl)bi(cafbazole); (terphenylyl)(diphenylpyridinyl)bi(carbazole); (naphthaleyl)(diphenylpyridinyl)bi (carbazole); (naphthaleyl)(diphenylpyridinyl)bi(carbazole); (triphenylenyl)(diphenylpyridinyl)bi(carbazole); (triphenylenyl)(diphenylpyridinyl)bi(carbazole); bi[(diphenylpyridinyl)carbazole]; (diphenylpyridinyl)(diphenylpyridinyl)bi(carbazole); bi[(diphenylpyridinyl) carbazole]; (dimethylfluorenyl)phenylbi(carbazole); (dimethylfluorenyl)(biphenylyl)bi(carbazole); (dimethylfluorenyl)(terphenylyl)bi(carbazole); (dibenzofuranyl)phenylbi(cartoazole); (dibenzofuranyl)(biphenylyl)bi(carbazole); (dibenzofuranyl)(terphenylyl)bi(carbazole); (dibenzothiophenyl)phenylbi(carbazole); (dibenzothiophenyl)(biphenylyl)bi(carbazole); (dibenzothiophenyl)(terphenylyl)bi(carbazole); bi[phenylcarbazole]; bi[(pyridinyl)carbazole]; bi[(pyrimidineyl)carbazole]; (triphenylenyl) phenylbi(carbazole); (triphenylenyl)(pyridinyl)bi (carbazole); (triphenylenyl)phenylbi(carbazole); (triphenylenyl)(pyridinyl)bi(carbazole); phenyl(triphenylenyl)bi(carbazole); (pyridinyl)(triphenylenyl)bi(carbazole); (biphenylyl)(biphenylyl)bi(carbazole); (biphenylyl)(terphenylyl)bi(carbazole); (biphenylyl)(terphenylyl)bi(carbazole); (dimethylfluonenyl)phenylbi(carbazole); (dimethylfluorenyl)(biphenylyl)bi(carbazole); (dimethylfluorenyl)(biphenylyl)bi(carbazole); (dimethylfluorenyl)(terphenylyl)bi(carbazole); (dibenzofuranyl)(biphenylyl)bi(carbazole); (dibenzothiophenyl)(biphenylyl)bi(carbazole); (phenylcarbazolyl)phenylbi(carbazole); (dibenzofuranyl)phenylbi(carbazole); (dibenzofuranyl)(biphenylyl)bi(carbazole); (dibenzofuranyl)(terphenylyl)bi(carbazole); (dibenzofuranyl) (biphenylyl)bi(carbazole); (dibenzothiophenyl)phenylbi (carbazole); (dibenzothiophenyl)(biphenylyl)bi(carbazole); (dibenzothiophenyl)(terphenylyl)bi(carbazole); (dibenzothiophenyl)(biphenylyl)bi(carbazole); (diphenylpyridinyl)(dimethylfluorenyl)bi(carbazole); (diphenylpyridinyl)(dimethylfluorenyl)bi(carbazole); [(pyridinyl)biphenylyl] (dimethylfluorenyl)bi(carbazole); [(pyridinyl)biphenylyl] (dimethylfluorenyl)bi(carbazole); [(pyridinyl)biphenylyl]

(dimethylfluorenyl)bi(carbazole); (diphenylpyridinyl)(dibenzofuranyl)bi(carbazole); (dibenzofuranyl)[(pyridinyl)biphenylyl]bi(carbazole); (dibenzofuranyl)[(pyridinyl)biphenylyl]bi(carbazole); (dibenzofuranyl)[(pyridinyl)biphenylyl]bi(carbazole); (dibenzothiophenyl)(diphenylpyridinyl)bi(carbazole); (dibenzothiophenyl)[(pyridinyl)biphenylyl]bi(carbazole); (dibenzothiophenyl)[(pyridinyl)biphenylyl]bi(carbazole); (dibenzothiophenyl)[(pyridinyl)biphenylyl]bi(carbazole); phenyl(diphenylpyridinyl)bi(carbazole); phenyl[(pyridinyl)biphenylyl]bi(carbazole); phenyl(diphenylpyridinyl)bi(carbazole); (biphenylyl)(diphenylpyridinyl)bi(carbazole); (biphenylyl)[(pyridinyl)biphenylyl]bi(carbazole); (biphenylyl)(diphenylpyridinyl)bi(carbazole); (biphenylyl)(diphenylpyridinyl)bi(carbazole); (biphenylyl)(diphenylpyridinyl)bi(carbazole); (biphenylyl)[(pyridinyl)biphenylyl]bi(carbazole); (diphenylpyridinyl)phenylbi(carbazole); (diphenylpyridinyl)phenylbi(carbazole); [(pyridinyl)biphenylyl]phenylbi(carbazole); (diphenylpyridinyl)(biphenylyl)bi(carbazole); (diphenylpyridinyl)(biphenylyl)bi(carbazole); [(pyridinyl)biphenylyl](biphenylyl)bi(carbazole); (diphenylpyridinyl)(biphenylyl)bi(carbazole); (diphenylpyridinyl)(biphenylyl)bi(carbazole); [(pyridinyl)biphenylyl](biphenylyl)bi(carbazole); (dibenzofuranyl)(terphenylyl)bi(carbazole); (dibenzofuranyl)(biphenylyl)bi(carbazole); (dibenzofuranyl)phenylbi(carbazole); (dibenzofuranyl)(biphenylyl)bi(carbazole); (dibenzothiophenyl)(terphenylyl)bi(carbazole); (dibenzothiophenyl)(biphenylyl)bi(carbazole); (dibenzothiophenyl)phenylbi(carbazole); (dibenzothiophenyl)(biphenylyl)bi(carbazole); (biphenylyl)(diphenylpyridinyl)bi(carbazole); (diphenylpyridinyl)(biphenylyl)bi(carbazole); phenyl(diphenylpyridinyl)bi(carbazole); (diphenylpyridinyl)phenylbi(carbazole); phenyl(diphenylpyridinyl)bi(carbazole); phenyl(diphenylpyridinyl)bi(carbazole); phenyl(diphenylpyridinyl)bi(carbazole); (diphenylpyridinyl)phenylbi(carbazole); (diphenylpyridinyl)phenylbi(carbazole); (biphenylyl)(diphenylpyridinyl)bi(carbazole); phenyl(diphenylpyridinyl)bi(carbazole); bi[(biphenylyl)carbazole]; bi[(biphenylyl)carbazole]; (biphenylyl)phenylbi(carbazole)

(Group 13A)

(carbazolyl)(triphenylenyl)biphenyl; (carbazolyl)(triphenylenyl)biphenyl; (carbazolyl)(triphenylenyl)biphenyl; (carbazolyl)(triphenylenyl)biphenyl; (carbazolyl)(triphenylenyl)terbenzene; (carbazolyl)(triphenylenyl)terbenzene; (carbazolyl)(triphenylenyl)terbenzene; (carbazolyl)(triphenylenyl)terbenzene; (carbazolyl)(triphenylenyl)quaterbenzene; (triphenylenyl)(carbazolyl)terbenzene; (phenylcarbazolyl)(triphenylenyl)biphenyl; (diphenylcarbazolyl)(triphenylenyl)biphenyl; (carbazolyl)(phenyltriphenylenyl)biphenyl; (carbazolyl)(triphenylenyl)terbenzene; (triphenylenyl)(carbazolyl)terbenzene; (carbazolyl)[(triphenylenyl)phenyl]terbenzene; (phenylcarbazolyl)(triphenylenyl)terbenzene; (diphenylcarbazolyl)(triphenylenyl)terbenzene; (carbazolyl)[(triphenylenyl)phenyl]pyridine; (carbazolyl)[(triphenylenyl)phenyl]pyridine; (carbazolyl)[(triphenylenyl)phenyl]pyridine; (carbazolyl)[(triphenylenyl)phenyl]pyridine; [(carbazolyl)pyridinyl](triphenylenyl)biphenyl; [(carbazolyhpyridinyl](triphenylenyl)biphenyl; [(carbazolyl)pyridinyl](triphenylenyl)biphenyl; [(carbazolyhpyridinyl](triphenylenyl)biphenyl; [(carbazolyl)pyridinyl](triphenylenyl)terbenzene; (carbazolyl)phenyl[(triphenylenyl)phenyl]pyridine; (phenylcarbazolyl)[(triphenylenyl)phenyl]pyridine; (diphenylcarbazolyl)[(triphenylenyl)phenyl]pyridine; (carbazolyl)[(phenyltriphenylenyl)phenyl]pyridine; [(carbazolyhpyridinyl](triphenylenyl)biphenyl; (carbazolyl)phenyl[(triphenylenyl)phenyl]pyridine; (triphenylenyl)[(carbazolyl)pyridinyl]terbenzene; [(phenylcarbazolyl)pyridinyl](triphenylenyl)biphenyl; [(diphenylcarbazolyl)pyridinyl](triphenylenyl)biphenyl; [(carbazolyl)phenyl][(triphenylenyl)phenyl]pyridine; [(carbazolyl)phenyl][(triphenylenyl)biphenylyl]pyridine; (carbazolyl)[(triphenylenyl)phenyl]pyrimidine; (carbazolyl)[(triphenylenyl)phenyl]pyrimidine; (carbazolyl)[(triphenylenyl)phenyl]pyrimidine; (carbazolyl)[(triphenylenyl)phenyl]pyridine; [(triphenylenyl)phenyl](carbazolyl)pyridine; [(triphenylenyl)phenyl](carbazolyl)pyridine; (carbazolyl)[(triphenylenyl)phenyl]pyridine; [(carbazolyl)pyridinyl](triphenylenyl)biphenyl; (carbazolyl)(phenyltriphenylenyl)biphenyl; (carbazolyl)(diphenyltriphenylenyl)biphenyl; [(carbazolyl)biphenylyl][(carbazolyl)phenyl]triphenylene; bis[(carbazolyl)biphenylyl]triphenylene; bis[(carbazolyl)biphenylyl]triphenylene; [(carbazolyhbiphenylyl][(carbazolyl)phenyl]triphenylene; (carbazolyl)[(triphenylenyl)phenyl]pyridine; (diphenyltriazinyl)(biphenylyl)indolocarbazole; (diphenyltriazinyl)(terphenylyl)indolocarbazole; [(biphenylyl)phenyltriazinyl](biphenylyl)indolocarbazole; [di(biphenylyl)triazinyl]phenylindolocarbazole; [(biphenylyl)phenyltriazinyl](biphenylyl)indolocarbazole; [di(biphenylyl)triazinyl](biphenylyl)indolocarbazole; [(biphenylyl)phenyltriazinyl](terphenylyl)indolocarbazole; [di(biphenylyl)triazinyl](terphenylyl)indolocarbazole; [(biphenylyl)phenyltriazinyl]thiaazaindenofluorene; [di(biphenylyl)triazinyl]thiaazaindenofluorene; [bis(dimethylfluorenyl)triazinyl]phenylindolocarbazole; [(biphenylyl)phenyltriazinyl]oxaazaindenofluorene; [di(biphenylyl)triazinyl]oxaazaindenofluorene; [bis(dimethylfluorenyl)triazinyl]thiaazaindenofluorene; (diphenyltriazinyl)phenylindolocarbazole; (diphenyltriazinyl)(biphenylyl)indolocarbazole; [phenyl(biphenylyl)triazinyl]phenylindolocarbazole; [di(biphenylyl)triazinyl]phenylindolocarbazole; [phenyl(biphenylyl)triazinyl]thiaazaindenofluorene; [di(biphenylyl)triazinyl]thiaazaindenofluorene;[phenyl(biphenylyl)triazinyl]azaoxaindenofluorene; [di(biphenylyl)triazinyl]azaoxaindenofluorene; [bis(dimethylfluorenyl)triazinyl]thiaazaindenofluorene;[bis(dimethylfluorenyl)triazinyl]azaoxaindenofluorene; [bis(dimethylfluorenyl)triazinyl]phenylindolocarbazole; (diphenyltriazinyl)(biphenylyl)indolocarbazole; (diphenyltriazinyl)(terphenylyl)indolocarbazole; [(biphenylyl)phenyltriazinyl](biphenylyl)indolocarbazole; [di(biphenylyl)triazinyl]phenylindolocarbazole; [di(biphenylyl)triazinyl](biphenylyl)indolocarbazole; [di(dimethylfluorenyl)triazinyl]phenylindolocarbazole; [(biphenylyl)phenyltriazinyl]thiaazaindenofluorene; [di(biphenylyl)triazinyl]thiaazaindenofluorene; [bis(dimethylfluorenyl)triazinyl]thiaazaindenofluorene; [(biphenylyl)phenyltriazinyl]oxaindenofluorene; [di(biphenylyl)triazinyl]azaoxaindenofluorene; [bis(dimethylfluorenyl)triazinyl]azaoxaindenofluorene; [(biphenylyl)phenyltriazinyl]dimethylindenocarbazole; [di(biphenylyl)triazinyl]dimethylindenocarbazole; [bis(dimethylfluorenyl)triazinyl]dimethylindenocarbazole; (diphenyltriazinyl)(biphenylyl)indolocarbazole; (diphenyltriazinyl)(terphenylyl)indolocarbazole; [(biphenylyl)phenyltriazinyl](biphenylyl)indolocarbazole; [bis(dimethylfluorenyl)triazinyl]phenylindolocarbazole; [bis(dimethylfluorenyl)triazinyl](biphenylyl)indolocarbazole; [(biphenylyl)phenyltriazinyl]azathiaindenofluorene;[di(biphenylyl)triazinyl]azathiaindenofluorene;[bis(dimethylfluorenyl)

triazinyl]azathiaindenofluorene;[(biphenylyl)phenyltriazinyl]azaoxaindenofluorene; [di(biphenylyl)triazinyl] azaoxaindenofluorene; [bis(dimethylfluorenyl)triazinyl] azaoxaindenofluorene; (biphenylyl)[(diphenyltriazinyl) phenyl]indolocarbazole; (terphenylyl)[(diphenyltriazinyl) phenyl]indolocarbazole; phenyl{[phenyl(biphenylyl) triazinyl]phenyl}indolocarbazole; phenyl{[di(biphenylyl) triazinyl]phenyl}indolocarbazole; phenyl{[bis (dimethylfluorenyl)triazinyl]phenyl}indolocarbazole; (biphenylyl){[(biphenylyl)phenyltriazinyl] phenyl}indolocarbazole; (biphenylyl){[di(biphenylyl)triazinyl]phenyl}indolocarbazole; (terphenylyl){[(biphenylyl) phenyltriazinyl]phenyl}indolocarbazole; [(diphenyltriazinyl)phenyl]thiaazaindenofluorene; {[phenyl (biphenylyl)triazinyl]phenyl}thiaazaindenofluorene; {[di (biphenylyl)triazinyl]phenyl}thiaazaindenofluorene; {[bis (dimethylfluorenyl)triazinyl]phenyl}thiaazaindenofluorene; [(diphenyltriazinyl)phenyl]oxaazaindenofluorene; {[phenyl (biphenylyl)triazinyl]phenyl}oxaazaindenofluorene; {[di (biphenylyl)triazinyl]phenyl}oxaazaindenofluorene; {[bis (dimethylfluorenyl)triazinyl]phenyl}oxaazaindenofluorene; [(phenylpyridinyl)phenyl](diphenyltriazinyl)indolocarbazole; (terphenylyl)(diphenyltriazinyl)indolocarbazole; (terphenylyl)[(biphenylyl)phenyltriazinyl]indolocarbazole; phenyl(diphenyltriazinyl)dimethyldiazadiindenofluorene; (biphenylyl)(diphenyltriazinyl)dimethyldiazaindenofluorene; (biphenylyl)[(biphenylyl)phenyltriazinyl]dimethyldiazaindenofluorene; tetramethyl[(biphenylyl)phenyltriazinyl]azadiindenofluorene; tetramethyl[di(biphenylyl) triazinyl]azadiindenofluorene; [(biphenylyl)phenyltriazinyl] azadithiadiindenofluorene; [di(biphenylyl)triazinyl] azadithiadiindenofluorene; [(biphenylyl)phenyltriazinyl] azadithiadiindenofluorene; [(biphenylyl)phenyltriazinyl] azadioxydiindenofluorene; [di(biphenylyl)triazinyl] azadithiadiindenofluorene; [di(biphenylyl)triazinyl] azadioxydiindenofluorene (Group 14A)

(biphenylyl)(diphenyltriazinyl)carbazole; iridium(III)bis [(dimethylphenyl)isobutylquinoline](acetylacetonate); phenyl(diphenyltriazinyl)indolocarbazole; iridium(III)bis(phenylmethyl-$d_3$pyridine)((diphenylmethyl-$d_3$)pyridine); (biphenylyl)(diphenyltriazinyl)carbazole; (terphenylyl)(diphenyltriazinyl)carbazole; triphenyl(diphenyltriazinyl)carbazole; (biphenylyl)[phenyl(biphenylyl)triazinyl]carbazole; diphenyl[phenyl(biphenylyl)triazinyl]carbazole; (biphenylyl)[(diphenyltriazinyl)phenyl]carbazole; phenyl[di(biphenylyl)triazinyl]carbazole; diphenyl[(diphenyltriazinyl)phenyl]carbazole; diphenyl[di(biphenylyl)triazinyl]carbazole; phenyl{[di(biphenylyl)triazinyl]phenyl}carbazole; di(biphenylyl)(diphenyltriazinyl)carbazole; (dimethylfluorenyl) (diphenyltriazinyl)carbazole; [(dimethylfluorenyl)phenyl] (diphenyltriazinyl)carbazole; (dimethylfluorenyl)[phenyl (biphenylyl)triazinyl]carbazole; [(dimethylfluorenyl) phenyl][phenyl(biphenylyl)triazinyl]carbazole; (dimethylfluorenyl)[di(biphenylyl)triazinyl]carbazole; (phenylcarbazolyl)(diphenyltriazinyl)carbazole; (triphenylenyl) [phenyl(biphenylyl)triazinyl]carbazole; (phenylcarbazolyl) [phenyl(biphenylyl)triazinyl]carbazole; phenyl[phenyl (dimethylfluorenyl)triazinyl]carbazole; (triphenylenyl) (diphenyltriazinyl)carbazole; (biphenylyl)[phenyl (dimethylfluorenyl)triazinyl]carbazole; (terphenylyl) [phenyl(dimethylfluorenyl)triazinyl]carbazole; (quaterphenylyl)[phenyl(biphenylyl)triazinyl]carbazole; phenyl[(biphenylyl)(dimethylfluorenyl)triazinyl]carbazole; [(terphenylyl)phenyl](diphenyltriazinyl)carbazole; phenyl [bis(dimethylfluorenyl)triazinyl]carbazole; [(terphenylyl) phenyl][phenyl(biphenylyl)triazinyl]carbazole; (terphenylyl)(diphenyltriazinyl)carbazole; (biphenylyl) (diphenyltriazinyl)carbazole; (biphenylyl)[phenyl (biphenylyl)triazinyl]carbazole; (biphenylyl)[di(biphenylyl) triazinyl]carbazole; (terphenylyl)(diphenyltriazinyl) carbazole; (terphenylyl)(diphenyltriazinyl)carbazole; (biphenylyl)(diphenyltriazinyl)carbazole; (terphenylyl) [phenyl(biphenylyl)triazinyl]carbazole; (biphenylyl)[phenyl (biphenylyl)triazinyl]carbazole; (terphenylyl)[di(biphenylyl)triazinyl]carbazole; (terphenylyl)(diphenyltriazinyl) carbazole; (terphenylyl)[phenyl(biphenylyl)triazinyl] carbazole; (terphenylyl)[phenyl(biphenylyl)triazinyl] carbazole; phenyl[(biphenylyl)(biphenylyl)triazinyl] carbazole; phenyl[(biphenylyl)phenyltriazinyl]carbazole; (biphenylyl)[phenyl(biphenylyl)triazinyl]carbazole; (biphenylyl)[(biphenylyl)(biphenylyl)triazinyl]carbazole; phenyl [di(biphenylyl)triazinyl]carbazole; (biphenylyl)[phenyl(dimethylfluorenyl)triazinyl]carbazole; (dimethylfluorenyl) [(biphenylyl)phenyltriazinyl]carbazole; (biphenylyl) {phenyl[(dimethylfluorenyl)phenyl]triazinyl}carbazole; [(dimethylfluorenyl)phenyl][phenyl(biphenylyl)triazinyl] carbazole; iridium(III)bis[(dimethylphenyl)quinoline] (acetylacetonate); iridium(III)bis[(dimethylphenyl)quinoline](diethylnonanedionate); iridium(III)bis [(dimethylphenyl)quinoline](dimethylheptanedionate); iridium(III)bis[(dimethylphenyl)isobutylquinoline[(dimethylheptanedionate); iridium(III)bis[(dimethylphenyl)quinoline](dimethylnonanedionate); iridium(III)bis[(dimethylphenyl)isobutylquinoline[(dimethylnonanedionate); iridium(III)bis[(dimethylphenyl)isobutylquinoline](acetylacetonate); iridium(III)bis[(dimethylphenyl)isobutylquinoline](acetylacetonate); iridium(III)bis[(dimethylphenyl) isobutylquinoline](diethylnonanedionate); iridium(III)bis [(dimethylphenyl)isobutylquinoline] (diethylnonanedionate); iridium(III)bis[(dimethylphenyl) isobutylquinoline](dimethylheptanedionate); iridium(III)bis [(dimethylphenyl)isobutylquinoline] (diethylnonanedionate); iridium(III)bis[(dimethylphenyl) isobutylquinoline[(dimethylnonanedionate); iridium(III)bis [(dimethylphenyl)isobutylquinoline] (dimethylheptanedionate); iridium(III)bis[(dimethylphenyl) isobutylquinoline](acetylacetonate); iridium(III)bis [(dimethylphenyl)isobutylquinoline [(dimethylnonanedionate); iridium(III)bis[(dimethylphenyl) cyclopentylquinoline](acetylacetonate); iridium(III)bis [(dimethylphenyl)cyclopentylquinoline](acetylacetonate); iridium(III)bis[(dimethylphenyl)cyclopentylquinoline](diethylnonanedionate); iridium(III)bis[(dimethylphenyl)cyclopentylquinoline](diethylnonanedionate); iridium(III)bis [(dimethylphenyl)cyclopentylquinoline] (dimethylheptanedionate); iridium(III)bis[(dimethylphenyl) cyclopentylquinoline[(dimethylheptanedionate); iridium (III)bis[(dimethylphenyl)cyclopentylquinoline] (dimethylnonanedionate); iridium(III)bis[(dimethylphenyl) cyclopentylquinoline](dimethylnonanedionate); iridium(III) bis[(dimethylphenyl)cyclopentylquinoline] (acetylacetonate); iridium(III)bis[(dimethylphenyl) cyclopentylquinoline](dimethylnonanedionate); iridium(III) bis[(dimethylphenyl)cyclopentylquinoline] (diethylnonanedionate); iridium(III)bis[(dimethylphenyl) isopropylquinoline](acetylacetonate); iridium(III)bis [(dimethylphenyl)isopropylquinoline] (diethylnonanedionate); iridium(III)bis[(dimethylphenyl) cyclopentylquinoline](dimethylheptanedionate); iridium (III)bis[(dimethylphenyl)isopropylquinoline] (dimethylheptanedionate); iridium(III)bis[(dimethylphenyl) isopropylquinoline](dimethylnonanedionate); iridium(III) bis[(dimethylphenyl)isopropylquinoline]

(dimethylnonanedionate); iridium(III)bis[(dimethylphenyl)isopropylquinoline](acetylacetonate); iridium(III)bis[(dimethylphenyl)isopropylquinoline](acetylacetonate); iridium(III)bis[(dimethylphenyl)isopropylquinoline](diethylnonanedionate); iridium(III)bis[(dimethylphenyl)isopropylquinoline](diethylnonanedionate); iridium(III)bis[(dimethylphenyl)isopropylquinoline](diethylpentanedionate); iridium(III)bis[(dimethylphenyl)isopropylquinoline](diethylpentanedionate); iridium(III)bis[(dimethylphenyl)isopropylquinoline](diethylnonanedionate); iridium(III)bis(phenylpyridine)(diphenylpyridine); iridium(III)bis(phenylpyridine)[phenyl(methylphenyl)pyridine); iridium(III)bis(phenylpyridine)[phenyl(ethylphenyl)pyridine]; iridium(III)bis(phenylpyridine)[phenyl(isopropylphenyl)pyridine]; iridium(III)bis(phenylpyridine)[phenyl(ethylfluorophenyl)pyridine]; iridium(III)bis(phenylpyridine)[phenyl(fluorophenyl)pyridine]; iridium(III)bis(phenylpyridine)[phenyl(isopropylfluorophenyl)pyridine]; iridium(III)bis(phenylpyridine)[phenyl(methylfluorophenyl)pyridine]; iridium(III)bis(phenylpyridine)[phenyl(isobutylfluorophenyl)pyridine]; iridium(III)bis(phenylpyridine)(diphenylpyridine); iridium(III)bis(phenylpyridine)[phenyl(isobutylphenyl)pyridine]; iridium(III)bis(phenylpyridine)[phenyl(methylphenyl)pyridine]; iridium(III)bis(phenylpyridine)[phenyl(ethylphenyl)pyridine]; iridium(III)bis(phenylpyridine)[phenyl(isopropylphenyl)pyridine]; iridium(III)bis(phenylpyridine)[phenyl(isobutylphenyl)pyridine]; iridium(III)bis(phenylpyridine)[phenyl(isopropylfluorophenyl)pyridine]; iridium(III)bis(phenylpyridine)[phenyl(fluorophenyl)pyridine]; iridium(III)bis(phenylpyridine)[phenyl(isobutylfluorophenyl)pyridine]; iridium(III)bis(phenylpyridine)[phenyl(methylfluorophenyl)pyridine]; iridium(III)bis(phenylpyridine)[diphenylpyridine]; iridium(III)bis(phenylpyridine)[phenyl(ethylfluorophenyl)pyridine]; iridium(III)bis(phenylmethylpyridine)[phenyl(methylphenyl)pyridine]; iridium(III)bis(phenylmethylpyridine)[phenyl(ethylphenyl)pyridine]; iridium(III)bis(phenylmethylpyridine)[phenyl(methylfluorophenyl)pyridine]; iridium(III)bis(phenylmethylpyridine)[phenyl(isopropylphenyl)pyridine]; iridium(III)bis(phenylmethylpyridine)[phenyl(ethylfluorophenyl)pyridine]; iridium(III)bis(phenylmethylpyridine)[phenyl(fluorophenyl)pyridine]; iridium(III)bis(phenylmethylpyridine)[phenyl(isopropylfluorophenyl)pyridine]; iridium(III)bis(phenylmethylpyridine)[phenyl(isobutylfluorophenyl)pyridine]; iridium(III)bis(phenylmethylpyridine)[phenyl(isopropylphenyl)pyridine]; iridium(III)bis(phenylmethylpyridine)[diphenylpyridine]; iridium(III)bis(phenylmethylpyridine)[phenyl(isobutylphenyl)pyridine]; iridium(III)bis(phenylmethylpyridine)[phenyl(methylphenyl)pyridine]; iridium(III)bis(phenylmethylpyridine)[phenyl(ethylphenyl)pyridine]; iridium(III)bis(phenylmethylpyridine)[phenyl(isopropylphenyl)pyridine]; iridium(III)bis(phenylmethylpyridine)[phenyl(ethylfluorophenyl)pyridine]; iridium(III)bis(phenylmethylpyridine)[phenyl(isobutylphenyl)pyridine]; iridium(III)bis(phenylmethylpyridine)[phenyl(isopropylfluorophenyl)pyridine]; iridium(III)bis(phenylmethylpyridine)[phenyl(fluorophenyl)pyridine]; iridium(III)bis(phenylmethylpyridine)[phenyl(isobutylfluorophenyl)pyridine]; iridium(III)bis(phenylmethylpyridine)[phenyl(methylfluorophenyl)pyridine]; iridium(III)bis(phenylpyridine)[phenyl((methyl-$d_3$)phenyl)pyridine]; iridium(III)bis(phenylpyridine)[phenyl((ethyl-$d_5$)phenyl)pyridine]; iridium(III)bis(phenylpyridine)[phenyl((ethyl-$d_5$)fluorophenyl)pyridine]; iridium(III)bis(phenylpyridine)[phenyl((isopropyl-$d_7$)phenyl)pyridine]; iridium(III)bis(phenylpyridine)[phenyl((isopropyl-$d_7$)fluorophenyl)pyridine]; iridium(III)bis(phenylpyridine)[phenyl((methyl-$d_3$)fluorophenyl)pyridine]; iridium(III)bis(phenylpyridine)[phenyl((isobutyl-$d_9$)fluorophenyl)pyridine]; iridium(III)bis(phenylpyridine)[phenyl(dimethyl-$d_6$)phenyl)pyridine]; iridium(III)bis(phenylpyridine)[phenyl((isobutyl-$d_9$)phenyl)pyridine]; iridium(III)bis(phenylpyridine)[phenyl((methyl-$d_3$)phenyl)pyridine]; iridium(III)bis(phenylpyridine)[phenyl((ethyl-$d_6$)phenyl)pyridine]; iridium(III)bis(phenylpyridine)[phenyl((isopropyl-$d_7$)phenyl)pyridine]; iridium(III)bis(phenylpyridine)[phenyl((isobutyl-$d_9$)phenyl)pyridine]; iridium(III)bis(phenylpyridine)[phenyl((isobutyl-$d_9$)fluorophenyl)pyridine]; iridium(III)bis(phenylpyridine)[phenyl((methyl-$d_3$)fluorophenyl)pyridine]; iridium(III)bis(phenyl(methyl-$d_3$)pyridine)[diphenylpyridine]; iridium(III)bis(phenylpyridine)[phenyl((ethyl-$d_5$)fluorophenyl)pyridine]; iridium(III)bis(phenyl(methyl-$d_3$)pyridine)[phenyl((methyl-$d_3$)phenyl)pyridine]; iridium(III)bis(phenylpyridine)[phenyl((isopropyl-$d_7$)fluorophenyl)pyridine]; iridium(III)bis(phenyl(methyl-$d_3$)pyridine)[phenyl((ethyl-$d_5$)phenyl)pyridine]; iridium(III)bis(phenyl(methyl-$d_3$)pyridine)[phenyl((isopropyl-$d_7$)phenyl)pyridine]; iridium(III)bis(phenyl(methyl-$d_3$)pyridine)[phenyl((isopropyl-$d_7$)fluorophenyl)pyridine]; iridium(III)bis(phenyl(methyl-$d_3$)pyridine)[phenyl((methyl-$d_3$)fluorophenyl)pyridine]; iridium(III)bis(phenyl(methyl-$d_3$)pyridine)[phenyl((isobutyl-$d_9$)fluorophenyl)pyridine]; iridium(III)bis(phenyl(methyl-$d_3$)pyridine)[phenyl((ethyl-$d_5$)fluorophenyl)pyridine]; iridium(III)bis(phenyl(methyl-$d_3$)pyridine)[phenyl(fluorophenyl)pyridine]; iridium(III)bis(phenyl(methyl-$d_3$)pyridine)[diphenylpyridine]; iridium(III)bis(phenyl(methyl-$d_3$)pyridine)[phenyl((isobutyl-$d_9$)phenyl)pyridine]; iridium(III)bis(phenyl(methyl-$d_3$)pyridine)[phenyl((methyl-$d_3$)phenyl)pyridine]; iridium(III)bis(phenyl(methyl-$d_3$)pyridine)[phenyl((ethyl-$d_5$)phenyl)pyridine]; iridium(III)bis(phenyl(methyl-$d_3$)pyridine)[phenyl((isopropyl-$d_7$)phenyl)pyridine]; iridium(III)bis(phenyl(methyl-$d_3$)pyridine)[phenyl((isobutyl-$d_9$)phenyl)pyridine]; iridium(III)bis(phenyl(methyl-$d_3$)pyridine)[phenyl((isopropyl-$d_7$)fluorophenyl)pyridine]; iridium(III)bis(phenyl(methyl-$d_3$)pyridine)[phenyl(fluorophenyl)pyridine]; iridium(III)bis(phenyl(methyl-$d_3$)pyridine)[phenyl((isobutyl-$d_9$)fluorophenyl)pyridine]; iridium(III)bis(phenyl(methyl-$d_3$)pyridine)[phenyl((methyl-$d_3$)fluorophenyl)pyridine]; iridium(III)bis(phenylpyridine)[phenylbipyridine]; iridium(III)bis(phenyl(methyl-$d_3$)pyridine)[phenyl((ethyl-$d_5$)fluorophenyl)pyridine]; iridium(III)bis(phenylpyridine)[phenylbipyridine]; iridium(III)bis(phenylpyridine)[phenylbipyridine]; iridium(III)bis(phenylpyridine)[isobutylphenylbipyridine]; iridium(III)bis(phenylpyridine)[methylphenylbipyridine]; iridium(III)bis(phenylpyridine)[(phenylpyridinyl)pyrimidine]; iridium(III)bis(phenylpyridine)[ethylphenylbipyridine]; iridium(III)bis(phenylpyridine)[(phenylpyridinyl)pyrazine]; iridium(III)bis(phenylpyridine)[isopropylphenylbipyridine]; iridium(III)bis(phenylpyridine)[(phenylpyridinyl)pyrimidine]; iridium(III)bis(phenylpyridine)[(phenylpyridinyl)pyrimidine]; iridium(III)bis(phenylpyridine)[(phenylpyridinyl)dimethyltriazine]; iridium(III)bis(phenylpyridine)[(phenylpyridinyl)triazine]; iridium(III)bis(phenylpyridine)[phenylbipyridine]; iridium(III)bis(phenylpyridine)[methyl(phenylpyridinyl)pyrimidine]; iridium(III)bis(phenylpyridine)[phenylbipyridine]; iridium(III)bis(phenylpyridine)[methyl(phenylpyridinyl)pyrimidine]; iridium(III)bis(phenylpyridine)[phenylbipyridine]; iridium(III)bis(phenylpyridine)[methylphenylbipyridine]; iridium(III)bis(phenylpyridine)[(phenylpyridinyl)pyrimidine]; iridium(III)bis(phenylpyridine)[ethylphenylbipyridine];

iridium(III)bis(phenylpyridine)[(phenylpyridinyl)pyrazine]; iridium(III)bis(phenylpyridine)[isopropylphenylbipyridine]; iridium(III)bis(phenylpyridine)[(phenylpyridinyl)pyrimidine]; iridium(III)bis(phenylpyridine)[isobutylphenylbipyridine]; iridium(III)bis(phenylpyridine)[(phenylpyridinyl)pyrimidine]; iridium(III)bis(phenylpyridine)[(phenylpyridinyl)triazine]; iridium(III)bis(phenylpyridine)[(methyl-$d_3$)phenylbipyridine]; iridium(III)bis(phenylpyridine)[methyl(phenylpyridinyl)pyrimidine]; iridium(III)bis(phenylpyridine)[(ethyl-$d_5$)phenylbipyridine]; iridium(III)bis(phenylpyridine)[methyl(phenylpyridinyl)pyrimidine]; iridium(III)bis(phenylpyridine)[dimethyl(phenylpyridinyl)triazine]; iridium(III)bis(phenylpyridine)[(isopropyl-$d_7$)phenylbipyridine]; iridium(III)bis(phenylpyridine)[(isobutyl-$d_9$)phenylbipyridine]; iridium(III)bis(phenylpyridine)[(dimethyl-$d_6$)(phenylpyridinyl)triazine]; iridium(III)bis(phenylpyridine)[(methyl-$d_3$)(phenylpyridinyl)pyrimidine]; iridium(III)bis(phenylpyridine)[(methyl-$d_3$)phenylbipyridine]; iridium(III)bis(phenylpyridine)[(ethyl-$d_5$)phenylbipyridine]; iridium(III)bis(phenylpyridine)[(methyl-$d_3$)(phenylpyridinyl)pyrimidine]; iridium(III)bis(phenylpyridine)[(isopropyl-$d_7$)phenylbipyridine]; iridium(III)bis(phenylpyridine)[(isobutyl-$d_9$)phenylbipyridine]; iridium(III)bis(phenylmethylpyridine)(phenylbipyridine); iridium(III)bis(phenylpyridine)[(methyl-$d_3$)(phenylpyridinyl)pyrimidine]; iridium(III)bis(phenylmethylpyridine)(phenylbipyridine); iridium(III)bis(phenylpyridine)[(methyl-$d_3$)(phenylpyridinyl)pyrimidine]; iridium(III)bis(phenylmethylpyridine)(phenylbipyridine); iridium(III)bis(phenylpyridine)[(dimethyl-$d_6$)(phenylpyridinyl)triazine]; iridium(III)bis(phenylmethylpyridine)(methylphenylbipyridine); iridium(III)bis(phenylmethylpyridine)(ethylphenylbipyridine); iridium(III)bis(phenylmethylpyridine)[(phenylpyridinyl)pyrimidine]; iridium(III)bis(phenylmethylpyridine)(isopropylphenylbipyridine); iridium(III)bis(phenylmethylpyridine)[(phenylpyridinyl)pyrazine]; iridium(III)bis(phenylmethylpyridine)[(phenylpyridinyl)pyrimidine]; iridium(III)bis(phenylmethylpyridine)(isobutylphenylbipyridine); iridium(III)bis(phenylmethylpyridine)[(phenylpyridinyl)pyrimidine]; iridium(III)bis(phenylmethylpyridine)[(phenylpyridinyl)triazine]; iridium(III)bis(phenylmethylpyridine)(phenylbipyridine); iridium(III)bis(phenylmethylpyridine)[methyl(phenylpyridinyl)pyrimidine]; iridium(III)bis(phenylmethylpyridine)(phenylbipyridine); iridium(III)bis(phenylmethylpyridine)[methyl(phenylpyridinyl)pyrimidine]; iridium(III)bis(phenylmethylpyridine)(phenylbipyridine); iridium(III)bis(phenylpyridine)[dimethyl(phenylpyridinyl)triazine]; iridium(III)bis(phenylmethylpyridine)(methylphenylbipyridine); iridium(III)bis(phenylmethylpyridine)(ethylphenylbipyridine); iridium(III)bis(phenylmethylpyridine)[(phenylpyridinyl)pyrazine]; iridium(III)bis(phenylmethylpyridine)(isopropylphenylbipyridine); iridium(III)bis(phenylmethylpyridine)[(phenylpyridinyl)pyrimidine]; iridium(III)bis(phenylmethylpyridine)(isobutylphenylbipyridine); iridium(III)bis(phenylmethylpyridine)[(phenylpyridinyl)pyrimidine]; iridium(III)bis(phenylmethylpyridine)[(phenylpyridinyl)pyrimidine]; iridium(III)bis(phenylmethylpyridine)[(phenylpyridinyl)triazine]; iridium(III)bis(phenylmethylpyridine)[methyl(phenylpyridinyl)pyrimidine]; iridium(III)bis(phenylmethylpyridine)[(methyl-$d_3$)phenylbipyridine]; iridium(III)bis(phenylmethylpyridine)[methyl(phenylpyridinyl)pyrimidine]; iridium(III)bis(phenyl(methyl-$d_3$)pyridine)[(ethyl-$d_5$)phenylbipyridine]; iridium(III)bis(phenylmethylpyridine)[dimethyl(phenylpyridinyl)triazine]; iridium(III)bis[phenyl(methyl-$d_3$)pyridine][phenylbipyridine]; iridium(III)bis[phenyl(methyl-$d_3$)pyridine][(isopropyl-$d_7$)phenylbipyridine]; iridium(III)bis[phenyl(methyl-$d_3$)pyridine][(isobutyl-$d_9$)phenylbipyridine]; iridium(III)bis(phenyl(methyl-$d_3$)pyridine)[(phenylpyridinyl)pyrimidine]; iridium(III)bis(phenyl(methyl-$d_3$)pyridine)[(phenylpyridinyl)pyrimidine]; iridium(III)bis(phenyl(methyl-$d_3$)pyridine)[(phenylpyridinyl)triazine]; iridium(III)bis(phenyl(methyl-$d_3$)pyridine)[(phenylpyridinyl)pyrazine]; iridium(III)bis(phenyl(methyl-$d_3$)pyridine)[(methyl-$d_3$)(phenylpyridinyl)pyrimidine]; iridium(III)bis(phenyl(methyl-$d_3$)pyridine)[(phenylpyridinyl)pyrimidine]; iridium(III)bis(phenyl(methyl-$d_3$)pyridine)[(methyl-$d_3$)(phenylpyridinyl)pyrimidine]; iridium(III)bis(phenyl(methyl-$d_3$)pyridine)[(dimethyl-$d_6$)(phenylpyridinyl)triazine]; iridium(III)bis[phenyl(methyl-$d_3$)pyridine][(isopropyl-$d_9$)phenylbipyridine]; iridium(III)bis[phenyl(methyl-$d_3$)pyridine][phenylbipyridine]; iridium(III)bis[phenyl(methyl-$d_3$)pyridine][(isobutyl-$d_9$)phenylbipyridine]; iridium(III)bis[phenyl(methyl-$d_3$)pyridine][(methyl-$d_3$)phenylbipyridine]; iridium(III)bis(phenyl(methyl-$d_3$)pyridine)[(phenylpyridinyl)pyrimidine]; iridium(III)bis[phenyl(methyl-$d_3$)pyridine][(ethyl-$d_7$)phenylbipyridine]; iridium(III)bis(phenyl(methyl-$d_3$)pyridine)[(phenylpyridinyl)pyrazine]; iridium(III)bis(phenyl(methyl-$d_3$)pyridine)[(phenylpyridinyl)pyrimidine]; iridium(III)bis(phenyl(methyl-$d_3$)pyridine)[(phenylpyridinyl)pyrimidine]; iridium(III)bis(phenyl(methyl-$d_3$)pyridine)[(phenylpyridinyl)triazine]; iridium(III)bis(phenyl(methyl-$d_3$)pyridine)[(methyl-$d_3$)(phenylpyridinyl)pyrimidine]; iridium(III)bis(phenyl(methyl-$d_3$)pyridine)[(methyl-$d_3$)(phenylpyridinyl)pyrimidine]; iridium(III)bis(phenyl(methyl-$d_3$)pyridine)[(dimethyl-$d_6$)(phenylpyridinyl)triazine]; (biphenylyl)(diphenyltriazinyl)indolocarbazole; phenyl[(biphenylyl)phenyltriazinyl]indolocarbazole; [(biphenylyl)phenyltriazinyl]oxaazaindenofluorene; [(biphenylyl)phenyltriazinyl]thiaazaindenofluorene; [(dimethylfluorenyl)phenyltriazinyl]thiaazaindenofluorene; [diphenyltriazinyl]thiaazaindenofluorene; phenyl[(dimethylfluorenyl)phenyltriazinyl]indolocarbazole; phenyl(dimethyltriazinyl)indolocarbazole; phenyl[phenyl(terphenylyl)triazinyl]indolocarbazole; (diphenyltriazinyl)azaoxaindenofluorene; [(biphenylyl)phenyltriazinyl)azaoxaindenofluorene; (diphenyltriazinyl)thiaazaindenofluorene; [(dimethylfluorenyl)phenyltriazinyl]thiaazaindenofluorene; [(biphenylyl)phenyltriazinyl]thiaazaindenofluorene; [(dimethylfluorenyl)phenyltriazinyl]azaoxaindenofluorene; phenyl[(dimethylfluorenyl)phenyltriazinyl]indolocarbazole; phenyl[(biphenylyl)phenyltriazinyl]indolocarbazole; phenyl(diphenyltriazinyl)indolocarbazole; phenyl[(dimethylfluorenyl)phenyltriazinyl]indolocarbazole; (biphenylyl)(diphenyltriazinyl)indolocarbazole; (diphenyltriazinyl)thiaazaindenofluorene; [(biphenylyl)phenyltriazinyl]thiaazaindenofluorene; [(biphenylyl)phenyltriazinyl]azaoxaindenofluorene; [(dimethylfluorenyl)phenyltriazinyl]thiaazaindenofluorene; [(dimethylfluorenyl)phenyltriazinyl]azaoxaindenofluorene; (diphenyltriazinyl)azaoxaindenofluorene; (diphenyltriazinyl)dimethylazaindenofluorene; [(biphenylyl)phenyltriazinyl]dimethylazaindenofluorene; (diphenyltriazinyl)phenylindolocarbazole; [(dimethylfluorenyl)phenyltriazinyl]dimethylazaindenofluorene; [(biphenylyl)phenyltriazinyl]phenylindolocarbazole; (diphenyltriazinyl)phenylindolocarbazole; (dimethylfluorenyl)phenylindolocarbazole; (diphenyltriazinyl)azathiaindenofluorene; (diphenyltriazinyl)azaoxaindenofluorene; [(biphenylyl)phenyltriazinyl]

azathiaindenofluorene; [(biphenylyl)phenyltriazinyl]azaoxaindenofluorene; [(dimethylfluorenyl)phenyltriazinyl]azathiaindenofluorene; [(dimethylfluorenyl)phenyltriazinyl]azaoxaindenofluorene; phenyl(diphenyltriazinyl)indolocarbazole; [(biphenylyl)phenyltriazinyl]azathiaindenofluorene; phenyl[(biphenylyl)phenyltriazinyl]indolocarbazole; [(dimethylfluorenyl)phenyltriazinyl]azathiaindenofluorene; phenyl[(dimethylfluorenyl)phenyltriazinyl]indolocarbazole; (diphenyltriazinyl)azathiaindenofluorene; (diphenyltriazinyl)azathiaindenofluorene; [(biphenylyl)phenyltriazinyl]azaoxaindenofluorene; [(dimethylfluorenyl)phenyltriazinyl]azaoxaindenofluorene; [(diphenyltriazinyl)phenyl]thiaazaindenofluorene; phenyl[(diphenyltriazinyl)phenyl]indolocarbazole; [(diphenyltriazinyl)phenyl]oxaazaindenofluorene; phenyl{[(dimethylfluorenyl)phenyltriazinyl]phenyl}indolocarbazole; phenyl[(diphenyltriazinyl)phenyl]dimethyldiazaindenofluorene; iridium(III)bis(phenylpyridine)(diphenylmethylpyridine); iridium(III)bis(phenylpyridine)(diphenylethylpyridine); iridium(III)bis(phenylpyridine)(diphenylisopropylpyridine); iridium(III)bis(phenylpyridine)[phenylmethyl(fluorophenyl)pyridine]; iridium(III)bis(phenylpyridine)[phenylethyl(fluorophenyl)pyridine]; iridium(III)bis(phenylpyridine)[phenylisopropyl(fluorophenyl)pyridine]; iridium(III)bis(phenylpyridine)[phenyl(methylphenyl)pyridine]; iridium(III)bis(phenylpyridine)[phenyl(ethylphenyl)pyridine]; iridium(III)bis(phenylpyridine)[phenyl(isopropylphenyl)pyridine]; iridium(III)bis(phenylpyridine)[phenyl(methylfluorophenyl)pyridine]; iridium(III)bis(phenylmethylpyridine)(diphenylmethylpyridine); iridium(III)bis(phenylmethylpyridine)(diphenylethylpyridine); iridium(III)bis(phenylmethylpyridine)(diphenylisopropylpyridine); iridium(III)bis(phenylmethylpyridine)[phenylmethyl(fluorophenyl)pyridine]; iridium(III)bis(phenylmethylpyridine)[phenylethyl(fluorophenyl)pyridine]; iridium(III)bis(phenylmethylpyridine)[phenylisopropyl(fluorophenyl)pyridine]; iridium(III)bis(phenylmethylpyridine)[phenyl(methylphenyl)pyridine]; iridium(III)bis(phenylmethylpyridine)[phenyl(ethylphenyl)pyridine]; iridium(III)bis(phenylmethylpyridine)[phenyl(isopropylphenyl)pyridine]; iridium(III)bis(phenylmethylpyridine)[phenyl(methylfluorophenyl)pyridine]; iridium(III)bis(phenylmethylpyridine)[diphenyl(methyl-$d_3$)pyridine]; iridium(III)bis(phenylpyridine)[diphenyl(ethyl-$d_5$)pyridine]; iridium(III)bis(phenylpyridine)[diphenyl(isopropyl-$d_7$)pyridine]; iridium(III)bis(phenylpyridine)[phenyl(methyl-$d_3$)(fluorophenyl)pyridine]; iridium(III)bis(phenylpyridine)[phenyl(ethyl-$d_5$)(fluorophenyl)pyridine]; iridium(III)bis(phenylpyridine)[phenyl(isopropyl-$d_7$)(fluorophenyl)pyridine]; iridium(III)bis(phenylpyridine){phenyl[(methyl-$d_3$)phenyl]pyridine}; iridium(III)bis(phenylpyridine){phenyl[(ethyl-$d_5$)phenyl]pyridine}; iridium(III)bis(phenylpyridine){phenyl[(isopropyl-$d_7$)phenyl]pyridine}; iridium(III)bis(phenylpyridine){phenyl[(methyl-$d_3$)fluorophenyl]pyridine}; iridium(III)bis[phenyl(methyl-$d_3$)pyridine][diphenyl(methyl-$d_3$)pyridine]; iridium(III)bis[phenyl(methyl-$d_3$)pyridine][diphenyl(ethyl-$d_5$)pyridine]; iridium(III)bis[phenyl(methyl-$d_3$)pyridine][diphenyl(isopropyl-$d_7$)pyridine]; iridium(III)bis[phenyl(methyl-$d_3$)pyridine][phenyl(methyl-$d_3$)(fluorophenyl)pyridine]; iridium(III)bis[phenyl(methyl-$d_3$)pyridine][phenyl(ethyl-$d_5$)(fluorophenyl)pyridine]; iridium(III)bis[phenyl(methyl-$d_3$)pyridine][phenyl(isopropyl-$d_7$)(fluorophenyl)pyridine]; iridium(III)bis[phenyl(methyl-$d_3$)pyridine]{phenyl[(methyl-$d_3$)phenyl]pyridine}; iridium(III)bis[phenyl(methyl-$d_3$)pyridine]{phenyl[(ethyl-$d_5$)phenyl]pyridine}; iridium(III)bis[phenyl(methyl-$d_3$)pyridine]{phenyl[(isopropyl-$d_7$)phenyl]pyridine}; iridium(III)bis[phenyl(methyl-$d_3$)pyridine]{phenyl[(methyl-$d_3$)fluorophenyl]pyridine}

(Group 15A)

(diphenyltriazinyl)(dibenzofuranyl)biphenyl; (diphenyltriazinyl)(dibenzothiophenyl)biphenyl; (diphenyltriazinyl)(dibenzoselenophenyl)biphenyl; (diphenyltriazinyl)(dibenzofuranyl)terbenzene; (diphenyltriazinyl)(dibenzothiophenyl)terbenzene; (diphenyltriazinyl)(dibenzoselenophenyl)terbenzene; (diphenyltriazinyl)(phenyldibenzofuranyl)biphenyl; (diphenyltriazinyl)(phenyldibenzothiophenyl)biphenyl; (diphenyltriazinyl)(phenyldibenzoselenophenyl)biphenyl; (diphenyltriazinyl)[(biphenylyl)dibenzofuranyl]biphenyl; (diphenyltriazinyl)[(biphenylyl)dibenzothiophenyl]biphenyl; (diphenyltriazinyl)[(biphenylyl)dibenzoselenophenyl]biphenyl; (diphenyltriazinyl)[(biphenylyl)dibenzofuranyl]biphenyl; (diphenyltriazinyl)[(biphenylyl)dibenzoselenophenyl]biphenyl; (diphenyltriazinyl)[(biphenylyl)dibenzoselenophenyl]biphenyl; (diphenyltriazinyl)(phenyldibenzofuranyl)terbenzene; (diphenyltriazinyl)(phenyldibenzothiophenyl)terbenzene; (diphenyltriazinyl)(phenyldibenzoselenophenyl)terbenzene; (diphenyltriazinyl)(phenyldibenzofuranyl)terbenzene; (diphenyltriazinyl)(phenyldibenzothiophenyl)terbenzene; (diphenyltriazinyl)(phenyldibenzoselenophenyl)terbenzene; (diphenyltriazinyl)[(biphenylyl)dibenzofuranyl]terbenzene; (diphenyltriazinyl)[(biphenylyl)dibenzothiophenyl]terbenzene; (diphenyltriazinyl)[(biphenylyl)dibenzoselenophenyl]terbenzene; [(biphenylyl)phenyltriazinyl](dibenzofuranyl)biphenyl; [(biphenylyl)phenyltriazinyl](dibenzothiophenyl)biphenyl; [(biphenylyl)phenyltriazinyl](dibenzoselenophenyl)biphenyl; [(biphenylyl)phenyltriazinyl](dibenzofuranyl)biphenyl; [(biphenylyl)phenyltriazinyl](dibenzothiophenyl)biphenyl; [(biphenylyl)phenyltriazinyl](dibenzoselenophenyl)biphenyl; [di(biphenylyl)triazinyl](dibenzofuranyl)biphenyl; [di(biphenylyl)triazinyl](dibenzothiophenyl)biphenyl; [di(biphenylyl)triazinyl](dibenzoselenophenyl)biphenyl; [(dimethylfluorenyl)phenyltriazinyl](dibenzofuranyl)biphenyl; [(dimethylfluorenyl)phenyltriazinyl](dibenzothiophenyl)biphenyl; [(dimethylfluorenyl)phenyltriazinyl](dibenzoselenophenyl)biphenyl; [(biphenylyl)phenyltriazinyl](phenyldibenzofuranyl)biphenyl; [(biphenylyl)phenyltriazinyl](phenyldibenzothiophenyl)biphenyl; [(biphenylyl)phenyltriazinyl](phenyldibenzoselenophenyl)biphenyl; [(biphenylyl)phenyltriazinyl](phenyldibenzofuranyl)biphenyl; [(biphenylyl)phenyltriazinyl](phenyldibenzothiophenyl)biphenyl; [(biphenylyl)phenyltriazinyl](phenyldibenzoselenophenyl)biphenyl; [(dimethylfluorenyl)phenyltriazinyl](phenyldibenzofuranyl)biphenyl; [(dimethylfluorenyl)phenyltriazinyl](phenyldibenzofuranyl)biphenyl; [(dimethylfluorenyl)phenyltriazinyl](phenyldibenzofuranyl)biphenyl; [(biphenylyl)phenyltriazinyl](dibenzofuranyl)terbenzene; [(biphenylyl)phenyltriazinyl](dibenzothiophenyl)terbenzene; [(biphenylyl)phenyltriazinyl](dibenzoselenophenyl)terbenzene; [(biphenylyl)phenyltriazinyl](dibenzofuranyl)terbenzene; [(biphenylyl)phenyltriazinyl](dibenzothiophenyl)terbenzene; [(biphenylyl)phenyltriazinyl](dibenzoselenophenyl)terbenzene; [(dimethylfluorenyl)phenyltriazinyl](dibenzofuranyl)terbenzene; [(dimethylfluorenyl)phenyltriazinyl](dibenzofuranyl)terbenzene; [(dimethylfluorenyl)phenyltriazinyl](dibenzofuranyl)terbenzene; [(biphenylyl)phenyltriazinyl][(biphenylyl)dibenzofuranyl]biphenyl; [(biphenylyl)phenyltriazinyl][(biphenylyl)dibenzothiophenyl]biphenyl; [(biphenylyl)

phenyltriazinyl][(biphenylyl)dibenzoselenophenyl] biphenyl; [(biphenylyl)phenyltriazinyl][(biphenylyl) dibenzofuranyl]biphenyl; [(biphenylyl)phenyltriazinyl] [(biphenylyl)dibenzothiophenyl]biphenyl; [(biphenylyl) phenyltriazinyl][(biphenylyl)dibenzoselenophenyl] biphenyl; [(dimethylfluorenyl)phenyltriazinyl][(biphenylyl) dibenzofuranyl]biphenyl; [(dimethylfluorenyl) phenyltriazinyl][(biphenylyl)dibenzothiophenyl]biphenyl; [(dimethylfluorenyl)phenyltriazinyl][(biphenylyl)dibenzoselenophenyl]biphenyl; (diphenyltriazinyl)(dibenzofuranyl) terbenzene; (diphenyltriazinyl)(dibenzothiophenyl)terbenzene; (diphenyltriazinyl)(dibenzoselenophenyl)terbenzene; (dibenzofuranyl)(diphenyltriazinyl)terbenzene; (dibenzothiophenyl)(diphenyltriazinyl)terbenzene; (diphenyltriazinyl) (dibenzoselenophenyl)terbenzene; (diphenyltriazinyl) (dibenzofuranyl)biphenyl; (diphenyltriazinyl) (dibenzothiophenyl)biphenyl; (diphenyltriazinyl) (dibenzoselenophenyl)biphenyl; (diphenyltriazinyl) (dibenzofuranyl)biphenyl; (diphenyltriazinyl) (dibenzothiophenyl)biphenyl; (diphenyltriazinyl) (dibenzoselenophenyl)biphenyl; (diphenyltriazinyl) (dibenzofuranyl)biphenyl; (diphenyltriazinyl) (dibenzothiophenyl)biphenyl; (diphenyltriazinyl) (dibenzoselenophenyl)biphenyl; (diphenyltriazinyl) (dibenzofuranyl)terbenzene; (diphenyltriazinyl) (dibenzothiophenyl)terbenzene; (diphenyltriazinyl) (dibenzoselenophenyl)terbenzene; (diphenyltriazinyl) (dibenzofuranyl)terbenzene; (diphenyltriazinyl) (dibenzothiophenyl)terbenzene; (diphenyltriazinyl) (dibenzoselenophenyl)terbenzene; (diphenyltriazinyl) (dibenzofuranyl)terbenzene; (diphenyltriazinyl) (dibenzothiophenyl)terbenzene; (diphenyltriazinyl) (dibenzoselenophenyl)terbenzene; (diphenyltriazinyl) (diphenyldibenzofuranyl)biphenyl; (diphenyltriazinyl) (diphenyldibenzothiophenyl)biphenyl; (diphenyltriazinyl) (diphenyldibenzoselenophenyl)biphenyl; (diphenyltriazinyl)(diphenyldibenzofuranyl)biphenyl; (diphenyltriazinyl)(diphenyldibenzothiophenyl)biphenyl; (diphenyltriazinyl)(diphenyldibenzoselenophenyl)biphenyl; (diphenyltriazinyl)(phenyldibenzofuranyl)biphenyl; (diphenyltriazinyl)(phenyldibenzothiophenyl)biphenyl; (diphenyltriazinyl)(phenyldibenzoselenophenyl)biphenyl; (diphenyltriazinyl)(pyridinyl)(phenyldibenzofuranyl)benzene; (diphenyltriazinyl)(pyridinyl)(phenyldibenzothiophenyl) benzene; (diphenyltriazinyl)(pyridinyl)(phenyldibenzoselenophenyl)benzene; (diphenyltriazinyl)(pyridinyl)(phenyldibenzofuranyl)benzene; (diphenyltriazinyl)(pyridinyl) (phenyldibenzothiophenyl)benzene; (diphenyltriazinyl) (pyridinyl)(phenyldibenzoselenophenyl)benzene; (diphenyltriazinyl)[(pyridinyl)dibenzofuranyl]biphenyl; (diphenyltriazinyl)[(pyridinyl)dibenzothiophenyl]biphenyl; (diphenyltriazinyl)[(pyridinyl)dibenzoselenophenyl]biphenyl; (diphenyltriazinyl)(dibenzofuranyl)terbenzene; (diphenyltriazinyl)(dibenzothiophenyl)terbenzene; (diphenyltriazinyl)(dibenzoselenophenyl)terbenzene; (dibenzofuranyl) (diphenyltriazinyl)terbenzene; (dibenzothiophenyl) (diphenyltriazinyl)terbenzene; (dibenzoselenophenyl) (diphenyltriazinyl)terbenzene; (diphenyltriazinyl) (dibenzofuranyl)(dimethylfluorenyl)benzene; (diphenyltriazinyl)(dibenzothiophenyl)(dimethylfluorenyl) benzene; (diphenyltriazinyl)(dibenzoselenophenyl)(dimethylfluorenyl)benzene; (diphenyltriazinyl)(dimethylfluorenyl) biphenyl; (diphenyltriazinyl)[spiro(cyclopentanefluorenyl)] biphenyl; (diphenyltriazinyl)(dimethylfluorenyl)terbenzene; (diphenyltriazinyl)(diphenylfluorenyl)biphenyl; [(diphenylyl)phenyltriazinyl](dimethylfluorenyl)biphenyl; [(dimethylfluorenyl)phenyltriazinyl](dimethylfluorenyl)terbenzene; (diphenyltriazinyl)di(dimethylfluorenyl)benzene; (diphenyltriazinyl)(dimethylfluorenyl)terbenzene; (diphenyltriazinyl)phenyldibenzofuran; (diphenyltriazinyl)phenyldibenzothiophene; (diphenyltriazinyl)phenyldibenzoselenophene; [(biphenylyl)phenyltriazinyl]phenyldibenzofuran; [(biphenylyl)phenyltriazinyl]phenyldibenzothiophene; [(biphenylyl)phenyltriazinyl]phenyldibenzoselenophene; [(biphenylyl)phenyltriazinyl]phenyldibenzofuran; [(biphenylyl) phenyltriazinyl]phenyldibenzothiophene; [(biphenylyl) phenyltriazinyl]phenyldibenzoselenophene; [di(biphenylyl) triazinyl]phenyldibenzofuran; [di(biphenylyl)triazinyl] phenyldibenzothiophene; [di(biphenylyl)triazinyl] phenyldibenzoselenophene; [di(biphenylyl)triazinyl] phenyldibenzofuran; [di(biphenylyl)triazinyl] phenyldibenzothiophene; [di(biphenylyl)triazinyl] phenyldibenzoselenophene; [di(biphenylyl)triazinyl] phenyldibenzofuran; [di(biphenylyl)triazinyl] phenyldibenzothiophene; [di(biphenylyl)triazinyl] phenyldibenzoselenophene; (diphenyltriazinyl) (phenyldibenzofuranyl)benzene; (diphenyltriazinyl) (phenyldibenzothiophenyl)benzene; (diphenyltriazinyl) (phenyldibenzoselenophenyl)benzene; [(biphenylyl) phenyltriazinyl](phenyldibenzofuranyl)benzene; [(biphenylyl)phenyltriazinyl](phenyldibenzothiophenyl) benzene; [(biphenylyl)phenyltriazinyl](phenyldibenzoselenophenyl)benzene; [(biphenylyl)phenyltriazinyl](phenyldibenzofuranyl)benzene; [(biphenylyl)phenyltriazinyl] (phenyldibenzothiophenyl)benzene; [(biphenylyl) phenyltriazinyl](phenyldibenzoselenophenyl)benzene; (diphenyltriazinyl)(phenyldibenzofuranyl)benzene; (diphenyltriazinyl)(phenyldibenzothiophenyl)benzene; (diphenyltriazinyl)(phenyldibenzoselenophenyl)benzene; [phenyl(biphenylyl)triazinyl](phenyldibenzofuranyl)benzene; [phenyl (biphenylyl)triazinyl](phenyldibenzothiophenyl)benzene; [phenyl(biphenylyl)triazinyl](phenyldibenzoselenophenyl) benzene; [phenyl(biphenylyl)triazinyl](phenyldibenzofuranyl)benzene; [phenyl(biphenylyl)triazinyl](phenyldibenzothiophenyl)benzene; [phenyl(biphenylyl)triazinyl] (phenyldibenzoselenophenyl)benzene; (diphenyltriazinyl) (phenyldibenzofuranyl)biphenyl; (diphenyltriazinyl) (phenyldibenzothiophenyl)biphenyl; (diphenyltriazinyl) (phenyldibenzoselenophenyl)biphenyl; [(biphenylyl) phenyltriazinyl](phenyldibenzofuranyl)biphenyl; [(biphenylyl)phenyltriazinyl](phenyldibenzothiophenyl)biphenyl; [(biphenylyl)phenyltriazinyl](phenyldibenzoselenophenyl)biphenyl; [(biphenylyl)phenyltriazinyl](phenyldibenzofuranyl)biphenyl; [(biphenylyl)phenyltriazinyl] (phenyldibenzothiophenyl)biphenyl; [(biphenylyl) phenyltriazinyl](phenyldibenzoselenophenyl)biphenyl; (phenyldibenzofuranyl)(diphenyltriazinyl)biphenyl; (phenyldibenzothiophenyl)(diphenyltriazinyl)biphenyl; (phenyldibenzoselenophenyl)(diphenyltriazinyl)biphenyl; (phenyldibenzothiophenyl)[phenyl(biphenylyl)triazinyl] biphenyl; (phenyldibenzoselenophenyl)[phenyl(biphenylyl) triazinyl]biphenyl; (phenyldibenzofuranyl)[phenyl (biphenylyl)triazinyl]biphenyl; (phenyldibenzothiophenyl) [phenyl(biphenylyl)triazinyl]biphenyl; (phenyldibenzoselenophenyl)[phenyl(biphenylyl)triazinyl] biphenyl; (diphenyltriazinyl)(phenyldibenzofuranyl)biphenyl; (diphenyltriazinyl)(phenyldibenzothiophenyl)biphenyl; (diphenyltriazinyl)(phenyldibenzoselenophenyl)biphenyl; [phenyl(biphenylyl)triazinyl](phenyldibenzofuranyl)biphenyl; [phenyl(biphenylyl)triazinyl](phenyldibenzothiophenyl)biphenyl; [phenyl(biphenylyl)triazinyl](phenyldibenzoselenophenyl)biphenyl; [phenyl(biphenylyl)triazinyl] (phenyldibenzofuranyl)biphenyl; [phenyl(biphenylyl) triazinyl](phenyldibenzothiophenyl)biphenyl; [phenyl (biphenylyl)triazinyl](phenyldibenzoselenophenyl) biphenyl; (biphenylyl)(diphenyltriazinyl)dibenzofuran; (biphenylyl)(diphenyltriazinyl)dibenzothiophene; (biphenylyl)(diphenyltriazinyl)dibenzoselenophene; (biphenylyl)[(biphenylyl)phenyltriazinyl]dibenzofuran; (biphenylyl)[(biphenylyl)phenyltriazinyl]dibenzothiophene; (biphenylyl)[(biphenylyl)phenyltriazinyl]dibenzoselenophene; (biphenylyl)[(biphenylyl)phenyltriazinyl]dibenzofuran; (biphenylyl)[(biphenylyl)phenyltriazinyl]dibenzothiophene; (biphenylyl)[(biphenylyl)phenyltriazinyl] dibenzoselenophene; (biphenylyl)[(diphenyltriazinyl) phenyl]dibenzofuran; (biphenylyl)[(diphenyltriazinyl) phenyl]dibenzothiophene; (biphenylyl)[(diphenyltriazinyl) phenyl]dibenzoselenophene; (biphenylyl){[(biphenylyl) phenyltriazinyl]phenyl}dibenzofuran; (biphenylyl){[(biphenylyl)phenyltriazinyl]phenyl}dibenzothiophene; (biphenylyl){[(biphenylyl)phenyltriazinyl] phenyl}dibenzoselenophene; (biphenylyl){[(biphenylyl) phenyltriazinyl]phenyl}dibenzofuran; (biphenylyl){[(biphenylyl)phenyltriazinyl]phenyl}dibenzothiophene; (biphenylyl){[(biphenylyl)phenyltriazinyl] phenyl}dibenzoselenophene; (biphenylyl)[(diphenyltriazinyl)phenyl]dibenzofuran; (biphenylyl)[(diphenyltriazinyl) phenyl]dibenzothiophene; (biphenylyl)[(diphenyltriazinyl) phenyl]dibenzoselenophene; (biphenylyl){[phenyl (biphenylyl)triazinyl]phenyl}dibenzofuran; (biphenylyl){[phenyl(biphenylyl)triazinyl]phenyl}dibenzothiophene; (biphenylyl){[phenyl(biphenylyl)triazinyl] phenyl}dibenzoselenophene; (biphenylyl){[phenyl(biphenylyl)triazinyl]phenyl}dibenzofuran; (biphenylyl){[phenyl (biphenylyl)triazinyl]phenyl}dibenzothiophene; (biphenylyl){[phenyl(biphenylyl)triazinyl] phenyl}dibenzoselenophene; (biphenylyl)(diphenyltriazinyl)dibenzofuran; (biphenylyl)(diphenyltriazinyl)dibenzothiophene; (biphenylyl)(diphenyltriazinyl) dibenzoselenophene; (biphenylyl)[(biphenylyl) phenyltriazinyl]dibenzofuran; (biphenylyl)[(biphenylyl) phenyltriazinyl]dibenzothiophene; (biphenylyl)[(biphenylyl)phenyltriazinyl]dibenzoselenophene; (biphenylyl)[(biphenylyl)phenyltriazinyl]dibenzofuran; (biphenylyl)[(biphenylyl)phenyltriazinyl]dibenzothiophene; (biphenylyl)[(biphenylyl)phenyltriazinyl]dibenzoselenophene; (biphenylyl)[(diphenyltriazinyl)phenyl]dibenzofuran; (biphenylyl)[(diphenyltriazinyl)phenyl]dibenzothiophene; (biphenylyl)[(diphenyltriazinyl)phenyl] dibenzoselenophene; (biphenylyl){[(biphenylyl) phenyltriazinyl]phenyl}dibenzofuran; (biphenylyl){[(biphenylyl)phenyltriazinyl]phenyl}dibenzothiophene; (biphenylyl){[(biphenylyl)phenyltriazinyl] phenyl}dibenzoselenophene; (biphenylyl){[phenyl(biphenylyl)triazinyl]phenyl}dibenzofuran; (biphenylyl){[phenyl (biphenylyl)triazinyl]phenyl}dibenzothiophene; (biphenylyl){[phenyl(biphenylyl)triazinyl] phenyl}dibenzoselenophene; (biphenylyl)[(diphenyltriazinyl)phenyl]dibenzofuran; (biphenylyl)[(diphenyltriazinyl) phenyl]dibenzothiophene; (biphenylyl)[(diphenyltriazinyl) phenyl]dibenzoselenophene; (biphenylyl){[(biphenylyl) phenyltriazinyl]phenyl}dibenzofuran; (biphenylyl){[(biphenylyl)phenyltriazinyl]phenyl}dibenzothiophene; (biphenylyl){[(biphenylyl)phenyltriazinyl] phenyl}dibenzoselenophene; (biphenylyl){[(biphenylyl) phenyltriazinyl]phenyl}dibenzofuran; (biphenylyl){[(biphenylyl)phenyltriazinyl]phenyl}dibenzothiophene; (biphenylyl){[(biphenylyl)phenyltriazinyl] phenyl}dibenzoselenophene; phenyl(dimethylfluorenyl) (phenyldibenzofuranyl)triazine; phenyl(dimethylfluorenyl) (phenyldibenzothiophenyl)triazine; phenyl (dimethylfluorenyl)(phenyldibenzoselenophenyl)triazine; (biphenylyl)(dimethylfluorenyl)(phenyldibenzofuranyl)triazine; (biphenylyl)(dimethylfluorenyl)(phenyldibenzothiophenyl)triazine; (biphenylyl)(dimethylfluorenyl)(phenyldibenzoselenophenyl)triazine; (biphenylyl) (dimethylfluorenyl)(phenyldibenzofuranyl)triazine; (biphenylyl)(dimethylfluorenyl)(phenyldibenzothiophenyl) triazine; (biphenylyl)(dimethylfluorenyl)(phenyldibenzoselenophenyl)triazine; phenyl(dimethylfluorenyl)[(phenyldibenzofuranyl)phenyl]triazine; phenyl (dimethylfluorenyl)[(phenyldibenzothiophenyl)phenyl] triazine; phenyl(dimethylfluorenyl) [(phenyldibenzoselenophenyl)phenyl]triazine; bis (dimethylfluorenyl)[(phenyldibenzofuranyl)phenyl]triazine; bis(dimethylfluorenyl)[(phenyldibenzothiophenyl)phenyl] triazine; bis(dimethylfluorenyl)[(phenyldibenzoselenophenyl)phenyl]triazine; phenyl[(biphenylyl)dibenzofuranyl]dimethylfluorenyl)triazine; phenyl[(biphenylyl) dibenzothiophenyl](dimethylfluorenyl)triazine; phenyl [(biphenylyl)dibenzoselenophenyl](dimethylfluorenyl) triazine; phenyl[(biphenylyl)dibenzofuranyl] dimethylfluorenyl)triazine; phenyl[(biphenylyl) dibenzothiophenyl](dimethylfluorenyl)triazine; phenyl [(biphenylyl)dibenzoselenophenyl]dimethylfluorenyl) triazine; phenyl(dimethylfluorenyl){[(biphenylyl) dibenzofuranyl]phenyl}triazine; phenyl(dimethylfluorenyl) {[(biphenylyl)dibenzothiophenyl]phenyl}triazine; phenyl (dimethylfluorenyl){[(biphenylyl)dibenzoselenophenyl] phenyl}triazine; phenyl(dimethylfluorenyl){[(biphenylyl) dibenzofuranyl]phenyl}triazine; phenyl(dimethylfluorenyl) {[(biphenylyl)dibenzothiophenyl]phenyl}triazine; phenyl (dimethylfluorenyl){[(biphenylyl)dibenzoselenophenyl] phenyl}triazine; phenyl[(dimethylfluorenyl)phenyl] (phenyldibenzofuranyl)triazine; phenyl[(dimethylfluorenyl) phenyl](phenyldibenzothiophenyl)triazine; phenyl [(dimethylfluorenyl)phenyl](phenyldibenzoselenophenyl) triazine; phenyl(dimethylfluorenyl)(phenyldibenzofuranyl) triazine; phenyl(dimethylfluorenyl) (phenyldibenzothiophenyl)triazine; phenyl (dimethylfluorenyl)(phenyldibenzoselenophenyl)triazine; phenyl[(biphenylyl)dibenzofuranyl]dimethylfluorenyl)triazine; phenyl[(biphenylyl)dibenzothiophenyl](dimethylfluorenyl)triazine; phenyl[(biphenylyl)dibenzofuranyl](dimethylfluorenyl)triazine; phenyl(dimethylfluorenyl){ [(biphenylyl)dibenzofuranyl]phenyl}triazine; phenyl (dimethylfluorenyl){[(biphenylyl)dibenzothiophenyl] phenyl}triazine; phenyl(dimethylfluorenyl){[(biphenylyl) dibenzoselenophenyl]phenyl}triazine; phenyl [(dimethylfluorenyl)phenyl](phenyldibenzofuranyl)triazine; phenyl[(dimethylfluorenyl)phenyl](phenyldibenzothiophenyl)triazine; phenyl[(dimethylfluorenyl)phenyl](phenyldibenzoselenophenyl)triazine; phenyl(dimethylfluorenyl)(phenyldibenzofuranyl)triazine; phenyl (dimethylfluorenyl)(phenyldibenzothiophenyl)triazine; phenyl(dimethylfluorenyl)(phenyldibenzoselenophenyl)triazine; phenyl(diphenyltriazinyl)dibenzofuran; phenyl(diphenyltriazinyl)dibenzothiophene; phenyl(diphenyltriazinyl)dibenzoselenophene; phenyl[(diphenyltriazinyl)phenyl] dibenzofuran; phenyl[(diphenyltriazinyl)phenyl] dibenzothiophene; phenyl[(diphenyltriazinyl)phenyl] dibenzoselenophene; (biphenylyl)[(diphenyltriazinyl) phenyl]dibenzofuran; (biphenylyl)[(diphenyltriazinyl) phenyl]dibenzothiophene; (biphenylyl)[(diphenyltriazinyl) phenyl]dibenzoselenophene; diphenyl[(diphenyltriazinyl) phenyl]dibenzofuran; diphenyl[(diphenyltriazinyl)phenyl] dibenzothiophene; diphenyl[(diphenyltriazinyl)phenyl] dibenzoselenophene; phenyl(diphenyltriazinyl)

dibenzofuran; phenyl(diphenyltriazinyl)dibenzothiophene; phenyl(diphenyltriazinyl)dibenzoselenophene; (biphenylyl)(diphenyltriazinyl)dibenzofuran; (biphenylyl)(diphenyltriazinyl)dibenzothiophene; (biphenylyl)(diphenyltriazinyl)dibenzoselenophene; (biphenylyl)(diphenyltriazinyl)dibenzofuran; (biphenylyl)(diphenyltriazinyl)dibenzothiophene; (biphenylyl)(diphenyltriazinyl)dibenzoselenophene; diphenyl[(diphenyltriazinyl)phenyl]dibenzofuran; diphenyl[(diphenyltriazinyl)phenyl]dibenzothiophene; diphenyl[(diphenyltriazinyl)phenyl]dibenzoselenophene; (biphenylyl)[(diphenyltriazinyl)phenyl]dibenzofuran; (biphenylyl)[(diphenyltriazinyl)phenyl]dibenzothiophene; (biphenylyl)[(diphenyltriazinyl)phenyl]dibenzoselenophene; (diphenyltriazinyl)phenyldibenzofuran; (diphenyltriazinyl)phenyldibenzothiophene; (diphenyltriazinyl)phenyldibenzoselenophene; [(diphenyltriazinyl)phenyl]phenyldibenzofuran; [(diphenyltriazinyl)phenyl]phenyldibenzothiophene; [(diphenyltriazinyl)phenyl]phenyldibenzoselenophene; [(diphenyltriazinyl)phenyl]phenyldibenzofuran; [(diphenyltriazinyl)phenyl]phenyldibenzothiophene; [(diphenyltriazinyl)phenyl]phenyldibenzoselenophene; [(diphenyltriazinyl)phenyl](biphenylyl)dibenzofuran; [(diphenyltriazinyl)phenyl](biphenylyl)dibenzothiophene; [(diphenyltriazinyl)phenyl](biphenylyl)dibenzoselenophene; [(diphenyltriazinyl)phenyl](biphenylyl)dibenzofuran; [(diphenyltriazinyl)phenyl](biphenylyl)dibenzothiophene; [(diphenyltriazinyl)phenyl](biphenylyl)dibenzoselenophene; [(diphenyltriazinyl)phenyl]phenyldibenzofuran; [(diphenyltriazinyl)phenyl]phenyldibenzothiophene; [(diphenyltriazinyl)phenyl]phenyldibenzoselenophene; (diphenyltriazinyl)(phenyldibenzofuranyl)pyridine; (diphenyltriazinyl)(phenyldibenzothiophenyl)pyridine; (diphenyltriazinyl)(phenyldibenzoselenophenyl)pyridine; [phenyl(phenylpyridinyhtriazinyl](phenyldibenzofuranyl)pyridine; [phenyl(phenylpyridinyhtriazinyl](phenyldibenzothiophenyl)pyridine; [phenyl(phenylpyridinyhtriazinyl](phenyldibenzoselenophenyl)pyridine; {[phenyl(phenylpyridinyl)triazinyl]phenyl}phenyldibenzofuran; {[phenyl(phenylpyridinyl)triazinyl]phenyl}phenyldibenzothiophene; {[phenyl(phenylpyridinyl)triazinyl]phenyl}phenyldibenzoselenophene; (diphenyltriazinyl)[(biphenylyl)dibenzofuranyl]pyridine; (diphenyltriazinyl)[(biphenylyl)dibenzothiophenyl]pyridine; (diphenyltriazinyl)[(biphenylyl)dibenzoselenophenyl]pyridine; phenyl(dimethylindenopyridinyl)(phenyldibenzofuranyl)triazine; phenyl(dimethylindenopyridinyl)(phenyldibenzothiophenyl)triazine; phenyl(dimethylindenopyridinyl)(phenyldibenzoselenophenyl)triazine; (biphenylyl)(dimethylindenopyridinyl)(phenyldibenzofuranyl)triazine; (biphenylyl)(dimethylindenopyridinyl)(phenyldibenzothiophenyl)triazine; (biphenylyl)(dimethylindenopyridinyl)(phenyldibenzoselenophenyl)triazine; phenyl(dimethylindenopyridinyl)(phenyldibenzofuranyl)triazine; phenyl(dimethylindenopyridinyl)(phenyldibenzothiophenyl)triazine; phenyl(dimethylindenopyridinyl)(phenyldibenzoselenophenyl)triazine; phenyl(spiro[cyclohexanefluorene]yl)(phenyldibenzofuranyl)triazine; phenyl(spiro[cyclohexanefluorene]yl)(phenyldibenzothiophenyl)triazine; phenyl(spiro[cyclohexanefluorene]yl)(phenyldibenzoselenophenyl)triazine; phenyl(spirobi[fluorene]yl)(phenyldibenzofuranyl)triazine; phenyl(spirobi[fluorene]yl)(phenyldibenzothiophenyl)triazine; phenyl(spirobi[fluorene]yl)(phenyldibenzoselenophenyl)triazine; (diphenyl-$d_{10}$)[(phenyldibenzofuranyl)phenyl-$d_{14}$]triazine; (diphenyl-$d_{10}$)[(phenyldibenzothiophenyl)phenyl-$d_{14}$]triazine; (diphenyl-$d_{10}$)[(phenyldibenzoselenophenyl)phenyl-$d_{14}$]triazine(diphenyl-$d_{10}$){[(biphenylyl)dibenzofuranyl]phenyl-$d_{18}$}triazine; (diphenyl-$d_{10}$){[(biphenylyl)dibenzothiophenyl]phenyl-$d_{18}$}triazine; (diphenyl-$d_{10}$){[(biphenylyl)dibenzoselenophenyl]phenyl-$d_{18}$}triazinephenyl[(dimethyl-$d_6$)fluorenyl](phenyldibenzofuranyl)triazine; phenyl[(dimethyl-$d_6$)fluorenyl](phenyldibenzothiophenyl)triazine; phenyl[(dimethyl-$d_6$)fluorenyl](phenyldibenzoselenophenyl)triazine; (diphenyl-$d_{10}$){[(biphenylyl)dibenzofuranyl]phenyl-$d_{18}$}triazine; (diphenyl-$d_{10}$){[(biphenylyl)dibenzothiophenyl]phenyl-$d_{18}$}triazine; (diphenyl-$d_{10}$){[(biphenylyl)dibenzoselenophenyl]phenyl-$d_{18}$}triazine (diphenyl-$d_{10}$){[(biphenylyl)dibenzofuranyl]phenyl}triazine; (diphenyl-$d_{10}$){[(biphenylyl)dibenzothiophenyl]phenyl}triazine; (diphenyl-$d_{10}$){[(biphenylyl)dibenzoselenophenyl]phenyl}triazine; (diphenyltriazinyl)[(biphenylyl)dibenzofuranyl]biphenyl; (diphenyltriazinyl)[(biphenylyl)dibenzothiophenyl]biphenyl; (diphenyltriazinyl)[(biphenylyl)dibenzoselenophenyl]biphenyl; (diphenyltriazinyl)[(biphenylyl)dibenzofuranyl]biphenyl; (diphenyltriazinyl)[(biphenylyl)dibenzothiophenyl]biphenyl; (diphenyltriazinyl)[(biphenylyl)dibenzoselenophenyl]biphenyl; [di(fluorophenyl)triazinyl][(biphenylyl)dibenzofuranyl]phenyl; [di(fluorophenyl)triazinyl][(biphenylyl)dibenzothiophenyl]phenyl; [di(fluorophenyl)triazinyl][(biphenylyl)dibenzoselenophenyl]phenyl; (dibenzothiophenyl)(diphenyltriazinyl)biphenyl; (diphenyltriazinyl)(dibenzothiophenyl)biphenyl; (diphenyltriazinyl)(dibenzothiophenyl)biphenyl; (dibenzofuranyl)triphenylene; (dibenzothiophenyl)triphenylene; (dibenzoselenophenyl)triphenylene; (dibenzofuranyl)(triphenylenyl)benzene; (dibenzothiophenyl)(triphenylenyl)benzene; (dibenzoselenophenyl)(triphenylenyl)benzene; (phenyldibenzofuranyl)(triphenylenyl)benzene; (phenyldibenzothiophenyl)(triphenylenyl)benzene; (phenyldibenzoselenophenyl)(triphenylenyl)benzene; (dibenzofuranyl)(triphenylenyl)biphenyl; (dibenzothiophenyl)(triphenylenyl)biphenyl; (dibenzoselenophenyl)(triphenylenyl)biphenyl; phenyl(triphenylenyl)dibenzofuran; phenyl(triphenylenyl)dibenzothiophene; phenyl(triphenylenyl)dibenzoselenophene; (biphenylyl)(triphenylenyl)dibenzofuran; (biphenylyl)(triphenylenyl)dibenzothiophene; (biphenylyl)(triphenylenyl)dibenzoselenophene; (terbenzenyl)(triphenylenyl)dibenzofuran; (terbenzenyl)(triphenylenyl)dibenzothiophene; (terbenzenyl)(triphenylenyl)dibenzoselenophene; (biphenylyl)[(triphenylenyl)phenyl]dibenzofuran; (biphenylyl)[(triphenylenyl)phenyl]dibenzothiophene; (biphenylyl)[(triphenylenyl)phenyl]dibenzoselenophene; (carbazolyl)(triphenylenyl)dibenzofuran; (carbazolyl)(triphenylenyl)dibenzothiophene; (carbazolyl)(triphenylenyl)dibenzoselenophene; (carbazolyl)(triphenylenyl)biphenyl; (triphenylenyl)(carbazolyl)biphenyl; (carbazolyl)[(triphenylenyl)phenyl]pyridine; tri(terbenzenyl)triazine; di(terbenzenyl)(biphenylyl)triazine; di(terbenzenyl)(biphenylyl)triazine; di(terbenzenyl)(dimethylfluorenyl)triazine; (dimethylfluorenyl)(terbenzenyl)(biphenylyl)triazine; phenyl(dibenzofuranyl)(terbenzenyl)triazine; phenyl(dibenzothiophenyl)(terbenzenyl)triazine; phenyl(dibenzoselenophenyl)(terbenzenyl)triazine; (biphenylyl)(dibenzofuranyl)(terbenzenyl)triazine; (biphenylyl)(dibenzothiophenyl)(terbenzenyl)triazine; (biphenylyl)(dibenzoselenophenyl)(terbenzenyl)triazine;

(dibenzofuranyl)(dimethylfluorenyl)(terbenzenyl)triazine; (dibenzothiophenyl)(dimethylfluorenyl)(terbenzenyl)triazine; (dibenzoselenophenyl)(dimethylfluorenyl)(terbenzenyl)triazine; [(carbazolyl)phenyl](terphenylyl)carbazole; [(carbazolyl)phenyl](terphenylyl)carbazole; [(carbazolyl)pyridinyl](terphenylyl)carbazole; [(carbazolyl)pyridinyl](terphenylyl)carbazole; [(carbazolyl)pyridinyl](terphenylyl)carbazole; (terphenylyl)bicarbazole; (terphenylyl)bicarbazole; [(carbazolyl)phenyl](triphenylenyl)carbazole; [(carbazolyl)phenyl](triphenylenyl)carbazole; [(carbazolyl)pyridinyl](triphenylenyl)carbazole; [(carbazolyl)pyridinyl](triphenylenyl)carbazole; [(carbazolyl)phenyl](triphenylenyl)carbazole; (triphenylenyl)bicarbazole; (triphenylenyl)bicarbazole; [(triphenylenyl)phenyl]bicarbazole; [(triphenylenyl)phenyl]bicarbazole; [(carbazolyl)phenyl](dimethylfluorenyl)carbazole; [(carbazolyl)phenyl](dimethylfluorenyl)carbazole; [(carbazolyl)pyridinyl](dimethylfluorenyl)carbazole; [(carbazolyhpyridinyl](dimethylfluorenyl)carbazole; (dimethylfluorenyl)bicarbazole; (dimethylfluorenyl)bicarbazole; [c-(dimethylfluorenyl)phenyl]bicarbazole; [c-(dimethylfluorenyl)phenyl]bicarbazole; [(carbazolyl)phenyl](dibenzofuranyl)carbazole; [(carbazolyl)phenyl](dibenzothiophenyl)carbazole; [(carbazolyl)phenyl](dibenzoselenophenyl)carbazole; [(carbazolyl)phenyl](dibenzofuranyl)carbazole; [(carbazolyl)phenyl](dibenzothiophenyl)carbazole; [(carbazolyl)phenyl](dibenzoselenophenyl)carbazole; [(carbazolyl)phenyl](dibenzofuranyl)carbazole; [(carbazolyl)phenyl](dibenzothiophenyl)carbazole; [(carbazolyl)phenyl](dibenzoselenophenyl)carbazole; [(carbazolyl)phenyl](dibenzofuranyl)carbazole; [(carbazolyl)phenyl](dibenzothiophenyl)carbazole; [(carbazolyl)phenyl](dibenzoselenophenyl)carbazole; (dibenzofuranyl)bicarbazole; (dibenzothiophenyl)bicarbazole; (dibenzoselenophenyl)bicarbazole; (dibenzofuranyl)bicarbazole; (dibenzothiophenyl)bicarbazole; (dibenzoselenophenyl)bicarbazole; (dibenzofuranyl)bicarbazole; (dibenzothiophenyl)bicarbazole; (dibenzoselenophenyl)bicarbazole; (dibenzofuranyl)bicarbazole; (dibenzothiophenyl)bicarbazole; (dibenzoselenophenyl)bicarbazole; (dibenzofuranyl)phenylbicarbazole; (dibenzothiophenyl)phenylbicarbazole; (dibenzoselenophenyl)phenylbicarbazole; (dibenzofuranyl)(bicarbazolyl)biphenyl; (dibenzothiophenyl)(bicarbazolyl)biphenyl; (dibenzoselenophenyl)(bicarbazolyl)biphenyl; (dibenzofuranyl)(bicarbazolyl)biphenyl; (dibenzothiophenyl)(bicarbazolyl)biphenyl; (dibenzoselenophenyl)(bicarbazolyl)biphenyl; (dibenzofuranyl)phenylbicarbazole; (dibenzothiophenyl)phenylbicarbazole; (dibenzoselenophenyl)phenylbicarbazole; (dibenzofuranyl)(bicarbazolyl)biphenyl; (dibenzothiophenyl)(bicarbazolyl)biphenyl; (dibenzoselenophenyl)(bicarbazolyl)biphenyl; (dibenzofuranyl)(bicarbazolyl)biphenyl; (dibenzothiophenyl)(bicarbazolyl)biphenyl; (dibenzoselenophenyl)(bicarbazolyl)biphenyl (Group 16A)

diphenylindolocarbazole; phenyl(biphenylyl)indolocarbazole; di(biphenylyl)indolocarbazole; phenyl(terphenylyl)indolocarbazole; phenyl(quaterphenylyl)indolocarbazole; phenyl(quinquephenylyl)indolocarbazole; phenyl(naphthaleyl)indolocarbazole; phenyl(binaphthalenyl)indolocarbazole; phenyl(acenaphthenyl)indolocarbazole; phenyl(acenaphthenyl)indolocarbazole; phenyl(azulenylphenyl)indolocarbazole; phenyl[(phenylanthraceneyl)phenyl]indolocarbazole; phenyl(methylphenyl)indolocarbazole; phenyl[(diphenylamino)phenyl]indolocarbazole; phenyl[[bis(trimethylphenyl)borane]phenyl]indolocarbazole; di(biphenylyl)indolocarbazole; biphenylyl(pyridinylphenyl)indolocarbazole; phenyl(triphenylenyl)indolocarbazole; phenyl(terphenylyl)indolocarbazole; phenyl(chrysenyl)indolocarbazole; phenyl(pyrenyl)indolocarbazole; phenyl(phenanthrenyl)indolocarbazole; phenyl(coronenyl)indolocarbazole; phenyl[(diphenylpyrimidineyl)phenyl]indolocarbazole; phenyl[(diphenyltriazinyl)phenyl]indolocarbazole; phenyl[(bithiophenyl)phenyl]indolocarbazole; phenyl[(isothiazolyl)phenyl]indolocarbazole; phenyl(dicyanophenyl)indolocarbazole; phenyl(dicyanophenyl)indolocarbazole; bis(ethylphenyl)indolocarbazole; bis(isopropylphenyl)indolocarbazole; bis(tert-butylphenyl)indolocarbazole; phenyl[[phenyl(naphthaleyl)amino]phenyl]indolocarbazole; phenyl[[di(naphthaleyl)amino]phenyl]indolocarbazole; phenyl[[di(naphthaleyl)borane]phenyl]indolocarbazole; phenyl(terphenylyl)indolocarbazole; di(naphthaleyl)indolocarbazole; phenyl(anthraceneyl)indolocarbazole; phenyl(tetracenyl)indolocarbazole; phenyl(perylenyl)indolocarbazole; phenyl(fluorenyl)indolocarbazole; phenyl[(n-butyl)phenyl]indolocarbazole; [(n-octyl)phenyl][(n-butyl)phenyl]indolocarbazole; phenyl[[phenyl(anthraceneyl)amino]phenyl]indolocarbazole; phenyl[[di(anthraceneyl)borane]phenyl]indolocarbazole; naphthalene(biphenylyl)indolocarbazole; phenyl[(phenylcarbazolyl)phenyl]indolocarbazole; phenyl[(carbazolyl)phenyl]indolocarbazole; phenyl[(dibenzothiophenyl)phenyl]indolocarbazole; phenyl[(phenylphenazinyl)phenyl]indolocarbazole; tetraphenylindolocarbazole; (dipyridine)(diphenyl)indolocarbazole; diphenyl(carbazolyl)indolocarbazole; phenyl(biphenylyl)indolocarbazole; tetraphenylindolocarbazole; di(naphthaleyl)indolocarbazole; phenyl[(phenyldibenzofuranyl)phenyl]indolocarbazole; phenyl(dibenzothiophenyl)indolocarbazole; phenyl(dibenzofuranyl)indolocarbazole; dimethyl(diphenyl)indolocarbazole; diphenyl[bis(diphenylamino)]indolocarbazole; diphenyl[bis(trimethylphenyl)boraneyl]indolocarbazole; diphenyldicyanoindolocarbazole; dipyridinylindolocarbazole; bis(phenylcarbazolyl)indolocarbazole; bis[phenylindolocarbazolyl]benzene; bis[phenylindolocarbazolyl]benzene; bis[phenylindolocarbazolyl]biphenyl; bis[phenylindolocarbazolyl]naphthalene; bis[phenylindolocarbazolyl]anthracene; bis[phenylindolocarbazolyl]pyrene; bis[phenylindolocarbazolyl](cyano)benzene; (phenylindolocarbazolyl)[(carbazolyl)indolocarbazolyl]benzene; (phenylindolocarbazolyl)[(dibenzoselenophenyl)indolocarbazolyl]benzene; phenyl(phenylpyridinyl)indolocarbazole; phenyl(diphenylpyrimidineyl)indolocarbazole; phenyl(diphenyltriazinyl)indolocarbazole; phenyl(phenylpyrazinyl)indolocarbazole; phenyl(quinolinyl)indolocarbazole; phenyl(quinazolinyl)indolocarbazole; phenyl(phenylbenzoimidazolyl)indolocarbazole; phenyl(cinnolinyl)indolocarbazole; phenyl(phenylcarbazolyl)indolocarbazole; methylbiphenylyl(phenylpyridinyl)indolocarbazole; phenyl(carbazolylpyridinyl)indolocarbazole; phenyl[phenyl(carbazolyl)pyrimidineyl]indolocarbazole; phenyl[phenyl(biphenylyl)triazinyl]indolocarbazole; biphenylyl(diphenyltriazinyl)indolocarbazole; phenyl[phenyl(biphenylyl)triazinyl]indolocarbazole; phenyl[di(biphenylyl)triazinyl]indolocarbazole; naphthaleyl(quinolinyl)indolocarbazole; phenyl(biphenylylquinazolinyl)indolocarbazole; phenyl(biphenylylindolyl)indolocarbazole; terphenylyl(phenylpyridinyl)indolocarbazole; phenyl[di(biphenylyl)triazinyl]indolocarbazole; tetraphenyl(quinolinyl)indolocarbazole; phenyl(carbazolyl)(phenylcarbazolyl)indolocarbazole; diphenylaminophenyl(phenylquinazolinyl)

indolocarbazole; phenyl{phenyl[(carbazolyl)methylphenyl]triazinyl}indolocarbazole; phenyl(naphthaleylcarbazolyl)indolocarbazole; phenyl(quinolinylcarbazolyl)indolocarbazole; phenyl(phenylpyridinyl)indolocarbazole; phenyl(phenylpyridinyl)indolocarbazole; biphenylyl(phenylpyridinyl)indolocarbazole; terphenylyl(phenylpyridinyl)indolocarbazole; phenyl(diphenylpyrimidineyl)indolocarbazole; (dibenzothiophenylphenyl)(diphenylpyrimidineyl)indolocarbazole; phenyl(diphenyltriazinyl)indolocarbazole; phenyl[phenyl(biphenylyl)triazinyl]indolocarbazole; biphenylyl[phenyl(biphenylyl)triazinyl]indolocarbazole; phenyl[biphenylyl(naphthaleyl)triazinyl]indolocarbazole; dibenzothiophenyl(diphenyltriazinyl)indolocarbazole; phenyl(quinolinyl)indolocarbazole; biphenylyl(quinazolinyl)indolocarbazole; phenyl(quinoxalinyl)indolocarbazole; phenyl(phenylcarbazolyl)indolocarbazole; phenyl(phenylcarbazolyl)indolocarbazole; phenyl(phenylcarbazolyl)indolocarbazole; phenyl(phenylcarbazolyl)indolocarbazole; phenyl(dibenzothiophenylcarbazolyl)indolocarbazole; phenyl(phenylpyridoindolyl)indolocarbazole; phenyl(phenylpyridinyl)indolocarbazole; phenyl(phenylpyridinyl)indolocarbazole; phenyl(diphenylpyrimidineyl)indolocarbazole; phenyl(diphenyltriazinyl)indolocarbazole; naphthalene(diphenyltriazinyl)indolocarbazole; phenyl(diphenyltriazinyl)indolocarbazole; phenyl[di(cyanophenyl)triazinyl]indolocarbazole; phenyl(phenylbipyridinyl)indolocarbazole; tert-butylphenyl(quinolinyl)indolocarbazole; phenyl(phenylquinazolinyl)indolocarbazole; phenyl(quinoxalinyl)indolocarbazole; phenyl(carbazolepyridinyl)indolocarbazole; phenyl(phenylcarbazolylpyridinyl)indolocarbazole; phenyl(phenylcarbazolylpyridinyl)indolocarbazole; phenyl(triphenylenylpyridinyl)indolocarbazole; methylpyridinyl(triphenylenyl)indolocarbazole; phenylpyridinyl(phenanthrenyl)indolocarbazole; phenylpyridinyl(pyrenyl)indolocarbazole; phenylpyridinyl(terphenylyl)indolocarbazole; phenyl(phenylcarbazolyl)indolocarbazole; phenyl(phenylcarbazolyl)indolocarbazole; phenyl(phenylcarbazolyl)indolocarbazole; phenyl(phenylcarbazolyl)indolocarbazole; biphenylyl(phenylcarbazolyl)indolocarbazole; phenyl(biphenylylcarbazolyl)indolocarbazole; phenyl(phenylpyridoindolyl)indolocarbazole; phenyl(phenylpyridinyl)indolocarbazole; phenyl(diphenylpyrimidineyl)indolocarbazole; phenyl(diphenyltriazinyl)indolocarbazole; phenyl(quinolinyl)indolocarbazole; phenyl(phenylquinazolinyl)indolocarbazole; phenyl(phenylindolyl)indolocarbazole; phenyl(phenylbenzoindolyl)indolocarbazole; phenyl[phenyl(naphthaleyl)triazinyl]indolocarbazole; phenyl[phenyl(phenanthrenyl)triazinyl]indolocarbazole; phenyl[phenyl(fluorenyl)triazinyl]indolocarbazole; phenylpyridinyl(triphenylenyl)indolocarbazole; phenyl(phenylcarbazolyl)indolocarbazole; phenyl(phenylcarbazolyl)indolocarbazole; phenyl(phenylcarbazolyl)indolocarbazole; phenyl(phenylcarbazolyl)indolocarbazole; benzothiophenyl(phenylcarbazolyl)indolocarbazole; phenyl(naphthaleylcarbazolyl)indolocarbazole; phenyl(phenylazaoxaindenofluorenyl)indolocarbazole; phenyl(pyridinyl)indolocarbazole; phenyl(diphenylpyridinyl)indolocarbazole; phenyl(diphenylpyrimidineyl)indolocarbazole; phenyl[phenyl(dibenzofuranyl)pyrimidineyl]indolocarbazole; phenyl(diphenyltriazinyl)indolocarbazole; phenyl[phenyl(phenylanthraceneyl)triazinyl]indolocarbazole; phenylpyridinyl(anthraceneyl)indolocarbazole; phenyl(quinolinyl)indolocarbazole; phenyl(isoquinolinyl)indolocarbazole; phenyl(acridineyl)indolocarbazole; phenyl[(phenylanthraceneyl)pyridinyl]indolocarbazole; phenyl(naphthaleylpyridinyl)indolocarbazole; phenyl(isoquinolinylpyridinyl)indolocarbazole; phenyl(phenylcarbazolyl)indolocarbazole; phenyl(phenylcarbazolyl)indolocarbazole; phenyl(phenylcarbazolyl)indolocarbazole; phenyl(phenylcarbazolyl)indolocarbazole; phenyl(methylphenylcarbazolyl)indolocarbazole; phenyl(terphenylylcarbazolyl)indolocarbazole; bis[phenylindolocarbazolyl]pyridazine; bis[phenylindolocarbazolyl]pyridine; bis[phenylindolocarbazolyl]cyanopyridine; bis[phenylindolocarbazolyl]pyrazine; bis[phenylindolocarbazolyl]phenylpyrimidine; bis[phenylindolocarbazolyl]phenylcarbazole; tris[phenylindolocarbazolyl]triazine (Group 17A)

(diphenyl-$d_{10}$)[(biphenylyldibenzothiophenyl)phenyl]triazine; (phenyl-$d_5$)(triphenylenylphenyl)dibenzothiophene; (dicarbazolyl-di $_6$)dibenzothiophene-$d_6$; [(dimethyl-$d_6$)fluorenyl][(diphenyltriazinyl)phenyl]dibenzothiophene (Group 18A)

phenyl(terphenylyl)indolocarbazole; (biphenylyl)(terphenylyl)indolocarbazole; (biphenylyl)(terphenylyl)indolocarbazole; bis(terphenylyl)indolocarbazole; bis(terphenylyl)indolocarbazole; bis(terphenylyl)indolocarbazole; bis(terphenylyl)indolocarbazole; bis(terphenylyl)indolocarbazole; (terphenylyl)(triphenylenyl)indolocarbazole; (terphenyl)(dimethylfluorenyl)indolocarbazole; (terphenylyl)(spiro[cyclopentanefluorene]yl)indolocarbazole; (terphenylyl)(spiro[cyclohexanefluorene]yl)indolocarbazole; (terphenylyl)(dimethylfluorenyl)indolocarbazole; (terphenylyl)(spirobi[fluorene]yl)indolocarbazole; (terphenylyl)(dibenzofuranyl)indolocarbazole; (terphenylyl)(dibenzofuranyl)indolocarbazole; (terphenylyl)(dibenzofuranyl)indolocarbazole; (terphenylyl)(dibenzothiophenyl)indolocarbazole; (terphenylyl)(dibenzothiophenyl)indolocarbazole; (terphenylyl)(dibenzothiophenyl)indolocarbazole; (terphenylyl)(dibenzoselenophenyl)indolocarbazole; (terphenylyl)(dibenzoselenophenyl)indolocarbazole; (terphenylyl)dibenzoselenophene-indolocarbazole; (terphenylyl)phenylcarbazole-indolocarbazole; (terphenylyl)(carbazolylphenyl)indolocarbazole; (terphenylyl)(benzothienopyridinyl)indolocarbazole; (terphenylyl)(benzothienopyrimidineyl)indolocarbazole; (terphenylyl)(benzothienopyrimidineyl)indolocarbazole; (terphenylyl)phenylbenzothienopyrimidineyl)indolocarbazole; (terphenylyl)(diphenyltriazinyl)indolocarbazole; (terphenylyl)(phenylquinazolinyl)indolocarbazole; (terphenylyl)(dibenzoquinazolinyl)indolocarbazole; (terphenylyl)(dibenzoquinoxalinyl)indolocarbazole; [(phenyl-$d_5$)biphenylyl](biphenylyl)indolocarbazole; [(phenyl-$d_5$)biphenylyl](phenyl-$d_5$)indolocarbazole; (terphenylyl)[(dimethyl-$d_6$)fluorene]indolocarbazole; (terphenylyl)(dibenzofuranylphenyl)indolocarbazole; (terphenylyl)(dibenzothiophenylphenyl)indolocarbazole; (terphenylyl)(triphenylenylphenyl)indolocarbazole; (terphenylyl)[(diphenyltriazinyl)phenyl]-indolocarbazole; (terphenylyl)(phenyl)indolocarbazole; (terphenylyl)(biphenylyl)indolocarbazole; (terphenylyl)(biphenylyl)indolocarbazole; di(terphenylyl)indolocarbazole; di(terphenylyl)indolocarbazole; (terphenylyl)(triphenylenyl)indolocarbazole; (terphenylyl)(dimethylfluorenyl)indolocarbazole; (terphenylyl)(spiro[cydohexanefluorene]yl)indolocarbazole; (terphenylyl)(spiro[cydopentanefluorene]yl)indolocarbazole; (terphenylyl)(spirobi[fluonene]yl)indolocarbazole; (terphenylyl)(dimethylfluorenyl)indolocarbazole; (terphenylyl)(dibenzofuranyl)indolocarbazole; (terphenylyl)

(dibenzofuranyl)indolocarbazole; (terphenylyl)(dibenzofuranyl)indolocarbazole; (terphenylyl)(dibenzothiophenyl) indolocarbazole; (terphenylyl)(dibenzothiophenyl) indolocarbazole; (terphenylyl)(dibenzothiophenyl) indolocarbazole; (terphenylyl)(dibenzoselenophenyl) indolocarbazole; (terphenylyl)(dibenzoselenophenyl) indolocarbazole; (terphenylyl)(dibenzoselenophenyl) indolocarbazole; (terphenylyl)(phenylcarbazolyl) indolocarbazole; (terphenylyl)[(carbazolyl)phenyl] indolocarbazole; (terphenylyl)(benzothienopyridinyl) indolocarbazole; (terphenylyl)(benzothienopyrimidineyl) indolocarbazole; (terphenylyl)(benzothienopyrimidineyl) indolocarbazole; (terphenylyl)(phenylbenzothienopyrimidineyl)indolocarbazole; (terphenylyl)(diphenylbenzothienopyrimidineyl)indolocarbazole; (terphenylyl)(diphenylbenzothienopyrimidineyl)indolocarbazole; (terphenylyl)(diphenyltriazinyl)indolocartoazole; (terphenylyl)(phenylquinazolinyl)indolocarbazole; (terphenylyl)(dibenzoquinazolinyl)indolocarbazole; (terphenylyl)(dibenzoquinoxalinyl)indolocarbazole; (terphenylyl)[(dimethyl-$d_6$)fluorenyl]indolocarbazole; (terphenylyl)[(diphenyltriazinyl)phenyl]indolocarbazole; [(phenyl-$d_5$)biphenylyl](biphenylyl)indolocarbazole; [(phenyl-$d_5$)biphenylyl](phenyl-$d_5$)indolocarbazole; (terphenylyl)(phenyl)indolocarbazole; (terphenylyl)(biphenylyl) indolocarbazole; (terphenylyl)(biphenylyl)indolocarbazole; di(terphenylyl)indolocarbazole; di{terphenylyl)indolocarbazole; (terphenylyl)(triphenylenyl)indolocarbazole; (terphenylyl)(dimethylfluorenyl)indolocarbazole; (terphenylyl)(spirobi[fluonene]yl)-indolocarbazole; (terphenylyl)(spiro[cydopentanefluorene]yl)indolocarbazole; (terphenylyl)(dibenzofuranyl)indolocarbazole; (terphenylyl)(dibenzofuranyl)indolocarbazole; (terphenylyl)(dibenzofuranyl)indolocarbazole; (terphenylyl)(dibenzothiophenyl)indolocarbazole; (terphenylyl)(dibenzothiophenyl)indolocarbazole; (terphenylyl)(dibenzothiophenyl)indolocarbazole; (terphenylyl)(diphenyltriazinyl)indolocarbazole; (terphenylyl)(phenylquinazolinyl)indolocarbazole; (terphenylyl)(benzothienopyrimidineyl)indolocarbazole; (terphenylyl)(phenyl)indolocarbazole; (terphenylyl)(biphenylyl) indolocarbazole; (terphenylyl)(biphenylyl)indolocarbazole; di(terphenylyl)indolocarbazole; di(terphenylyl)indolocarbazole; (terphenylyl)(triphenylenyl)indolocarbazole; (terphenylyl)(dimethylfluorenyl)indolocarbazole; (terphenylyl)(spirobi[fluorene]yl)-indolocarbazole; (terphenylyl)(spiro[cydopentanefluorene]yl)indolocarbazole; (terphenylyl)(dibenzofuranyl)indolocarbazole; (terphenylyl)(dibenzofuranyl)indolocarbazole; (terphenylyl)(dibenzofuranyl)indolocarbazole; (terphenylyl)(dibenzothiophenyl)indolocarbazole; (terphenylyl)(dibenzothiophenyl)indolocarbazole; (terphenylyl)(dibenzothiophenyl)indolocarbazole; (terphenylyl)(diphenyltriazinyl)indolocarbazole; (terphenylyl)(phenylquinazolinyl)indolocarbazole; (terphenylyl)(benzothienopyrimidineyl)indolocarbazole; (terphenylyl)(phenyl)indolocarbazole; (terphenylyl)(biphenylyl) indolocarbazole; (terphenylyl)(biphenylyl)indolocarbazole; di(terphenylyl)indolocarbazole; di(terphenylyl)indolocarbazole; (terphenylyl)(dimethylfluorenyl)indolocarbazole; (terphenylyl)(dibenzofuranyl)indolocarbazole; (terphenylyl)(dibenzothiophenyl)indolocarbazole; (terphenylyl)(dibenzothiophenyl)indolocarbazole; (terphenylyl)(benzothienopyridinyl)indolocarbazole; (terphenylyl)(benzothienopyrimidineyl)indolocarbazole; (terphenylyl)(diphenyltriazinyl)indolocarbazole; (terphenylyl)(phenylquinazolinyl)indolocarbazole; [(phenyl-$d_5$)biphenylyl[(biphenylyl)indolocarbazole; [(phenyl-$d_5$)biphenylyl](phenyl-$d_5$)indolocarbazole; (terphenylyl)(phenyl)indolocarbazole; (terphenylyl)(biphenylyl)indolocarbazole; (terphenylyl)(biphenylyl)indolocarbazole; (terphenylyl)(dibenzothiophenyl)indolocarbazole; (terphenylyl)(dibenzothiophenyl)indolocarbazole; dibenzofuranyl(diphenyltriazinyl)biphenyl; dibenzothiophenyl(diphenyltriazinyl)biphenyl; dibenzoselenophenyl(diphenyltriazinyl)biphenyl; dibenzofuranyl(diphenyltriazinyl)terbenzene; dibenzothiophenyl(diphenyltriazinyl)terbenzene; dibenzoselenophenyl(diphenyltriazinyl)terbenzene; dibenzofuranyl(diphenyltriazinyl)terbenzene; dibenzothiophenyl(diphenyltriazinyl)terbenzene; dibenzoselenophenyl(diphenyltriazinyl)terbenzene; (phenyldibenzofuranyl)(diphenyltriazinyl)biphenyl; (phenyldibenzothiophenyl)(diphenyltriazinyl)biphenyl; (phenyldibenzoselenophenyl)(diphenyltriazinyl)biphenyl; [(biphenylyl)dibenzofuranyl](diphenyltriazinyl)biphenyl; [(biphenylyl)phenyldibenzothiophenyl](diphenyltriazinyl)biphenyl; [(biphenylyl)phenyldibenzoselenophenyl](diphenyltriazinyl)biphenyl; [(biphenylyl)dibenzofuranyl](diphenyltriazinyl)biphenyl; [(biphenylyl)phenyldibenzothiophenyl](diphenyltriazinyl)biphenyl; [(biphenylyl)phenyldibenzoselenophenyl](diphenyltriazinyl)biphenyl; (phenyldibenzofuranyl)(diphenyltriazinyl)terbenzene; (phenyldibenzothiophenyl)(diphenyltriazinyl)terbenzene; (phenyldibenzoselenophenyl)(diphenyltriazinyl)terbenzene; (phenyldibenzofuranyl)(diphenyltriazinyl)terbenzene; (phenyldibenzothiophenyl)(diphenyltriazinyl)terbenzene; (phenyldibenzoselenophenyl)(diphenyltriazinyl)terbenzene; [biphenylyl(dibenzofuranyl)](diphenyltriazinyl)terbenzene; [biphenylyl(dibenzothiophenyl)](diphenyltriazinyl)terbenzene; [biphenylyl(dibenzoselenophenyl)](diphenyltriazinyl)terbenzene; dibenzofuranyl[phenyl(biphenylyl)triazinyl]biphenyl; dibenzothiophenyl[phenyl(biphenylyl)triazinyl]biphenyl; dibenzoselenophenyl[phenyl(biphenylyl)triazinyl]biphenyl; dibenzofuranyl[phenyl(biphenylyl)triazinyl]biphenyl; dibenzothiophenyl[phenyl(biphenylyl)triazinyl]biphenyl; dibenzoselenophenyl[phenyl(biphenylyl)triazinyl]biphenyl; dibenzofuranyl[bis(biphenylyl)triazinyl]biphenyl; dibenzothiophenyl[bis(biphenylyl)triazinyl]biphenyl; dibenzoselenophenyl[bis(biphenylyl)triazinyl]biphenyl; dibenzofuranyl[dimethylfluorenyl(biphenylyl)triazinyl]biphenyl; dibenzothiophenyl[dimethylfluorenyl(biphenylyl)triazinyl]biphenyl; dibenzoselenophenyl[dimethylfluorenyl(biphenylyl)triazinyl]biphenyl; phenyldibenzofuranyl[phenyl(biphenylyl)triazinyl]biphenyl; phenyldibenzothiophenyl[phenyl(biphenylyl)triazinyl]biphenyl; phenyldibenzoselenophenyl[phenyl(biphenylyl)triazinyl]biphenyl; phenyldibenzofuranyl[phenyl(biphenylyl)triazinyl]biphenyl; phenyldibenzothiophenyl[phenyl(biphenylyl)triazinyl]biphenyl; phenyldibenzoselenophenyl[phenyl(biphenylyl)triazinyl]biphenyl; phenyldibenzofuranyl[dimethylfluorenyl(biphenylyl)triazinyl]biphenyl; phenyldibenzothiophenyl[dimethylfluorenyl(biphenylyl)triazinyl]biphenyl; phenyldibenzoselenophenyl[dimethylfluorenyl(biphenylyl)triazinyl]biphenyl; dibenzofuranyl[phenyl(biphenylyl)triazinyl]terbenzene; dibenzothiophenyl[phenyl(biphenylyl)triazinyl]terbenzene; dibenzoselenophenyl[phenyl(biphenylyl)triazinyl]terbenzene; dibenzofuranyl[phenyl(biphenylyl)triazinyl]terbenzene; dibenzothiophenyl[phenyl(biphenylyl)triazinyl]terbenzene; dibenzoselenophenyl[phenyl(biphenylyl)triazinyl]terbenzene; dibenzofuranyl[dimethylfluorenyl(biphenylyl)triazinyl]terbenzene; dibenzothiophenyl[dimethylfluorenyl(biphenylyl)triazinyl]terbenzene; dibenzoselenophenyl[dimethylfluorenyl(biphenylyl)triazinyl]terbenzene; (biphenylyl)dibenzofuranyl[phenyl(biphenylyl)triazinyl]biphenyl; (biphenylyl)dibenzothiophenyl[phenyl(biphenylyl)triazinyl]biphenyl; (biphenylyl)dibenzoselenophenyl[phenyl(biphenylyl)triazinyl]biphenyl; (biphenylyl)dibenzofuranyl[phenyl(biphenylyl)triazinyl]biphenyl; (biphenylyl)dibenzothiophenyl[phenyl(biphenylyl)triazinyl]biphenyl; (biphenylyl)dibenzoselenophenyl[phenyl(biphenylyl)triazinyl]biphenyl; (biphenylyhdibenzofuranyl[dimethylfluorenyl(biphenylyl)triazinyl]biphenyl; (biphenylyhdibenzothiophenyl[dimethylfluorenyl(biphenylyl)triazinyl]biphenyl; (biphenylyhdibenzoselenophenyl[dimethylfluorenyl(biphenylyl)triazinyl]biphenyl; diphenyltriazinyl(dibenzofuranyl)terbenzene; diphenyltriazinyl(dibenzothiophenyl)]terbenzene; diphenyltriazinyl(dibenzoselenophenyl)terbenzene; dibenzofuranyl(diphenyltriazinyl)terbenzene; dibenzothiophenyl(diphenyltriazinyl)terbenzene; dibenzoselenophenyl(diphenyltriazinyl)terbenzene; dibenzofuranyl(diphenyltriazinyl)biphenyl; dibenzothiophenyl(diphenyltriazinyl)biphenyl; dibenzoselenophenyl(diphenyltriazinyl)biphenyl; dibenzofuranyl(diphenyltriazinyl)biphenyl; dibenzothiophenyl(diphenyltriazinyl)biphenyl; dibenzoselenophenyl(diphenyltriazinyl)biphenyl; dibenzofuranyl(diphenyltriazinyl)biphenyl; dibenzothiophenyl(diphenyltriazinyl)biphenyl; dibenzoselenophenyl(diphenyltriazinyl)biphenyl; dibenzofuranyl(diphenyltriazinyl)terbenzene; dibenzothiophenyl(diphenyltriazinyl)terbenzene; dibenzoselenophenyl(diphenyltriazinyl)terbenzene; dibenzofuranyl(diphenyltriazinyl)terbenzene; dibenzothiophenyl(diphenyltriazinyl)terbenzene; dibenzoselenophenyl(diphenyltriazinyl)terbenzene; dibenzofuranyl(diphenyltriazinyl)terbenzene; dibenzothiophenyl(diphenyltriazinyl)terbenzene; dibenzoselenophenyl(diphenyltriazinyl)terbenzene; diphenyldibenzofuranyl(diphenyltriazinyl)biphenyl; diphenyldibenzothiophenyl(diphenyltriazinyl)biphenyl; diphenyldibenzoselenophenyl(diphenyltriazinyl)biphenyl; diphenyldibenzofuranyl(diphenyltriazinyl)biphenyl; diphenyldibenzothiophenyl(diphenyltriazinyl)biphenyl; diphenyldibenzoselenophenyl(diphenyltriazinyl)biphenyl; phenyldibenzofuranyl(diphenyltriazinyl)biphenyl; phenyldibenzothiophenyl(diphenyltriazinyl)biphenyl; phenyldibenzoselenophenyl(diphenyltriazinyl)biphenyl; (phenyldibenzofuranyl)(diphenyltriazinyl)(pyridinyl)benzene; (phenyldibenzothiophenyl)(diphenyltriazinyl)(pyridinyl)benzene; (phenyldibenzoselenophenyl)(diphenyltriazinyl)(pyridinyl)benzene; (phenyldibenzofuranyl)(diphenyltriazinyl)(pyridinyl)benzene; (phenyldibenzothiophenyl)(diphenyltriazinyl)(pyridinyl)benzene; (phenyldibenzoselenophenyl)(diphenyltriazinyl)(pyridinyl)benzene; [(pyridinyl)dibenzofuranyl](diphenyltriazinyl)biphenyl; [(pyridinyl)dibenzothiophenyl](diphenyltriazinyl)biphenyl; [(pyridinyl)phenyldibenzoselenophenyl](diphenyltriazinyl)biphenyl; diphenyltriazinyl(dibenzofuranyl)terbenzene; diphenyltriazinyl(dibenzothiophenyl)terbenzene; diphenyltriazinyl(dibenzoselenophenyl)terbenzene; dibenzofuranyl(diphenyltriazinyl)terbenzene; dibenzothiophenyl(diphenyltriazinyl)terbenzene; dibenzoselenophenyl(diphenyltriazinyl)terbenzene; (dibenzofuranyl)(dimethylfluorenyl)(diphenyltriazinyl)benzene; (dibenzothiophenyl)(dimethylfluorenyl)(diphenyltriazinyl)benzene; (dibenzoselenophenyl)(dimethylfluorenyl)(diphenyltriazinyl)benzene; diphenyltriazinyl(dimethylfluorenyl)biphenyl; diphenyltriazinyl(spiro[cyclopentanefluorene]yl)biphenyl; diphenyltriazinyl(dimethylfluorenyl)terbenzene; diphenylfluorenyl(diphenyltriazinyl)biphenyl; dimethylfluorenyl[phenyl(biphenylyl)triazinyl]biphenyl; dimethylfluorenyl[phenyl(biphenylyl)triazinyl]biphenyl; dimethylfluorenyl[phenyl(dimethylfluorenyl)triazinyl]terbenzene; diphenyl[bis(dimethylfluorenyl)phenyl]triazine; phenyl(diphenyltriazinyl)dibenzofuran; phenyl(diphenyltriazinyl)dibenzothiophene; phenyl(diphenyltriazinyl)dibenzoselenophene; phenyl[phenyl(biphenylyl)triazinyl]dibenzofuran; phenyl[phenyl(biphenylyl)triazinyl]dibenzothiophene; phenyl[phenyl(biphenylyl)triazinyl]dibenzoselenophene; phenyl[phenyl(biphenylyl)triazinyl]dibenzofuran; phenyl[phenyl(biphenylyl)triazinyl]dibenzothiophene; phenyl[phenyl(biphenylyl)triazinyl]dibenzoselenophene; phenyl[bis(biphenylyl)triazinyl]dibenzofuran; phenyl[bis(biphenylyl)triazinyl]dibenzothiophene; phenyl[bis(biphenylyl)triazinyl]benzoselenophene; phenyl[bis(biphenylyl)triazinyl]dibenzofuran; phenyl[bis(biphenylyl)triazinyl]dibenzothiophene; phenyl[bis(biphenylyl)triazinyl]benzoselenophene; phenyl[bis(biphenylyl)triazinyl]dibenzofuran; phenyl[bis(biphenylyl)triazinyl]dibenzothiophene; phenyl[bis(biphenylyl)triazinyl]benzoselenophene; phenyl[(diphenyltriazinyl)phenyl]dibenzofuran; phenyl[(diphenyltriazinyl)phenyl]dibenzothiophene; phenyl[(diphenyltriazinyl)phenyl]benzoselenophene; phenyl{[phenyl(biphenylyl)triazinyl]phenyl}dibenzofuran; phenyl{[phenyl(biphenylyl)triazinyl]phenyl}dibenzothiophene; phenyl{[phenyl(biphenylyl)triazinyl]phenyl}benzoselenophene; phenyl{[phenyl(biphenylyl)triazinyl]phenyl}dibenzofuran; phenyl{[phenyl(biphenylyl)triazinyl]phenyl}dibenzothiophene; phenyl{[phenyl(biphenylyl)triazinyl]phenyl}benzoselenophene; phenyl[(diphenyltriazinyl)phenyl]dibenzofuran; phenyl[(diphenyltriazinyl)phenyl]dibenzothiophene; phenyl[(diphenyltriazinyl)phenyl]benzoselenophene; phenyl{[phenyl(biphenylyl)triazinyl]phenyl}dibenzofuran; phenyl{[phenyl(biphenylyl)triazinyl]phenyl}dibenzothiophene; phenyl{[phenyl(biphenylyl)triazinyl]phenyl}benzoselenophene; phenyl{[phenyl(biphenylyl)triazinyl]phenyl}dibenzofuran; phenyl{[phenyl(biphenylyl)triazinyl]phenyl}dibenzothiophene; phenyl{[phenyl(biphenylyl)triazinyl]phenyl}benzoselenophene; phenyldibenzofuran(diphenyltriazinyl)biphenyl; phenyldibenzothiophene(diphenyltriazinyl)biphenyl; phenylbenzoselenophene(diphenyltriazinyl)biphenyl; phenyldibenzofuran[phenyl(biphenylyl)triazinyl]biphenyl; phenyldibenzothiophene[phenyl(biphenylyl)triazinyl]biphenyl; phenylbenzoselenophene[phenyl(biphenylyl)triazinyl]biphenyl; phenyldibenzofuran[phenyl(biphenylyl)triazinyl]biphenyl; phenyldibenzothiophene[phenyl(biphenylyl)triazinyl]biphenyl; phenylbenzoselenophene[phenyl(biphenylyl)triazinyl]biphenyl; phenyldibenzofuran(diphenyltriazinyl)biphenyl; phenyldibenzothiophene(diphenyltriazinyl)biphenyl; phenylbenzoselenophene(diphenyltriazinyl)biphenyl; phenyldibenzofuran[phenyl(biphenylyl)triazinyl]biphenyl; phenyldibenzothiophene[phenyl(biphenylyl)triazinyl]biphenyl; phenylbenzoselenophene[phenyl(biphenylyl)triazinyl]biphenyl; phenyldibenzofuran[phenyl(biphenylyl)triazinyl]biphenyl; phenyldibenzothiophene[phenyl(biphenylyl)triazinyl]biphenyl; phenylbenzoselenophene[phenyl(biphenylyl)triazinyl]biphenyl; phenyldibenzofuran(diphenyltriazinyl)biphenyl; phenyldibenzothiophene(diphenyltriazinyl)biphenyl; phenylbenzoselenophene(diphenyltriazinyl)biphenyl; phenyldibenzofuran[phenyl(biphenylyl)triazinyl]biphenyl; phenyldibenzothiophene[phenyl(biphenylyl)triazinyl]biphenyl; phenylbenzoselenophene[phenyl(biphenylyl)triazinyl]biphenyl; phenyldibenzofuran[phenyl(biphenylyl)triazinyl]biphenyl; phenyldibenzothiophene[phenyl(biphenylyl)triazinyl]biphenyl; phenylbenzoselenophene[phenyl(biphenylyl)triazinyl]biphenyl; biphenylyl(diphenyltriazinyl)dibenzofuran; biphenylyl(diphenyltriazinyl)dibenzothiophene; biphenylyl(diphenyltriazinyl)benzoselenophene; biphenylyl[phenyl(biphenylyl)triazinyl]dibenzofuran; biphenylyl[phenyl(biphenylyl)triazinyl]dibenzothiophene; biphenylyl[phenyl(biphenylyl)triazinyl]benzoselenophene; biphenylyl[phenyl(biphenylyl)triazinyl]dibenzofuran; biphenylyl[phenyl(biphenylyl)triazinyl]dibenzothiophene; biphenylyl[phenyl(biphenylyl)triazinyl]benzoselenophene; biphenylyl[(diphenyltriazinyl)phenyl]dibenzofuran; biphenylyl[(diphenyltriazinyl)phenyl]dibenzothiophene; biphenylyl[(diphenyltriazinyl)phenyl]benzoselenophene; [(biphenylyl)dibenzofuranyl][phenyl(biphenylyl)triazinyl]benzene; [(biphenylyl)dibenzothiophenyl][phenyl(biphenylyl)triazinyl]benzene; [(biphenylyl)benzoselenophenyl][phenyl(biphenylyl)triazinyl]benzene; [(biphenylyl)dibenzofuranyl][phenyl(biphenylyl)triazinyl]benzene; [(biphenylyl)dibenzothiophenyl][phenyl(biphenylyl)triazinyl]benzene; [(biphenylyl)benzoselenophenyl][phenyl(biphenylyl)triazinyl]benzene; biphenylyl[(diphenyltriazinyl)phenyl]dibenzofuran; biphenylyl[(diphenyltriazinyl)phenyl]dibenzothiophene; biphenylyl[(diphenyltriazinyl)phenyl]benzoselenophene; [(biphenylyl)dibenzofuranyl][phenyl(biphenylyl)triazinyl]benzene; [(biphenylyl)dibenzothiophenyl][phenyl(biphenylyl)triazinyl]benzene; [(biphenylyl)benzoselenophenyl][phenyl(biphenylyl)triazinyl]benzene; [(biphenylyl)dibenzofuranyl][phenyl(biphenylyl)triazinyl]benzene; [(biphenylyl)dibenzothiophenyl][phenyl(biphenylyl)triazinyl]benzene; [(biphenylyl)benzoselenophenyl][phenyl(biphenylyl)triazinyl]benzene; biphenylyl(diphenyltriazinyl)dibenzofuran; biphenylyl(diphenyltriazinyl)dibenzothiophene; biphenylyl(diphenyltriazinyl)benzoselenophene; biphenylyl[phenyl(biphenylyl)triazinyl]dibenzofuran; biphenylyl[phenyl(biphenylyl)triazinyl]dibenzothiophene; biphenylyl[phenyl(biphenylyl)triazinyl]benzoselenophene; biphenylyl[phenyl(biphenylyl)triazinyl]dibenzofuran; biphenylyl[phenyl(biphenylyl)triazinyl]dibenzothiophene; biphenylyl[phenyl(biphenylyl)triazinyl]benzoselenophene; biphenylyl[(diphenyltriazinyl)phenyl]dibenzofuran; biphenylyl[(diphenyltriazinyl)phenyl]dibenzothiophene; biphenylyl[(diphenyltriazinyl)phenyl]benzoselenophene; [(biphenylyl)dibenzofuranyl][phenyl(biphenylyl)triazinyl]benzene; [(biphenylyl)dibenzothiophenyl][phenyl(biphenylyl)triazinyl]benzene; [(biphenylyl)benzoselenophenyl][phenyl(biphenylyl)triazinyl]benzene; [(biphenylyl)dibenzofuranyl][phenyl(biphenylyl)triazinyl]benzene; [(biphenylyl)dibenzothiophenyl][phenyl(biphenylyl)triazinyl]benzene; [(biphenylyl)benzoselenophenyl][phenyl(biphenylyl)triazinyl]benzene; biphenylyl[(diphenyltriazinyl)phenyl]dibenzofuran; biphenylyl[(diphenyltriazinyl)phenyl]dibenzothiophene; biphenylyl[(diphenyltriazinyl)phenyl]benzoselenophene; [(biphenylyl)dibenzofuranyl][phenyl(biphenylyl)triazinyl]benzene; [(biphenylyl)dibenzothiophenyl][phenyl(biphenylyl)triazinyl]benzene; [(biphenylyl)benzoselenophenyl][phenyl(biphenylyl)triazinyl]benzene; [(biphenylyl)dibenzofuranyl][phenyl(biphenylyl)triazinyl]benzene; [(biphenylyl)dibenzothiophenyl][phenyl(biphenylyl)triazinyl]benzene; [(biphenylyl)benzoselenophenyl][phenyl(biphenylyl)triazinyl]benzene; phenyl[phenyl(dimethylfluorenyl)triazinyl]dibenzofuran; phenyl[phenyl(dimethylfluorenyl)triazinyl]dibenzothiophene; phenyl[phenyl(dimethylfluorenyl)triazinyl]benzoselenophene; phenyl[biphenylyl(dimethylfluorenyl)triazinyl]dibenzofuran; phenyl[biphenylyl(dimethylfluorenyl)triazinyl]dibenzothiophene; phenyl[biphenylyl(dimethylfluorenyl)triazinyl]benzoselenophene; phenyl[biphenylyl(dimethylfluorenyl)triazinyl]dibenzofuran; phenyl[biphenylyl(dimethylfluorenyl)triazinyl]dibenzothiophene; phenyl[biphenylyl(dimethylfluorenyl)triazinyl]benzoselenophene; phenyldibenzofuranyl[phenyl(dimethylfluorenyl)triazinyl]benzene; phenyldibenzothiophenyl[phenyl(dimethylfluorenyl)triazinyl]benzene; phenylbenzoselenophenyl[phenyl(dimethylfluorenyl)triazinyl]benzene; phenyldibenzofuranyl[bis(dimethylfluorenyl)triazinyl]benzene; phenyldibenzothiophenyl[bis(dimethylfluorenyl)triazinyl]benzene; phenylbenzoselenophenyl[bis(dimethylfluorenyl)triazinyl]benzene; biphenylyl[phenyl(dimethylfluorenyl)triazinyl]dibenzofuran; biphenylyl[phenyl(dimethylfluorenyl)triazinyl]dibenzothiophene; biphenylyl[phenyl(dimethylfluorenyl)triazinyl]benzoselenophene; biphenylyl[phenyl(dimethylfluorenyl)triazinyl]dibenzofuran; biphenylyl[phenyl(dimethylfluorenyl)triazinyl]dibenzothiophene; biphenylyl[phenyl(dimethylfluorenyl)triazinyl]benzoselenophene; [(biphenylyl)dibenzofuranyl][phenyl(dimethylfluorenyl)triazinyl]benzene; [(biphenylyl)dibenzothiophenyl][phenyl(dimethylfluorenyl)triazinyl]benzene; [(biphenylyl)benzoselenophenyl][phenyl(dimethylfluorenyl)triazinyl]benzene; [(biphenylyl)dibenzofuranyl][phenyl(dimethylfluorenyl)triazinyl]benzene; [(biphenylyl)dibenzothiophenyl][phenyl(dimethylfluorenyl)triazinyl]benzene; [(biphenylyl)benzoselenophenyl][phenyl(dimethylfluorenyl)triazinyl]benzene; phenyl[phenyl(dimethylfluorenylphenyl)triazinyl]dibenzofuran; phenyl[phenyl(dimethylfluorenylphenyl)triazinyl]dibenzothiophene; phenyl[phenyl(dimethylfluorenylphenyl)triazinyl]benzoselenophene; phenyl[phenyl(dimethylfluorenyl)triazinyl]dibenzofuran; phenyl[phenyl(dimethylfluorenyl)triazinyl]dibenzothiophene; phenyl[phenyl(dimethylfluorenyl)triazinyl]benzoselenophene; phenyl[(biphenylyl)dibenzofuranyl](dimethylfluorenyl)triazine; phenylpiphenylyhdibenzothiophenylKdimethylfluorenyl)triazine; phenyl[(biphenylyl)benzoselenophenylKdimethylfluorenyl)triazine; [(biphenylyl)dibenzofuranyl][phenyl(dimethylfluorenyl)triazinyl]benzene; [(biphenylyl)dibenzothiophenyl][phenyl(dimethylfluorenyl)triazinyl]benzene; [(biphenylyl)benzoselenophenyl][phenyl(dimethylfluorenyl)triazinyl]benzene; phenyl(phenyldibenzofuranyl)(phenyldimethylfluorenyl)triazine; phenyl(phenyldibenzothiophenyl)(phenyldimethylfluorenyl)triazine; phenyl(phenylbenzoselenophenyl)(phenyldimethylfluorenyl)triazine; phenyl(phenyldibenzofuranyl)(dimethylfluorenyl)triazine; phenyl(phenyldibenzothiophenyl)(dimethylfluorenyl)triazine; phenyl(phenylbenzoselenophenyl)(dimethylfluorenyl)triazine; diphenyl(phenyldibenzofuranyl)triazine; diphenyl(phenyldibenzothiophenyl)triazine; diphenyl(phenylbenzoselenophenyl)triazine; diphenyltriazinyl(phenyldibenzofuranyl)benzene; diphenyltriazinyl(phenyldibenzothiophenyl)benzene; diphenyltriazinyl(phenylbenzoselenophenyl)benzene; diphenyltriazinyl[(biphenylyl)dibenzofuranyl]benzene; diphenyltriazinyl[(biphenylyl)dibenzothiophenyl]benzene; diphenyltriazinyl[(biphenylyl)benzoselenophenyl]benzene; diphenyltriazinyl(diphenyldibenzofuranyl)benzene; diphenyltriazinyl(diphenyldibenzothiophenyl)benzene; diphenyltriazinyl(diphenylbenzoselenophenyl)benzene; diphenyl(phenyldibenzofuranyl)triazine; diphenyl(phenyldibenzothiophenyl)triazine; diphenyl(phenylbenzoselenophenyl)triazine; diphenyl[(biphenylyl)dibenzofuranyl]triazine; diphenyl[(biphenylyl)dibenzothiophenyl]triazine; diphenyl[(biphenylyl)

benzoselenophenyl]triazine; diphenyl[(biphenylyl)dibenzofuranyl]triazine; diphenyl[(biphenylyl)dibenzothiophenyl] triazine; diphenyl[(biphenylyl)benzoselenophenyl]triazine; diphenyltriazinyl(diphenyldibenzofuranyl)benzene; diphenyltriazinyl(diphenyldibenzothiophenyl)benzene; diphenyltriazinyl(diphenylbenzoselenophenyl)benzene; diphenyltriazinyl(biphenylyldibenzofuranyl)benzene; diphenyltriazinyl(biphenylyldibenzothiophenyl)benzene; diphenyltriazinyl(biphenylylbenzoselenophenyl)benzene; diphenyl[phenyldibenzofuranyl]triazine; diphenyl[phenyldibenzothiophenyl]triazine; diphenyl[phenylbenzoselenophenyl]triazine; diphenyltriazinyl(phenyldibenzofuranyl) benzene; diphenyltriazinyl(phenyldibenzothiophenyl) benzene; diphenyltriazinyl(phenylbenzoselenophenyl) benzene; diphenyltriazinyl(phenyldibenzofuranyl)benzene; diphenyltriazinyl(phenyldibenzothiophenyl)benzene; diphenyltriazinyl(phenylbenzoselenophenyl)benzene; diphenyltriazinyl(biphenylyldibenzofuranyl)benzene; diphenyltriazinyl(biphenylyldibenzothiophenyl)benzene; diphenyltriazinyl(biphenylylbenzoselenophenyl)benzene; diphenyltriazinyl(biphenylyldibenzofuranyl)benzene; diphenyltriazinyl(biphenylyldibenzothiophenyl)benzene; diphenyltriazinyl(biphenylylbenzoselenophenyl)benzene; diphenyltriazinyl(phenyldibenzofuranyl)benzene; diphenyltriazinyl(phenyldibenzothiophenyl)benzene; diphenyltriazinyl(phenylbenzoselenophenyl)benzene; diphenyltriazinyl (phenyldibenzofuranyl)pyridine; diphenyltriazinyl (phenyldibenzothiophenyl)pyridine; diphenyltriazinyl (phenylbenzoselenophenyl)pyridine; phenyl (phenylpyridinyl)triazinyl(phenyldibenzofuranyl)pyridine; phenyl(phenylpyridinyl)triazinyl(phenyldibenzothiophenyl) pyridine; phenyl(phenylpyridinyl)triazinyl(phenylbenzoselenophenyl)pyridine; phenyl(phenylpyridinyl)triazinyl(phenyldibenzofuranyl)benzene; phenyl(phenylpyridinyl) triazinyl(phenyldibenzothiophenyl)benzene; phenyl (phenylpyridinyl)triazinyl(phenylbenzoselenophenyl) benzene; diphenyltriazinyl(biphenylyldibenzofuranyl) pyridine; diphenyltriazinyl(biphenylyldibenzothiophenyl) pyridine; diphenyltriazinyl(biphenylylbenzoselenophenyl) pyridine; phenyl(dimethylindenopyridinyl) (phenyldibenzofuranyl)triazine; phenyl (dimethylindenopyridinyl)(phenyldibenzothiophenyl) triazine; phenyl(dimethylindenopyridinyl) (phenylbenzoselenophenyl)triazine; (biphenylyl) (dimethylindenopyridinyl)(phenyldibenzofuranyl)triazine; (biphenylyl)(dimethylindenopyridinyh(phenyldibenzothiophenyl)triazine; (biphenylyl)(dimethylindenopyridinyh (phenylbenzoselenophenyl)triazine; phenyl(dimethylindenopyridinyl)(phenyldibenzofuranyl)triazine; phenyl (dimethylindenopyridinyl)(phenyldibenzothiophenyl) triazine; phenyl(dimethylindenopyridinyl) (phenylbenzoselenophenyl)triazine; phenyl(spiro [cyclohexaneindenopyridine]yl)(phenyldibenzofuranyl) triazine; phenyl(spiro[cyclohexaneindenopyridine]yl) (phenyldibenzothiophenyl)triazine; phenyl(spiro [cyclohexaneindenopyridine]yl)(phenylbenzoselenophenyl) triazine; phenyl(spirobi[fluorene]yl)(phenyldibenzofuranyl) triazine; phenyl(spirobi[fluorene]yl) (phenyldibenzothiophenyl)triazine; phenyl(spirobi [fluorene]yl)(phenylbenzoselenophenyl)triazine; benzened$_3$ [(diphenyl-d$_{10}$)triazinyl][(phenyl-d$_5$)dibenzofuranyl-d$_6$]; benzened$_3$[(diphenyl-d$_{10}$)triazinyl][(phenyl-d$_5$)dibenzothiophenyl-d$_6$]; benzened$_3$[(diphenyl-d$_{10}$)triazinyl][(phenyl-d$_5$)benzoselenophenyl-d$_6$]; benzened$_3$[(diphenyl-d$_{10}$)triazinyl][(biphenylyl-d$_8$)dibenzofuranyl-d$_6$]; benzened$_3$ [(diphenyl-d$_{10}$)triazinyl][(biphenylyl-d$_8$) dibenzothiophenyl-d$_6$]; benzened$_3$[(diphenyl-d$_{10}$)triazinyl] [(biphenylyl-d$_8$)benzoselenophenyl-d$_6$]; phenyl[(dimethyl-d$_6$)fluorene][phenyldibenzofuranyl]triazine; phenyl [(dimethyl-d$_6$)fluorene][phenyldibenzothiophenyl]triazine; phenyl[(dimethyl-d$_6$)fluorene][phenylbenzoselenophenyl] triazine; benzened$_3$[(diphenyl-d$_{10}$)triazinyl][(biphenylyl-d$_8$) dibenzofuranyl-d$_6$]; benzened$_3$[(diphenyl-d$_{10}$)triazinyl][(biphenylyl-d$_8$)dibenzothiophenyl-d$_6$]; benzened$_3$[(diphenyl-d$_{10}$)triazinyl][(biphenylyl-d$_8$)benzoselenophenyl-d$_6$]; [(diphenyl-d$_{10}$)triazinyl][(biphenylyl)dibenzofuranyl]benzene; [(diphenyl-d$_{10}$)triazinyl][(biphenylyl)dibenzothiophenyl]benzene; [(diphenyl-d$_{10}$)triazinyl][(biphenylyl)benzoselenophenyl]benzene; (diphenyltriazinyl)[(biphenylyl) dibenzofuranyl]biphenyl; (diphenyltriazinyl)[(biphenylyl) dibenzothiophenyl]biphenyl; (diphenyltriazinyl) [(biphenylyl)benzoselenophenyl]biphenyl; [bis (fluorophenyl)triazinyl][(biphenylyl)dibenzofuranyl] benzene; [bis(fluorophenyl)triazinyl][(biphenylyl) dibenzothiophenyl]benzene; [bis(fluorophenyl)triazinyl] [(biphenylyl)benzoselenophenyl]benzene; diphenyltriazinyl [(dimethylfluorenyl)dibenzofuranyl]benzene; diphenyltriazinyl[(dimethylfluorenyl)dibenzothiophenyl] benzene; diphenyltriazinyl[(dimethylfluorenyl)benzoselenophenyl]benzene; diphenyltriazinyl[(dimethylfluorenyl) dibenzofuranyl]biphenyl; diphenyltriazinyl [(dimethylfluorenyl)dibenzothiophenyl]biphenyl; diphenyltriazinyl[(dimethylfluorenyl)benzoselenophenyl] biphenyl; diphenyltriazinyl[(dimethylfluorenyl)dibenzofuranyl]biphenyl; diphenyltriazinyl[(dimethylfluorenyl) dibenzothiophenyl]biphenyl; diphenyltriazinyl [(dimethylfluorenyl)benzoselenophenyl]biphenyl; diphenyltriazinyl[(dimethylfluorenyl)dibenzofuranyl]biphenyl; diphenyltriazinyl[(dimethylfluorenyl)dibenzothiophenyl]biphenyl; diphenyltriazinyl[(dimethylfluorenyl)benzoselenophenyl]biphenyl; diphenyltriazinyl [(dimethylfluorenyl)dibenzofuranyl]pyridine; diphenyltriazinyl[(dimethylfluorenyl)dibenzothiophenyl] pyridine; diphenyltriazinyl[(dimethylfluorenyl)benzoselenophenyl]pyridine; diphenyltriazinyl[(dimethylfluorenyl) dibenzofuranyl]benzene; diphenyltriazinyl [(dimethylfluorenyl)dibenzothiophenyl]benzene; diphenyltriazinyl[(dimethylfluorenyl)benzoselenophenyl] benzene; diphenyltriazinyl[(dimethylfluorenyl)dibenzofuranyl]benzene; diphenyltriazinyl[(dimethylfluorenyl)dibenzothiophenyl]benzene; diphenyltriazinyl[(dimethylfluorenyl) benzoselenophenyl]benzene; diphenyltriazinyl [(dimethylfluorenyl)dibenzofuranyl]benzene; diphenyltriazinyl[(dimethylfluorenyl)dibenzothiophenyl] benzene; diphenyltriazinyl[(dimethylfluorenyl)benzoselenophenyl]benzene; diphenyltriazinyl[(dimethylfluorenyl) dibenzofuranyl]benzene; diphenyltriazinyl [(dimethylfluorenyl)dibenzothiophenyl]benzene; diphenyltriazinyl[(dimethylfluorenyl)benzoselenophenyl] benzene; diphenyltriazinyl[(dimethylfluorenyl)dibenzofuranyl]biphenyl; diphenyltriazinyl[(dimethylfluorenyl)dibenzothiophenyl]biphenyl; diphenyltriazinyl [(dimethylfluorenyl)benzoselenophenyl]biphenyl; [phenyl (biphenylyl)triazinyl][(dimethylfluorenyl)dibenzofuranyl] benzene; [phenyl(biphenylyl)triazinyl][(dimethylfluorenyl) dibenzothiophenyl]benzene; [phenyl(biphenylyl)triazinyl] [(dimethylfluorenyl)benzoselenophenyl]benzene; [phenyl (biphenylyl)triazinyl][(dimethylfluorenyl)dibenzofuranyl] benzene; [phenyl(biphenylyl)triazinyl][(dimethylfluorenyl) dibenzothiophenyl]benzene; [phenyl(biphenylyl)triazinyl] [(dimethylfluorenyl)benzoselenophenyl]benzene; [phenyl (dimethylfluorenyl)triazinyl][(dimethylfluorenyl) dibenzofuranyl]benzene; [phenyl(dimethylfluorenyl) triazinyl][(dimethylfluorenyl)dibenzothiophenyl]benzene;

[phenyl(dimethylfluorenyl)triazinyl][(dimethylfluorenyl)benzoselenophenyl]benzene; diphenyltriazinyl[(dimethylfluorenyl)dibenzofuranyl]benzene; diphenyltriazinyl[(dimethylfluorenyl)dibenzothiophenyl]benzene; diphenyltriazinyl[(dimethylfluorenyl)benzoselenophenyl]benzene; diphenyltriazinyl[bis(dimethylfluorenyl)dibenzofuranyl]benzene; diphenyltriazinyl[bis(dimethylfluorenyl)dibenzothiophenyl]benzene; diphenyltriazinyl[bis(dimethylfluorenyl)benzoselenophenyl]benzene; [phenyl(terphenylyl)triazinyl][(dimethylfluorenyl)dibenzofuranyl]benzene; [phenyl(terphenylyl)triazinyl]triazinyl[(dimethylfluorenyl)dibenzothiophenyl]benzene; [phenyl(terphenylyl)triazinyl][(dimethylfluorenyl)benzoselenophenyl]benzene; diphenyltriazinyl[(spiro[cyclopentanefluorene]yl)dibenzofuranyl]benzene; diphenyltriazinyl[(spiro[cyclopentanefluorene]yl)dibenzothiophenyl]benzene; diphenyltriazinyl[(spiro[cyclopentanefluorene]yl)benzoselenophenyl]benzene; diphenyltriazinyl[(diphenylfluorenyl)dibenzofuranyl]benzene; diphenyltriazinyl[(diphenylfluorenyl)dibenzothiophenyl]benzene; diphenyltriazinyl[(diphenylfluorenyl)benzoselenophenyl]benzene; diphenyltriazinyl[(spirobi[fluorene]yl)dibenzofuranyl]benzene; diphenyltriazinyl[(spirobi[fluorene]yl)dibenzothiophenyl]benzene; diphenyltriazinyl[(spirobi[fluorene]yl)benzoselenophenyl]benzene; diphenyltriazinyl[phenyl(dimethylfluorenyl)dibenzofuranyl]benzene; diphenyltriazinyl[phenyl(dimethylfluorenyl)dibenzothiophenyl]benzene; diphenyltriazinyl[phenyl(dimethylfluorenyl)benzoselenophenyl]benzene; diphenyltriazinyl[phenyl(dimethylfluorenyl)dibenzofuranyl]benzene; diphenyltriazinyl[phenyl(dimethylfluorenyl)dibenzothiophenyl]benzene; diphenyltriazinyl[phenyl(dimethylfluorenyl)benzoselenophenyl]benzene; [(diphenyltriazinyl)phenyl](phenyldimethylfluorenyl)dibenzofuran; [(diphenyltriazinyl)phenyl](phenyldimethylfluorenyl)dibenzothiophene; [(diphenyltriazinyl)phenyl](phenyldimethylfluorenyl)benzoselenophene; diphenyltriazinyl{[(dimethyl-$d_6$)fluorenyl]dibenzofuranyl}benzene; diphenyltriazinyl{[(dimethyl-$d_6$)fluorenyl]dibenzothiophenyl]benzene; diphenyltriazinyl{[(dimethyl-$d_6$)fluorenypenzoselenophenyl}benzene; diphenyltriazinyl[(dimethylfluorenyl)dibenzofuranyl]benzene; diphenyltriazinyl[(dimethylfluorenyl)dibenzothiophenyl]benzene; diphenyltriazinyl[(dimethylfluorenyl)benzoselenophenyl]benzene; diphenyltriazinyl[(dimethylfluorenyl)dibenzofuranyl]benzene; diphenyltriazinyl[(dimethylfluorenyl)dibenzothiophenyl]benzene; diphenyltriazinyl[(dimethylfluorenyl)benzoselenophenyl]benzene; diphenyltriazinyl[(dimethylfluorenyl)dibenzofuranyl]benzene; diphenyltriazinyl[(dimethylfluorenyl)dibenzothiophenyl]benzene; diphenyltriazinyl[(dimethylfluorenyl)benzoselenophenyl]benzene; diphenyltriazinyl[(dimethylfluorenyl)dibenzofuranyl]benzene; diphenyltriazinyl[(dimethylfluorenyl)dibenzothiophenyl]benzene; diphenyltriazinyl[(dimethylfluorenyl)benzoselenophenyl]benzene; diphenyltriazinyl[phenyl(dimethylfluorenyl)dibenzofuranyl]benzene; diphenyltriazinyl[phenyl(dimethylfluorenyl)dibenzothiophenyl]benzene; diphenyltriazinyl[phenyl(dimethylfluorenyl)benzoselenophenyl]benzene; diphenyltriazinyl[phenyl(dimethylfluorenyl)dibenzofuranyl]benzene; diphenyltriazinyl[phenyl(dimethylfluorenyl)dibenzothiophenyl]benzene; diphenyltriazinyl[phenyl(dimethylfluorenyl)benzoselenophenyl]benzene; diphenyltriazinyl[(dimethylfluorenyl)dibenzofuranyl]benzene; diphenyltriazinyl[(dimethylfluorenyl)dibenzothiophenyl]benzene; diphenyltriazinyl[(dimethylfluorenyl)benzoselenophenyl]benzene; [(diphenyl-$d_{10}$)triazinyl][(dimethylfluorenyl)dibenzofuranyl]benzene; [(diphenyl-$d_{10}$)triazinyl][(dimethylfluorenyl)dibenzothiophenyl]benzene; [(diphenyl-$d_{10}$)triazinyl][(dimethylfluorenyl)benzoselenophenyl]benzene; benzene-$d_4$[(diphenyl-$d_{10}$)triazinyl][(dimethylfluorenyl)dibenzofuranyl]; benzene-$d_4$[(diphenyl-$d_{10}$)triazinyl][(dimethylfluorenyl)dibenzothiophenyl]; benzene-$d_4$[(diphenyl-$d_{10}$)triazinyl][(dimethylfluorenyl)benzoselenophenyl]; [(diphenyl-$d_{10}$)triazinyl]{[(dimethyl-$d_6$)fluorenyl]dibenzofuranyl}benzene; [(diphenyl-$d_{10}$)triazinyl]{[(dimethyl-$d_6$)fluorenyl]dibenzothiophenyl}benzene; [(diphenyl-$d_{10}$)triazinyl]{[(dimethyl-$d_6$)fluorenyl]benzoselenophenyl}benzene; benzene-$d_4$[(diphenyl-$d_{10}$)triazinyl][(dimethylfluorenyl)dibenzofuranyl]; benzene-$d_4$[(diphenyl-$d_{10}$)triazinyl][(dimethylfluorenyl)dibenzothiophenyl]; benzene-$d_4$[(diphenyl-$d_{10}$)triazinyl][(dimethylfluorenyl)benzoselenophenyl]

(Group 19A)

phenyl[phenyl(biphenylyl)triazinyl]indenocarbazole; biphenylyl[phenyl(biphenylyl)triazinyl]indenocarbazole; biphenylyl[phenyl(biphenylyl)triazinyl]indenocarbazole; (dimethyl)(phenyl)[phenyl(biphenylyl)triazinyl]indenocarbazole; triphenyl[phenyl(biphenylyl)triazinyl]indenocarbazole; phenyl(dipyridinyl)[phenyl(biphenylyl)triazinyl]indenocarbazole; biphenylyl[phenyl(biphenylyl)triazinyl]indenocarbazole; phenyl[phenyl(biphenylyl)triazinyl]indenocarbazole; biphenylyl[phenyl(biphenylyl)triazinyl]indenocarbazole; terphenylyl[phenyl(biphenylyl)triazinyl]indenocarbazole; terphenylyl[phenyl(biphenylyl)triazinyl]indenocarbazole; [di(n-hexyl)](phenyl)[phenyl(biphenylyl)triazinyl]indenocarbazole; (dinaphthaleyl)(phenyl)[phenyl(biphenylyl)triazinyl]indenocarbazole; (diquinolinyl)(phenyl)[phenyl(biphenylyl)triazinyl]indenocarbazole; phenyl[phenyl(biphenylyl)triazinyl]indenocarbazole; biphenylyl [phenyl (biphenylyl)triazinyl]indenocarbazole; biphenylyl [phenyl (biphenylyl)triazinyl]indenocarbazole; phenyl[bis(dibenzofuranyl)][phenyl(biphenylyl)triazinyl]indenocarbazole; phenyl[bis(carbazolyl)][phenyl(biphenylyl)triazinyl]indenocarbazole; phenyl[bis(biphenylyl)triazinyl]indenocarbazole; phenyl[bis(biphenylyl)triazinyl]indenocarbazole; (biphenylyl)[bis(biphenylyl)triazinyl]indenocarbazole; (biphenylyl)[phenyl(biphenylyl)triazinyl]indenocarbazole; phenyl[bis(biphenylyl)triazlnyl]indenocarbazole; phenyl[bis(biphenylyl)triazinyl]indenocarbazole; (biphenylyl)[bis(biphenylyl)triazinyl]indenocarbazole; (biphenylyl)[bis(biphenylyl)triazinyl]indenocarbazole; phenyl[bis(biphenylyl)triazinyl]indenocarbazole; (biphenylyl)[bis(biphenylyl)triazinyl]indenocarbazole; (biphenylyl)[bis(biphenylyl)triazinyl]indenocarbazole; phenyl[phenyl(terphenylyl)triazinyl]indenocarbazole; phenyl[bis(terphenylyl)triazinyl]indenocarbazole; phenyl[phenyl(biphenylyl)triazinyl]indenocarbazole; phenyl[bis(biphenylyl)triazinyl]indenocarbazole; phenyl[bis(biphenylyl)triazinyl)indenocarbazole; phenyl[bis(biphenylyl)triazinyl]indenocarbazole; (biphenylyl)[phenyl(biphenylyl)triazinyl]indenocarbazole; (dimethyl)(phenyl)[phenyl(biphenylyl)triazinyl]indenocarbazole; phenyl[phenyl(biphenylyl)triazinyl]indenocarbazole; phenyl[bis(biphenylyl)triazinyl]indenocarbazole; (biphenylyl)[phenyl(biphenylyl)triazinyl[indenocarbazole; (terphenylyl)[phenyl(biphenylyl)triazinyl]indenocarbazole; phenyl[phenyl(biphenylyl)triazinyl]indenocarbazole; phenyl[phenyl(biphenylyl)triazinyl]indenocarbazole; phenyl[phenyl(biphenylyl)triazinyl]indenocarbazole; phenyl[bis(biphenylyl)triazlnyl]indenocarbazole; phenyl[bis(biphenylyl)triazinyl]indenocarbazole; phenyl[bis (biphenylyl)triazinyl]indenocartoazole; (biphenylyl)[phenyl (biphenylyl)triazinyl]indenocarbazole; (terphenylyl)[phenyl (biphenylyl)triazinyl]indenocarbazole; phenyl[phenyl (biphenylyl)triazinyl]indenocarbazole; phenyl[phenyl (biphenylyl)triazinyl]indenocarbazole; phenyl[phenyl (biphenylyl)triazinyl]indenocarbazole; phenyl[phenyl (terphenylyl)triazinyl]indenocarbazole; phenyl[bis (biphenylyl)triazinyl]indenocarbazolei phenyl[bis (biphenylyl)triazinyl]indenocarbazole; phenyl[bis (biphenylyl)triazinyl]indenocarbazole; (biphenylyl)[phenyl (biphenylyl)triazinyl]indenocarbazole; phenyl[phenyl (biphenylyl)triazinyl]indenocarbazole; phenyl[phenyl (biphenylyl)triazinyl]indenocarbazole; phenyl[phenyl (biphenylyl)triazinyl]indenocarbazole; phenyl[phenyl (terphenylyl)triazinyl]indenocarbazole; phenyl[phenyl (terphenylyl)triazinyl]indenocarbazole; (biphenylyl)[phenyl (biphenylyl)triazinyl]indenocarbazole; (biphenylyl)[phenyl (biphenylyl)triazinyl]indenocarbazole; phenyl[bis (biphenylyl)triazinyl]indenocarbazole; phenyl[bis (biphenylyl)triazinyl]indenocarbazole; phenyl[phenyl (biphenylyl)triazinyl]indenocarbazole; phenyl[phenyl (biphenylyl)triazinyl]indenocarbazole; phenyl[phenyl (terphenylyl)triazinyl]indenocarbazole; phenyl[(biphenylyl) (terphenylyl)triazinyl]indenocarbazole; (biphenylyl)[phenyl (biphenylyl)triazinyl]indenocarbazole; phenyl[bis (biphenylyl)triazinyl]indenocarbazole; phenyl[bis (biphenylyl)triazinyl]indenocarbazole; (biphenylyl)[phenyl (biphenylyl)triazlnyl]indenocartoazole; phenyl(naphthaleyl) bi(carbazole); bi[(naphthaleyl)carbazole]; (biphenylyl) (naphthaleyl)bi(carbazole); (biphenylyl)(naphthaleyl)bi (carbazole); (terphenylyl)(naphthaleyl)bi(carbazole); [(naphthaleyl)phenyl](naphthaleyl)bi(cartoazole); bi[(naphthaleyl)carbazole]; (phenanthnenyl)(naphthaleyl)bi(carbazole); (phenylanthraceneyl)(naphthaleyl)bi(carbazole); phenyl(naphthaleyl)bi(carbazole); bi[(naphthaleyl)carbazole]; (biphenylyl)(naphthaleyl)bi(carbazole); (biphenylyl)(naphthaleyl)bi(carbazole); (terphenylyl)(naphthaleyl)bi(carbazole); [(naphthaleyl)phenyl](naphthaleyl)bi(carbazole); bi[(naphthaleyl)carbazole]; (phenanthrenyl)(naphthaleyl)bi (carbazole); (phenylanthraceneyl)(naphthaleyl)bi(carbazole); phenyl(phenanthrenyl)bi(carbazole); (phenanthrenyl) (biphenylyl)bi(carbazole); (phenanthrenyl)(biphenylyl)bi (carbazole); (terphenylyl)(phenanthrenyl)bi(carbazole); (phenanthrenyl)[(naphthaleyl)phenyl]bi(carbazole); bi[(phenanthrenyl)carbazole]; (phenylanthraceneyl) (phenanthrenyl)bi(carbazole); phenyl(naphthaleyl)bi(carbazole); bi[(naphthaleyl)carbazole]; phenyl(naphthaleyl)bi (carbazole); bi[(naphthaleyl)carbazole]; phenyl (phenanthrenyl)bi(carbazole); bi[(phenanthrenyl) carbazole]; phenyl(anthraceneyl)bi(carbazole); bi[(anthraceneyl)carbazole]; phenyl(naphthaleyl)bi(carbazole); bi[(naphthaleyl)carbazole]; phenyl(naphthaleyl)bi (carbazole); bi[(naphthaleyl)carbazole]; phenyl(phenanthrenyl)bi(carbazole); bi[(phenanthrenyl)carbazole]; phenyl (anthraceneyl)bi(carbazole); bi[(anthraceneyl)carbazole]; phenyl(naphthaleyl)bi(carbazole); bi[(naphthaleyl)carbazole]; phenyl(naphthaleyl)bi(carbazole); bi[(naphthaleyl) carbazole]; phenyl(phenanthrenyl)bi(carbazole); bi[(phenanthrenyl)carbazole]; phenyl(naphthaleyl)bi(carbazole); bi[(naphthaleyl)carbazole]; phenyl(naphthaleyl)bi (carbazole); phenyl(naphthaleyl)bi(carbazole); bi[(naphthaleyl)carbazole]; phenyl(naphthaleyl)bi(carbazole); phenyl (phenanthrenyl)bi(carbazole); bi[(phenanthrenyl) carbazole]; phenyl(phenanthrenyl)bi(carbazole); phenyl (anthraceneyl)bi(carbazole); phenyl(naphthaleyl)bi (carbazole); phenyl(naphthaleyl)bi(carbazole); bi[(naphthaleyl)carbazole]; phenyl(naphthaleyl)bi(carbazole); phenyl(phenanthrenyl)bi(carbazole); phenyl(anthraceneyl)bi(carbazole); phenyl(naphthaleyl)bi(carbazole); phenyl(naphthaleyl)bi(carbazole); bi[(naphthaleyl)carbazole]; phenyl(naphthaleyl)bi(carbazole); phenyl(naphthaleyl)bi(carbazole); bi[(naphthaleyl)carbazole]; phenyl (phenanthrenyl)bi(carbazole); phenyl(phenanthrenyl)bi (carbazole); bi[(phenanthrenyl)carbazole]; phenyl (anthraceneyl)bi(carbazole); phenyl(anthraceneyl)bi (carbazole); bi[(anthraceneyl)carbazole]

(Group 20A)

(dibenzofuranyl)(diphenyltriazinyl)biphenyl; (dibenzothiophenyl)(diphenyltriazinyl)biphenyl; (dibenzoselenophenyl)(diphenyltriazinyl)biphenyl; (dibenzofuranyl)(diphenyltriazinyl)terbenzene; (dibenzothiophenyl) (diphenyltriazinyl)terbenzene; (dibenzoselenophenyl) (diphenyltriazinyl)terbenzene; (dibenzofuranyl) (diphenyltriazinyl)terbenzene; (dibenzothiophenyl) (diphenyltriazinyl)terbenzene; (dibenzoselenophenyl) (diphenyltriazinyl)terbenzene; (phenyldibenzofuranyl) (diphenyltriazinyl)biphenyl; (phenyldibenzothiophenyl) (diphenyltriazinyl)biphenyl; (phenyldibenzoselenophenyl) (diphenyltriazinyl)biphenyl; [(biphenylyl)dibenzofuranyl] (diphenyltriazinyl)biphenyl; [(biphenylyl) dibenzothiophenyl](diphenyltriazinyl)biphenyl; [(biphenylyl)dibenzoselenophenyl](diphenyltriazinyl)biphenyl; [(biphenylyl)dibenzofuranyl](diphenyltriazinyl)biphenyl; [(biphenylyl)dibenzothiophenyl](diphenyltriazinyl) biphenyl; [(biphenylyl)dibenzoselenophenyl] (diphenyltriazinyl)biphenyl; (phenyldibenzofuranyl) (diphenyltriazinyl)terbenzene; (phenyldibenzothiophenyl) (diphenyltriazinyl)terbenzene; (phenyldibenzoselenophenyl)(diphenyltriazinyl)terbenzene; (phenyldibenzofuranyl)(diphenyltriazinyl)terbenzene; (phenyldibenzothiophenyl)(diphenyltriazinyl)terbenzene; (phenyldibenzoselenophenyl)(diphenyltriazinyl)terbenzene; [(biphenylyl)dibenzofuranyl](diphenyltriazinyl)terbenzene; [(biphenylyl)dibenzothiophenyl](diphenyltriazinyl)terbenzene; [(biphenylyl)dibenzoselenophenyl](diphenyltriazinyl) terbenzene; (dibenzofuranyl)[phenyl(biphenylyl)triazinyl] biphenyl; (dibenzothiophenyl)[phenyl(biphenylyl)triazinyl] biphenyl; (dibenzoselenophenyl)[phenyl(biphenylyl) triazinyl]biphenyl; (dibenzofuranyl)[phenyl(biphenylyl) triazinyl]biphenyl; (dibenzothiophenyl)[phenyl(biphenylyl) triazinyl]biphenyl; (dibenzoselenophenyl)[phenyl (biphenylyl)triazinyl]biphenyl; (dibenzofuranyl)[bis (biphenylyl)triazinyl]biphenyl; (dibenzothiophenyl)[bis (biphenylyl)triazinyl]biphenyl; (dibenzoselenophenyl)[bis (biphenylyl)triazinyl]biphenyl; (dibenzofuranyl)[phenyl (dimethylfluorenyl)triazinyl]biphenyl; (dibenzothiophenyl) [phenyl(dimethylfluorenyl)triazinyl]biphenyl; (dibenzoselenophenyl)[phenyl(dimethylfluorenyl)triazinyl] biphenyl; (phenyldibenzofuranyl)[phenyl(biphenylyl)triazinyl]biphenyl; (phenyldibenzothiophenyl)[phenyl(biphenylyl)triazinyl]biphenyl; (phenyldibenzoselenophenyl)[phenyl (biphenylyl)triazinyl]biphenyl; (phenyldibenzofuranyl) [phenyl(biphenylyl)triazinyl]biphenyl; (phenyldibenzothiophenyl)[phenyl(biphenylyl)triazinyl]biphenyl; (phenyldibenzoselenophenyl)[phenyl(biphenylyl) triazinyl]biphenyl; (phenyldibenzofuranyl)[phenyl(dimethylfluorenyl)triazinyl]biphenyl; (phenyldibenzothiophenyl) [phenyl(dimethylfluorenyl)triazinyl]biphenyl; (phenyldibenzoselenophenyl)[phenyl(dimethylfluorenyl)triazinyl]biphenyl; (dibenzofuranyl)[phenyl(biphenylyl)triazinyl]biphenyl; (dibenzothiophenyl)[phenyl(biphenylyl)triazinyl]biphenyl; (dibenzoselenophenyl)[phenyl(biphenylyl) triazinyl]biphenyl; (dibenzofuranyl)[phenyl(biphenylyl) triazinyl]terbenzene; (dibenzothiophenyl)[phenyl (biphenylyl)triazinyl]terbenzene; (dibenzoselenophenyl)[phenyl(biphenylyl)triazinyl]terbenzene; (dibenzofuranyl)[phenyl(dimethylfluorenyl)triazinyl]terbenzene; (dibenzothiophenyl)[phenyl(dimethylfluorenyl)triazinyl]terbenzene; (dibenzoselenophenyl)[phenyl(dimethylfluorenyl)triazinyl]terbenzene; [(biphenylyl)dibenzofuranyl][phenyl(biphenylyl)triazinyl]biphenyl; [(biphenylyl)dibenzothiophenyl][phenyl(biphenylyl)triazinyl]biphenyl; [(biphenylyhdibenzoselenophenyl][phenyl(biphenylyl)triazinyl]biphenyl; [(biphenylyl)dibenzofuranyl][phenyl(biphenylyl)triazinyl]biphenyl; [(biphenylyl)dibenzothiophenyl][phenyl(biphenylyl)triazinyl]biphenyl; [(biphenylyhdibenzoselenophenyl][phenyl(biphenylyl)triazinyl]biphenyl; [(biphenylyl)dibenzofuranyl][phenyl(dimethylfluorenyl)triazinyl]biphenyl; [(biphenylyl)dibenzothiophenyl][phenyl(dimethylfluorenyl)triazinyl]biphenyl; [(biphenylyhdibenzoselenophenyl][phenyl(dimethylfluorenyl)triazinyl]biphenyl; (diphenyltriazinyl)[(biphenylyl)dibenzofuranyl]terbenzene; (diphenyltriazinyl)[(biphenylyl)dibenzothiophenyl]terbenzene; (diphenyltriazinyl)[(biphenylyl)dibenzoselenophenyl]terbenzene; (dibenzofuranyl)(diphenyltriazinyl)terbenzene; (dibenzothiophenyl)(diphenyltriazinyl)terbenzene; (dibenzoselenophenyl)(diphenyltriazinyl)terbenzene; (dibenzofuranyl)(diphenyltriazinyl)biphenyl; (dibenzothiophenyl)(diphenyltriazinyl)biphenyl; (dibenzoselenophenyl)(diphenyltriazinyl)biphenyl; (dibenzofuranyl)(diphenyltriazinyl)biphenyl; (dibenzothiophenyl)(diphenyltriazinyl)biphenyl; (dibenzoselenophenyl)(diphenyltriazinyl)biphenyl; (dibenzofuranyl)(diphenyltriazinyl)biphenyl; (dibenzothiophenyl)(diphenyltriazinyl)biphenyl; (dibenzoselenophenyl)(diphenyltriazinyl)biphenyl; (dibenzofuranyl)(diphenyltriazinyl)terbenzene; (dibenzothiophenyl)(diphenyltriazinyl)terbenzene; (dibenzoselenophenyl)(diphenyltriazinyl)terbenzene; (dibenzofuranyl)(diphenyltriazinyl)terbenzene; (dibenzothiophenyl)(diphenyltriazinyl)terbenzene; (dibenzoselenophenyl)(diphenyltriazinyl)terbenzene; (dibenzofuranyl)(diphenyltriazinyl)terbenzene; (dibenzothiophenyl)(diphenyltriazinyl)terbenzene; (dibenzoselenophenyl)(diphenyltriazinyl)terbenzene; (diphenyldibenzofuranyl)(diphenyltriazinyl)biphenyl; (diphenyldibenzothiophenyl)(diphenyltriazinyl)biphenyl; (diphenyldibenzoselenophenyl)(diphenyltriazinyl)biphenyl; (diphenyldibenzofuranyl)(diphenyltriazinyl)biphenyl; (diphenyldibenzothiophenyl)(diphenyltriazinyl)biphenyl; (diphenyldibenzoselenophenyl)(diphenyltriazinyl)biphenyl; (phenyldibenzofuranyl)(diphenyltriazinyl)biphenyl; (phenyldibenzothiophenyl)(diphenyltriazinyl)biphenyl; (phenyldibenzoselenophenyl)(diphenyltriazinyl)biphenyl; (phenyldibenzofuranyl)(diphenyltriazinyl)(pyridinyl)benzene; (phenyldibenzothiophenyl)(diphenyltriazinyl)(pyridinyl)benzene; (phenyldibenzoselenophenyl)(diphenyltriazinyl)(pyridinyl)benzene; (phenyldibenzofuranyl)(diphenyltriazinyl)(pyridinyl)benzene; (phenyldibenzothiophenyl)(diphenyltriazinyl)(pyridinyl)benzene; (phenyldibenzoselenophenyl)(diphenyltriazinyl)(pyridinyl)benzene; [(pyridinyl)dibenzofuranyl](diphenyltriazinyl)biphenyl; [(pyridinyl)dibenzothiophenyl](diphenyltriazinyl)biphenyl; [(pyridinyl)dibenzoselenophenyl](diphenyltriazinyl)biphenyl; (diphenyltriazinyl)(dibenzofuranyl)terbenzene; (diphenyltriazinyl)(dibenzothiophenyl)terbenzene; (diphenyltriazinyl)(dibenzoselenophenyl)terbenzene; (dibenzofuranyl)(diphenyltriazinyl)terbenzene; (dibenzothiophenyl)(diphenyltriazinyl)terbenzene; (dibenzoselenophenyl)(diphenyltriazinyl)terbenzene; (dibenzofuranyl)(diphenyltriazinyl)(dimethylfluorenyl)benzene; (dibenzothiophenyl)(diphenyltriazinyl)(dimethylfluorenyl)benzene; (dibenzoselenophenyl)(diphenyltriazinyl)(dimethylfluorenyl)benzene; (diphenyltriazinyl)(dimethylfluorenyl)biphenyl; (diphenyltriazinyl)(spiro[cyclopentanefluorene]yl)biphenyl; (diphenyltriazinyl)(dimethylfluorenyl)terbenzene; (diphenyltriazinyl)(diphenylfluorenyl)biphenyl; [phenyl(biphenylyl)triazinyl](dimethylfluorenyl)biphenyl; [phenyl(dimethylfluorenyl)triazinyl](dimethylfluorenyl)terbenzene; (diphenyltriazinyl)[bis(dimethylfluorenyl)]benzene; (diphenyltriazinyl)(dimethylfluorenyl)terbenzene; (diphenyltriazinyl)phenyldibenzofuran; (diphenyltriazinyl)phenyldibenzothiophene; (diphenyltriazinyl)phenyldibenzoselenophene; [phenyl(biphenylyl)triazinyl]phenyldibenzofuran; [phenyl(biphenylyl)triazinyl]phenyldibenzothiophene; [phenyl(biphenylyl)triazinyl]phenyldibenzoselenophene; [phenyl(biphenylyl)triazinyl]phenyldibenzofuran; [phenyl(biphenylyl)triazinyl]phenyldibenzothiophene; [phenyl(biphenylyl)triazinyl]phenyldibenzoselenophene; [bis(biphenylyl)triazinyl]phenyldibenzofuran; [bis(biphenylyl)triazinyl]phenyldibenzothiophene; [bis(biphenylyl)triazinyl]phenyldibenzoselenophene; [bis(biphenylyl)triazinyl]phenyldibenzofuran; [bis(biphenylyl)triazinyl]phenyldibenzothiophene; [bis(biphenylyl)triazinyl]phenyldibenzoselenophene; [bis(biphenylyl)triazinyl]phenyldibenzofuran; [bis(biphenylyl)triazinyl]phenyldibenzothiophene; [bis(biphenylyl)triazinyl]phenyldibenzoselenophene; (diphenyltriazinyl)(phenyldibenzofuranyl)benzene; (diphenyltriazinyl)(phenyldibenzothiophenyl)benzene; (diphenyltriazinyl)(phenyldibenzoselenophenyl)benzene; [phenyl(biphenylyl)triazinyl](phenyldibenzofuranyl)benzene; [phenyl(biphenylyl)triazinyl](phenyldibenzothiophenyl)benzene; [phenyl(biphenylyl)triazinyl](phenyldibenzoselenophenyl)benzene; [phenyl(biphenylyl)triazinyl](phenyldibenzofuranyl)benzene; [phenyl(biphenylyl)triazinyl](phenyldibenzothiophenyl)benzene; [phenyl(biphenylyl)triazinyl](phenyldibenzoselenophenyl)benzene; (diphenyltriazinyl)(phenyldibenzofuranyl)benzene; (diphenyltriazinyl)(phenyldibenzothiophenyl)benzene; (diphenyltriazinyl)(phenyldibenzoselenophenyl)benzene; [phenyl(biphenylyl)triazinyl](phenyldibenzofuranyl)benzene; [phenyl(biphenylyl)triazinyl](phenyldibenzothiophenyl)benzene; [phenyl(biphenylyl)triazinyl](phenyldibenzoselenophenyl)benzene; [phenyl(biphenylyl)triazinyl](phenyldibenzofuranyl)benzene; [phenyl(biphenylyl)triazinyl](phenyldibenzothiophenyl)benzene; [phenyl(biphenylyl)triazinyl](phenyldibenzoselenophenyl)benzene; (diphenyltriazinyl)(phenyldibenzofuranyl)biphenyl; (diphenyltriazinyl)(phenyldibenzothiophenyl)biphenyl; (diphenyltriazinyl)(phenyldibenzoselenophenyl)biphenyl; [phenyl(biphenylyl)triazinyl](phenyldibenzofuranyl)biphenyl; [phenyl(biphenylyl)triazinyl](phenyldibenzothiophenyl)biphenyl; [phenyl(biphenylyl)triazinyl](phenyldibenzoselenophenyl)biphenyl; [phenyl(biphenylyl)triazinyl](phenyldibenzofuranyl)biphenyl; [phenyl(biphenylyl)triazinyl](phenyldibenzothiophenyl)biphenyl; [phenyl(biphenylyl)triazinyl](phenyldibenzoselenophenyl)biphenyl; (diphenyltriazinyl)(phenyldibenzofuranyl)biphenyl; (diphenyltriazinyl)(phenyldibenzothiophenyl)biphenyl; (diphenyltriazinyl)(phenyldibenzoselenophenyl)biphenyl; [phenyl(biphenylyl)triazinyl](phenyldibenzofuranyl)biphenyl; [phenyl(biphenylyl)triazinyl](phenyldibenzothiophenyl)biphenyl; [phenyl(biphenylyl)triazinyl](phenyldibenzoselenophenyl)biphenyl; [phenyl(biphenylyl)triazinyl](phenyldibenzofuranyl)biphenyl; [phenyl(biphenylyl)triazinyl](phenyldibenzothiophenyl)biphenyl; [phenyl(biphenylyl)triazinyl](phenyldibenzoselenophenyl)biphenyl; (diphenyltriazinyl)(phenyldibenzofuranyl)biphenyl; (diphenyltriazinyl)(phenyldibenzothiophenyl)biphenyl; (diphenyltriazinyl)(phenyldibenzoselenophenyl)biphenyl; [phenyl(biphenylyl)triazinyl](phenyldibenzofuranyl)biphenyl; [phenyl(biphenylyl)triazinyl](phenyldibenzothiophenyl)biphenyl; [phenyl(biphenylyl)triazinyl](phenyldibenzoselenophenyl)biphenyl; [phenyl(biphenylyl)triazinyl](phenyldibenzofuranyl)biphenyl; [phenyl(biphenylyl)triazinyl](phenyldibenzothiophenyl)biphenyl; [phenyl(biphenylyl)triazinyl](phenyldibenzoselenophenyl)biphenyl; (diphenyltriazinyl)(biphenylyl)dibenzofuran; (diphenyltriazinyl)(biphenylyl)dibenzothiophene; (diphenyltriazinyl)(biphenylyl)dibenzoselenophene; [phenyl(biphenylyl)triazinyl](biphenylyl)dibenzofuran; [phenyl(biphenylyl)triazinyl](biphenylyl)dibenzothiophene; [phenyl(biphenylyl)triazinyl](biphenylyl)dibenzoselenophene; [phenyl(biphenylyl)triazinyl](biphenylyl)dibenzofuran; [phenyl(biphenylyl)triazinyl](biphenylyl)dibenzothiophene; [phenyl(biphenylyl)triazinyl](biphenylyl)dibenzoselenophene; (diphenyltriazinyl)[(biphenylyl)dibenzofuranyl]benzene; (diphenyltriazinyl)[(biphenylyl)dibenzothiophenyl]benzene; (diphenyltriazinyl)[(biphenylyl)dibenzoselenophenyl]benzene; [phenyl(biphenylyl)triazinyl][(biphenylyl)dibenzofuranyl]benzene; [phenyl(biphenylyl)triazinyl][(biphenylyl)dibenzothiophene]benzene; [phenyl(biphenylyl)triazinyl][(biphenylyl)dibenzoselenophene]benzene; [phenyl(biphenylyl)triazinyl][(biphenylyl)dibenzofuranyl]benzene; [phenyl(biphenylyl)triazinyl][(biphenylyl)dibenzothiophene]benzene; [phenyl(biphenylyl)triazinyl][(biphenylyl)dibenzoselenophene]benzene; (diphenyltriazinyl)[(biphenylyl)dibenzofuranyl]benzene; (diphenyltriazinyl)[(biphenylyl)dibenzothiophenyl]benzene; (diphenyltriazinyl)[(biphenylyl)dibenzoselenophenyl]benzene; [phenyl(biphenylyl)triazinyl][(biphenylyl)dibenzofuranyl]benzene; [phenyl(biphenylyl)triazinyl][(biphenylyl)dibenzothiophenyl]benzene; [phenyl(biphenylyl)triazinyl][(biphenylyl)dibenzoselenophenyl]benzene; [phenyl(biphenylyl)triazinyl][(biphenylyl)dibenzofuranyl]benzene; [phenyl(biphenylyl)triazinyl][(biphenylyl)dibenzothiophenyl]benzene; [phenyl(biphenylyl)triazinyl][(biphenylyl)dibenzoselenophenyl]benzene; (diphenyltriazinyl)(biphenylyl)dibenzofuran; (diphenyltriazinyl)(biphenylyl)dibenzothiophene; (diphenyltriazinyl)(biphenylyl)dibenzoselenophene; [phenyl(biphenylyl)triazinyl](biphenylyl)dibenzofuran; [phenyl(biphenylyl)triazinyl](biphenylyl)dibenzothiophene; [phenyl(biphenylyl)triazinyl](biphenylyl)dibenzoselenophene; [phenyl(biphenylyl)triazinyl](biphenylyl)dibenzofuran; [phenyl(biphenylyl)triazinyl](biphenylyl)dibenzothiophene; [phenyl(biphenylyl)triazinyl](biphenylyl)dibenzoselenophene; (diphenyltriazinyl)[(biphenylyl)dibenzofuranyl]benzene; (diphenyltriazinyl)[(biphenylyl)dibenzothiophenyl]benzene; (diphenyltriazinyl)[(biphenylyl)dibenzoselenophenyl]benzene; [phenyl(biphenylyl)triazinyl][(biphenylyl)dibenzofuranyl]benzene; [phenyl(biphenylyl)triazinyl][(biphenylyl)dibenzothiophenyl]benzene; [phenyl(biphenylyl)triazinyl][(biphenylyl)dibenzoselenophenyl]benzene; (diphenyltriazinyl)[(biphenylyl)dibenzofuranyl]benzene; (diphenyltriazinyl)[(biphenylyl)dibenzothiophenyl]benzene; (diphenyltriazinyl)[(biphenylyl)dibenzoselenophenyl]benzene; (diphenyltriazinyl)[(biphenylyl)dibenzofuranyl]benzene; (diphenyltriazinyl)[(biphenylyl)dibenzothiophenyl]benzene; (diphenyltriazinyl)[(biphenylyl)dibenzoselenophenyl]benzene; [phenyl(biphenylyl)triazinyl][(biphenylyl)dibenzofuranyl]benzene; [phenyl(biphenylyl)triazinyl][(biphenylyl)dibenzothiophenyl]benzene; [phenyl(biphenylyl)triazinyl][(biphenylyl)dibenzoselenophenyl]benzene; [phenyl(biphenylyl)triazinyl][(biphenylyl)dibenzofuranyl]benzene; [phenyl(biphenylyl)triazinyl][(biphenylyl)dibenzothiophenyl]benzene; [phenyl(biphenylyl)triazinyl][(biphenylyl)dibenzoselenophenyl]benzene; [phenyl(dimethylfluorenyl)triazinyl](phenyldibenzofuran); [phenyl(dimethylfluorenyl)triazinyl](phenyldibenzothiophene); [phenyl(dimethylfluorenyl)triazinyl](phenyldibenzoselenophene); [(biphenylyl)(dimethylfluorenyl)triazinyl](phenyldibenzofuran); [(biphenylyl)(dimethylfluorenyl)triazinyl](phenyldibenzothiophene); [(biphenylyl)(dimethylfluorenyl)triazinyl](phenyldibenzoselenophene); [(biphenylyl)(dimethylfluorenyl)triazinyl](phenyldibenzofuran); [(biphenylyl)(dimethylfluorenyl)triazinyl](phenyldibenzothiophene); [(biphenylyl)(dimethylfluorenyl)triazinyl](phenyldibenzoselenophene); [phenyl(dimethylfluorenyl)triazinyl](phenyldibenzofuranyl)benzene; [phenyl(dimethylfluorenyl)triazinyl](phenyldibenzothiophenyl)benzene; [phenyl(dimethylfluorenyl)triazinyl](phenyldibenzoselenophenyl)benzene; [bis(dimethylfluorenyl)triazinyl](phenyldibenzofuranyl)benzene; [bis(dimethylfluorenyl)triazinyl](phenyldibenzothiophenyl)benzene; [bis(dimethylfluorenyl)triazinyl](phenyldibenzoselenophenyl)benzene; [phenyl(dimethylfluorenyl)triazinyl](biphenylyl)dibenzofuran; [phenyl(dimethylfluorenyl)triazinyl](biphenylyl)dibenzothiophene; [phenyl(dimethylfluorenyl)triazinyl](biphenylyl)dibenzoselenophene; [phenyl(dimethylfluorenyl)triazinyl](biphenylyl)dibenzofuran; [phenyl(dimethylfluorenyl)triazinyl](biphenylyl)dibenzothiophene; [phenyl(dimethylfluorenyl)triazinyl](biphenylyl)dibenzoselenophene; [phenyl(dimethylfluorenyl)triazinyl][(biphenylyl)dibenzofuranyl]benzene; [phenyl(dimethylfluorenyl)triazinyl][(biphenylyl)dibenzothiophenyl]benzene; [phenyl(dimethylfluorenyl)triazinyl][(biphenylyl)dibenzoselenophenyl]benzene; [phenyl(dimethylfluorenyl)triazinyl][(biphenylyl)dibenzofuranyl]benzene; [phenyl(dimethylfluorenyl)triazinyl][(biphenylyl)dibenzothiophenyl]benzene; [phenyl(dimethylfluorenyl)triazinyl][(biphenylyl)dibenzoselenophenyl]benzene; [phenyl(dimethylfluorenylphenyl)triazinyl](phenyldibenzofuranyl)benzene; [phenyl(dimethylfluorenylphenyl)triazinyl](phenyldibenzothiophenyl)benzene; [phenyl(dimethylfluorenylphenyl)triazinyl](phenyldibenzoselenophenyl)benzene; [phenyl(dimethylfluorenyl)triazinyl]phenyldibenzofuran; [phenyl(dimethylfluorenyl)triazinyl]phenyldibenzothiophene; [phenyl(dimethylfluorenyl)triazinyl]phenyldibenzoselenophene; [phenyl(dimethylfluorenyl)triazinyl](biphenylyl)dibenzofuran; [phenyl(dimethylfluorenyl)triazinyl](biphenylyl)dibenzothiophene; [phenyl(dimethylfluorenyl)triazinyl](biphenylyl)dibenzoselenophene; [phenyl(dimethylfluorenyl)triazinyl][(biphenylyl)dibenzofuranyl]benzene; [phenyl(dimethylfluorenyhtriazinyl][(biphenylyl)dibenzothiophenyl]benzene; [phenyl(dimethylfluorenyl)triazinyl][(biphenylyl)dibenzoselenophenyl]benzene; [phenyl(dimethylfluorenylphenyl)triazinyl](phenyldibenzofuranyl)benzene; [phenyl(dimethylfluorenylphenyl)triazinyl](phenyldibenzothiophenyl)benzene; [phenyl(dimethylfluorenylphenyl)triazinyl](phenyldibenzoselenophenyl)benzene; [phenyl(dimethylfluorenyl)triazinyl](phenyldibenzofuran); [phenyl(dimethylfluorenyl)triazinyl]

(phenyldibenzothiophene); [phenyl(dimethylfluorenyl) triazinyl](phenyldibenzoselenophene); phenyl (diphenyltriazinyl)dibenzofuran; phenyl(diphenyltriazinyl) dibenzothiophene; phenyl(diphenyltriazinyl) dibenzoselenophene; phenyl[(diphenyltriazinyl)phenyl] dibenzofuran; phenyl[(diphenyltriazinyl)phenyl] dibenzothiophene; phenyl[(diphenyltriazinyl)phenyl] dibenzoselenophene; (biphenylyl)[(diphenyltriazinyl) phenyl]dibenzofuran; (biphenylyl)[(diphenyltriazinyl) phenyl]dibenzothiophene; (biphenylyl)[(diphenyltriazinyl) phenyl]dibenzoselenophene; diphenyl[(diphenyltriazinyl) phenyl]dibenzofuran; diphenyl[(diphenyltriazinyl)phenyl] dibenzothiophene; diphenyl[(diphenyltriazinyl)phenyl] dibenzoselenophene; phenyl(diphenyltriazinyl) dibenzofuran; phenyl(diphenyltriazinyl)dibenzothiophene; phenyl(diphenyltriazinyl)dibenzoselenophene; (biphenylyl) (diphenyltriazinyl)dibenzofuran; (biphenylyl)(diphenyltriazinyl)dibenzothiophene; (biphenylyl)(diphenyltriazinyl) dibenzoselenophene; (biphenylyl)(diphenyltriazinyl) dibenzofuran; (biphenylyl)(diphenyltriazinyl) dibenzothiophene; (biphenylyl)(diphenyltriazinyl) dibenzoselenophene; diphenyl[(diphenyltriazinyl)phenyl] dibenzofuran; diphenyl[(diphenyltriazinyl)phenyl] dibenzothiophene; diphenyl[(diphenyltriazinyl)phenyl] dibenzoselenophene; (biphenylyl)[(diphenyltriazinyl) phenyl]dibenzofuran; (biphenylyl)[(diphenyltriazinyl) phenyl]dibenzothiophene; (biphenylyl)[(diphenyltriazinyl) phenyl]dibenzoselenophene; phenyl(diphenyltriazinyl) dibenzofuran; phenyl(diphenyltriazinyl)dibenzothiophene; phenyl(diphenyltriazinyl)dibenzoselenophene; phenyl[(diphenyltriazinyl)phenyl]dibenzofuran; phenyl[(diphenyltriazinyl)phenyl]dibenzothiophene; phenyl[(diphenyltriazinyl) phenyl]dibenzoselenophene; phenyl[(diphenyltriazinyl) phenyl]dibenzofuran; phenyl[(diphenyltriazinyl)phenyl] dibenzothiophene; phenyl[(diphenyltriazinyl)phenyl] dibenzoselenophene; (biphenylyl)[(diphenyltriazinyl) phenyl]dibenzofuran; (biphenylyl)[(diphenyltriazinyl) phenyl]dibenzothiophene; (biphenylyl)[(diphenyltriazinyl) phenyl]dibenzoselenophene; (biphenylyl) [(diphenyltriazinyl)phenyl]dibenzofuran; (biphenylyl) [(diphenyltriazinyl)phenyl]dibenzothiophene; (biphenylyl) [(diphenyltriazinyl)phenyl]dibenzoselenophene; phenyl [(diphenyltriazinyl)phenyl]dibenzofuran; phenyl [(diphenyltriazinyl)phenyl]dibenzothiophene; phenyl [(diphenyltriazinyl)phenyl]dibenzoselenophene; (diphenyltriazinyl)(phenyldibenzofuranyl)pyridine; (diphenyltriazinyl)(phenyldibenzothiophenyl)pyridine; (diphenyltriazinyl)(phenyldibenzoselenophenyl)pyridine; [phenyl (phenylpyridinyl)triazinyl](phenyldibenzofuranyl)pyridine; [phenyl(phenylpyridinyl)triazinyl](phenyldibenzothiophenyl)pyridine; [phenyl(phenylpyridinyl)triazinyl](phenyldibenzoselenophenyl)pyridine; [phenyl(phenylpyridinyl) triazinyl](phenyldibenzofuranyl)benzene; [phenyl (phenylpyridinyl)triazinyl](phenyldibenzothiophenyl) benzene; [phenyl(phenylpyridinyl)triazinyl] (phenyldibenzoselenophenyl)benzene; (diphenyltriazinyl) [(biphenylyl)dibenzofuranyl)]pyridine; (diphenyltriazinyl) [(biphenylyl)dibenzothiophenyl)]pyridine; (diphenyltriazinyl)[(biphenylyl)dibenzoselenophenyl)]pyridine; phenyl[phenyl(dimethylfluorenyl)triazinyl]dibenzofuran; phenyl[phenyl(dimethylfluorenyl)triazinyl]dibenzothiophene; phenyl[phenyl(dimethylfluorenyl)triazinyl] dibenzoselenophene; phenyl[(biphenylyl) (dimethylfluorenyl)triazinyl]dibenzofuran; phenyl [(biphenylyl)(dimethylfluorenyl)triazinyl] dibenzothiophene; phenyl[(biphenylyl)(dimethylfluorenyl) triazinyl]dibenzoselenophene; phenyl[phenyl (dimethylfluorenyl)triazinyl]dibenzofuran; phenyl[phenyl (dimethylfluorenyl)triazinyl]dibenzothiophene; phenyl[phenyl(dimethylfluorenyl)triazinyl]dibenzoselenophene; phenyl[phenyl(spiro[cyclohexanefluorene]yl)triazinyl] dibenzofuran; phenyl[phenyl(spiro[cyclohexanefluorene]yl) triazinyl]dibenzothiophene; phenyl[phenyl(spiro[cyclohexanefluorene]yl)triazinyl]dibenzoselenophene; phenyl [phenyl(spirobi[9H-fluorene]yl)triazinyl]dibenzofuran; phenyl[phenyl(spirobi[9H-fluorene]yl)triazinyl]dibenzothiophene; phenyl[phenyl(spirobi[9H-fluorene]yl)triazinyl] dibenzoselenophene; benzene-$d_3$[(diphenyl-$d_{10}$)triazinyl] [(phenyl-$d_5$)dibenzofuranyl-$d_6$]; benzene-$d_3$[(diphenyl-$d_{10}$) triazinyl][phenyl-$d_5$)dibenzothiophenyl-$d_6$]; benzene-$d_3$ [(diphenyl-$d_{10}$)triazinyl][(phenyl-$d_5$)dibenzoselenophenyl-$d_6$]; benzene-$d_3$[(diphenyl-$d_{10}$)triazinyl][(biphenylyl-$d_9$) dibenzofuranyl-$d_6$]; benzene-$d_3$[(diphenyl-$d_{10}$)triazinyl] [(biphenylyl-$d_9$)dibenzothiophenyl-$d_6$]; benzene-$d_3$ [(diphenyl-$d_{10}$)triazinyl][(biphenylyl-$d_9$) dibenzoselenophenyl-$d_6$]; phenyl{phenyl[(dimethyl-$d_6$) fluorenyl]triazinyl}dibenzofuran; phenyl{phenyl[(dimethyl-$d_6$)fluorenyl]triazinyl}dibenzothiophene; phenyl{phenyl [(dimethyl-$d_6$)fluorenyl]triazinyl}dibenzoselenophene; benzene-$d_3$[(diphenyl-$d_{10}$)triazinyl][(biphenylyl-$d_9$)dibenzofuranyl-$d_6$]; benzene-$d_3$[(diphenyl-$d_{10}$)triazinyl][(biphenylyl-$d_9$)dibenzothiophenyl-$d_6$]; benzene-$d_3$[(diphenyl-$d_{10}$) triazinyl][biphenylyl-$d_9$)dibenzoselenophenyl-$d_6$]; [(diphenyl-$d_{10}$)triazinyl][(biphenylyl)dibenzofuranyl]benzene; [(diphenyl-$d_{10}$)triazinyl][(biphenylyl)dibenzothiophenyl]benzene; [(diphenyl-$d_{10}$)triazinyl][(biphenylyl)dibenzoselenophenyl]benzene; (diphenyltriazinyl)[(biphenylyl) dibenzofuranyl]benzene; (diphenyltriazinyl)[(biphenylyl) dibenzothiophenyl]benzene; (diphenyltriazinyl) [(biphenylyl)dibenzoselenophenyl]benzene; (difluorophenyltriazinyl)[(biphenylyl)dibenzofuranyl]benzene; (difluorophenyltriazinyl)[(biphenylyl)dibenzothiophenyl]benzene; (difluorophenyltriazinyl)[(biphenylyl) dibenzoselenophenyl]benzene; (diphenyltriazinyl) [(dimethylfluorenyl)dibenzofuranyl]benzene; (diphenyltriazinyl)[(dimethylfluorenyl)dibenzothiophenyl] benzene; (diphenyltriazinyl)[(dimethylfluorenyl)dibenzoselenophenyl]benzene; (diphenyltriazinyl)[(dimethylfluorenyl)dibenzofuranyl]biphenyl; (diphenyltriazinyl) [(dimethylfluorenyl)dibenzothiophenyl]biphenyl; (diphenyltriazinyl)[(dimethylfluorenyl)dibenzoselenophenyl]biphenyl; (diphenyltriazinyl)[(dimethylfluorenyl)dibenzofuranyl] biphenyl; (diphenyltriazinyl)[(dimethylfluorenyl)dibenzothiophenyl]biphenyl; (diphenyltriazinyl) [(dimethylfluorenyl)dibenzoselenophenyl]biphenyl; (diphenyltriazinyl)[(dimethylfluorenyl)dibenzofuranyl]biphenyl; (diphenyltriazinyl)[(dimethylfluorenyl)dibenzothiophenyl]biphenyl; (diphenyltriazinyl)[(dimethylfluorenyl) dibenzoselenophenyl]biphenyl; (diphenyltriazinyl) [(dimethylfluorenyl)dibenzofuranyl]pyridine; (diphenyltriazinyl)[(dimethylfluorenyl)dibenzothiophenyl] pyridine; (diphenyltriazinyl)[(dimethylfluorenyl)dibenzoselenophenyl]pyridine; (diphenyltriazinyl)[(dimethylfluorenyl)dibenzofuranyl]benzene; (diphenyltriazinyl) [(dimethylfluorenyl)dibenzothiophenyl]benzene; (diphenyltriazinyl)[(dimethylfluorenyl)dibenzoselenophenyl]benzene; (diphenyltriazinyl)[(dimethylfluorenyl)dibenzofuranyl]benzene; (diphenyltriazinyl)[(dimethylfluorenyl) dibenzothiophenyl]benzene; (diphenyltriazinyl) [(dimethylfluorenyl)dibenzoselenophenyl]benzene; (diphenyltriazinyl)[(dimethylfluorenyl)dibenzofuranyl]benzene; (diphenyltriazinyl)[(dimethylfluorenyl)dibenzothiophenyl]benzene; (diphenyltriazinyl)[(dimethylfluorenyl) dibenzoselenophenyl]benzene; (diphenyltriazinyl)

[(dimethylfluorenyl)dibenzofuranyl]biphenyl; (diphenyltriazinyl)[(dimethylfluorenyl)dibenzothiophenyl]biphenyl; (diphenyltriazinyl)[(dimethylfluorenyl)dibenzoselenophenyl]biphenyl; [phenyl(biphenylyl)triazinyl][(dimethylfluorenyl)dibenzofuranyl]benzene; [phenyl(biphenylyl)triazinyl][(dimethylfluorenyl)dibenzothiophenyl]benzene; [phenyl(biphenylyl)triazinyl][(dimethylfluorenyl)dibenzoselenophenyl]benzene; [phenyl(biphenylyl)triazinyl][(dimethylfluorenyl)dibenzofuranyl]benzene; [phenyl(biphenylyl)triazinyl][(dimethylfluorenyl)dibenzothiophenyl]benzene; [phenyl(biphenylyl)triazinyl][(dimethylfluorenyl)dibenzoselenophenyl]benzene; [phenyl(dimethylfluorenyl)triazinyl][(dimethylfluorenyl)dibenzofuranyl]benzene; [phenyl(dimethylfluorenyl)triazinyl][(dimethylfluorenyl)dibenzothiophenyl]benzene; [phenyl(dimethylfluorenyl)triazinyl][(dimethylfluorenyl)dibenzoselenophenyl]benzene; (diphenyltriazinyl)[(dimethylfluorenyl)dibenzofuranyl]benzene; (diphenyltriazinyl)[(dimethylfluorenyl)dibenzothiophenyl]benzene; (diphenyltriazinyl)[(dimethylfluorenyl)dibenzoselenophenyl]benzene; (diphenyltriazinyl)[bis(dimethylfluorenyl)dibenzofuranyl]benzene; (diphenyltriazinyl)[bis(dimethylfluorenyl)dibenzothiophenyl]benzene; (diphenyltriazinyl)[bis(dimethylfluorenyl)dibenzoselenophenyl]benzene; [phenyl(terphenyl)triazinyl][(dimethylfluorenyl)dibenzofuranyl]benzene; [phenyl(terphenyl)triazinyl][(dimethylfluorenyl)dibenzothiophenyl]benzene; [phenyl(terphenyl)triazinyl][(dimethylfluorenyl)dibenzoselenophenyl]benzene; (diphenyltriazinyl)[(spiro[cyclopentanefluorene]yl)dibenzofuranyl]benzene; (diphenyltriazinyl)[(spiro[cyclopentanefluorene]yl)dibenzothiophenyl]benzene; (diphenyltriazinyl)[(spiro[cyclopentanefluorene]yl)dibenzoselenophenyl]benzene; (diphenyltriazinyl)[(diphenylfluorenyl)dibenzofuranyl]benzene; (diphenyltriazinyl)[(diphenylfluorenyl)dibenzothiophenyl]benzene; (diphenyltriazinyl)[(diphenylfluorenyl)dibenzoselenophenyl]benzene; (diphenyltriazinyl)[(diphenylfluorenyl)dibenzofuranyl]benzene; (diphenyltriazinyl)[(diphenylfluorenyl)dibenzothiophenyl]benzene; (diphenyltriazinyl)[(diphenylfluorenyl)dibenzoselenophenyl]benzene; (diphenyltriazinyl)[phenyl(dimethylfluorenyl)dibenzofuranyl]benzene; (diphenyltriazinyl)[phenyl(dimethylfluorenyl)dibenzothiophenyl]benzene; (diphenyltriazinyl)[phenyl(dimethylfluorenyl)dibenzoselenophenyl]benzene; (diphenyltriazinyl)[phenyl(dimethylfluorenyl)dibenzofuranyl]benzene; (diphenyltriazinyl)[phenyl(dimethylfluorenyl)dibenzothiophenyl]benzene; (diphenyltriazinyl)[phenyl(dimethylfluorenyl)dibenzoselenophenyl]benzene; (diphenyltriazinyl)[(phenyldimethylfluorenyl)dibenzofuranyl]benzene; (diphenyltriazinyl)[(phenyldimethylfluorenyl)dibenzothiophenyl]benzene; (diphenyltriazinyl)[(phenyldimethylfluorenyl)dibenzoselenophenyl]benzene; (diphenyltriazinyl){[(dimethyl-$d_6$)fluorenyl]dibenzofuranyl}benzene; (diphenyltriazinyl){[(dimethyl-$d_6$)fluorenyl]dibenzothiophenyl}benzene; (diphenyltriazinyl){[(dimethyl-$d_6$)fluorenypenzoselenophenyl}benzene; (diphenyltriazinyl)[(dimethylfluorenyl)dibenzofuranyl]benzene; (diphenyltriazinyl)[(dimethylfluorenyl)dibenzothiophenyl]benzene; (diphenyltriazinyl)[(dimethylfluorenyl)dibenzoselenophenyl]benzene; (diphenyltriazinyl)[(dimethylfluorenyl)dibenzofuranyl]benzene; (diphenyltriazinyl)[(dimethylfluorenyl)dibenzothiophenyl]benzene; (diphenyltriazinyl)[(dimethylfluorenyl)dibenzoselenophenyl]benzene; (diphenyltriazinyl)[(dimethylfluorenyl)dibenzofuranyl]benzene; (diphenyltriazinyl)[(dimethylfluorenyl)dibenzothiophenyl]benzene; (diphenyltriazinyl)[(dimethylfluorenyl)dibenzoselenophenyl]benzene; (diphenyltriazinyl)[(dimethylfluorenyl)dibenzofuranyl]benzene; (diphenyltriazinyl)[(dimethylfluorenyl)dibenzothiophenyl]benzene; (diphenyltriazinyl)[(dimethylfluorenyl)dibenzoselenophenyl]benzene; (diphenyltriazinyl)[phenyl(dimethylfluorenyl)dibenzofuranyl]benzene; (diphenyltriazinyl)[phenyl(dimethylfluorenyl)dibenzothiophenyl]benzene; (diphenyltriazinyl)[phenyl(dimethylfluorenyl)dibenzoselenophenyl]benzene; (diphenyltriazinyl)[phenyl(dimethylfluorenyl)dibenzofuranyl]benzene; (diphenyltriazinyl)[phenyl(dimethylfluorenyl)dibenzothiophenyl]benzene; (diphenyltriazinyl)[phenyl(dimethylfluorenyl)dibenzoselenophenyl]benzene; (diphenyltriazinyl)[(dimethylfluorenyl)dibenzofuranyl]benzene; (diphenyltriazinyl)[(dimethylfluorenyl)dibenzothiophenyl]benzene; (diphenyltriazinyl)[(dimethylfluorenyl)dibenzoselenophenyl]benzene; [(diphenyl-$d_{10}$)triazinyl][(dimethylfluorenyl)dibenzofuranyl]benzene; [(diphenyl-$d_{10}$)triazinyl][(dimethylfluorenyl)dibenzothiophenyl]benzene; [(diphenyl-$d_{10}$)triazinyl][(dimethylfluorenyl)dibenzoselenophenyl]benzene; benzene-$d_3$[(diphenyl-$d_{10}$)triazinyl][(dimethylfluorenyl)dibenzofuranyl]; benzene-$d_3$[(diphenyl-$d_{10}$)triazinyl][(dimethylfluorenyl)dibenzothiophenyl]; benzene-$d_3$[(diphenyl-$d_{10}$)triazinyl][(dimethylfluorenyl)dibenzoselenophenyl]; [(diphenyl-$d_{10}$)triazinyl]{[(dimethyl-$d_6$)fluorenyl]dibenzofuranyl}benzene; [(diphenyl-$d_{10}$)triazinyl]{[(dimethyl-$d_6$)fluorenyl]dibenzothiophenyl}benzene; [(diphenyl-$d_{10}$)triazinyl]{[(dimethyl-$d_6$)fluorenyl]dibenzoselenophenyl}benzene; benzene-$d_4$[(diphenyl-$d_{10}$)triazinyl][(dimethylfluorenyl)dibenzofuranyl]; benzene-$d_4$(diphenyl-$d_{10}$)triazinyl][(dimethylfluorenyl)dibenzothiophenyl]; benzene-$d_4$[(diphenyl-$d_{10}$)triazinyl][(dimethylfluorenyl)dibenzoselenophenyl]; phenyl(triphenylenyl)bi[carbazole]; phenyl(triphenylenyl)bi[carbazole]; phenyl(triphenylenyl)bi[carbazole]; phenyl(dimethylfluorenyl)bi[carbazole]; phenyl(dimethylfluorenyl)bi[carbazole]; phenyl(dimethylfluorenyl)bi[carbazole]; phenyl(dimethylfluorenyl)bi[carbazole]; phenyl(dimethylfluorenyl)bi[carbazole]; phenyl(dimethylfluorenyl)bi[carbazole]; (biphenylyl)(dimethylfluorenyl)bi[carbazole]; (biphenylyl)(dimethylfluorenyl)bi[carbazole]; (terphenylyl)(dimethylfluorenyl)bi[carbazole]; diphenylter[carbazole]; diphenylter[carbazole]diphenylter[carbazole] phenyl(dibenzofuranyl)bi[carbazole]; phenyl(dibenzothiophenyl)bi[carbazole]; phenyl(dibenzoselenophenyl)bi[carbazole]; phenyl(dibenzofuranyl)bi[carbazole]; phenyl(dibenzothiophenyl)bi[carbazole]; phenyl(dibenzoselenophenyl)bi[carbazole]; phenyl(dibenzofuranyl)bi[carbazole]; phenyl(dibenzothiophenyl)bi[carbazole]; phenyl(dibenzoselenophenyl)bi[carbazole]; phenyl(dibenzofuranyl)bi[carbazole]; phenyl(dibenzothiophenyl)bi[carbazole]; phenyl(dibenzoselenophenyl)bi[carbazole]; phenyl(dibenzofuranyl)bi[carbazole]; phenyl(dibenzothiophenyl)bi[carbazole]; phenyl(dibenzoselenophenyl)bi[carbazole]; phenyl(dibenzofuranyl)bi[carbazole]; phenyl(dibenzothiophenyl)bi[carbazole]; phenyl(dibenzoselenophenyl)bi[carbazole]; phenyl(dibenzofuranyl)bi[carbazole]; phenyl(dibenzothiophenyl)bi[carbazole]; phenyl(dibenzoselenophenyl)bi[carbazole]; phenyl(dibenzofuranyl)bi[carbazole]; phenyl(dibenzothiophenyl)bi[carbazole]; phenyl(dibenzoselenophenyl)bi[carbazole]; (biphenylyl)(dibenzofuranyl)bi[carbazole]; (biphenylyl)(dibenzothiophenyl)bi[carbazole]; (biphenylyl)(dibenzoselenophenyl)bi[carbazole]; (biphenylyl)(dibenzofuranyl)bi[carbazole]; (biphenylyl)(dibenzothiophenyl)bi[carbazole]; (biphenylyl)(dibenzoselenophenyl)bi[carbazole]; (biphenylyl)

(dibenzofuranyl)bi[carbazole]; (biphenylyl)(dibenzothiophenyl)bi[carbazole]; (biphenylyl)(dibenzoselenophenyl)bi[carbazole]; phenyl(phenyldibenzofuranyl)bi[carbazole]; phenyl(phenyldibenzothiophenyl)bi[carbazole]; phenyl(phenyldibenzoselenophenyl)bi[carbazole]; phenyl(dibenzofuranyl)bi[carbazole]; phenyl(dibenzothiophenyl)bi[carbazole]; phenyl(dibenzoselenophenyl)bi[carbazole]; phenyl(dibenzofuranyl)bi[carbazole]; phenyl(dibenzothiophenyl)bi[carbazole]; phenyl(dibenzoselenophenyl)bi[carbazole]; phenyl(dibenzofuranyl)bi[carbazole]; phenyl(dibenzothiophenyl)bi[carbazole]; phenyl(dibenzoselenophenyl)bi[carbazole]; phenyl(dibenzofuranyl)bi[carbazole]; phenyl(dibenzothiophenyl)bi[carbazole]; phenyl(dibenzoselenophenyl)bi[carbazole]; phenyl(dibenzofuranyl)bi[carbazole]; phenyl(dibenzothiophenyl)bi[carbazole]; phenyl(dibenzoselenophenyl)bi[carbazole]; phenyl(benzofuropyridinyl)bi[carbazole]; phenyl(benzothienopyridinyl)bi[carbazole]; phenyl(benzoselenopyridinyl)bi[carbazole]; (dimethylfluorenyl)(dibenzofuranyl)bi[carbazole]; (dimethylfluorenyl)(dibenzothiophenyl)bi[carbazole]; (dimethylfluorenyl)(dibenzoselenophenyl)bi[carbazole]; (dimethylfluorenyl)(dibenzofuranyl)bi[carbazole]; (dimethylfluorenyl)(dibenzothiophenyl)bi[carbazole]; (dimethylfluorenyl)(dibenzoselenophenyl)bi[carbazole]; bi[phenylcarbazole]; phenyl(biphenylyl)bi[carbazole]; phenyl(biphenylyl)bi[carbazole]; bi[(biphenylyl)carbazole];bi[(biphenylyl)carbazole];triphenylbi[carbazole]; bi[diphenylcarbazole]; phenyl[phenyl(biphenylyl)]bi[carbazole]; bi[phenylcarbazole];phenyl(biphenylyl)bi[carbazole]; phenyl(biphenylyl)bi[carbazole]; bi[(biphenylyl)carbazole];bi[(biphenylyl)carbazole];bi[(biphenylyl)carbazole];triphenylbi[carbazole]; bi[diphenylcarbazole]; phenyl[phenyl(biphenylyl)]bi[carbazole]; phenyl(terphenylyl)bi[carbazole]; phenyl(terphenylyl)bi[carbazole]; phenyl(terphenylyl)bi[carbazole]; phenyl(diphenylpyridinyl)bi[carbazole]

(Group 21A)

(dibenzofuranyl)(diphenyltriazinyl)biphenyl; (dibenzothiophenyl)(diphenyltriazinyl)biphenyl; (dibenzoselenophenyl)(diphenyltriazinyl)biphenyl; (dibenzofuranyl)(diphenyltriazinyl)terbenzene; (dibenzothiophenyl)(diphenyltriazinyl)terbenzene; (dibenzoselenophenyl)(diphenyltriazinyl)terbenzene; (dibenzofuranyl)(diphenyltriazinyl)terbenzene; (dibenzothiophenyl)(diphenyltriazinyl)terbenzene; (dibenzoselenophenyl)(diphenyltriazinyl)terbenzene; (phenyldibenzofuranyl)(diphenyltriazinyl)biphenyl; (phenyldibenzothiophenyl)(diphenyltriazinyl)biphenyl; (phenyldibenzoselenophenyl)(diphenyltriazinyl)biphenyl; [(biphenylyl)dibenzofuranyl](diphenyltriazinyl)biphenyl; [(biphenylyl)dibenzothiophenyl](diphenyltriazinyl)biphenyl; [(biphenylyl)dibenzoselenophenyl](diphenyltriazinyl)biphenyl; [(biphenylyl)dibenzofuranyl](diphenyltriazinyl)biphenyl; [(biphenylyl)dibenzothiophenyl](diphenyltriazinyl)biphenyl; [(biphenylyl)dibenzoselenophenyl](diphenyltriazinyl)biphenyl; (phenyldibenzofuranyl)(diphenyltriazinyl)terbenzene; (phenyldibenzothiophenyl)(diphenyltriazinyl)terbenzene; (phenyldibenzoselenophenyl)(diphenyltriazinyl)terbenzene; (phenyldibenzofuranyl)(diphenyltriazinyl)terbenzene; (phenyldibenzothiophenyl)(diphenyltriazinyl)terbenzene; (phenyldibenzoselenophenyl)(diphenyltriazinyl)terbenzene; [(biphenylyl)dibenzofuranyl](diphenyltriazinyl)terbenzene; [(biphenylyl)dibenzothiophenyl](diphenyltriazinyl)terbenzene; [(biphenylyl)dibenzoselenophenyl](diphenyltriazinyl)terbenzene; (dibenzofuranyl)[phenyl(biphenylyl)triazinyl]biphenyl; (dibenzothiophenyl)[phenyl(biphenylyl)triazinyl]biphenyl; (dibenzoselenophenyl)[phenyl(biphenylyl)triazinyl]biphenyl; (dibenzofuranyl)[phenyl(biphenylyl)triazinyl]biphenyl; (dibenzothiophenyl)[phenyl(biphenylyl)triazinyl]biphenyl; (dibenzoselenophenyl)[phenyl(biphenylyl)triazinyl]biphenyl; (dibenzofuranyl)[bis(biphenylyl)triazinyl]biphenyl; (dibenzothiophenyl)[bis(biphenylyl)triazinyl]biphenyl; (dibenzoselenophenyl)[bis(biphenylyl)triazinyl]biphenyl; (dibenzofuranyl)[phenyl(dimethylfluorenyl)triazinyl]biphenyl; (dibenzothiophenyl)[phenyl(dimethylfluorenyl)triazinyl]biphenyl; (dibenzoselenophenyl)[phenyl(dimethylfluorenyl)triazinyl]biphenyl; (phenyldibenzofuranyl)[phenyl(biphenylyl)triazinyl]biphenyl; (phenyldibenzothiophenyl)[phenyl(biphenylyl)triazinyl]biphenyl; (phenyldibenzoselenophenyl)[phenyl(biphenylyl)triazinyl]biphenyl; (phenyldibenzofuranyl)[phenyl(biphenylyl)triazinyl]biphenyl; (phenyldibenzothiophenyl)[phenyl(biphenylyl)triazinyl]biphenyl; (phenyldibenzoselenophenyl)[phenyl(biphenylyl)triazinyl]biphenyl; (phenyldibenzofuranyl)[phenyl(dimethylfluorenyl)triazinyl]biphenyl; (phenyldibenzothiophenyl)[phenyl(dimethylfluorenyl)triazinyl]biphenyl; (phenyldibenzoselenophenyl)[phenyl(dimethylfluorenyl)triazinyl]biphenyl; (phenyldibenzofuranyl)[phenyl(biphenylyl)triazinyl]terbenzene; (phenyldibenzothiophenyl)[phenyl(biphenylyl)triazinyl]terbenzene; (phenyldibenzoselenophenyl)[phenyl(biphenylyl)triazinyl]terbenzene; (phenyldibenzofuranyl)[phenyl(biphenylyl)triazinyl]terbenzene; (phenyldibenzothiophenyl)[phenyl(biphenylyl)triazinyl]terbenzene; (phenyldibenzoselenophenyl)[phenyl(biphenylyl)triazinyl]terbenzene; (phenyldibenzofuranyl)[phenyl(dimethylfluorenyl)triazinyl]terbenzene; (phenyldibenzothiophenyl)[phenyl(dimethylfluorenyl)triazinyl]terbenzene; (phenyldibenzoselenophenyl)[phenyl(dimethylfluorenyl)triazinyl]terbenzene; [(biphenylyl)dibenzofuranyl][phenyl(biphenylyl)triazinyl]biphenyl; [(biphenylyl)dibenzothiophenyl][phenyl(biphenylyl)triazinyl]biphenyl; [(biphenylyl)dibenzoselenophenyl][phenyl(biphenylyl)triazinyl]biphenyl; [(biphenylyl)dibenzofuranyl][phenyl(biphenylyl)triazinyl]biphenyl; [(biphenylyl)dibenzothiophenyl][phenyl(biphenylyl)triazinyl]biphenyl; [(biphenylyl)dibenzoselenophenyl][phenyl(biphenylyl[(triazinyl]biphenyl; [(biphenylyl)dibenzofuranyl][phenyl(dimethylfluorenyl)triazinyl]biphenyl; [(biphenylyl)dibenzothiophenyl][phenyl(dimethylfluorenyl)triazinyl]biphenyl; [(biphenylyl)dibenzoselenophenyl][phenyl(dimethylfluorenyl)triazinyl]biphenyl; (diphenyltriazinyl)(dibenzofuranyl)terbenzene; (diphenyltriazinyl)(dibenzothiophenyl)terbenzene; (diphenyltriazinyl)(dibenzoselenophenyl)terbenzene; (dibenzofuranyl)(diphenyltriazinyl)terbenzene; (dibenzothiophenyl)(diphenyltriazinyl)terbenzene; (dibenzoselenophenyl)(diphenyltriazinyl)terbenzene; (diphenyltriazinyl)(dibenzofuranyl)biphenyl; (diphenyltriazinyl)(dibenzothiophenyl)biphenyl; (diphenyltriazinyl)(dibenzoselenophenyl)biphenyl; (diphenyltriazinyl)(dibenzofuranyl)biphenyl; (diphenyltriazinyl)(dibenzothiophenyl)biphenyl; (diphenyltriazinyl)(dibenzoselenophenyl)biphenyl; (diphenyltriazinyl)(dibenzofuranyl)biphenyl; (diphenyltriazinyl)(dibenzothiophenyl)biphenyl; (diphenyltriazinyl)(dibenzoselenophenyl)biphenyl; (dibenzofuranyl)(diphenyltriazinyl)terbenzene; (dibenzothiophenyl)(diphenyltriazinyl)terbenzene; (dibenzoselenophenyl)(diphenyltriazinyl)terbenzene; (dibenzofuranyl)(diphenyltriazinyl)terbenzene; (dibenzothiophenyl)

(diphenyltriazinyl)terbenzene; (dibenzoselenophenyl)(diphenyltriazinyl)terbenzene; (dibenzofuranyl)(diphenyltriazinyl)terbenzene; (dibenzothiophenyl)(diphenyltriazinyl) terbenzene; (dibenzoselenophenyl)(diphenyltriazinyl) terbenzene; (diphenyltriazinyl)(diphenyldibenzofuranyl) biphenyl; (diphenyltriazinyl)(diphenyldibenzothiophenyl) biphenyl; (diphenyltriazinyl) (diphenyldibenzoselenophenyl)biphenyl; (diphenyltriazinyl)(diphenyldibenzofuranyl)biphenyl; (diphenyltriazinyl)(diphenyldibenzothiophenyl)biphenyl; (diphenyltriazinyl)(diphenyldibenzoselenophenyl)biphenyl; (diphenyltriazinyl)(phenyldibenzofuranyl)biphenyl; (diphenyltriazinyl)(phenyldibenzothiophenyl)biphenyl; (diphenyltriazinyl)(phenyldibenzoselenophenyl)biphenyl; (diphenyltriazinyl)(phenyldibenzofuranyl)(pyridinyl)benzene; (diphenyltriazinyl)(phenyldibenzothiophenyl)(pyridinyl) benzene; (diphenyltriazinyl)(phenyldibenzoselenophenyl) (pyridinyl)benzene; (diphenyltriazinyl)(phenyldibenzofuranyl)(pyridinyl)benzene; (diphenyltriazinyl) (phenyldibenzothiophenyl)(pyridinyl)benzene; (diphenyltriazinyl)(phenyldibenzoselenophenyl)(pyridinyl) benzene; (diphenyltriazinyl)[(pyridinyl)dibenzofuranyl]biphenyl; (diphenyltriazinyl)[(pyridinyl)dibenzothiophenyl] biphenyl; (diphenyltriazinyl)[(pyridinyl) dibenzoselenophenyl]biphenyl; (diphenyltriazinyl) (dibenzofuranyl)terbenzene; (diphenyltriazinyl) (dibenzothiophenyl)terbenzene; (diphenyltriazinyl) (dibenzoselenophenyl)terbenzene; (dibenzofuranyl) (diphenyltriazinyl)terbenzene; (dibenzothiophenyl) (diphenyltriazinyl)terbenzene; (dibenzoselenophenyl) (diphenyltriazinyl)terbenzene; (diphenyltriazinyl) (dibenzofuranyl)(dimethylfluorenyl)benzene; (diphenyltriazinyl)(dibenzothiophenyl)(dimethylfluorenyl) benzene; (diphenyltriazinyl)(dibenzoselenophenyl)(dimethylfluorenyl)benzene; (diphenyltriazinyl)(dimethylfluorenyl) biphenyl; (diphenyltriazinyl)(spiro[cyclopentanefluorene] yl)biphenyl; (diphenyltriazinyl)(dimethylfluorenyl) terbenzene; (diphenyltriazinyl)(diphenylfluorenyl)biphenyl; [phenyl(biphenylyl)triazinyl](dimethylfluorenyl)biphenyl; [phenyl(dimethylfluorenyl)triazinyl](dimethylfluorenyl)terbenzene; (diphenyltriazinyl)[bis(dimethylfluorenyl)]benzene; (diphenyltriazinyl)(dimethylfluorenyl)terbenzene; phenyl(diphenyltriazinyl)dibenzofuran; phenyl(diphenyltriazinyl)dibenzothiophene; phenyl(diphenyltriazinyl)dibenzoselenophene; phenyl[phenyl(biphenylyl)triazinyl]dibenzofuran; phenyl[phenyl(biphenylyl)triazinyl] dibenzothiophene; phenyl[phenyl(biphenylyl)triazinyl] dibenzoselenophene; phenyl[phenyl(biphenylyl)triazinyl] dibenzofuran; phenyl[phenyl(biphenylyl)triazinyl] dibenzothiophene; phenyl[phenyl(biphenylyl)triazinyl] dibenzoselenophene; phenyl[bis(biphenylyl)triazinyl] dibenzofuran; phenyl[bis(biphenylyl)triazinyl] dibenzothiophene; phenyl[bis(biphenylyl)triazinyl] dibenzoselenophene; phenyl[bis(biphenylyl)triazinyl] dibenzofuran; phenyl[bis(biphenylyl)triazinyl] dibenzothiophene; phenyl[bis(biphenylyl)triazinyl] dibenzoselenophene; phenyl[bis(biphenylyl)triazinyl] dibenzofuran; phenyl[bis(biphenylyl)triazinyl] dibenzothiophene; phenyl[bis(biphenylyl)triazinyl] dibenzoselenophene; (diphenyltriazinyl) (phenyldibenzofuranyl)benzene; (diphenyltriazinyl) (phenyldibenzothiophenyl)benzene; (diphenyltriazinyl) (phenyldibenzoselenophenyl)benzene; [phenyl(biphenylyl) triazinyl](phenyldibenzofuranyl)benzene; [phenyl (biphenylyl)triazinyl](phenyldibenzothiophenyl)benzene; [phenyl(biphenylyl)triazinyl](phenyldibenzoselenophenyl) benzene; [phenyl(biphenylyl)triazinyl](phenyldibenzofuranyl)benzene; [phenyl(biphenylyl)triazinyl](phenyldibenzothiophenyl)benzene; [phenyl(biphenylyl)triazinyl] (phenyldibenzoselenophenyl)benzene; (diphenyltriazinyl) (phenyldibenzofuranyl)benzene; (diphenyltriazinyl) (phenyldibenzothiophenyl)benzene; (diphenyltriazinyl) (phenyldibenzoselenophenyl)benzene; [phenyl(biphenylyl) triazinyl](phenyldibenzofuranyl)benzene; [phenyl (biphenylyl)triazinyl](phenyldibenzothiophenyl)benzene; [phenyl(biphenylyl)triazinyl](phenyldibenzoselenophenyl) benzene; [phenyl(biphenylyl)triazinyl](phenyldibenzofuranyl)benzene; [phenyl(biphenylyl)triazinyl](phenyldibenzothiophenyl)benzene; [phenyl(biphenylyl)triazinyl] (phenyldibenzoselenophenyl)benzene; (diphenyltriazinyl) (phenyldibenzofuranyl)biphenyl; (diphenyltriazinyl) (phenyldibenzothiophenyl)biphenyl; (diphenyltriazinyl) (phenyldibenzoselenophenyl)biphenyl; [phenyl(biphenylyl) triazinyl](phenyldibenzofuranyl)biphenyl; [phenyl (biphenylyl)triazinyl](phenyldibenzothiophenyl)biphenyl; [phenyl(biphenylyl)triazinyl](phenyldibenzoselenophenyl) biphenyl; [phenyl(biphenylyl)triazinyl](phenyldibenzofuranyl)biphenyl; [phenyl(biphenylyl)triazinyl](phenyldibenzothiophenyl)biphenyl; [phenyl(biphenylyl)triazinyl] (phenyldibenzoselenophenyl)biphenyl; (diphenyltriazinyl) (phenyldibenzofuranyl)biphenyl; (diphenyltriazinyl) (phenyldibenzothiophenyl)biphenyl; (diphenyltriazinyl) (phenyldibenzoselenophenyl)biphenyl; [phenyl(biphenylyl) triazinyl](phenyldibenzofuranyl)biphenyl; [phenyl (biphenylyl)triazinyl](phenyldibenzothiophenyl)biphenyl; [phenyl(biphenylyl)triazinyl](phenyldibenzoselenophenyl) biphenyl; [phenyl(biphenylyl)triazinyl](phenyldibenzofuranyl)biphenyl; [phenyl(biphenylyl)triazinyl](phenyldibenzothiophenyl)biphenyl; [phenyl(biphenylyl)triazinyl] (phenyldibenzoselenophenyl)biphenyl; (diphenyltriazinyl) (phenyldibenzofuranyl)biphenyl; (diphenyltriazinyl) (phenyldibenzothiophenyl)biphenyl; (diphenyltriazinyl) (phenyldibenzoselenophenyl)biphenyl; [phenyl(biphenylyl) triazinyl](phenyldibenzofuranyl)biphenyl; [phenyl (biphenylyl)triazinyl](phenyldibenzothiophenyl)biphenyl; [phenyl(biphenylyl)triazinyl](phenyldibenzoselenophenyl) biphenyl; [phenyl(biphenylyl)triazinyl](phenyldibenzofuranyl)biphenyl; [phenyl(biphenylyl)triazinyl](phenyldibenzothiophenyl)biphenyl; [phenyl(biphenylyl)triazinyl] (phenyldibenzoselenophenyl)biphenyl; (diphenyltriazinyl) (biphenylyl)dibenzofuran; (diphenyltriazinyl)(biphenylyl) dibenzothiophene; (diphenyltriazinyl)(biphenylyl) dibenzoselenophene; [phenyl(biphenylyl)triazinyl] (biphenylyl)dibenzofuran; [phenyl(biphenylyl)triazinyl] (biphenylyl)dibenzothiophene; [phenyl(biphenylyl) triazinyl](biphenylyl)dibenzoselenophene; [phenyl (biphenylyl)triazinyl](biphenylyl)dibenzofuran; [phenyl (biphenylyl)triazinyl](biphenylyl)dibenzothiophene; [phenyl(biphenylyl)triazinyl](biphenylyl)dibenzoselenophene; (diphenyltriazinyl)[(biphenylyl)dibenzofuranyl]benzene; (diphenyltriazinyl)[(biphenylyl)dibenzothiophenyl] benzene; (diphenyltriazinyl)[(biphenylyl) dibenzoselenophenyl]benzene; [phenyl(biphenylyl) triazinyl][(biphenylyl)dibenzofuranyl]benzene; [phenyl (biphenylyl)triazinyl][(biphenylyl)dibenzothiophenyl] benzene; [phenyl(biphenylyl)triazinyl][(biphenylyl) dibenzoselenophenyl]benzene; [phenyl(biphenylyl) triazinyl][(biphenylyl)dibenzofuranyl]benzene; [phenyl (biphenylyl)triazinyl][(biphenylyl)dibenzothiophenyl] benzene; [phenyl(biphenylyl)triazinyl][(biphenylyl) dibenzoselenophenyl]benzene; (diphenyltriazinyl) [(biphenylyl)dibenzofuranyl]benzene; (diphenyltriazinyl) [(biphenylyl)dibenzothiophenyl]benzene; (diphenyltriazinyl)[(biphenylyl)dibenzoselenophenyl]benzene; [phenyl(biphenylyl)triazinyl][(biphenylyl)dibenzofuranyl]benzene; [phenyl(biphenylyl)triazinyl][(biphenylyl)dibenzothiophenyl]benzene; [phenyl(biphenylyl)triazinyl][(biphenylyl)dibenzoselenophenyl]benzene; [phenyl(biphenylyl)triazinyl][(biphenylyl)dibenzofuranyl]benzene; [phenyl(biphenylyl)triazinyl][(biphenylyl)dibenzothiophenyl]benzene; [phenyl(biphenylyl)triazinyl][(biphenylyl)dibenzoselenophenyl]benzene; (diphenyltriazinyl)(biphenylyl)dibenzofuran; (diphenyltriazinyl)(biphenylyl)dibenzothiophene; (diphenyltriazinyl)(biphenylyl)dibenzoselenophene; [phenyl(biphenylyl)triazinyl](biphenylyl)dibenzofuran; [phenyl(biphenylyl)triazinyl](biphenylyl)dibenzothiophene; [phenyl(biphenylyl)triazinyl][(biphenylyl)dibenzoselenophene; [phenyl(biphenylyl)triazinyl](biphenylyl)dibenzofuran; [phenyl(biphenylyl)triazinyl](biphenylyl)dibenzothiophene; [phenyl(biphenylyl)triazinyl][(biphenylyl)dibenzoselenophene; (diphenyltriazinyl)[(biphenylyl)dibenzofuranyl]benzene; (diphenyltriazinyl)[(biphenylyl)dibenzothiophenyl]benzene; (diphenyltriazinyl)[(biphenylyl)dibenzoselenophenyl]benzene; [phenyl(biphenylyl)triazinyl][(biphenylyl)dibenzofuranyl]benzene; [phenyl(biphenylyl)triazinyl][(biphenylyl)dibenzothiophenyl]benzene; [phenyl(biphenylyl)triazinyl][(biphenylyl)dibenzoselenophenyl]benzene; [phenyl(biphenylyl)triazinyl][(biphenylyl)dibenzofuranyl]benzene; [phenyl(biphenylyl)triazinyl][(biphenylyl)dibenzothiophenyl]benzene; [phenyl(biphenylyl)triazinyl][(biphenylyl)dibenzoselenophenyl]benzene; (diphenyltriazinyl)[(biphenylyl)dibenzofuranyl]benzene; (diphenyltriazinyl)[(biphenylyl)dibenzothiophenyl]benzene; (diphenyltriazinyl)[(biphenylyl)dibenzoselenophenyl]benzene; [phenyl(biphenylyl)triazinyl][(biphenylyl)dibenzofuranyl]benzene; [phenyl(biphenylyl)triazinyl][(biphenylyl)dibenzothiophenyl]benzene; [phenyl(biphenylyl)triazinyl][(biphenylyl)dibenzoselenophenyl]benzene; [phenyl(biphenylyl)triazinyl][(biphenylyl)dibenzofuranyl]benzene; [phenyl(biphenylyl)triazinyl][(biphenylyl)dibenzothiophenyl]benzene; [phenyl(biphenylyl)triazinyl][(biphenylyl)dibenzoselenophenyl]benzene; phenyl[phenyl(dimethylfluorenyl)triazinyl]dibenzofuran; phenyl[phenyl(dimethylfluorenyl)triazinyl]dibenzothiophene; phenyl[phenyl(dimethylfluorenyl)triazinyl]dibenzoselenophene; phenyl[(biphenylyl)(dimethylfluorenyl)triazinyl]dibenzofuran; phenyl[(biphenylyl)(dimethylfluorenyl)triazinyl]dibenzothiophene; phenyl[(biphenylyl)(dimethylfluorenyl)triazinyl]dibenzoselenophene; phenyl[(biphenylyl)(dimethylfluorenyl)triazinyl]dibenzofuran; phenyl[(biphenylyl)(dimethylfluorenyl)triazinyl]dibenzothiophene; phenyl[(biphenylyl)(dimethylfluorenyl)triazinyl]dibenzoselenophene; [phenyl(dimethylfluorenyhtriazinyl](phenyldibenzofuranyl)benzene; [phenyl(dimethylfluorenyhtriazinyl](phenyldibenzothiophenyl)benzene; [phenyl(dimethylfluorenyhtriazinyl](phenyldibenzoselenophenyl)benzene; [bis(dimethylfluorenyl)triazinyl](phenyldibenzofuranyl)benzene; [bis(dimethylfluorenyhtriazinyl](phenyldibenzothiophenyl)benzene; [bis(dimethylfluorenyhtriazinyl](phenyldibenzoselenophenyl)benzene; (biphenylyl)[phenyl(dimethylfluorenyl)triazinyl]dibenzofuran; (biphenylyl)[phenyl(dimethylfluorenyl)triazinyl]dibenzothiophene; (biphenylyl)[phenyl(dimethylfluorenyl)triazinyl]dibenzoselenophene; (biphenylyl)[phenyl(dimethylfluorenyl)triazinyl]dibenzofuran; (biphenylyl)[phenyl(dimethylfluorenyl)triazinyl]dibenzothiophene; (biphenylyl)[phenyl(dimethylfluorenyl)triazinyl]dibenzoselenophene; [phenyl(dimethylfluorenyl)triazinyl][(biphenylyl)dibenzofuranyl]benzene; [phenyl(dimethylfluorenyl)triazinyl][(biphenylyl)dibenzothiophenyl]benzene; [phenyl(dimethylfluorenyl)triazinyl][(biphenylyl)dibenzoselenophenyl]benzene; [phenyl(dimethylfluorenyl)triazinyl][(biphenylyl)dibenzofuranyl]benzene; [phenyl(dimethylfluorenyl)triazinyl][(biphenylyl)dibenzothiophenyl]benzene; [phenyl(dimethylfluorenyl)triazinyl][(biphenylyl)dibenzoselenophenyl]benzene; phenyl[phenyl(phenyldimethylfluorenyl)triazinyl]dibenzofuran; phenyl[phenyl(phenyldimethylfluorenyl)triazinyl]dibenzothiophene; phenyl[phenyl(phenyldimethylfluorenyl)triazinyl]dibenzoselenophene; phenyl[phenyl(dimethylfluorenyl)triazinyl]dibenzofuran; phenyl[phenyl(dimethylfluorenyl)triazinyl]dibenzothiophene; phenyl[phenyl(dimethylfluorenyl)triazinyl]dibenzoselenophene; (biphenylyl)[phenyl(dimethylfluorenyl)triazinyl]dibenzofuran; (biphenylyl)[phenyl(dimethylfluorenyl)triazinyl]dibenzothiophene; (biphenylyl)[phenyl(dimethylfluorenyl)triazinyl]dibenzoselenophene; [phenyl(dimethylfluorenyl)triazinyl][(biphenylyl)dibenzofuranyl]benzene; [phenyl(dimethylfluorenyl)triazinyl][(biphenylyl)dibenzothiophenyl]benzene; [phenyl(dimethylfluorenyl)triazinyl][(biphenylyl)dibenzoselenophenyl]benzene; phenyl[phenyl(dimethylfluorenyl)triazinyl]dibenzofuran; phenyl[phenyl(dimethylfluorenyl)triazinyl]dibenzothiophene; phenyl[phenyl(dimethylfluorenyl)triazinyl]dibenzoselenophene; phenyl[phenyl(dimethylfluorenyl)triazinyl]dibenzofuran; phenyl[phenyl(dimethylfluorenyl)triazinyl]dibenzothiophene; phenyl[phenyl(dimethylfluorenyl)triazinyl]dibenzoselenophene; phenyl(diphenyltriazinyl)dibenzofuran; phenyl(diphenyltriazinyl)dibenzothiophene; phenyl(diphenyltriazinyl)dibenzoselenophene; (diphenyltriazinyl)(phenyldibenzofuranyl)benzene; (diphenyltriazinyl)(phenyldibenzothiophenyl)benzene; (diphenyltriazinyl)(phenyldibenzoselenophenyl)benzene; (diphenyltriazinyl)[(biphenylyl)dibenzofuranyl]benzene; (diphenyltriazinyl)[(biphenylyl)dibenzothiophenyl]benzene; (diphenyltriazinyl)[(biphenylyl)dibenzoselenophenyl]benzene; (diphenyltriazinyl)(diphenyldibenzofuranyl)benzene; (diphenyltriazinyl)(diphenyldibenzothiophenyl)benzene; (diphenyltriazinyl)(diphenyldibenzoselenophenyl)benzene; phenyl(diphenyltriazinyl)dibenzofuran; phenyl(diphenyltriazinyl)dibenzothiophene; phenyl(diphenyltriazinyl)dibenzoselenophene; (biphenylyl)(diphenyltriazinyl)dibenzofuran; (biphenylyl)(diphenyltriazinyl)dibenzothiophene; (biphenylyl)(diphenyltriazinyl)dibenzoselenophene; (biphenylyl)(diphenyltriazinyl)dibenzofuran; (biphenylyl)(diphenyltriazinyl)dibenzothiophene; (biphenylyl)(diphenyltriazinyl)dibenzoselenophene; (diphenyltriazinyl)(diphenyldibenzofuranyl)benzene; (diphenyltriazinyl)(diphenyldibenzothiophenyl)benzene; (diphenyltriazinyl)(diphenyldibenzoselenophenyl)benzene; (diphenyltriazinyl)[(biphenylyl)dibenzofuranyl]benzene; (diphenyltriazinyl)[(biphenylyl)dibenzothiophenyl]benzene; (diphenyltriazinyl)[(biphenylyl)dibenzoselenophenyl]benzene; phenyl(diphenyltriazinyl)dibenzofuran; phenyl(diphenyltriazinyl)dibenzothiophene; phenyl(diphenyltriazinyl)dibenzoselenophene; (diphenyltriazinyl)(phenyldibenzofuranyl)benzene; (diphenyltriazinyl)(phenyldibenzothiophenyl)benzene; (diphenyltriazinyl)(phenyldibenzoselenophenyl)benzene; (diphenyltriazinyl)(phenyldibenzofuranyl)benzene; (diphenyltriazinyl)(phenyldibenzothiophenyl)benzene; (diphenyltriazinyl)(phenyldibenzoselenophenyl)benzene; (diphenyltriazinyl)[(biphenylyl)dibenzofuranyl]benzene; (diphenyltriazinyl)[(biphenylyl)dibenzothiophenyl]benzene;

(diphenyltriazinyl)[(biphenylyl)dibenzoselenophenyl]benzene; (diphenyltriazinyl)[(biphenylyl)dibenzofuranyl]benzene; (diphenyltriazinyl)[(biphenylyl)dibenzothiophenyl]benzene; (diphenyltriazinyl)[(biphenylyl)dibenzoselenophenyl]benzene; (diphenyltriazinyl)(phenyldibenzofuranyl)benzene; (diphenyltriazinyl)(phenyldibenzothiophenyl)benzene; (diphenyltriazinyl)(phenyldibenzoselenophenyl)benzene; (diphenyltriazinyl)(phenyldibenzofuranyl)pyridine; (diphenyltriazinyl)(phenyldibenzothiophenyl)pyridine; (diphenyltriazinyl)(phenyldibenzoselenophenyl)pyridine; [phenyl(phenylpyridinyhtriazinyl](phenyldibenzofuranyl)pyridine; [phenyl(phenylpyridinyhtriazinyl](phenyldibenzothiophenyl)pyridine; [phenyl(phenylpyridinyhtriazinyl](phenyldibenzoselenophenyl)pyridine; [phenyl(phenylpyridinyhtriazinyl](phenyldibenzofuranyl)benzene; [phenyl(phenylpyridinyhtriazinyl](phenyldibenzothiophenyl)benzene; [phenyl(phenylpyridinyhtriazinyl](phenyldibenzoselenophenyl)benzene; (diphenyltriazinyl)[(biphenylyl)dibenzofuranyl]pyridine; (diphenyltriazinyl)[(biphenylyl)dibenzothiophenyl]pyridine; (diphenyltriazinyl)[(biphenylyl)dibenzoselenophenyl]pyridine; phenyl[phenyl(dimethylbenzofuropyridine)triazinyl]dibenzofuran; phenyl[phenyl(dimethylbenzothienopyridine)triazinyl]dibenzothiophene; phenyl[phenyl(dimethylbenzoselenopyridine)triazinyl]dibenzoselenophene; [(biphenylyl)(dimethylbenzofuropyridine)triazinyl]dibenzofuran; [(biphenylyl)(dimethylbenzothienopyridine)triazinyl]dibenzothiophene; [(biphenylyl)(dimethylbenzoselenopyridine)triazinyl]dibenzoselenophene; phenyl[phenyl(dimethylbenzofuropyridine)triazinyl]dibenzofuran; phenyl[phenyl(dimethylbenzothienopyridine)triazinyl]dibenzothiophene; phenyl[phenyl(dimethylbenzoselenopyridine)triazinyl]dibenzoselenophene; phenyl[phenyl(spiro[cyclohexanefluorene]yl)triazinyl]dibenzofuran; phenyl[phenyl(spiro[cyclohexanefluorene]yl)triazinyl]dibenzothiophene; phenyl[phenyl(spiro[cyclohexanefluorene]yl)triazinyl]dibenzoselenophene; phenyl[phenyl(spirobi[fluorene]yl)triazinyl]dibenzofuran; phenyl[phenyl(spirobi[fluorene]yl)triazinyl]dibenzothiophene; phenyl[phenyl(spirobi[fluorene]yl)triazinyl]dibenzoselenophene; benzene-$d_3$[(diphenyl-$d_{10}$)triazinyl][(phenyl-$d_5$)dibenzofuranyl-$d_6$]; benzene-$d_3$[(diphenyl-$d_{10}$)triazinyl][(phenyl-$d_5$)dibenzothiophenyl-$d_6$]; benzene-$d_3$[(diphenyl-$d_{10}$)triazinyl][(phenyl-$d_5$)dibenzoselenophenyl-$d_6$]; benzene-$d_3$[(diphenyl-$d_{10}$)triazinyl][(biphenylyl-$d_9$)dibenzofuranyl-$d_6$]; benzene-$d_3$[(diphenyl-$d_{10}$)triazinyl][(biphenylyl-$d_9$)dibenzothiophenyl-$d_6$]; benzene-$d_3$[(diphenyl-$d_{10}$)triazinyl][(biphenylyl-$d_9$)dibenzoselenophenyl-$d_6$]; phenyl{phenyl[(dimethyl-$d_6$)fluorenyl]triazinyl}dibenzofuran; phenyl{phenyl[(dimethyl-$d_6$)fluorenyl]triazinyl}dibenzothiophene; phenyl{phenyl[(dimethyl-$d_6$)fluorenyl]triazinyl}dibenzoselenophene; benzene-$d_3$[(diphenyl-$d_{10}$)triazinyl][(biphenylyl-$d_9$)dibenzofuranyl-$d_6$]; benzene-$d_3$[(diphenyl-$d_{10}$)triazinyl][(biphenylyl-$d_9$)dibenzothiophenyl-$d_6$]; benzene-$d_3$[(diphenyl-$d_{10}$)triazinyl][biphenylyl-$d_9$)dibenzoselenophenyl-$d_6$]; [(diphenyl-$d_{10}$)triazinyl][(biphenylyl)dibenzofuranyl]benzene; [(diphenyl-$d_{10}$)triazinyl][(biphenylyl)dibenzothiophenyl]benzene; [(diphenyl-$d_{10}$)triazinyl][(biphenylyl)dibenzoselenophenyl]benzene; (diphenyltriazinyl)[(biphenylyl)dibenzofuranyl]biphenyl; (diphenyltriazinyl)[(biphenylyl)dibenzothiophenyl]biphenyl; (diphenyltriazinyl)[(biphenylyl)dibenzoselenophenyl]biphenyl; (difluorophenyltriazinyl)[(biphenylyl)dibenzofuranyl]benzene; (difluorophenyltriazinyl)[(biphenylyl)dibenzothiophenyl]benzene; (difluorophenyltriazinyl)[(biphenylyl)dibenzoselenophenyl]benzene; (diphenyltriazinyl)[(dimethylfluorenyl)dibenzofuranyl]benzene; (diphenyltriazinyl)[(dimethylfluorenyl)dibenzothiophenyl]benzene; (diphenyltriazinyl)[(dimethylfluorenyl)dibenzoselenophenyl]benzene; (diphenyltriazinyl)[(dimethylfluorenyl)dibenzofuranyl]biphenyl; (diphenyltriazinyl)[(dimethylfluorenyl)dibenzothiophenyl]biphenyl; (diphenyltriazinyl)[(dimethylfluorenyl)dibenzoselenophenyl]biphenyl; (diphenyltriazinyl)[(dimethylfluorenyl)dibenzofuranyl]biphenyl; (diphenyltriazinyl)[(dimethylfluorenyl)dibenzothiophenyl]biphenyl; (diphenyltriazinyl)[(dimethylfluorenyl)dibenzoselenophenyl]biphenyl; (diphenyltriazinyl)[(dimethylfluorenyl)dibenzofuranyl]biphenyl; (diphenyltriazinyl)[(dimethylfluorenyl)dibenzothiophenyl]biphenyl; (diphenyltriazinyl)[(dimethylfluorenyl)dibenzoselenophenyl]biphenyl; (diphenyltriazinyl)[(dimethylfluorenyl)dibenzofuranyl]pyridine; (diphenyltriazinyl)[(dimethylfluorenyl)dibenzothiophenyl]pyridine; (diphenyltriazinyl)[(dimethylfluorenyl)dibenzoselenophenyl]pyridine; (diphenyltriazinyl)[(dimethylfluorenyl)dibenzofuranyl]benzene; (diphenyltriazinyl)[(dimethylfluorenyl)dibenzothiophenyl]benzene; (diphenyltriazinyl)[(dimethylfluorenyl)dibenzoselenophenyl]benzene; (diphenyltriazinyl)[(dimethylfluorenyl)dibenzofuranyl]benzene; (diphenyltriazinyl)[(dimethylfluorenyl)dibenzothiophenyl]benzene; (diphenyltriazinyl)[(dimethylfluorenyl)dibenzoselenophenyl]benzene; (diphenyltriazinyl)[(dimethylfluorenyl)dibenzofuranyl]benzene; (diphenyltriazinyl)[(dimethylfluorenyl)dibenzothiophenyl]benzene; (diphenyltriazinyl)[(dimethylfluorenyl)dibenzoselenophenyl]benzene; (diphenyltriazinyl)[(dimethylfluorenyl)dibenzofuranyl]biphenyl; (diphenyltriazinyl)[(dimethylfluorenyl)dibenzothiophenyl]biphenyl; (diphenyltriazinyl)[(dimethylfluorenyl)dibenzoselenophenyl]biphenyl; [phenyl(biphenylyl)triazinyl][(dimethylfluorenyl)dibenzofuranyl]benzene; [phenyl(biphenylyl)triazinyl][(dimethylfluorenyl)dibenzothiophenyl]benzene; [phenyl(biphenylyl)triazinyl][(dimethylfluorenyl)dibenzoselenophenyl]benzene; [phenyl(biphenylyl)triazinyl][(dimethylfluorenyl)dibenzofuranyl]benzene; [phenyl(biphenylyl)triazinyl][(dimethylfluorenyl)dibenzothiophenyl]benzene; [phenyl(biphenylyl)triazinyl][(dimethylfluorenyl)dibenzoselenophenyl]benzene; [phenyl(dimethylfluorenyl)triazinyl][(dimethylfluorenyl)dibenzofuranyl]benzene; [phenyl(dimethylfluorenyl)triazinyl][(dimethylfluorenyl)dibenzothiophenyl]benzene; [phenyl(dimethylfluorenyl)triazinyl][(dimethylfluorenyl)dibenzoselenophenyl]benzene; (diphenyltriazinyl)[(dimethylfluorenyl)dibenzofuranyl]benzene; (diphenyltriazinyl)[(dimethylfluorenyl)dibenzothiophenyl]benzene; (diphenyltriazinyl)[(dimethylfluorenyl)dibenzoselenophenyl]benzene; (diphenyltriazinyl)[bis(dimethylfluorenyl)dibenzofuranyl]benzene; (diphenyltriazinyl)[bis(dimethylfluorenyl)dibenzothiophenyl]benzene; (diphenyltriazinyl)[bis(dimethylfluorenyl)dibenzoselenophenyl]benzene; [phenyl(terphenylyl)triazinyl][(dimethylfluorenyl)dibenzofuranyl]benzene; [phenyl(terphenylyl)triazinyl][(dimethylfluorenyl)dibenzothiophenyl]benzene; [phenyl(terphenylyl)triazinyl][(dimethylfluorenyl)dibenzoselenophenyl]benzene; (diphenyltriazinyl)[(spiro[cyclopentanefluorene]yl)dibenzofuranyl]benzene; (diphenyltriazinyl)[(spiro[cyclopentanefluorene]yl)dibenzothiophenyl]benzene; (diphenyltriazinyl)[(spiro[cyclopentanefluorene]yl)dibenzoselenophenyl]benzene; (diphenyltriazinyl)[(diphenylfluorenyl)dibenzofuranyl]benzene; (diphenyltriazinyl)[(diphenylfluorenyl)dibenzothiophenyl]

benzene; (diphenyltriazinyl)[(diphenylfluorenyl)dibenzoselenophenyl]benzene; (diphenyltriazinyl)[(spirobi[fluorene]yl)dibenzofuranyl]benzene; (diphenyltriazinyl)[(spirobi[fluorene]yl)dibenzothiophenyl]benzene; (diphenyltriazinyl)[(spirobi[fluorene]yl)dibenzoselenophenyl]benzene; (diphenyltriazinyl)[phenyl(dimethylfluorenyl)dibenzofuranyl]benzene; (diphenyltriazinyl)[phenyl(dimethylfluorenyl)dibenzothiophenyl]benzene; (diphenyltriazinyl)[phenyl(dimethylfluorenyl)dibenzoselenophenyl]benzene; (diphenyltriazinyl)[phenyl(dimethylfluorenyl)dibenzofuranyl]benzene; (diphenyltriazinyl)[phenyl(dimethylfluorenyl)dibenzothiophenyl]benzene; (diphenyltriazinyl)[phenyl(dimethylfluorenyl)dibenzoselenophenyl]benzene; (diphenyltriazinyl)[(phenyldimethylfluorenyl)dibenzofuranyl]benzene; (diphenyltriazinyl)[(phenyldimethylfluorenyl)dibenzothiophenyl]benzene; (diphenyltriazinyl)[(phenyldimethylfluorenyl)dibenzoselenophenyl]benzene; (diphenyltriazinyl){[(dimethyl-$d_6$)fluorenyl]dibenzofuranyl}benzene; (diphenyltriazinyl){[(dimethyl-$d_6$)fluorenyl]dibenzothiophenyl}benzene; (diphenyltriazinyl){[(dimethyl-$d_6$)fluorenyl]dibenzoselenophenyl}benzene; (diphenyltriazinyl)[(dimethylfluorenyl)dibenzofuranyl]benzene; (diphenyltriazinyl)[(dimethylfluorenyl)dibenzothiophenyl]benzene; (diphenyltriazinyl)[(dimethylfluorenyl)dibenzoselenophenyl]benzene; (diphenyltriazinyl)[(dimethylfluorenyl)dibenzofuranyl]benzene; (diphenyltriazinyl)[(dimethylfluorenyl)dibenzothiophenyl]benzene; (diphenyltriazinyl)[(dimethylfluorenyl)dibenzoselenophenyl]benzene; (diphenyltriazinyl)[(dimethylfluorenyl)dibenzofuranyl]benzene; (diphenyltriazinyl)[(dimethylfluorenyl)dibenzothiophenyl]benzene; (diphenyltriazinyl)[(dimethylfluorenyl)dibenzoselenophenyl]benzene; (diphenyltriazinyl)[(dimethylfluorenyl)dibenzofuranyl]benzene; (diphenyltriazinyl)[(dimethylfluorenyl)dibenzothiophenyl]benzene; (diphenyltriazinyl)[(dimethylfluorenyl)dibenzoselenophenyl]benzene; (diphenyltriazinyl)[phenyl(dimethylfluorenyl)dibenzofuranyl]benzene; (diphenyltriazinyl)[phenyl(dimethylfluorenyl)dibenzothiophenyl]benzene; (diphenyltriazinyl)[phenyl(dimethylfluorenyl)dibenzoselenophenyl]benzene; (diphenyltriazinyl)[phenyl(dimethylfluorenyl)dibenzofuranyl]benzene; (diphenyltriazinyl)[phenyl(dimethylfluorenyl)dibenzothiophenyl]benzene; (diphenyltriazinyl)[phenyl(dimethylfluorenyl)dibenzoselenophenyl]benzene; (diphenyltriazinyl)[(dimethylfluorenyl)dibenzofuranyl]benzene; (diphenyltriazinyl)[(dimethylfluorenyl)dibenzothiophenyl]benzene; (diphenyltriazinyl)[(dimethylfluorenyl)dibenzoselenophenyl]benzene; [(diphenyl-$d_{10}$)triazinyl][(dimethylfluorenyl)dibenzofuranyl]benzene; [(diphenyl-$d_{10}$)triazinyl][(dimethylfluorenyl)dibenzothiophenyl]benzene; [(diphenyl-$d_{10}$)triazinyl][(dimethylfluorenyl)dibenzoselenophenyl]benzene; benzene-$d_4$[(diphenyl-$d_{10}$)triazinyl][(dimethylfluorenyl)dibenzofuranyl]; benzene-$d_4$[(diphenyl-$d_{10}$)triazinyl][(dimethylfluorenyl)dibenzothiophenyl]; benzene-$d_4$[(diphenyl-$d_{10}$)triazinyl][(dimethylfluorenyl)dibenzoselenophenyl]; [(diphenyl-$d_{10}$)triazinyl]{[(dimethyl-$d_6$)fluorenyl]dibenzofuranyl}benzene; [(diphenyl-$d_{10}$)triazinyl]{[(dimethyl-$d_6$)fluorenyl]dibenzothiophenyl}benzene; [(diphenyl-$d_{10}$)triazinyl]{[(dimethyl-$d_6$)fluorenyl]dibenzoselenophenyl}benzene; benzene-$d_4$[(diphenyl-$d_{10}$)triazinyl][(dimethylfluorenyl)dibenzofuranyl]; benzene-$d_4$[(diphenyl-$d_{10}$)triazinyl][(dimethylfluorenyl)dibenzothiophenyl]; benzene-$d_4$[(diphenyl-$d_{10}$)triazinyl][(dimethylfluorenyl)dibenzoselenophenyl]; [bis(carbazole)yl]benzofuropyridine; [bis(carbazole)yl]benzothienopyridine; [bis(carbazole)yl]benzoselenopyridine; [bis(carbazole)yl]benzofuropyridine; [bis(carbazole)yl]benzothienopyridine; [bis(carbazole)yl]benzoselenopyridine; [bis(carbazole)yl]benzofuropyridine; [bis(carbazole)yl]benzothienopyridine; [bis(carbazole)yl]benzoselenopyridine; [bis(carbazole)yl]benzofuropyridine; [bis(carbazole)yl]benzothienopyridine; [bis(carbazole)yl]benzoselenopyridine; (triphenylenyl)(carbazolyl)benzofuropyridine; (triphenylenyl)(carbazolyl)benzothienopyridine; (triphenylenyl)(carbazolyl)benzoselenopyridine; (dibenzothiophenyl)(carbazolyl)benzofuropyridine; (dibenzothiophenyl)(carbazolyl)benzothienopyridine; (dibenzothiophenyl)(carbazolyl)benzoselenopyridine; phenyl(triphenylenyl)benzofuropyridine; phenyl(triphenylenyl)benzothienopyridine; phenyl(triphenylenyl)benzoselenopyridine; phenyl(triphenylenyl)benzofuropyridine; phenyl(triphenylenyl)benzothienopyridine; phenyl(triphenylenyl)benzoselenopyridine; phenyl(triphenylenyl)bi[carbazole]; phenyl(triphenylenyl)bi[carbazole]; phenyl(triphenylenyl)bi[carbazole]; phenyl(dimethylfluorenyl)bi[carbazole]; phenyl(dimethylfluorenyl)bi[carbazole]; phenyl(dimethylfluorenyl)bi[carbazole]; phenyl(dimethylfluorenyl)bi[carbazole]; phenyl(dimethylfluorenyl)bi[carbazole]; phenyl(dimethylfluorenyl)bi[carbazole]; (biphenylyl)(dimethylfluorenyl)bi[carbazole]; (biphenylyl)(dimethylfluorenyl)bi[carbazole]; (terphenylyl)(dimethylfluorenyl)bi[carbazole]; diphenyl(ter[carbazole]); diphenyl(ter[carbazole]); diphenyl(ter[carbazole]); bi(phenylcarbazole); phenyl(biphenylyl)bi[carbazole]; phenyl(biphenylyl)bi[carbazole]; bi[(biphenylyl)carbazole]; bi[(biphenylyl)carbazole]; triphenylbi[carbazole]; bi[diphenylcarbazole]; diphenyl(biphenylyhbi[carbazole]ti[phenylcarbazole]; phenyl(biphenylyl)bi[carbazole]; phenyl(biphenylyl)bi[carbazole]; bi[(biphenylyl)carbazole]; bi[(biphenylyl)carbazole]; triphenylbi[carbazole]; bi[diphenylcarbazole]; diphenyl(biphenylyl)bi[carbazole]:phenyl(terphenylyl)bi[carbazole]; phenyl(terphenylyl)bi[carbazole]; phenyl(terphenylyl)bi[carbazole]; phenyl(diphenylpyridinyl)bi[carbazole]; phenyl(dibenzofuranyl)bi[carbazole]; phenyl(dibenzothiophenyl)bi[carbazole]; phenyl(dibenzoselenophenyl)bi[carbazole]; phenyl(dibenzofuranyl)bi[carbazole]; phenyl(dibenzothiophenyl)bi[carbazole]; phenyl(dibenzoselenophenyl)bi[carbazole]; phenyl(dibenzofuranyl)bi[carbazole]; phenyl(dibenzothiophenyl)bi[carbazole]; phenyl(dibenzoselenophenyl)bi[carbazole]; phenyl(dibenzofuranyl)bi[carbazole]; phenyl(dibenzothiophenyl)bi[carbazole]; phenyl(dibenzoselenophenyl)bi[carbazole]; phenyl(dibenzofuranyl)bi[carbazole]; phenyl(dibenzothiophenyl)bi[carbazole]; phenyl(dibenzoselenophenyl)bi[carbazole]; (phenylcarbazolyl)(dibenzofuranyl)fluorene; (phenylcarbazolyl)(dibenzothiophenyl)fluorene; (phenylcarbazolyl)(dibenzoselenophenyl)fluorene; phenyl(dibenzofuranyl)bi[carbazole]; phenyl(dibenzothiophenyl)bi[carbazole]; phenyl(dibenzoselenophenyl)bi[carbazole]; phenyl(dibenzofuranyl)bi[carbazole]; phenyl(dibenzothiophenyl)bi[carbazole]; phenyl(dibenzoselenophenyl)bi[carbazole]; (biphenylyl)(dibenzofuranyl)bi[carbazole]; (biphenylyl)(dibenzothiophenyl)bi[carbazole]; (biphenylyl)(dibenzoselenophenyl)bi[carbazole]; (biphenylyl)(dibenzofuranyl)bi[carbazole]; (biphenylyl)(dibenzothiophenyl)bi[carbazole]; (biphenylyl)(dibenzoselenophenyl)bi[carbazole]; (biphenylyl)(dibenzofuranyl)bi[carbazole]; (biphenylyl)(dibenzothiophenyl)bi[carbazole]; (biphenylyl)(dibenzoselenophenyl)bi[carbazole]; phenyl(phenyldibenzofuranyl)bi[carbazole]; phenyl (phenyldibenzothiophenyl)bi[carbazole]; phenyl (phenyldibenzoselenophenyl)bi[carbazole]; phenyl (dibenzofuranyl)bi[carbazole]; phenyl(dibenzothiophenyl) bi[carbazole]; phenyl(dibenzoselenophenyl)bi[carbazole]; phenyl(dibenzofuranyl)bi[carbazole]; phenyl(dibenzothiophenyl)bi[carbazole]; phenyl(dibenzoselenophenyl)bi[carbazole]; phenyl(dibenzofuranyl)bi[carbazole]; phenyl (dibenzothiophenyl)bi[carbazole]; phenyl (dibenzoselenophenyl)bi[carbazole]; phenyl (dibenzofuranyl)bi[carbazole]; phenyl(dibenzothiophenyl) bi[carbazole]; phenyl(dibenzoselenophenyl)bi[carbazole]; phenyl(dibenzofuranyl)bi[carbazole]; phenyl(dibenzothiophenyl)bi[carbazole]; phenyl(dibenzoselenophenyl)bi[carbazole]; (naphthaleyl)(dibenzofuranyl)bi[carbazole]; (naphthaleyl)(dibenzothiophenyl)bi[carbazole]; (naphthaleyl) (dibenzoselenophenyl)bi[carbazole]; (dimethylfluorenyl) (dibenzofuranyl)bi[carbazole]; (dimethylfluorenyl) (dibenzothiophenyl)bi[carbazole]; (dimethylfluorenyl) (dibenzoselenophenyl)bi[carbazole]; (dimethylfluorenyl) (dibenzofuranyl)bi[carbazole]; (dimethylfluorenyl) (dibenzothiophenyl)bi[carbazole]; (dimethylfluorenyl) (dibenzoselenophenyl)bi[carbazole]; (triphenylenyl) dibenzofuran; (triphenylenyl)dibenzothiophene; (triphenylenyl)dibenzoselenophene; (triphenylenyl)(dibenzofuranyl)benzene; (triphenylenyl)(dibenzothiophenyl)benzene; (triphenylenyl)(dibenzoselenophenyl)benzene; (triphenylenyl)(phenyldibenzofuranyl)benzene; (triphenylenyl) (phenyldibenzothiophenyl)benzene; (triphenylenyl) (phenyldibenzoselenophenyl)benzene; (triphenylenyl) (dibenzofuranyl)biphenyl; (triphenylenyl) (dibenzothiophenyl)biphenyl; (triphenylenyl) (dibenzoselenophenyl)biphenyl; phenyl(triphenylenyl) dibenzofuran; phenyl(triphenylenyl)dibenzothiophene; phenyl(triphenylenyl)dibenzoselenophene; (biphenylyl)(triphenylenyl)dibenzofuran; (biphenylyl)(triphenylenyl) dibenzothiophene; (biphenylyl)(triphenylenyl)dibenzoselenophene; (terphenylyl)(triphenylenyl)dibenzofuran; (terphenylyl)(triphenylenyl)dibenzothiophene; (terphenylyl)(triphenylenyl)dibenzoselenophene; (biphenylyl)[(triphenylenyl)phenyl]dibenzofuran; (biphenylyl)[(triphenylenyl) phenyl]dibenzothiophene; (biphenylyl)[(triphenylenyl) phenyl]dibenzoselenophene; (carbazolyl)(triphenylenyl) dibenzofuran; (carbazolyl)(triphenylenyl)dibenzothiophene; (carbazolyl)(triphenylenyl)dibenzoselenophene; (carbazolyl)(triphenylenyl)biphenyl; (carbazolyl)(triphenylenyl) biphenyl; iridium(III)tris[phenylpyridine-N,C']; iridium(III) tris[methyl(phenyl)pyridine-N,C']; iridium(III)tris[(methyl-$d_3$)(phenyl)pyridine-N,C']; iridium(III)tris[(dimethyl-$d_6$) (phenyl)pyridine-N,C']; iridium(III)tris[(methyl-$d_6$) (diphenyl)pyridine-N,C']; iridium(III)tris[(pyridinyl) biphenyl-N,C']; iridium(III)tris[(methylpyridinyl)biphenyl-N,C']; iridium(III)bis(phenylpyridine-N,C'[(pyridinyl) biphenyl-N,C']; iridium(III)bis(phenylpyridine-N,C' [(pyridinyl)biphenyl-N,C']; iridium(III)bis(phenylpyridine-N,C'[(methylpyridinyl)biphenyl-N,C']; iridium(III)bis (phenylpyridine-N,C'[(methylpyridinyl)biphenyl-N,C']; iridium(III)bis(phenylpyridine-N,C'{[(methyl-$d_3$)pyridinyl] biphenyl-N,C'}; iridium(III)bis(phenylpyridine-N,C'] [(methyl)(diphenyl)pyridine-N,C']; iridium(III)bis(phenylpyridine-N,C'][(methyl-$d_3$)(diphenyl)pyridine-N,C']; iridium(III)bis(phenylpyridine-N,C'[ethane-$d_3$-(diphenyl) pyridine-N,C']; iridium(III)bis(phenylpyridine-N,C'] [(methyl)(diphenyl)pyridine-N,C']; iridium(III)bis[(methyl) (phenyl)pyridine-N,C'][(methyl)(phenyl)(naphthaleyl) pyridine-N,C']; iridium(III)bis[(methyl)(phenyl)pyridine-N,C'][(methyl)(diphenyl)pyridine-N,C']; iridium(III)bis [(methyl)(phenyl)pyridine-N,C'][diphenylpyridine-N,C']; iridium(III)bis{[(methylphenyl-$d_3$)pyridined$_4$]-N,C'}{[(diphenyl-$d_9$)pyridined$_4$]-N,C'}; iridium(III)bis[(methyl)(phenyl)pyridine-N,C'][diphenylpyridine-N,C']; iridium(III)bis [(methyl-$d_3$)(phenyl)pyridine-N,C'][diphenylpyridine-N,C']; iridium(III)bis[phenylpyridine-N,C'][(methyl) (diphenyl)pyridine-N,C']; iridium(III)bis[phenylpyridine-N,C'][(methyl-$d_3$)(diphenyl)pyridine-N,C']; iridium(III)bis [phenylpyridine-N,C'][(ethyl)(diphenyl)pyridine-N,C']; iridium(III)bis[phenylpyridine-N,C'][(methyl)(phenyl) (fluorophenyl)pyridine-N,C']; iridium(III)bis[phenylpyridine-N,C'[(dibenzofuranyl)pyridine-N,C']; iridium(III)bis [phenylpyridine-N,C'][(isopropyl)(dibenzofuranyl) pyridine-N,C']; iridium(III)bis[(methyl)(phenyl)pyridine-N,C'][(isopropyl)(dibenzofuranyl)pyridine-N,C']; iridium(III) bis[phenylpyridine-N,C'][(isopropyl-$d_7$)(dibenzofuranyl) pyridine-N,C']; iridium(III)bis[(methyl-$d_3$)(phenyl) pyridine-N,C'][(isopropyl-$d_7$)(dibenzofuranyl)pyridine-N,C']; iridium(III)bis[(methyl-$d_3$)(phenyl)pyridine-N,C'] [(methyl-$d_3$)(diphenyl)pyridine-N,C']; iridium(III)bis [phenylpyridine-N,C'][(isopropyl) (isopropylbenzofuropyridinyl)pyridine-N,C']; iridium(III) bis[phenylpyridine-N,C'][(benzofuropyridinyl)pyridine-N,C']; iridium(III)bis[phenylpyridine-N,C' [(benzofuropyridinyl)pyridine-N,C']; iridium(III)bis [phenylpyridine-N,C'][(methylbenzofuropyridinyl) pyridine-N,C']; iridium(III)bis[phenylpyridine-N,C']{ [(methyl-$d_3$)benzofuropyridinyl]pyridine-N,C'}; iridium (III)bis[phenylpyridine-N,C'][(methylbenzofuropyridinyl) pyridine-N,C']; iridium(III)bis[phenylpyridine-N,C']{ [(methyl-$d_3$)benzofuropyridinyl]pyridine-N,C'}; iridium (III)bis[(methyl-$d_3$)(phenyl)pyridine-N,C']{[(methyl-$d_3$) benzofuropyridinyl]pyridine-N,C'}; iridium(III)bis [(methyl-$d_3$)(phenyl)pyridine-N,C'][(isopropyl-$d_7$) (benzofuropyridinyl)pyridine-N,C']; iridium(III)bis [(methyl-$d_3$)(phenyl)pyridine-N,C']{(isopropyl-$d_7$) [(methyl-$d_3$)benzofuropyridinyl]pyridine-N,C'}; iridium (III)bis[(isopropyl-$d_7$)(phenyl)pyridine-N,C']{(isopropyl-$d_7$)[(methyl-$d_3$)benzofuropyridinyl]pyridine-N,C'}; iridium (III)bis[(methyl-$d_3$)(phenyl)pyridine-N,C'][(isopropyl-$d_1$) (benzofuropyridinyl)pyridine-N,C']; iridium(III)bis [(methyl-$d_3$)(phenyl)pyridine-N,C']{(isopropyl-$d_1$) [(methyl-$d_3$)benzofuropyridinyl]pyridine-N,C'}; iridium (III)bis[(methyl-$d_3$)(phenyl)pyridine-N,C'][(isopropyl) (methyl-$d_3$)(benzofuropyridinyl)pyridine-N,C']; iridium(III) bis[(methyl-$d_3$)(phenyl)pyridine-N,C'][(isopropyl-$d_1$) (methyl-$d_3$)(benzofuropyridinyl)pyridine-N,C']; iridium(III) bis[(dimethyl-$d_6$)(phenyl)pyridine-N,C']{(isopropyl-$d_7$) [(methyl-$d_3$)benzofuropyridinyl]pyridine-N,C'}; iridium (III)bis[(dimethyl-$d_6$)(phenyl)pyridine-N,C']{(isopropyl) (methyl-$d_3$)[(methyl-$d_3$)benzofuropyridinyl]pyridine-N,C'}; iridium(III)bis[(dimethyl-$d_6$)(phenyl)pyridine-N,C']{(isopropyl-$d_7$)(methyl-$d_3$)[(methyl-$d_3$)benzofuropyridinyl]pyridine-N,C']; iridium(III)bis[(dimethyl-$d_6$)(phenyl)pyridine-N,C']{[(isopropyl-$d_7$)(methyl-$d_3$)][(methyl-$d_3$) benzofuropyridinyl]pyridine-N,C']; iridium(III)bis[(methyl-$d_3$)(phenyl)pyridine-N,C']{(isopropyl-$d_7$)(methyl-$d_3$) [(methyl-$d_3$)benzofuropyridinyl]pyridine-N,C'}; iridium (III)bis(phenylpyridine-N,C'{[(dimethyl-$d_6$) benzofuropyridinyl]pyridine-N,C'}; iridium(III)bis [(dimethyl-$d_6$)(phenyl)pyridine-N,C']{(isopropyl) [(isopropyl)benzofuropyridinyl]pyridine-N,C'}; iridium(III) bis[(dimethyl-$d_6$)(phenyl)pyridine-N,C']{(isopropyl-$d_1$) [(isopropyl-$d_1$)benzofuropyridinyl]pyridine-N,C']; iridium (III)bis[(methyl-$d_3$)(phenyl)pyridine-N,C']{[(isopropyl-$d_1$) [(isopropyl-$d_1$)benzofuropyridinyl]pyridine-N,C'}; iridium (III)bis[(phenyl)pyridine-N,C']{[(dimethyl-$d_6$) benzofuropyridinyl]pyridine-N,C'}; iridium(III)bis[(phenyl)

pyridine-N,C']{[(dimethyl-$d_6$)benzofuropyridinyl]pyridine-N,C'}; iridium(III)bis[(methyl-$d_3$)(phenyl)pyridine-N,C'][diphenylpyridine-N,C']; iridium(III)bis[phenylpyridine-N,C'][diphenylpyridine-N,C']; iridium(III)bis{[methyl(phenyl-$d_3$)](pyridined$_4$)-N,C'}{[(diphenyl-$d_9$)(pyridined$_3$)]-N,C'}; iridium(III)bis[phenylpyridine-N,Clphenyl[(methyl-$d_3$)phenyl]pyridine-N,C']; iridium(III)bis[(methyl)(phenyl)pyridine-N,C'][diphenylpyridine-N,C']; iridium(III)bis[(dimethyl)(phenyl)pyridine-N,C'][diphenylpyridine-N,C']; iridium(III)bis[(dimethyl)(phenyl)pyridine-N,Clphenyl[(methyl-$d_3$)phenyl]pyridine-N,C']; iridium(III)bis[(dimethyl-$d_6$)(phenyl)pyridine-N,C'][diphenylpyridine-N,C']; iridium(III)bis[(methyl)(phenyl)pyridine-N,C'][diphenylpyridine-N,C']; iridium(III)bis[(phenyl)pyridine-N,C'[(fluorophenyl)(methylbenzofuropyridinyl)pyridine-N,C']; iridium(III)bis[(phenyl)pyridine-N,C'[(fluorophenyl)(methylbenzofuropyridinyl)pyridine-N,C']; iridium(III)bis[(phenyl)pyridine-N,C'[{(fluorophenyl)[(methyl-$d_3$)benzofuropyridinyl]pyridine-N,C']; iridium(III)bis[(phenyl)pyridine-N,C'[{(fluorophenyl)[(methyl-$d_3$)benzofuropyridinyl]pyridine-N,C']; iridium(III)bis[(phenyl)pyridine-N,C'[{(phenyl)[(methyl-$d_3$)benzofuropyridinyl]pyridine-N,C']; iridium(III)bis[(phenyl)pyridine-N,C'][phenylbipyridine-N,C']; iridium(III)bis[(isopropylphenyl)pyridine-N,C'][(fluorophenyl)(methylbenzofuropyridinyl)pyridine-N,C']; iridium(III)bis{[(isopropyl-$d_7$)phenyl]pyridine-N,C'}{(fluorophenyl)[(methyl-$d_3$)benzofuropyridinyl]pyridine-N,C']; iridium(III)bis{[(isopropyl-$d_7$)phenyl]pyridine-N,C'}{(fluorophenyl)[(methyl-$d_3$)benzofuropyridinyl]pyridine-N,C'}; iridium(III)bis{[(methylphenyltriazinyl)phenyl]pyridine-N,C'}iridium(III)bis[phenylquinoline-N,C'](acetylacetonate); iridium(III)bis[(methyl)(methylphenyl)quinoline-N,C'](acetylacetonate); iridium(III)bis[(methyl)(methylphenyl)quinoline-N,C'](diethylnonanedionate); iridium(III)bis[(methyl)(methylphenyl)quinoline-N,C'](methyldiethylnonanedionate); iridium(III)bis[(dimethylphenyl)quinoline-N,C'](acetylacetonate); iridium(III)bis[(isobutyl)(dimethylphenyl)quinoline-N,C'](acetylacetonate); iridium(III)bis[(isobutyl)(methylphenyl)quinoline-N,C'](dimethylnonanedionate); iridium(III)bis[(isobutyl)(methylphenyl)quinoline-N,C'](dimethylheptanedionate); iridium(III)bis[(isobutyl)(dimethylphenyl)quinoline-N,C'](acetylacetonate); iridium(III)bis[(isobutyl)(dimethylphenyl)quinoline-N,C'](dimethylnonanedionate); iridium(III)bis[(phenyl)quinoline-N,C'](diethylnonanedionate); iridium(III)bis[(isopentyl)(dimethylphenyl)quinoline-N,C'](diethylnonanedionate); iridium(III)bis[(isobutyl)(dimethylphenyl)quinoline-N,C'](diethylnonanedionate); iridium(III)bis[(isobutyl)(dimethylphenyl)quinoline-N,C'](bis[cyclopentyl]acetylacetonate); iridium(III)bis[(isobutyl)(dimethylphenyl)quinoline-N,C'](bis[cyclohexyl]acetylacetonate); iridium(III)bis[(diisobutyl)(dimethylphenyl)quinoline-N,C'](acetylacetonate); iridium(III)bis[(dimethyl)(dimethylphenyl)quinoline-N,C'](ethylmethyldecanedionate); iridium(III)bis[(dimethyl)(dimethylphenyl)quinoline-N,C'](dimethylnonanedionate); iridium(III)bis[(dimethyl)[(dimethyl-$d_6$)phenyl]quinoline-N,C'](acetylacetonate); iridium(III)bis[methyl(diphenyl)dibenzoquinoxaline-N,C'](acetylacetonate); iridium(III)bis[(phenyl)quinoline-N,C'](acetylacetonate); iridium(III)bis[(phenyl)isoquinoline-N,C'](acetylacetonate); iridium(III)bis[(cyclobutyl)(dimethylphenyl)quinoline-N,C'](diethylnonanedionate); iridium(III)bis[(cyclopentyl)(dimethylphenyl)quinoline-N,C'](diethylnonanedionate); iridium(III)bis[(cyclobutyl)(dimethylphenyl)quinoline-N,C'](methyldiethylnonanedionate); iridium(III)bis[(cyclopentyl)(dimethylphenyl)quinoline-N,C'](methyldiethylnonanedionate); iridium(III)bis[(cyclohexyl)(methylphenyl)quinoline-N,C'](acetylacetonate); iridium(III)bis[(methylphenyl)(dimethylphenyl)quinoline-N,C'](diethylnonanedionate); iridium(III)bis[(trifluoropropyl)(dimethylphenyl)quinoline-N,C'](diethylnonanedionate); iridium(III)bis[(trifluoropropyl)(dimethylphenyl)quinoline-N,C'](acetylacetonate); iridium(III)bis[(trifluoropropyl)(dimethylphenyl)quinoline-N,C'][bis(cyclopentyl)acetylacetonate]; iridium(III)bis[(trifluoropropyl)(dimethylphenyl)quinoline-N,C'][bis(cyclohexyl)acetylacetonate]; iridium(III)bis[(trifluoropropyl)(dimethylphenyl)quinoline-N,C'](diethylnonanedionate); iridium(III)bis[(trifluoropropyl)(dimethylphenyl)quinoline-N,C'](acetylacetonate); iridium(III)bis[(trifluoropropyl)(dimethylphenyl)quinoline-N,C'][bis(cyclopentyl)acetylacetonate]; iridium(III)bis[(trifluoropropyl)(dimethylphenyl)quinoline-N,C'][bis(cyclohexyl)acetylacetonate]; iridium(III)bis[(trifluorodimethylbutyl)(dimethylphenyl)quinoline-N,C'](diethylnonanedionate); iridium(III)bis[(trifluorodimethylbutyl)(dimethylphenyl)quinoline-N,C'](acetylacetonate); iridium(III)bis[(trifluorodimethylbutyl)(dimethylphenyl)quinoline-N,C'][bis(cyclohexyl)acetylacetonate]; iridium(III)bis[(trifluorodimethylbutyl)(dimethylphenyl)quinoline-N,C'][bis(cyclopentyl)acetylacetonate]; iridium(III)bis[(trifluorodimethylbutyl)(dimethylphenyl)quinoline-N,C'](diethylnonanedionate); iridium(III)bis[(trifluorodimethylbutyl)(dimethylphenyl)quinoline-N,C'](acetylacetonate); iridium(III)bis[(trifluorodimethylbutyl)(dimethylphenyl)quinoline-N,C'][bis(cyclopentyl)acetylacetonate]; iridium(III)bis[(trifluorodimethylbutyl)(dimethylphenyl)quinoline-N,C'][bis(cyclohexyl)acetylacetonate]; iridium(III)bis[(trifluoropropyl)(dimethylphenyl)quinoline-N,C'][bis(ethylmethylisopropylnonanedionate]; iridium(III)bis[(trifluorodimethylbutyl)(dimethylphenyl)quinoline-N,C'][dimethyldiisopropylnonanedionate]; iridium(III)bis[(trifluorodimethylbutyl)(dimethylphenyl)quinoline-N,C'][dimethyldiisopropylnonanedionate]; iridium(III)bis[(isobutyl)(dimethylbenzofuropyridinyl)quinoline-N,C'][dimethyldiisopropylnonanedionate]; iridium(III)bis[(isobutyl)(dimethylbenzofuropyridinyl)quinoline-N,C'][diethylnonanedionate]; iridium(III)bis[(trifluorodimethylbutyl)(dimethylbenzofuropyridinyl)quinoline-N,C'][diethylmethylnonanedionate]; iridium(III)bis[(isobutyl)(dimethylphenyl)quinoline-N,C'][dimethyldiisopropylnonanedionate]; iridium(III)bis[(isopropylphenyl)quinoline-N,C']{[di(isopropyl)triazinyl](methylbenzofuropyridinyl)pyridine-N,C'}; iridium(III)bis[(isopropyl)(dimethylphenyl)isoquinoline-N,C'][diethylnonanedionate]; iridium(III)bis[(isopropyl)(dimethylphenyl)isoquinoline-N,C'][diethylnonanedionate]; iridium(III)bis[di(isopropyl)(dimethylphenyl)isoquinoline-N,C'][acetylacetonate]; iridium(III)tris[dimethyldibenzoquinoline-N,C']; iridium(III)bis[(tert-butylphenyl)thienoisoquinoline-N,C'][acetylacetonate]; iridium(III)bis[(phenyl)thienopyridine-N,C'](acetylacetonate]; iridium(III)bis[(dimethylfluorenyl)quinoline-N,C'](acetylacetonate]; iridium(III)bis[(methylnaphthaleyl)pyridine-N,C'](acetylacetonate]; iridium(III)bis[{(methyl)(fluoro)phenyl]isoquinoline-N,C'}[acetylacetonate]; iridium(III)bis[(methyl)(fluoro)(dimethylphenyl)quinoline-N,C'][acetylacetonate]

(Group 22A)

phenyl(terphenylyl)indolocarbazole; (biphenylyl)(terphenylyl)indolocarbazole; (biphenylyl)(terphenylyl)indolocarbazole; bis(terphenylyl)indolocarbazole; bis(terphenylyl)indolocarbazole; bis(terphenylyl)indolocarbazole; bis (terphenylyl)indolocarbazole; bis(terphenylyl) indolocarbazole; (triphenylenyl)(terphenylyl) indolocarbazole; (dimethylfluorenyl)(terphenylyl) indolocarbazole; (spiro[cyclopentanefluorene]yl) (terphenylyl)indolocarbazole; (spiro[cyclohexanefluorene] yl)(terphenylyl)indolocarbazole; (dimethylfluorenyl) (terphenylyl)indolocarbazole; (spirobi[fluorene]yl) (terphenylyl)indolocarbazole; (dibenzofuranyl) (terphenylyl)indolocarbazole; (dibenzofuranyl) (terphenylyl)indolocarbazole; (dibenzofuranyl) (terphenylyl)indolocarbazole; (dibenzothiophenyl) (terphenylyl)indolocarbazole; (dibenzothiophenyl) (terphenylyl)indolocarbazole; (dibenzothiophenyl) (terphenylyl)indolocarbazole; (dibenzoselenophenyl) (terphenylyl)indolocarbazole; (dibenzoselenophenyl) (terphenylyl)indolocarbazole; (dibenzoselenophenyl) (terphenylyl)indolocarbazole; (phenylcarbazolyl) (terphenylyl)indolocarbazole; [(carbazolyl)phenyl] (terphenylyl)indolocarbazole; (benzothienopyridinyl) (terphenylyl)indolocarbazole; (benzothienopyrimidineyl) (terphenylyl)indolocarbazole; (benzothienopyrimidineyl) (terphenylyl)indolocarbazole; (phenylbenzothienopyrimidineyl)(terphenylyl)indolocarbazole; (diphenyltriazinyl)(terphenylyl)indolocarbazole; (phenylquinazolinyl)(terphenylyl)indolocarbazole; (dibenzoquinazolinyl)(terphenylyl)indolocarbazole; (dibenzoquinoxalinyl)(terphenylyl)indolocarbazole; [(phenyl-$d_5$)biphenylyl](biphenylyl[(indolocarbazole; [(phenyl-$d_5$)biphenylyl](phenyl-$d_5$)indolocarbazole; [(dimethyl-$d_6$) fluorenyl](terphenylyl)indolocarbazole; [(dibenzofuranyl) phenyl](terphenylyl)indolocarbazole; [(dibenzothiophenyl) phenyl](terphenylyl)indolocarbazole; [(triphenylenyl) phenyl](terphenylyl)indolocarbazole; [(diphenyltriazinyl) phenyl](terphenylyl)indolocarbazole; (phenyl)(terphenylyl) indolocarbazole; (biphenylyl)(terphenylyl)indolocarbazole; (biphenylyl)(terphenylyl)indolocarbazole; bis(terphenylyl) indolocarbazole; bis(terphenylyl)indolocarbazole; (triphenylenyl)(terphenylyl)indolocarbazole; (dimethylfluorenyl) (terphenylyl)indolocarbazole; (spiro[cyclohexanefluorene] yl)(terphenylyl)indolocarbazole; (spiro [cyclopentanefluorene]yl)(terphenylyl)indolocarbazole; (spirobi[fluorene]yl)(terphenylyl)indolocarbazole; (dimethylfluorenyl)(terphenylyl)indolocarbazole; (dibenzofuranyl) (terphenylyl)indolocarbazole; (dibenzofuranyl)(terphenylyl)indolocarbazole; (dibenzofuranyl)(terphenylyl) indolocarbazole; (dibenzothiophenyl)(terphenylyl) indolocarbazole; (dibenzothiophenyl)(terphenylyl) indolocarbazole; (dibenzoselenophenyl)(terphenylyl) indolocarbazole; (dibenzoselenophenyl)(terphenylyl) indolocarbazole; (dibenzoselenophenyl)(terphenylyl) indolocarbazole; (dibenzoselenophenyl)(terphenylyl) indolocarbazole; (phenylcarbazolyl)(terphenylyl) indolocarbazole; [(carbazolyl)phenyl](terphenylyl) indolocarbazole; (benzothienopyridinyl)(terphenylyl) indolocarbazole; (benzothienopyrimidineyl)(terphenylyl) indolocarbazole; (benzothienopyrimidineyl)(terphenylyl) indolocarbazole; (phenylbenzothienopyrimidineyl) (terphenylyl)indolocarbazole; (diphenylbenzothienopyrimidineyl)(terphenylyl)indolocarbazole; (diphenylbenzothienopyrimidineyl)(terphenylyl)indolocarbazole; (diphenyltriazinyl)(terphenylyl)indolocarbazole; (phenylpyridotriazinyl)(terphenylyl)indolocarbazole; (dibenzopyrimidineyl)(terphenylyl)indolocarbazole; (dibenzoquinoxalinyl)(terphenylyl)indolocarbazole; [(dimethyl-$d_6$)fluorenyl](terphenylyl)indolocarbazole; [(diphenyltriazinyl)phenyl](terphenylyl)indolocarbazole; [(phenyl-$d_5$) biphenylyl](biphenylyl)indolocarbazole; [(phenyl-$d_5$) biphenylyl](phenyl-$d_5$)indolocarbazole; (phenyl) (terphenylyl)indolocarbazole; (biphenylyl)(terphenylyl) indolocarbazole; (biphenylyl)(terphenylyl)indolocarbazole; bis(terphenylyl)indolocarbazole; bis(terphenylyl)indolocarbazole; (triphenylenyl)(terphenylyl)indolocarbazole; (dimethylfluorenyl)(terphenylyl)indolocarbazole; (spirobi[fluorene]yl)(terphenylyl)indolocarbazole; (spiro [cyclopentanefluorene]yl)(terphenylyl)indolocarbazole; (dibenzofuranyl)(terphenylyl)indolocarbazole; (dibenzofuranyl)(terphenylyl)indolocarbazole; (dibenzofuranyl)(terphenylyl)indolocarbazole; (dibenzothiophenyl)(terphenylyl)indolocarbazole; (dibenzothiophenyl)(terphenylyl) indolocarbazole; (dibenzothiophenyl)(terphenylyl) indolocarbazole; (diphenyltriazinyl)(terphenylyl) indolocarbazole; (phenylquinazolinyl)(terphenylyl) indolocarbazole; (benzothienopyrimidineyl)(terphenylyl) indolocarbazole; (phenyl)(terphenylyl)indolocarbazole; (biphenylyl)(terphenylyl)indolocarbazole; (biphenylyl)(terphenylyl)indolocarbazole; bis(terphenylyl)indolocarbazole; bis(terphenylyl)indolocarbazole; (triphenylenyl)(terphenylyl)indolocarbazole; (dimethylfluorenyl)(terphenylyl)indolocarbazole; (spirobi[fluorene]yl)(terphenylyl)indolocarbazole; (spiro[cyclopentanefluorene]yl)(terphenylyl) indolocarbazole; (dibenzofuranyl)(terphenylyl) indolocarbazole; (dibenzofuranyl)(terphenylyl) indolocarbazole; (dibenzofuranyl)(terphenylyl) indolocarbazole; (dibenzothiophenyl)(terphenylyl) indolocarbazole; (dibenzothiophenyl)(terphenylyl) indolocarbazole; (dibenzothiophenyl)(terphenylyl) indolocarbazole; (diphenyltriazinyl)(terphenylyl) indolocarbazole; (phenylquinazolinyl)(terphenylyl) indolocarbazole; (benzothienopyrimidineyl)(terphenylyl) indolocarbazole; (phenyl)(terphenylyl)indolocarbazole; (biphenylyl)(terphenylyl)indolocarbazole; (biphenylyl)(terphenylyl)indolocarbazole; bis(terphenylyl)indolocarbazole; (dimethylfluorenyl)(terphenylyl)indolocarbazole; (dibenzofuranyl)(terphenylyl)indolocarbazole; (dibenzothiophenyl) (terphenylyl)indolocarbazole; (dibenzothiophenyl)(terphenylyl)indolocarbazole; (benzothienopyridinyl)(terphenylyl) indolocarbazole; (benzothienopyrimidineyl)(terphenylyl) indolocarbazole; (diphenyltriazinyl)(terphenylyl) indolocarbazole; (phenylquinazolinyl)(terphenylyl) indolocarbazole; [(phenyl-$d_5$)biphenylyl](biphenylyl) indolocarbazole; [(cyclohexyl-$d_5$)biphenylyl](phenyl-$d_5$) indolocarbazole; (phenyl)(terphenylyl)indolocarbazole; (biphenylyl)(terphenylyl)indolocarbazole; (biphenylyl)(terphenylyl)indolocarbazole; (dibenzothiophenyl)(terphenylyl)indolocarbazole; (dibenzothiophenyl)(terphenylyl)indolocarbazole; (dibenzofuranyl)(diphenyltriazinyl)biphenyl; (dibenzothiophenyl)(diphenyltriazinyl)biphenyl; (dibenzoselenophenyl)(diphenyltriazinyl)biphenyl; (dibenzofuranyl) (diphenyltriazinyl)terbenzene; (dibenzothiophenyl)(diphenyltriazinyl)terbenzene; (dibenzoselenophenyl) (diphenyltriazinyl)terbenzene; (phenyldibenzofuranyl) (diphenyltriazinyl)biphenyl; (phenyldibenzothiophenyl) (diphenyltriazinyl)biphenyl; (phenyldibenzoselenophenyl) (diphenyltriazinyl)biphenyl; [(biphenylyl)dibenzofuranyl] (diphenyltriazinyl)biphenyl; [(biphenylyl) dibenzothiophenyl](diphenyltriazinyl)biphenyl; [(biphenylyl)dibenzoselenophenyl](diphenyltriazinyl)biphenyl; [(biphenylyl)dibenzofuranyl](diphenyltriazinyl)biphenyl; [(biphenylyl)dibenzothiophenyl](diphenyltriazinyl) biphenyl; [(biphenylyl)dibenzoselenophenyl] (diphenyltriazinyl)biphenyl; (phenyldibenzofuranyl) (diphenyltriazinyl)terphenyl; (phenyldibenzothiophenyl)

(diphenyltriazinyl)terphenyl; (phenyldibenzoselenophenyl)(diphenyltriazinyl)terphenyl; (phenyldibenzofuranyl)(diphenyltriazinyl)terphenyl; (phenyldibenzothiophenyl)(diphenyltriazinyl)terphenyl; (phenyldibenzoselenophenyl)(diphenyltriazinyl)terphenyl; [(biphenylyl)dibenzofuranyl](diphenyltriazinyl)terphenyl; [(biphenylyl)dibenzothiophenyl](diphenyltriazinyl)terphenyl; [(biphenylyl)dibenzoselenophenyl](diphenyltriazinyl)terphenyl; [phenyl(biphenylyl)triazinyl](dibenzofuranyl)biphenyl; [phenyl(biphenylyl)triazinyl](dibenzothiophenyl)biphenyl; [phenyl(biphenylyl)triazinyl](dibenzoselenophenyl)biphenyl; [phenyl(biphenylyl)triazinyl](dibenzofuranyl)biphenyl; [phenyl(biphenylyl)triazinyl](dibenzothiophenyl)biphenyl; [phenyl(biphenylyl)triazinyl](dibenzoselenophenyl)biphenyl; [bis(biphenylyl)triazinyl](dibenzofuranyl)biphenyl; [bis(biphenylyl)triazinyl](dibenzothiophenyl)biphenyl; [bis(biphenylyl)triazinyl](dibenzoselenophenyl)biphenyl; [phenyl(dimethylfluorenyl)triazinyl](dibenzofuranyl)biphenyl; [phenyl(dimethylfluorenyl)triazinyl](dibenzothiophenyl)biphenyl; [phenyl(dimethylfluorenyl)triazinyl](dibenzoselenophenyl)biphenyl; [phenyl(biphenylyl)triazinyl](phenyldibenzofuranyl)biphenyl; [phenyl(biphenylyl)triazinyl](phenyldibenzothiophenyl)biphenyl; [phenyl(biphenylyl)triazinyl](phenyldibenzoselenophenyl)biphenyl; [phenyl(biphenylyl)triazinyl](phenyldibenzofuranyl)biphenyl; [phenyl(biphenylyl)triazinyl](phenyldibenzothiophenyl)biphenyl; [phenyl(biphenylyl)triazinyl](phenyldibenzoselenophenyl)biphenyl; [phenyl(dimethylfluorenyl)triazinyl](phenyldibenzofuranyl)biphenyl; [phenyl(dimethylfluorenyl)triazinyl](phenyldibenzothiophenyl)biphenyl; [phenyl(dimethylfluorenyl)triazinyl](phenyldibenzoselenophenyl)biphenyl; [phenyl(biphenylyl)triazinyl](dibenzofuranyl)terphenyl; [phenyl(biphenylyl)triazinyl](dibenzothiophenyl)terphenyl; [phenyl(biphenylyl)triazinyl](dibenzoselenophenyl)terphenyl; [phenyl(biphenylyl)triazinyl](dibenzofuranyl)terphenyl; [phenyl(biphenylyl)triazinyl](dibenzothiophenyl)terphenyl; [phenyl(biphenylyl)triazinyl](dibenzoselenophenyl)terphenyl; [phenyl(dimethylfluorenyl)triazinyl](dibenzofuranyl)terphenyl; [phenyl(dimethylfluorenyl)triazinyl](dibenzothiophenyl)terphenyl; [phenyl(dimethylfluorenyl)triazinyl](dibenzoselenophenyl)terphenyl; [phenyl(biphenylyl)triazinyl][(biphenylyl)dibenzofuranyl]biphenyl; [phenyl(biphenylyl)triazinyl][(biphenylyl)dibenzothiophenyl]biphenyl; [phenyl(biphenylyl)triazinyl][(biphenylyl)dibenzoselenophenyl]biphenyl; [phenyl(biphenylyl)triazinyl][(biphenylyl)dibenzofuranyl]biphenyl; [phenyl(biphenylyl)triazinyl][(biphenylyl)dibenzothiophenyl]biphenyl; [phenyl(biphenylyl)triazinyl][(biphenylyl)dibenzoselenophenyl)]biphenyl; [phenyl(dimethylfluorenyl)triazinyl][(biphenylyl)dibenzofuranyl]biphenyl; [phenyl(dimethylfluorenyl)triazinyl][(biphenylyl)dibenzothiophenyl]biphenyl; [phenyl(dimethylfluorenyl)triazinyl][(biphenylyl)dibenzoselenophenyl]biphenyl; [phenyl(biphenylyl)triazinyl](dibenzofuranyl)terphenyl; [phenyl(biphenylyl)triazinyl](dibenzothiophenyl)terphenyl; [phenyl(biphenylyl)triazinyl](dibenzoselenophenyl)terphenyl; (dibenzofuranyl)[phenyl(biphenylyl)triazinyl]terphenyl; (dibenzothiophenyl)[phenyl(biphenylyl)triazinyl]terphenyl; (dibenzoselenophenyl)[phenyl(biphenylyl)triazinyl]terphenyl; (diphenyltriazinyl)(dibenzofuranyl)biphenyl; (diphenyltriazinyl)(dibenzothiophenyl)biphenyl; (diphenyltriazinyl)(dibenzoselenophenyl)biphenyl; (diphenyltriazinyl)(dibenzofuranyl)biphenyl; (diphenyltriazinyl)(dibenzothiophenyl)biphenyl; (diphenyltriazinyl)(dibenzoselenophenyl)biphenyl; (diphenyltriazinyl)(dibenzofuranyl)biphenyl; (diphenyltriazinyl)(dibenzothiophenyl)biphenyl; (diphenyltriazinyl)(dibenzoselenophenyl)biphenyl; (diphenyltriazinyl)(dibenzofuranyl)terphenyl; (diphenyltriazinyl)(dibenzothiophenyl)terphenyl; (diphenyltriazinyl)(dibenzoselenophenyl)terphenyl; (diphenyltriazinyl)(dibenzofuranyl)terphenyl; (diphenyltriazinyl)(dibenzothiophenyl)terphenyl; (diphenyltriazinyl)(dibenzoselenophenyl)terphenyl; (diphenyltriazinyl)(dibenzofuranyl)terphenyl; (diphenyltriazinyl)(dibenzothiophenyl)terphenyl; (diphenyltriazinyl)(dibenzoselenophenyl)terphenyl; (diphenyltriazinyl)(diphenyldibenzofuranyl)biphenyl; (diphenyltriazinyl)(diphenyldibenzothiophenyl)biphenyl; (diphenyltriazinyl)(diphenyldibenzoselenophenyl)biphenyl; (diphenyltriazinyl)(diphenyldibenzofuranyl)biphenyl; (diphenyltriazinyl)(diphenyldibenzothiophenyl)biphenyl; (diphenyltriazinyl)(diphenyldibenzoselenophenyl)biphenyl; (diphenyltriazinyl)(phenyldibenzofuranyl)biphenyl; (diphenyltriazinyl)(phenyldibenzothiophenyl)biphenyl; (diphenyltriazinyl)(phenyldibenzoselenophenyl)biphenyl; (diphenyltriazinyl)(phenyldibenzofuranyl)(pyridinyl)phenyl; (diphenyltriazinyl)(phenyldibenzothiophenyl)(pyridinyl)phenyl; (diphenyltriazinyl)(phenyldibenzoselenophenyl)(pyridinyl)phenyl; (diphenyltriazinyl)(phenyldibenzofuranyl)(pyridinyl)phenyl; (diphenyltriazinyl)(phenyldibenzothiophenyl)(pyridinyl)phenyl; (diphenyltriazinyl)(phenyldibenzoselenophenyl)(pyridinyl)phenyl; (diphenyltriazinyl)[(pyridinyl)dibenzofuranyl]biphenyl; (diphenyltriazinyl)[(pyridinyl)dibenzothiophenyl]biphenyl; (diphenyltriazinyl)[(pyridinyl)dibenzoselenophenyl]biphenyl; (diphenyltriazinyl)(dibenzofuranyl)terphenyl; (diphenyltriazinyl)(dibenzothiophenyl)terphenyl; (diphenyltriazinyl)(dibenzoselenophenyl)terphenyl; (dibenzofuranyl)(diphenyltriazinyl)terphenyl; (dibenzothiophenyl)(diphenyltriazinyl)terphenyl; (dibenzoselenophenyl)(diphenyltriazinyl)terphenyl; (diphenyltriazinyl)(dibenzofuranyl)(dimethylfluorenyl)benzene; (diphenyltriazinyl)(dibenzothiophenyl)(dimethylfluorenyl)benzene; (diphenyltriazinyl)(dibenzoselenophenyl)(dimethylfluorenyl)benzene; (diphenyltriazinyl)(dimethylfluorenyl)biphenyl; (diphenyltriazinyl)(spiro[cyclopentanefluorene]yl)biphenyl; (diphenyltriazinyl)(dimethylfluorenyl)terphenyl; (diphenyltriazinyl)(diphenylfluorenyl)biphenyl; [phenyl(biphenylyl)triazinyl](dimethylfluorenyl)biphenyl; [phenyl(dimethylfluorenyl)triazinyl](dimethylfluorenyl)terphenyl; (diphenyltriazinyl)[bis(diphenylfluorenyl)]benzene; (diphenyltriazinyl)(diphenylfluorenyl)terbenzene; (diphenyltriazinyl)(triphenylenyl)biphenyl; phenyl[(diphenyltriazinyl)phenyl]indolocarbazole; (biphenylyl)[(diphenyltriazinyl)phenyl]indolocarbazole; (biphenylyl)[(diphenyltriazinyl)phenyl]indolocarbazole; (dimethylfluorenyl)[(diphenyltriazinyl)phenyl]indolocarbazole; (dibenzothiophenyl)[(diphenyltriazinyl)phenyl]indolocarbazole; (dibenzofuranyl)[(diphenyltriazinyl)phenyl]indolocarbazole; (dibenzothiophenyl)[(diphenyltriazinyl)phenyl]indolocarbazole; (phenyl)[(diphenyltriazinyl)biphenylyl]indolocarbazole; (phenyl)[(diphenyltriazinyl)terphenyl]indolocarbazole; (phenyl)[(diphenyltriazinyl)terphenylyl]indolocarbazole; (phenyl)[((phenyl)(biphenylyl)triazinyl)phenyl]indolocarbazole; (phenyl)[(di(biphenylyl)triazinyl)phenyl]indolocarbazole; (phenyl)[((phenyl)(biphenylyl)triazinyl)phenyl]indolocarbazole; (phenyl)[((phenyl)(naphthyl)triazinyl)phenyl]indolocarbazole; (phenylcarbazolyl)[(diphenyltriazinyl)phenyl]indolocarbazole; (phenylcarbazolyl)[(diphenyltriazinyl)phenyl]indolocarbazole; (phenylcarbazolyl)[(diphenyltriazinyl)phenyl]indolocarbazole; di(phenyl)(triphenylenylbiphenylyl)triazine; (phenyl)(biphenylyl)(triphenylenylphenyl)triazine; (phenyl)(biphenylyl)(triphenylenylphenyl)triazine; di(biphenylyl)(triphenylenylphenyl)triazine; di(phenyl)(triphenylenylbiphenylyl)triazine; di(biphenylyl)(triphenylenyl)triazine; di(biphenylyl)(triphenylenyl)triazine; (phenyl)(biphenylyl)(triphenylenyl)triazine; (phenyl)(biphenylyl)(triphenylenyl)triazine; (naphthyl)[(diphenyltriazinyl)phenyl]indolocarbazole; (phenyl)(diphenyltriazinyl)dibenzofuran; (phenyl)(diphenyltriazinyl)dibenzothiophene; (phenyl)(diphenyltriazinyl)dibenzoselenophene; (phenyl)[(phenyl)(biphenylyl)triazinyl]dibenzofuran; (phenyl)[(phenyl)(biphenylyl)triazinyl]dibenzothiophene; (phenyl)[(phenyl)(biphenylyl)triazinyl]dibenzoselenophene; (phenyl)[(phenyl)(biphenylyl)triazinyl]dibenzofuran; (phenyl)[(phenyl)(biphenylyl)triazinyl]dibenzothiophene; (phenyl)[(phenyl)(biphenylyl)triazinyl]dibenzoselenophene; (phenyl)[di(biphenylyl)triazinyl]dibenzofuran; (phenyl)[di(biphenylyl)triazinyl]dibenzothiophene; (phenyl)[di(biphenylyl)triazinyl]dibenzoselenophene; (phenyl)[di(biphenylyl)triazinyl]dibenzofuran; (phenyl)[di(biphenylyl)triazinyl]dibenzothiophene; (phenyl)[di(biphenylyl)triazinyl]dibenzoselenophene; (phenyl)[di(biphenylyl)triazinyl]dibenzofuran; (phenyl)[di(biphenylyl)triazinyl]dibenzothiophene; (phenyl)[di(biphenylyl)triazinyl]dibenzoselenophene; (phenyl)[(diphenyltriazinyl)phenyl]dibenzofuran; (phenyl)[(diphenyltriazinyl)phenyl]dibenzothiophene; (phenyl)[(diphenyltriazinyl)phenyl]dibenzoselenophene; (phenyl)[(phenyl)(biphenylyl)triazinylphenyl]dibenzofuran; (phenyl)[(phenyl)(biphenylyl)triazinylphenyl]dibenzothiophene; (phenyl)[(phenyl)(biphenylyl)triazinylphenyl]dibenzoselenophene; (phenyl)[(phenyl)(biphenylyl)triazinylphenyl]dibenzofuran; (phenyl)[(phenyl)(biphenylyl)triazinylphenyl]dibenzothiophene; (phenyl)[(phenyl)(biphenylyl)triazinylphenyl]dibenzoselenophene; (phenyl)[(diphenyltriazinyl)phenyl]dibenzofuran; (phenyl)[(diphenyltriazinyl)phenyl]dibenzothiophene; (phenyl)[(diphenyltriazinyl)phenyl]dibenzoselenophene; (phenyl)[(phenyl)(biphenylyl)triazinylphenyl]dibenzofuran; (phenyl)[(phenyl)(biphenylyl)triazinylphenyl]dibenzothiophene; (phenyl)[(phenyl)(biphenylyl)triazinylphenyl]dibenzoselenophene; (phenyl)[(phenyl)(biphenylyl)triazinylphenyl]dibenzofuran; (phenyl)[(phenyl)(biphenylyl)triazinylphenyl]dibenzothiophene; (phenyl)[(phenyl)(biphenylyl)triazinylphenyl]dibenzoselenophene; (phenyl)[(diphenyltriazinyl)biphenylyl]dibenzofuran; (phenyl)[(diphenyltriazinyl)biphenylyl]dibenzothiophene; (phenyl)[(diphenyltriazinyl)biphenylyl]dibenzoselenophene; (phenyl)[(phenyl)(biphenylyl)triazinylbiphenylyl]dibenzofuran; (phenyl)[(phenyl)(biphenylyl)triazinylbiphenylyl]dibenzothiophene; (phenyl)[(phenyl)(biphenylyl)triazinylbiphenylyl] dibenzoselenophene; (phenyl)[(phenyl)(biphenylyl)triazinylbiphenylyl]dibenzofuran; (phenyl)[(phenyl)(biphenylyl)triazinylbiphenylyl]dibenzothiophene; (phenyl)[(phenyl)(biphenylyl)triazinylbiphenylyl] dibenzoselenophene; (phenyl)[(diphenyltriazinyl)biphenylyl]dibenzofuran; (phenyl)[(diphenyltriazinyl)biphenylyl]dibenzothiophene; (phenyl)[(diphenyltriazinyl)biphenylyl]dibenzoselenophene; (phenyl)[(phenyl)(biphenylyl)triazinylbiphenylyl]dibenzofuran; (phenyl)[(phenyl)(biphenylyl)triazinylbiphenylyl]dibenzothiophene; (phenyl)[(phenyl)(biphenylyl)triazinylbiphenylyl]dibenzoselenophene; (phenyl)[(phenyl)(biphenylyl)triazinylbiphenylyl]dibenzofuran; (phenyl)[(phenyl)(biphenylyl)triazinylbiphenylyl]dibenzothiophene; (phenyl)[(phenyl)(biphenylyl)triazinylbiphenylyl]dibenzoselenophene; (phenyl)[(diphenyltriazinyl)biphenylyl]dibenzofuran; (phenyl)[(diphenyltriazinyl)biphenylyl]dibenzothiophene; (phenyl)[(diphenyltriazinyl)biphenylyl]dibenzoselenophene; (phenyl)[(phenyl)(biphenylyl)triazinylbiphenylyl]dibenzofuran; (phenyl)[(phenyl)(biphenylyl)triazinylbiphenylyl]dibenzothiophene; (phenyl)[(phenyl)(biphenylyl)triazinylbiphenylyl]dibenzoselenophene; (phenyl)[(phenyl)(biphenylyl)triazinylbiphenylyl]dibenzofuran; (phenyl)[(phenyl)(biphenylyl)triazinylbiphenylyl]dibenzothiophene; (phenyl)[(phenyl)(biphenylyl)triazinylbiphenylyl]dibenzoselenophene; (biphenylyl)(diphenyltriazinyl)dibenzofuran; (biphenylyl)(diphenyltriazinyl)dibenzothiophene; (biphenylyl)(diphenyltriazinyl)dibenzoselenophene; (biphenylyl)[(phenyl)(biphenylyl)triazinyl]dibenzofuran; (biphenylyl)[(phenyl)(biphenylyl)triazinyl]dibenzothiophene; (biphenylyl)[(phenyl)(biphenylyl)triazinyl]dibenzoselenophene; (biphenylyl)[(phenyl)(biphenylyl)triazinyl]dibenzofuran; (biphenylyl)[(phenyl)(biphenylyl)triazinyl]dibenzothiophene; (biphenylyl)[(phenyl)(biphenylyl)triazinyl]dibenzoselenophene; (phenyl)[(diphenyltriazinyl)phenyl]dibenzofuran; (phenyl)[(diphenyltriazinyl)phenyl]dibenzothiophene; (phenyl)[(diphenyltriazinyl)phenyl]dibenzoselenophene; (biphenylyl)[(phenyl)(biphenylyl)triazinylphenyl]dibenzofuran; (biphenylyl)[(phenyl)(biphenylyl)triazinylphenyl]dibenzothiophene; (biphenylyl)[(phenyl)(biphenylyl)triazinylphenyl]dibenzoselenophene; (biphenylyl)[(phenyl)(biphenylyl)triazinylphenyl]dibenzofuran; (biphenylyl)[(phenyl)(biphenylyl)triazinylphenyl]dibenzothiophene; (biphenylyl)[(phenyl)(biphenylyl)triazinylphenyl]dibenzoselenophene; (biphenylyl)[di(phenyl)triazinylphenyl]dibenzofuran; (biphenylyl)[di(phenyl)triazinylphenyl]dibenzothiophene; (biphenylyl)[di(phenyl)triazinylphenyl]dibenzoselenophene; (biphenylyl)[(phenyl)(biphenylyl)triazinylphenyl]dibenzofuran; (biphenylyl)[(phenyl)(biphenylyl)triazinylphenyl]dibenzothiophene; (biphenylyl)[(phenyl)(biphenylyl)triazinylphenyl]dibenzoselenophene; (biphenylyl)[(phenyl)(biphenylyl)triazinylphenyl]dibenzofuran; (biphenylyl)[(phenyl)(biphenylyl)triazinylphenyl]dibenzothiophene; (biphenylyl)[(phenyl)(biphenylyl)triazinylphenyl]dibenzoselenophene; (biphenylyl)[di(phenyl)triazinyl]dibenzofuran; (biphenylyl)[di(phenyl)triazinyl]dibenzothiophene; (biphenylyl)[di(phenyl)triazinyl]dibenzoselenophene; (biphenylyl)[(phenyl)(biphenylyl)triazinyl]dibenzofuran; (biphenylyl)[(phenyl)(biphenylyl)triazinyl]dibenzothiophene; (biphenylyl)[(phenyl)(biphenylyl)triazinyl]dibenzoselenophene; (biphenylyl)[(phenyl)(biphenylyl)triazinyl]dibenzofuran; (biphenylyl)[(phenyl)(biphenylyl)triazinyl]dibenzothiophene; (biphenylyl)[(phenyl)(biphenylyl)triazinyl]dibenzoselenophene; (biphenylyl)[di(phenyl)triazinylphenyl]dibenzofuran; (biphenylyl)[di(phenyl)triazinylphenyl]dibenzothiophene; (biphenylyl)[di(phenyl)triazinylphenyl]dibenzoselenophene; (biphenylyl)[(phenyl)(biphenylyl)triazinylphenyl]dibenzofuran; (biphenylyl)[(phenyl)(biphenylyl)triazinylphenyl]dibenzothiophene; (biphenylyl)[(phenyl)(biphenylyl)triazinylphenyl]dibenzoselenophene; (biphenylyl)[(phenyl)(biphenylyl)triazinylphenyl]dibenzofuran; (biphenylyl)[(phenyl)(biphenylyl)triazinylphenyl]dibenzothiophene; (biphenylyl)[(phenyl)(biphenylyl)triazinylphenyl]dibenzoselenophene; (biphenylyl)[di(phenyl)triazinylphenyl]dibenzofuran; (biphenylyl)[di(phenyl)triazinylphenyl]dibenzothiophene; (biphenylyl)[di(phenyl)triazinylphenyl]dibenzoselenophene; (biphenylyl)[(phenyl)(biphenylyl)triazinylphenyl]dibenzofuran; (biphenylyl)[(phenyl)(biphenylyl)triazinylphenyl]dibenzothiophene;

(biphenylyl)[(phenyl)(biphenylyl)triazinylphenyl]dibenzoselenophene; (biphenylyl)[(phenyl)(biphenylyl)triazinylphenyl]dibenzofuran; (biphenylyl)[(phenyl)(biphenylyl)triazinylphenyl]dibenzothiophene; (biphenylyl)[(phenyl)(biphenylyl)triazinylphenyl]dibenzoselenophene; (phenyl)[(phenyl)(dimethylfluorenyl)triazinyl]dibenzofuran; (phenyl)[(phenyl)(dimethylfluorenyl)triazinyl]dibenzothiophene; (phenyl)[(phenyl)(dimethylfluorenyl)triazinyl]dibenzoselenophene; (phenyl)[(biphenylyl)(dimethylfluorenyl)triazinyl]dibenzofuran; (phenyl)[(biphenylyl)(dimethylfluorenyl)triazinyl]dibenzothiophene; (phenyl)[(biphenylyl)(dimethylfluorenyl)triazinyl]dibenzoselenophene; (phenyl)[(biphenylyl)(dimethylfluorenyl)triazinyl]dibenzofuran; (phenyl)[(biphenylyl)(dimethylfluorenyl)triazinyl]dibenzothiophene; (phenyl)[(biphenylyl)(dimethylfluorenyl)triazinyl]dibenzoselenophene; (phenyl)[(phenyl)(dimethylfluorenyl)triazinylphenyl]dibenzofuran; (phenyl)[(phenyl)(dimethylfluorenyl)triazinylphenyl]dibenzothiophene; (phenyl)[(phenyl)(dimethylfluorenyl)triazinylphenyl]dibenzoselenophene; (phenyl)[bis(dimethylfluorenyl)triazinylphenyl]dibenzofuran; (phenyl)[bis(dimethylfluorenyl)triazinylphenyl]dibenzothiophene; (phenyl)[bis(dimethylfluorenyl)triazinylphenyl]dibenzoselenophene; (biphenylyl)[(phenyl)(dimethylfluorenyl)triazinyl]dibenzofuran; (biphenylyl)[(phenyl)(dimethylfluorenyl)triazinyl]dibenzothiophene; (biphenylyl)[(phenyl)(dimethylfluorenyl)triazinyl]dibenzoselenophene; (biphenylyl)[(phenyl)(dimethylfluorenyl)triazinyl]dibenzofuran; (biphenylyl)[(phenyl)(dimethylfluorenyl)triazinyl]dibenzothiophene; (biphenylyl)[(phenyl)(dimethylfluorenyl)triazinyl]dibenzoselenophene; (biphenylyl)[(phenyl)(dimethylfluorenyl)triazinylphenyl]dibenzofuran; (biphenylyl)[(phenyl)(dimethylfluorenyl)triazinylphenyl]dibenzothiophene; (biphenylyl)[(phenyl)(dimethylfluorenyl)triazinylphenyl]dibenzoselenophene; (biphenylyl)[(phenyl)(dimethylfluorenyl)triazinylphenyl]dibenzofuran; (biphenylyl)[(phenyl)(dimethylfluorenyl)triazinylphenyl]dibenzothiophene; (biphenylyl)[(phenyl)(dimethylfluorenyl)triazinylphenyl]dibenzoselenophene; (phenyl)[(phenyl)(dimethylfluorenylphenyl)triazinyl]dibenzofuran; (phenyl)[(phenyl)(dimethylfluorenylphenyl)triazinyl]dibenzothiophene; (phenyl)[(phenyl)(dimethylfluorenylphenyl)triazinyl]dibenzoselenophene; (phenyl)[(phenyl)(dimethylfluorenyl)triazinyl]dibenzofuran; (phenyl)[(phenyl)(dimethylfluorenyl)triazinyl]dibenzothiophene; (phenyl)[(phenyl)(dimethylfluorenyl)triazinyl]dibenzoselenophene; (biphenylyl)[(phenyl)(dimethylfluorenyl)triazinyl]dibenzofuran; (biphenylyl)[(phenyl)(dimethylfluorenyl)triazinyl]dibenzothiophene; (biphenylyl)[(phenyl)(dimethylfluorenyl)triazinyl]dibenzoselenophene; (biphenylyl)[(phenyl)(dimethylfluorenyl)triazinylphenyl]dibenzofuran; (biphenylyl)[(phenyl)(dimethylfluorenyl)triazinylphenyl]dibenzothiophene; (biphenylyl)[(phenyl)(dimethylfluorenyl)triazinylphenyl]dibenzoselenophene; (phenyl)[(dimethylfluorenyl)terphenylyl]dibenzofuran; (phenyl)[(dimethylfluorenyl)terphenylyl]dibenzothiophene; (phenyl)[(dimethylfluorenyl)terphenylyl]dibenzoselenophene; (phenyl)[(phenyl)(dimethylfluorenyl)triazinyl]dibenzofuran; (phenyl)[(phenyl)(dimethylfluorenyl)triazinyl]dibenzothiophene; (phenyl)[(phenyl)(dimethylfluorenyl)triazinyl]dibenzoselenophene; (phenyl)[di(phenyl)triazinyl]dibenzofuran; (phenyl)[di(phenyl)triazinyl]dibenzothiophene; (phenyl)[di(phenyl)triazinyl]dibenzoselenophene; (phenyl)[di(phenyl)triazinylphenyl]dibenzofuran; (phenyl)[di(phenyl)triazinylphenyl]dibenzothiophene; (phenyl)[di(phenyl)triazinylphenyl]dibenzoselenophene; (biphenylyl)[di(phenyl)triazinylphenyl]dibenzofuran; (biphenylyl)[di(phenyl)triazinylphenyl]dibenzothiophene; (biphenylyl)[di(phenyl)triazinylphenyl]dibenzoselenophene; di(phenyl)[di(phenyl)triazinylphenyl]dibenzofuran; di(phenyl)[di(phenyl)triazinylphenyl]dibenzothiophene; di(phenyl)[di(phenyl)triazinylphenyl]dibenzoselenophene; (phenyl)[di(phenyl)triazinyl]dibenzofuran; (phenyl)[di(phenyl)triazinyl]dibenzothiophene; (phenyl)[di(phenyl)triazinyl]dibenzoselenophene; (biphenylyl)[di(phenyl)triazinyl]dibenzofuran; (biphenylyl)[di(phenyl)triazinyl]dibenzothiophene; (biphenylyl)[di(phenyl)triazinyl]dibenzoselenophene; (biphenylyl)[di(phenyl)triazinyl]dibenzofuran; (biphenylyl)[di(phenyl)triazinyl]dibenzothiophene; (biphenylyl)[di(phenyl)triazinyl]dibenzoselenophene; di(phenyl)[di(phenyl)triazinylphenyl]dibenzofuran; di(phenyl)[di(phenyl)triazinylphenyl]dibenzothiophene; di(phenyl)[di(phenyl)triazinylphenyl]dibenzoselenophene; (biphenylyl)[di(phenyl)triazinylphenyl]dibenzofuran; (biphenylyl)[di(phenyl)triazinylphenyl]dibenzothiophene; (biphenylyl)[di(phenyl)triazinylphenyl]dibenzoselenophene; (phenyl)[di(phenyl)triazinyl]dibenzofuran; (phenyl)[di(phenyl)triazinyl]dibenzothiophene; (phenyl)[di(phenyl)triazinylphenyl]dibenzoselenophene; (phenyl)[di(phenyl)triazinylphenyl]dibenzofuran; (phenyl)[di(phenyl)triazinylphenyl]dibenzothiophene; (phenyl)[di(phenyl)triazinylphenyl]dibenzoselenophene; (phenyl)[di(phenyl)triazinylphenyl]dibenzofuran; (phenyl)[di(phenyl)triazinylphenyl]dibenzothiophene; (biphenylyl)[di(phenyl)triazinylphenyl]dibenzoselenophene; (biphenylyl)[di(phenyl)triazinylphenyl]dibenzofuran; (biphenylyl)[di(phenyl)triazinylphenyl]dibenzothiophene; (biphenylyl)[di(phenyl)triazinylphenyl]dibenzoselenophene; (biphenylyl)[di(phenyl)triazinylphenyl]dibenzofuran; (biphenylyl)[di(phenyl)triazinylphenyl]dibenzothiophene; (biphenylyl)[di(phenyl)triazinylphenyl]dibenzoselenophene; (phenyl)[di(phenyl)triazinylphenyl]dibenzofuran; (phenyl)[di(phenyl)triazinylphenyl]dibenzothiophene; (phenyl)[di(phenyl)triazinylphenyl]dibenzoselenophene; (phenyl)[di(phenyl)triazinylpyridyl]dibenzofuran; (phenyl)[di(phenyl)triazinylpyridyl]dibenzothiophene; (phenyl)[di(phenyl)triazinylpyridyl]dibenzoselenophene; (phenyl)[(phenyl)(phenylpyridyl)triazinylpyridyl]dibenzofuran; (phenyl)[(phenyl)(phenylpyridyl)triazinylpyridyl]dibenzothiophene; (phenyl)[(phenyl)(phenylpyridyl)triazinylpyridyl]dibenzoselenophene; (phenyl)[(phenyl)(phenylpyridyl)triazinylpyridyl]dibenzofuran; (phenyl)[(phenyl)(phenylpyridyl)triazinylpyridyl]dibenzothiophene; (phenyl)[(phenyl)(phenylpyridyl)triazinylpyridyl]dibenzoselenophene; (biphenylyl)[(phenyl)(pyridyl)triazinylpyridyl]dibenzofuran; (biphenylyl)[(phenyl)(pyridyl)triazinylpyridyl]dibenzothiophene; (biphenylyl)[(phenyl)(pyridyl)triazinylpyridyl]dibenzoselenophene; (phenyl)[(phenyl)(dimethylindenopyridyl)triazinyl]dibenzofuran; (phenyl)[(phenyl)(dimethylindenopyridyl)triazinyl]dibenzothiophene; (phenyl)[(phenyl)(dimethylindenopyridyl)triazinyl]dibenzoselenophene; (phenyl)[(biphenylyl)(dimethylindenopyridyl)triazinyl]dibenzofuran; (phenyl)[(biphenylyl)(dimethylindenopyridyl)triazinyl]dibenzothiophene; (phenyl)[(biphenylyl)(dimethylindenopyridyl)triazinyl]dibenzoselenophene; (phenyl)[(phenyl)(dimethylindenopyridyl)triazinyl]dibenzofuran; (phenyl)[(phenyl)(dimethylindenopyridyl)triazinyl]dibenzothiophene; (phenyl)[(phenyl)(dimethylindenopyridyl)triazinyl]dibenzoselenophene; (phenyl)[(phenyl)

(spirocyclohexanefluorenyl)triazinyl]dibenzofuran; (phenyl)[(phenyl)(spirocyclohexanefluorenyl)triazinyl]dibenzothiophene; (phenyl)[(phenyl)(spirocyclohexanefluorenyl)triazinyl]dibenzoselenophene; (phenyl)[(phenyl)(spirobifluorenyl)triazinyl]dibenzofuran; (phenyl)[(phenyl)(spirobifluorenyl)triazinyl]dibenzothiophene; (phenyl)[(phenyl)(spirobifluorenyl)triazinyl]dibenzoselenophene; (phenyl-$d_5$)[(diphenyl-$d_{10}$)triazinylphenyl-$d_9$]dibenzofuran; (phenyl-$d_5$)[(diphenyl-$d_{10}$)triazinylphenyl-$d_9$]dibenzothiophene; (phenyl-$d_5$)[(diphenyl-$d_{10}$triazinylphenyl-$d_9$]dibenzoselenophene; (biphenyl-$d_9$)[(diphenyl-$d_{10}$)triazinylphenyl-$d_9$]dibenzofuran; (biphenyl-$d_9$)[(diphenyl-$d_{10}$)triazinylphenyl-$d_9$]dibenzothiophene; (biphenyl-$d_9$)[(diphenyl-$d_{10}$)triazinylphenyl-$d_9$]dibenzoselenophene; (phenyl)[(phenyl)(dimethyl-$d_6$)fluorenyl)triazinyl]dibenzofuran; (phenyl)[(phenyl)(dimethyl-$d_6$)fluorenyl)triazinyl]dibenzothiophene; (phenyl)[(phenyl)(dimethyl-$d_6$)fluorenyl)triazinyl]dibenzoselenophene; (biphenyl-$d_9$)[(diphenyl-$d_{10}$)triazinylphenyl-$d_9$]dibenzofuran; (biphenyl-$d_9$)[(diphenyl-$d_{10}$)triazinylphenyl-$d_9$]dibenzothiophene; (biphenyl-$d_9$)[(diphenyl-$d_{10}$)triazinylphenyl-$d_9$]dibenzoselenophene; (biphenylyl)[(diphenyl-$d_{10}$)triazinylphenyl]dibenzofuran; (biphenylyl)[(diphenyl-$d_{10}$)triazinylphenyl]dibenzothiophene; (biphenylyl)[(diphenyl-$d_{10}$)triazinylphenyl]dibenzoselenophene; (biphenylyl)[di(phenyl)triazinylbiphenylyl]dibenzofuran; (biphenylyl)[di(phenyl)triazinylbiphenylyl]dibenzothiophene; (biphenylyl)[di(phenyl)triazinylbiphenylyl]dibenzoselenophene; (biphenylyl)[bis(fluorophenyl)triazinylphenyl]dibenzofuran; (biphenylyl)[bis(fluorophenyl)triazinylphenyl]dibenzothiophene; (biphenylyl)[bis(fluorophenyl)triazinylphenyl]dibenzoselenophene; (dimethylfluorenyl)[di(phenyl)triazinylphenyl]dibenzofuran; (dimethylfluorenyl)[di(phenyl)triazinylphenyl]dibenzothiophene; (dimethylfluorenyl)[di(phenyl)triazinylphenyl]dibenzoselenophene; (dimethylfluorenyl)[di(phenyl)triazinylbiphenylyl]dibenzofuran; (dimethylfluorenyl)[di(phenyl)triazinylbiphenylyl]dibenzothiophene; (dimethylfluorenyl)[di(phenyl)triazinylbiphenylyl]dibenzoselenophene; (dimethylfluorenyl)[di(phenyl)triazinylbiphenylyl]dibenzofuran; (dimethylfluorenyl)[di(phenyl)triazinylbiphenylyl]dibenzothiophene; (dimethylfluorenyl)[di(phenyl)triazinylbiphenylyl]dibenzoselenophene; (dimethylfluorenyl)[di(phenyl)triazinylbiphenylyl]dibenzofuran; (dimethylfluorenyl)[di(phenyl)triazinylbiphenylyl]dibenzothiophene; (dimethylfluorenyl)[di(phenyl)triazinylbiphenylyl]dibenzoselenophene; (dimethylfluorenyl)[di(phenyl)triazinylpyridyl]dibenzofuran; (dimethylfluorenyl)[di(phenyl)triazinylpyridyl]dibenzothiophene; (dimethylfluorenyl)[di(phenyl)triazinylpyridyl]dibenzoselenophene; (dimethylfluorenyl)[di(phenyl)triazinylphenyl]dibenzofuran; (dimethylfluorenyl)[di(phenyl)triazinylphenyl]dibenzothiophene; (dimethylfluorenyl)[di(phenyl)triazinylphenyl]dibenzoselenophene; (dimethylfluorenyl)[di(phenyl)triazinylphenyl]dibenzofuran; (dimethylfluorenyl)[di(phenyl)triazinylphenyl]dibenzothiophene; (dimethylfluorenyl)[di(phenyl)triazinylphenyl]dibenzoselenophene; (dimethylfluorenyl)[di(phenyl)triazinylphenyl]dibenzofuran; (dimethylfluorenyl)[di(phenyl)triazinylphenyl]dibenzothiophene; (dimethylfluorenyl)[di(phenyl)triazinylphenyl]dibenzoselenophene; (dimethylfluorenyl)[di(phenyl)triazinylbiphenylyl]dibenzofuran; (dimethylfluorenyl)[di(phenyl)triazinylbiphenylyl]dibenzothiophene; (dimethylfluorenyl)[di(phenyl)triazinylbiphenylyl]dibenzoselenophene; (dimethylfluorenyl)[(phenyl)(biphenylyl)triazinylphenyl]dibenzofuran; (dimethylfluorenyl)[(phenyl)(biphenylyl)triazinylphenyl]dibenzothiophene; (dimethylfluorenyl)[(phenyl)(biphenylyl)triazinylphenyl]dibenzoselenophene; (dimethylfluorenyl)[(phenyl)(dimethylfluorenyl)triazinylphenyl]dibenzofuran; (dimethylfluorenyl)[(phenyl)(dimethylfluorenyhtriazinylphenyl]dibenzothiophene; (dimethylfluorenyl)[(phenyl)(dimethylfluorenyl)triazinylphenyl]dibenzoselenophene; (dimethylfluorenyl)[di(phenyl)triazinylphenyl]dibenzofuran; (dimethylfluorenyl)[di(phenyl)triazinylphenyl]dibenzothiophene; (dimethylfluorenyl)[di(phenyl)triazinylphenyl]dibenzoselenophene; bis(dimethylfluorenyl)[di(phenyl)triazinylphenyl]dibenzofuran; bis(dimethylfluorenyl)[di(phenyl)triazinylphenyl]dibenzothiophene; bis(dimethylfluorenyl)[di(phenyl)triazinylphenyl]dibenzoselenophene; (dimethylfluorenyl)[(phenyl)(terphenylyl)triazinylphenyl]dibenzofuran; (dimethylfluorenyl)[(phenyl)(terphenylyl)triazinylphenyl]dibenzothiophene; (dimethylfluorenyl)[(phenyl)(terphenylyl)triazinylphenyl]dibenzoselenophene; (spirocyclopentanefluorenyl)[di(phenyl)triazinylphenyl]dibenzofuran; (spirocyclopentanefluorenyl)[di(phenyl)triazinylphenyl]dibenzothiophene; (spirocyclopentanefluorenyl)[di(phenyl)triazinylphenyl]dibenzoselenophene; (diphenylfluorenyl)[di(phenyl)triazinylphenyl]dibenzofuran; (diphenylfluorenyl)[di(phenyl)triazinylphenyl]dibenzothiophene; (diphenylfluorenyl)[di(phenyl)triazinylphenyl]dibenzoselenophene; (spirobifluorenyl)[di(phenyl)triazinylphenyl]dibenzofuran; (spirobifluorenyl)[di(phenyl)triazinylphenyl]dibenzothiophene; (spirobifluorenyl)[di(phenyl)triazinylphenyl]dibenzoselenophene; (phenyl)(dimethylfluorenyl)[di(phenyl)triazinylphenyl]dibenzofuran; (phenyl)(dimethylfluorenyl)[di(phenyl)triazinylphenyl]dibenzothiophene; (phenyl)(dimethylfluorenyl)[di(phenyl)triazinylphenyl]dibenzoselenophene; (phenyl)(dimethylfluorenyl)[di(phenyl)triazinylphenyl]dibenzofuran; (phenyl)(dimethylfluorenyl)[di(phenyl)triazinylphenyl]dibenzothiophene; (phenyl)(dimethylfluorenyl)[di(phenyl)triazinylphenyl]dibenzoselenophene; [di(methyl)(phenyl)fluorenyl][di(phenyl)triazinylphenyl]dibenzofuran; [di(methyl)(phenyl)fluorenyl][di(phenyl)triazinylphenyl]dibenzothiophene; [di(methyl)(phenyl)fluorenyl][di(phenyl)triazinylphenyl]dibenzoselenophene; [(dimethyl-$d_6$)fluorenyl][di(phenyl)triazinylphenyl]dibenzofuran; [(dimethyl-$d_6$)fluorenyl][di(phenyl)triazinylphenyl]dibenzothiophene; [(dimethyl-$d_6$)fluorenyl][di(phenyl)triazinylphenyl]dibenzoselenophene; (dimethylfluorenyl)[di(phenyl)triazinylphenyl]dibenzofuran; (dimethylfluorenyl)[di(phenyl)triazinylphenyl]dibenzothiophene; (dimethylfluorenyl)[di(phenyl)triazinylphenyl]dibenzoselenophene; (dimethylfluorenyl)[di(phenyl)triazinylphenyl]dibenzofuran; (dimethylfluorenyl)[di(phenyl)triazinylphenyl]dibenzothiophene; (dimethylfluorenyl)[di(phenyl)triazinylphenyl]dibenzoselenophene; (dimethylfluorenyl)[di(phenyl)triazinylphenyl]dibenzofuran; (dimethylfluorenyl)[di(phenyl)triazinylphenyl]dibenzothiophene; (dimethylfluorenyl)[di(phenyl)triazinylphenyl]dibenzoselenophene; (dimethylfluorenyl)[di(phenyl)triazinylphenyl]dibenzofuran; (dimethylfluorenyl)[di(phenyl)triazinylphenyl]dibenzothiophene; (dimethylfluorenyl)[di(phenyl)triazinylphenyl]dibenzoselenophene; (phenyl)(dimethylfluorenyl)[di(phenyl)triazinylphenyl]dibenzofuran; (phenyl)(dimethylfluorenyl)[di(phenyl)triazinylphenyl]dibenzothiophene; (phenyl)(dimethylfluorenyl)[di(phenyl)triazinylphenyl]dibenzoselenophene; (phenyl)(dimethylfluorenyl)[di(phenyl)triazinylphenyl]dibenzofuran; (phenyl)(dimethylfluorenyl)[di(phenyl)triazinylphenyl]

dibenzothiophene; (phenyl)(dimethylfluorenyl)[di(phenyl)triazinylphenyl]dibenzoselenophene; (dimethylfluorenyl)[di(phenyl)triazinylphenyl]dibenzofuran; (dimethylfluorenyl)[di(phenyl)triazinylphenyl]dibenzothiophene; (dimethylfluorenyl)[di(phenyl)triazinylphenyl]dibenzoselenophene; (dimethylfluorenyl)[(diphenyl-$d_{10}$)triazinylphenyl]dibenzofuran; (dimethylfluorenyl)[(diphenyl-$d_{10}$)triazinylphenyl]dibenzothiophene; (dimethylfluorenyl)[(diphenyl-$d_{10}$)triazinylphenyl]dibenzoselenophene; (dimethylfluorenyl)[(diphenyl-$d_{10}$)triazinylphenyl-$d_9$]dibenzofuran; (dimethylfluorenyl)[(diphenyl-$d_{10}$)triazinylphenyl-$d_4$]dibenzothiophene; (dimethylfluorenyl)[(diphenyl-$d_{10}$)triazinylphenyl-$d_9$]dibenzoselenophene; [(dimethyl-$d_6$)fluorenyl][(diphenyl-$d_{10}$)triazinylphenyl]dibenzofuran; [(dimethyl-$d_6$)fluorenyl][(diphenyl-$d_{10}$)triazinylphenyl]dibenzothiophene; [(dimethyl-$d_6$)fluorenyl][(diphenyl-$d_{10}$)triazinylphenyl]dibenzoselenophene; (dimethylfluorenyl)[(diphenyl-$d_{10}$)triazinylphenyl-$d_4$]dibenzofuran; (dimethylfluorenyl)[(diphenyl-$d_{10}$)triazinylphenyl-$d_9$]dibenzothiophene; (dimethylfluorenyl)[(diphenyl-$d_{10}$)triazinylphenyl-$d_9$]dibenzoselenophene; (terphenylyl)[(phenyl)(biphenylyl)triazinyl]dibenzofuran; (terphenylyl)[(phenyl)(biphenylyl)triazinyl]dibenzothiophene; (terphenylyl)[(phenyl)(biphenylyl)triazinyl]dibenzoselenophene; (terphenylyl)[(phenyl)(biphenylyl)triazinyl]dibenzofuran; (terphenylyl)[(phenyl)(biphenylyl)triazinyl]dibenzothiophene; (terphenylyl)[(phenyl)(biphenylyl)triazinyl]dibenzoselenophene; (terphenylyl)[di(phenyl)triazinyl]dibenzofuran; (terphenylyl)[di(phenyl)triazinyl]dibenzothiophene; (terphenylyl)[di(phenyl)triazinyl]dibenzoselenophene; (terphenylyl)[di(biphenylyl)triazinyl]dibenzofuran; (terphenylyl)[di(biphenylyl)triazinyl]dibenzothiophene; (terphenylyl)[di(biphenylyl)triazinyl]dibenzoselenophene; (terphenylyl)[(phenyl)(biphenylyl)triazinyl]dibenzofuran; (terphenylyl)[(phenyl)(biphenylyl)triazinyl]dibenzothiophene; (terphenylyl)[(phenyl)(biphenylyl)triazinyl]dibenzoselenophene; (terphenylyl)[(phenyl)(biphenylyl)triazinyl]dibenzofuran; (terphenylyl)[(phenyl)(biphenylyl)triazinyl]dibenzothiophene; (terphenylyl)[(phenyl)(biphenylyl)triazinyl]dibenzoselenophene; (terphenylyl)[di(phenyl)triazinyl]dibenzofuran; (terphenylyl)[di(phenyl)triazinyl]dibenzothiophene; (terphenylyl)[di(phenyl)triazinyl]dibenzoselenophene; (terphenylyl)[(phenyl)(dibenzothiophenyl)triazinyl]dibenzofuran; (terphenylyl)[(phenyl)(dibenzothiophenyl)triazinyl]dibenzothiophene; (terphenylyl)[(phenyl)(dibenzothiophenyl)triazinyl]dibenzoselenophene; (terphenylyl)[(phenyl)(dibenzofuranyl)triazinyl]dibenzofuran; (terphenylyl)[(phenyl)(dibenzofuranyl)triazinyl]dibenzothiophene; (terphenylyl)[(phenyl)(dibenzofuranyl)triazinyl]dibenzoselenophene; (terphenylyl)[(phenyl)(dimethylfluorenyl)triazinyl]dibenzofuran; (terphenylyl)[(phenyl)(dimethylfluorenyl)triazinyl]dibenzothiophene; (terphenylyl)[(phenyl)(dimethylfluorenyl)triazinyl]dibenzoselenophene; (terphenylyl)[(phenyl)(dibenzothiophenyl)triazinyl]dibenzofuran; (terphenylyl)[(phenyl)(dibenzothiophenyl)triazinyl]dibenzothiophene; (terphenylyl)[(phenyl)(dibenzothiophenyl)triazinyl]dibenzoselenophene; (terphenylyl)[(phenyl)(dibenzofuranyl)triazinyl]dibenzofuran; (terphenylyl)[(phenyl)(dibenzofuranyl)triazinyl]dibenzothiophene; (terphenylyl)[(phenyl)(dibenzofuranyl)triazinyl]dibenzoselenophene; (terphenylyl)[(phenyl)(dimethylfluorenyl)triazinyl]dibenzofuran; (terphenylyl)[(phenyl)(dimethylfluorenyl)triazinyl]dibenzothiophene; (terphenylyl)[(phenyl)(dimethylfluorenyl)triazinyl]dibenzoselenophene; (terphenylyl)[di(phenyl)triazinylphenyl]dibenzofuran; (terphenylyl)[di(phenyl)triazinylphenyl]dibenzothiophene; (terphenylyl)[di(phenyl)triazinylphenyl]dibenzoselenophene; (terphenylyl)[di(phenyl)triazinylphenyl]dibenzofuran; (terphenylyl)[di(phenyl)triazinylphenyl]dibenzothiophene; (terphenylyl)[di(phenyl)triazinylphenyl]dibenzoselenophene; (terphenyl-$d_{13}$)[(diphenyl-$d_{10}$)triazinylphenyl-$d_3$]dibenzofuran-$d_6$; (terphenyl-$d_{13}$)[(diphenyl-$d_{10}$)triazinylphenyl-$d_3$]dibenzothiophene-$d_6$; (terphenyl-$d_{13}$)[(diphenyl-$d_{10}$)triazinylphenyl-$d_3$]dibenzoselenophene-$d_6$; (terphenylyl)[(diphenyl-$d_{10}$)triazinylphenyl]dibenzofuran; (terphenylyl)[(diphenyl-$d_{10}$)triazinylphenyl]dibenzothiophene; (terphenylyl)[(diphenyl-$d_{10}$)triazinylphenyl]dibenzoselenophene; (terphenylyl)[(diphenyl-$d_{10}$)triazinylphenyl]dibenzofuran; (terphenylyl)[(diphenyl-$d_{10}$)triazinylphenyl]dibenzothiophene; (terphenylyl)[(diphenyl-$d_{10}$)triazinylphenyl]dibenzoselenophene (Group 23A)

di(phenyl)[(phenyl)indoloindolyl]triazine; di(phenyl)[(phenyl)indoloindolyl]pyridine; di(phenyl)[(phenyl)indoloindolyl]pyrimidine; di(phenyl)[(phenyl)indoloindolyl]pyrimidine; di(biphenylyl)[(phenyl)indoloindolyl]triazine; di(phenyl)[(diphenyltriazinyl)indoloindolyl]triazine; di(phenyl)[(phenyl)indoloindolylphenyl]triazine; (phenyl)[(phenyl)indoloindolyl]quinazoline; bis(phenylcarbazolyl)indoloindole; (phenyl)(phenylcarbazolyl)indoloindole; (phenyl)(dibenzofuranyl)indoloindole; (phenyl)(dibenzothiophenyl)indoloindole; (phenyl)(carbazolylphenyl)indoloindole; di(phenyl)(benzothienoindolyl)triazine; (phenyl)(biphenylyl)(benzothienoindolyl)triazine; di(biphenylyl)(benzothienoindolyl)triazine; (phenyl)(carbazolylphenyl)(benzothienoindolyl)triazine; (phenylquinazolyl)benzothienoindole; (phenylcarbazolyl)benzothienoindole; (naphthylcarbazolyl)benzothienoindole; (triphenylenylcarbazolyl)benzothienoindole; (biphenylylcarbazolyl)benzothienoindole; (terphenylylcarbazolyl)benzothienoindole; (diphenylpyridyl)benzofuroindole; (diphenylpyrimidinyl)benzofuroindole; di(phenyl)(benzofuroindolyl)triazine; (phenyl)(biphenylyl)(benzofuroindolyl)triazine; di(biphenylyl)(benzofuroindolyl)triazine; (biphenylyl)(benzofuroindolyl)quinazoline; (carbazolyl)(benzofuroindolyl)dibenzofuran; (phenylcarbazolyl)benzofuroindole; (naphthylcarbazolyl)benzofuroindole; (terphenylylcarbazolyl)benzofuroindole; di(phenyl)(phenylbenzofuroindolyl)triazine; di(phenyl)(carbazolylbenzofuroindolyl)triazine; di(phenyl)bicarbazole; di(biphenylyl)bicarbazole; (phenyl)(biphenylyl)bicarbazole; di(biphenylyl)bicarbazole; (phenyl)(biphenylyl)bicarbazole; di(biphenylyl)bicarbazole; (phenyl)(naphthylphenyl)bicarbazole; (phenyl)(naphthylphenyl)bicarbazole; (phenyl)(naphthyl)bicarbazole; di(naphthyl)bicarbazole; (naphthyl)(biphenylyl)bicarbazole; (naphthyl)(biphenylyl)bicarbazole; (naphthyl)(terphenylyl)bicarbazole; (naphthyl)(naphthylphenyl)bicarbazole; di(naphthyl)bicarbazole; (naphthyl)(phenanthryl)bicarbazole; (naphthyl)(phenylanthryl)bicarbazole; (phenyl)(naphthyl)bicarbazole; di(naphthyl)bicarbazole; (naphthyl)(biphenylyl)bicarbazole; (naphthyl)(biphenylyl)bicarbazole; (naphthyl)(terphenylyl)bicarbazole; (naphthyl)(naphthylphenyl)bicarbazole; di(naphthyl)bicarbazole; (naphthyl)(phenanthryl)bicarbazole; (naphthyl)(phenylanthryl)bicarbazole; (phenyl)(phenanthryl)bicarbazole; (biphenylyl)(phenanthryl)bicarbazole; (biphenylyl)(phenanthryl)bicarbazole; (terphenylyl)(phenanthryl)bicarbazole; (naphthylphenyl)(phenanthryl)bicarbazole; di(phenanthryl)bicarbazole; (phenylanthryl)(phenanthryl)bicarbazole; (phenyl)(naphthyl)bicarbazole; di(naphthyl)bicarbazole; (phenyl)(naphthyl)bicarbazole; di(naphthyl)bicarbazole; (phenyl)(phenanthryl)bicarbazole; di(phenanthryl)bicarbazole; (phenyl)(anthryl)bicarbazole; di(anthryl)bicarbazole;

(phenyl)(naphthyl)bicarbazole; di(naphthyl)bicarbazole; (phenyl)(naphthyl)bicarbazole; di(naphthyl)bicarbazole; (phenyl)(phenanthryl)bicarbazole; di(phenanthryl)bicarbazole; (phenyl)(anthryl)bicarbazole; di(anthryl)bicarbazole; (phenyl)(naphthyl)bicarbazole; di(naphthyl)bicarbazole; (phenyl)(naphthyl)bicarbazole; di(naphthyl)bicarbazole; (phenyl)(phenanthryl)bicarbazole; di(phenanthryl)bicarbazole; (phenyl)(naphthyl)bicarbazole; di(naphthyl)bicarbazole; (phenyl)(naphthyl)bicarbazole; (phenyl)(naphthyl)bicarbazole; di(naphthyl)bicarbazole; (phenyl)(naphthyl) bicarbazole; (phenyl)(phenanthryl)bicarbazole; di(phenanthryl)bicarbazole; (phenyl)(phenanthryl)bicarbazole; (phenyl)(anthryl)bicarbazole; (phenyl)(naphthyl)bicarbazole; (phenyl)(naphthyl)bicarbazole; di(naphthyl)bicarbazole; (phenyl)(naphthyl)bicarbazole; (phenyl)(phenanthryl) bicarbazole; (phenyl)(anthryl)bicarbazole; (phenyl) (naphthyl)bicarbazole; (phenyl)(naphthyl)bicarbazole; di(naphthyl)bicarbazole; (phenyl)(naphthyl)bicarbazole; (phenyl)(naphthyl)bicarbazole; di(naphthyl)bicarbazole; (phenyl)(phenanthryl)bicarbazole; (phenyl)(phenanthryl)bicarbazole; di(phenanthryl)bicarbazole; (phenyl)(anthryl)bicarbazole; (phenyl)(anthryl)bicarbazole; di(anthryl)bicarbazole; (phenyl)(pyrenyl)bicarbazole; (phenyl)(triphenylenyl) bicarbazole; (biphenylyl)(dibenzofuranyl)carbazole; (biphenylyl)(dibenzofuranyl)carbazole; (terphenylyl) (dibenzofuranyl)carbazole; (naphthylphenyl)(dibenzofuranyl)carbazole; (naphthylphenyl)(dibenzofuranyl)carbazole; (naphthyl)(dibenzofuranyl)carbazole; (phenanthryl)(dibenzofuranyl)carbazole; (triphenylenyl)(dibenzofuranyl)carbazole; (naphthyl)(dibenzofuranyl)carbazole; (biphenylyl) (dibenzothiophenyl)carbazole; (terphenylyl) (dibenzothiophenyl)carbazole; (naphthylphenyl) (dibenzothiophenyl)carbazole; (naphthylphenyl) (dibenzothiophenyl)carbazole; (naphthyl) (dibenzothiophenyl)carbazole; (phenanthryl) (dibenzothiophenyl)carbazole; (triphenylenyl) (dibenzothiophenyl)carbazole; (naphthyl) (dibenzothiophenyl)carbazole; (phenyl)(phenylpyridyl) bicarbazole; (phenylpyridyl)(dibenzofuranyl)carbazole; (phenylpyridyl)(dibenzothiophenyl)carbazole; (phenyl)(diphenylpyrimidinyl)bicarbazole; (diphenylpyrimidinyl) (dibenzofuranyl)carbazole; (diphenylpyrimidinyl)(dibenzothiophenyl)carbazole; (phenyl)(diphenyltriazinyl) bicarbazole; (diphenyltriazinyl)(dibenzofuranyl)carbazole; (diphenyltriazinyl)(dibenzothiophenyl)carbazole; (phenyl) (phenylquinazolyl)bicarbazole; (phenylquinazolyl)(dibenzofuranyl)carbazole; (phenylquinazolyl)(dibenzothiophenyl)carbazole (Group 24A)

(phenyl)(biphenylyl)[(phenyl)indolocarbazolyl]triazine; (phenyl)(biphenylyl)[(phenyl)indolocarbazolyl]triazine; di(phenyl)[(biphenylyl)indolocarbazolyl]triazine; di(phenyl)[(biphenylyl)indolocarbazolyl]triazine; di(phenyl)[di (phenyl)indolocarbazolyl]triazine; di(phenyl)[di(phenyl)indolocarbazolyl]triazine; di(phenyl)[di(phenyl) indolocarbazolyl]triazine; di(phenyl)[(phenyl)(naphthyl) indolocarbazolyl]triazine; di(phenyl)[(phenyl)(quinolyl) indolocarbazolyl]triazine; di(phenyl)[(phenyl)(naphthyl) indolocarbazolyl]triazine; (phenyl)(terphenylyl)[(phenyl) indolocarbazolyl]triazine; (phenyl)(terphenylyl)[(phenyl) indolocarbazolyl]triazine; (phenyl)(terphenylyl)[(phenyl) indolocarbazolyl]triazine; (phenyl)(terphenylyl)[(phenyl) indolocarbazolyl]triazine; di(phenyl)[(terphenylyl) indolocarbazolyl]triazine; di(phenyl)[(terphenylyl) indolocarbazolyl]triazine; di(phenyl)[(terphenylyl) indolocarbazolyl]triazine; di(phenyl)[(terphenylyl) indolocarbazolyl]triazine; di(biphenylyl)[(phenyl) indolocarbazolyl]triazine; di(biphenylyl)[(phenyl)indolocarbazolyl]triazine; di(biphenylyl)[(phenyl)indolocarbazolyl]triazine; di(phenyl)[(phenyl)(biphenylyl)indolocarbazolyl]triazine; di(phenyl)[(phenyl)(biphenylyl) indolocarbazolyl]triazine; di(phenyl)[tri(phenyl) indolocarbazolyl]triazine; di(phenyl)[tri(phenyl) indolocarbazolyl]triazine; di(phenyl)[(phenyl)(biphenylyl) indolocarbazolyl]triazine; di(phenyl)[(phenyl)(biphenylyl) indolocarbazolyl]triazine; di(phenyl)[(phenyl)di(pyridyl) indolocarbazolyl]triazine; di(phenyl)[(phenyl)di(methyl) indolocarbazolyl]triazine; di(phenyl)[(phenyl)di(butyl) indolocarbazolyl]triazine; di(phenyl)[(phenyl)di(tert-butyl) indolocarbazolyl]triazine; (phenyl)(biphenylyl)[(phenyl)di (butyl)indolocarbazolyl]triazine; (phenyl)(biphenylyl) [(phenyl)di(tert-butyl)indolocarbazolyl]triazine; (phenyl) (terphenylyl)[(phenyl)di(butyl)indolocarbazolyl]triazine; (phenyl)(terphenylyl)[(phenyl)di(tert-butyl)indolocarbazolyl]triazine; (phenyl)(biphenylyl)[(phenyl)di(butyl)indolocarbazolyl]triazine; (phenyl)(biphenylyl)[(phenyl)di(tert-butyl)indolocarbazolyl]triazine; (phenyl)(terphenylyl) [(phenyl)di(tert-butyl)indolocarbazolyl]triazine; (phenyl) (terphenylyl)[(phenyl)di(butyl)indolocarbazolyl]triazine; (biphenylyl)(terphenylyl)[(phenyl)di(butyl)indolocarbazolyl]triazine; (phenyl)(biphenylyl)[(phenyl)indolocarbazolyl]triazine; (phenyl)(biphenylyl)[(phenyl)indolocarbazolyl]triazine; di(phenyl)[(biphenylyl)indolocarbazolyl] triazine; di(phenyl)[(biphenylyl)indolocarbazolyl]triazine; di(phenyl)[di(phenyl)indolocarbazolyl]triazine; di(phenyl) [di(phenyl)indolocarbazolyl]triazine; di(phenyl)[di(phenyl) indolocarbazolyl]triazine; di(phenyl)[(phenyl)(naphthyl)indolocarbazolyl]triazine; di(phenyl)[(phenyl)(quinolyl) indolocarbazolyl]triazine; di(phenyl)[(phenyl)(naphthyl) indolocarbazolyl]triazine; (phenyl)(terphenylyl)[(phenyl) indolocarbazolyl]triazine; (phenyl)(terphenylyl)[(phenyl) indolocarbazolyl]triazine; (phenyl)(terphenylyl)[(phenyl) indolocarbazolyl]triazine; (phenyl)(terphenylyl)[(phenyl) indolocarbazolyl]triazine; di(phenyl)[(terphenylyl) indolocarbazolyl]triazine; di(phenyl)[(terphenylyl) indolocarbazolyl]triazine; di(phenyl)[(terphenylyl) indolocarbazolyl]triazine; di(biphenylyl)[(phenyl) indolocarbazolyl]triazine; di(biphenylyl)[(phenyl) indolocarbazolyl]triazine; di(biphenylyl)[(phenyl) indolocarbazolyl]triazine; di(biphenylyl)[(phenyl) indolocarbazolyl]triazine; di(phenyl)[(phenyl)(biphenylyl) indolocarbazolyl]triazine; di(phenyl)[(phenyl)(biphenylyl) indolocarbazolyl]triazine; di(phenyl)[tri(phenyl) indolocarbazolyl]triazine; di(phenyl)[tri(phenyl) indolocarbazolyl]triazine; di(phenyl)[di(phenyl) (biphenylyl)indolocarbazolyl]triazine; di(phenyl)[di (phenyl)(biphenylyl)indolocarbazolyl]triazine; di(phenyl) [(phenyl)di(pyridyl)indolocarbazolyl]triazine; di(phenyl) [(phenyl)di(methyl)indolocarbazolyl]triazine; di(phenyl) [(phenyl)di(butyl)indolocarbazolyl]triazine; di(phenyl) [(phenyl)di(tert-butyl)indolocarbazolyl]triazine; (phenyl) (biphenylyl)[(phenyl)di(butyl)indolocarbazolyl]triazine; (phenyl)(biphenylyl)[(phenyl)di(tert-butyl)indolocarbazolyl]triazine; (phenyl)(terphenylyl)[(phenyl)di(butyl)indolocarbazolyl]triazine; (phenyl)(terphenylyl)[(phenyl)di(tert-butyl)indolocarbazolyl]triazine; (phenyl)(biphenylyl) [(phenyl)di(butyl)indolocarbazolyl]triazine; (phenyl) (biphenylyl)[(phenyl)di(tert-butyl)indolocarbazolyl] triazine; (phenyl)(terphenylyl)[(phenyl)di(tert-butyl) indolocarbazolyl]triazine; (phenyl)(terphenylyl)[(phenyl)di (butyl)indolocarbazolyl]triazine; (biphenylyl)(terphenylyl) [(phenyl)di(butyl)indolocarbazolyl]triazine; (phenyl) (biphenylyl)[(phenyl)indolocarbazolyl]triazine; (phenyl) (biphenylyl)[(phenyl)indolocarbazolyl]triazine; di(phenyl)

[(biphenylyl)indolocarbazolyl]triazine; di(phenyl)[(biphenylyl)indolocarbazolyl]triazine; di(phenyl)[di(phenyl)indolocarbazolyl]triazine; di(phenyl)[di(phenyl)indolocarbazolyl]triazine; di(phenyl)[di(phenyl)indolocarbazolyl]triazine; di(phenyl)[(phenyl)(naphthyl)indolocarbazolyl]triazine; di(phenyl)[(phenyl)(quinolyl)indolocarbazolyl]triazine; di(phenyl)[(phenyl)(naphthyl)indolocarbazolyl]triazine; (phenyl)(terphenylyl)[(phenyl)indolocarbazolyl]triazine; (phenyl)(terphenylyl)[(phenyl)indolocarbazolyl]triazine; (phenyl)(terphenylyl)[(phenyl)indolocarbazolyl]triazine; (phenyl)(terphenylyl)[(phenyl)indolocarbazolyl]triazine; di(phenyl)[(terphenylyl)indolocarbazolyl]triazine; di(phenyl)[(terphenylyl)indolocarbazolyl]triazine; di(phenyl)[(terphenylyl)indolocarbazolyl]triazine; di(phenyl)[(terphenylyl)indolocarbazolyl]triazine; di(biphenylyl)[(phenyl)indolocarbazolyl]triazine; di(biphenylyl)[(phenyl)indolocarbazolyl]triazine; di(biphenylyl)[(phenyl)indolocarbazolyl]triazine; di(phenyl)[(phenyl)(biphenylyl)indolocarbazolyl]triazine; di(phenyl)[(phenyl)(biphenylyl)indolocarbazolyl]triazine; di(phenyl)[tri(phenyl)indolocarbazolyl]triazine; di(phenyl)[tri(phenyl)indolocarbazolyl]triazine; di(phenyl)[di(phenyl)(biphenylyl)indolocarbazolyl]triazine; di(phenyl)[di(phenyl)(biphenylyl)indolocarbazolyl]triazine; di(phenyl)[(phenyl)di(pyridyl)indolocarbazolyl]triazine; di(phenyl)[(phenyl)di(methyl)indolocarbazolyl]triazine; di(phenyl)[(phenyl)di(butyl)indolocarbazolyl]triazine; di(phenyl)[(phenyl)di(tert-butyl)indolocarbazolyl]triazine; (phenyl)(biphenylyl)[(phenyl)di(butyl)indolocarbazolyl]triazine; (phenyl)(biphenylyl)[(phenyl)di(tert-butyl)indolocarbazolyl]triazine; (phenyl)(terphenylyl)[(phenyl)di(butyl)indolocarbazolyl]triazine; (phenyl)(terphenylyl)[(phenyl)di(tert-butyl)indolocarbazolyl]triazine; (phenyl)(biphenylyl)[(phenyl)di(butyl)indolocarbazolyl]triazine; (phenyl)(biphenylyl)[(phenyl)di(tert-butyl)indolocarbazolyl]triazine; (phenyl)(terphenylyl)[(phenyl)di(butyl)indolocarbazolyl]triazine; (phenyl)(terphenylyl)[(phenyl)di(tert-butyl)indolocarbazolyl]triazine; (biphenylyl)(terphenylyl)[(phenyl)di(tert-butyl)indolocarbazolyl]triazine; (phenyl)(biphenylyl)[(phenyl)indolocarbazolyl]triazine; (phenyl)(biphenylyl)[(phenyl)indolocarbazolyl]triazine; di(phenyl)[(biphenylyl)indolocarbazolyl]triazine; di(phenyl)[(biphenylyl)indolocarbazolyl]triazine; di(phenyl)[tri(phenyl)indolocarbazolyl]triazine; di(phenyl)[(phenyl)di(butyl)indolocarbazolyl]triazine; (phenyl)(terphenylyl)[(phenyl)indolocarbazolyl]triazine; (phenyl)(terphenylyl)[(phenyl)indolocarbazolyl]triazine; (phenyl)(terphenylyl)[(phenyl)indolocarbazolyl]triazine; (phenyl)(terphenylyl)[(phenyl)indolocarbazolyl]triazine; di(biphenylyl)[(phenyl)indolocarbazolyl]triazine; di(biphenylyl)[(phenyl)indolocarbazolyl]triazine; (phenyl)(biphenylyl)[(phenyl)indolocarbazolyl]triazine; (phenyl)(biphenylyl)[(phenyl)indolocarbazolyl]triazine; (phenyl)(terphenylyl)[(phenyl)indolocarbazolyl]triazine; (phenyl)(terphenylyl)[(phenyl)indolocarbazolyl]triazine; (phenyl)(terphenylyl)[(phenyl)indolocarbazolyl]triazine; (phenyl)(terphenylyl)[(phenyl)indolocarbazolyl]triazine; di(biphenylyl)[(phenyl)indolocarbazolyl]triazine; di(biphenylyl)[(phenyl)indolocarbazolyl]triazine; (phenyl)(biphenylyl)[(phenyl)indolocarbazolyl]triazine; (phenyl)(biphenylyl)[(phenyl)indolocarbazolyl]triazine; di(phenyl)[(biphenylyl)indolocarbazolyl]triazine; di(phenyl)[(biphenylyl)indolocarbazolyl]triazine; di(phenyl)[tri(phenyl)indolocarbazolyl]triazine; di(phenyl)[(phenyl)di(butyl)indolocarbazolyl]triazine; (phenyl)(terphenylyl)[(phenyl)indolocarbazolyl]triazine; (phenyl)(terphenylyl)[(phenyl)indolocarbazolyl]triazine; (phenyl)(terphenylyl)[(phenyl)indolocarbazolyl]triazine; (phenyl)(terphenylyl)[(phenyl)indolocarbazolyl]triazine; di(biphenylyl)[(phenyl)indolocarbazolyl]triazine; di(biphenylyl)[(phenyl)indolocarbazolyl]triazine; di(terphenylyl)[(phenyl)indolocarbazolyl]triazine; di(terphenylyl)[(phenyl)indolocarbazolyl]triazine; di(terphenylyl)[(phenyl)indolocarbazolyl]triazine; di(terphenylyl)[(phenyl)indolocarbazolyl]triazine; (phenyl)(biphenylyl)[(phenyl)(dibenzofuranyl)indolocarbazolyl]triazine; (phenyl)(biphenylyl)[(phenyl)(dibenzothiophenyl)indolocarbazolyl]triazine; (phenyl)(terphenylyl)[(phenyl)(dibenzofuranyl)indolocarbazolyl]triazine; (phenyl)(terphenylyl)[(phenyl)(dibenzothiophenyl)indolocarbazolyl]triazine; di(phenyl)[(phenyl)indolocarbazolyl]triazine; di(phenyl)[(phenyl)indolocarbazolyl]triazine; di(phenyl)[(phenyl)indolocarbazolyl]triazine; di(phenyl)[(phenyl)indolocarbazolyl]triazine; (naphthyl)(biphenylyl)bicarbazole; di(biphenylyl)bicarbazole; di(biphenylyl)bicarbazole; di(biphenylyl)bicarbazole; (biphenylyl)(phenanthryl)bicarbazole; (biphenylyl)(anthryl)bicarbazole; (biphenylyl)(naphthylphenyl)bicarbazole; (biphenylyl)(naphthylphenyl)bicarbazole; (biphenylyl)(terphenylyl)bicarbazole; (biphenylyl)(anthrylphenyl)bicarbazole; (biphenylyl)(naphthylphenyl)bicarbazole; (biphenylyl)(anthrylphenyl)bicarbazole; (biphenylyl)(naphthylphenyl)bicarbazole; (biphenylyl)(terphenylyl)bicarbazole; (biphenylyl)(terphenylyl)bicarbazole; (biphenylyl)(terphenylyl)bicarbazole; (biphenylyl)(terphenylyl)bicarbazole; (biphenylyl)(naphthylphenyl)bicarbazole; (biphenylyl)(naphthylphenyl)bicarbazole; (biphenylyl)(phenanthrylphenyl)bicarbazole; (biphenylyl)(terphenylyl)bicarbazole; (biphenylyl)(naphthylbiphenylyl)bicarbazole; (biphenylyl)(naphthylphenyl)bicarbazole; (biphenylyl)(naphthylphenyl)bicarbazole; (biphenylyl)(phenanthrylphenyl)bicarbazole; (biphenylyl)(terphenylyl)bicarbazole; (biphenylyl)(naphthylbiphenylyl)bicarbazole; (biphenylyl)(naphthylphenyl)bicarbazole; (biphenylyl)(naphthylphenyl)bicarbazole; (biphenylyl)(phenanthrylphenyl)bicarbazole; (phenyl)(biphenylyl)bicarbazole; (phenyl)(naphthylphenyl)bicarbazole; (phenyl)(naphthylphenyl)bicarbazole; (phenyl)(phenanthrylphenyl)bicarbazole; (phenyl)(terphenylyl)bicarbazole; (phenyl)(terphenylyl)bicarbazole; (phenyl)(terphenylyl)bicarbazole; (phenyl)(naphthylbiphenylyl)bicarbazole; (phenyl)(naphthylbiphenylyl)bicarbazole; (naphthyl)(biphenylyl)bicarbazole; di(biphenylyl)bicarbazole; di(biphenylyl)bicarbazole; di(biphenylyl)bicarbazole; (biphenylyl)(phenanthryl)bicarbazole; (biphenylyl)(anthryl)bicarbazole; (biphenylyl)(naphthylphenyl)bicarbazole; (biphenylyl)(naphthylphenyl)bicarbazole; (biphenylyl)(terphenylyl)bicarbazole; (biphenylyl)(anthrylphenyl)bicarbazole; (biphenylyl)(naphthylphenyl)bicarbazole; (biphenylyl)(anthrylphenyl)bicarbazole; (biphenylyl)(naphthylphenyl)bicarbazole; (biphenylyl)(terphenylyl)bicarbazole; (biphenylyl)(terphenylyl)bicarbazole; (biphenylyl)(terphenylyl)bicarbazole; (biphenylyl)(naphthylbiphenylyl)bicarbazole; (biphenylyl)(naphthylphenyl)bicarbazole; (biphenylyl)(naphthylphenyl)bicarbazole; (biphenylyl)(phenanthrylphenyl)bicarbazole; (biphenylyl)(terphenylyl)bicarbazole; (biphenylyl)(naphthylbiphenylyl)bicarbazole; (biphenylyl)(naphthylphenyl)bicarbazole; (biphenylyl)(naphthylphenyl)bicarbazole; (biphenylyl)(phenanthrylphenyl)bicarbazole; (biphenylyl)(terphenylyl)bicarbazole; (biphenylyl)(naphthylbiphenylyl)bicarbazole; (biphenylyl)(naphthylphenyl)bicarbazole; (biphenylyl)(naphthylphenyl)bicarbazole; (biphenylyl)(phenanthrylphenyl)bicarbazole; (phenyl)

(biphenylyl)bicarbazole; (phenyl)(naphthylphenyl) bicarbazole; (phenyl)(naphthylphenyl)bicarbazole; (phenyl) (phenanthrylphenyl)bicarbazole; (phenyl)(terphenylyl) bicarbazole; (phenyl)(terphenylyl)bicarbazole; (phenyl) (terphenylyl)bicarbazole; (phenyl)(naphthylbiphenylyl) bicarbazole; (phenyl)(naphthylbiphenylyl)bicarbazole; (naphthyl)(biphenylyl)bicarbazole; di(biphenylyl)bicarbazole; di(biphenylyl)bicarbazole; di(biphenylyl)bicarbazole; (biphenylyl)(phenanthryl)bicarbazole; (biphenylyl)(anthryl) bicarbazole; (biphenylyl)(naphthylphenyl)bicarbazole; (biphenylyl)(naphthylphenyl)bicarbazole; (biphenylyl)(terphenylyl)bicarbazole; (biphenylyl)(anthrylphenyl)bicarbazole; (biphenylyl)(naphthylphenyl)bicarbazole; (biphenylyl)(anthrylphenyl)bicarbazole; (biphenylyl)(naphthylphenyl)bicarbazole; (biphenylyl)(terphenylyl)bicarbazole; (biphenylyl)(terphenylyl)bicarbazole; (biphenylyl)(terphenylyl) bicarbazole; (biphenylyl)(naphthylbiphenylyl)bicarbazole; (biphenylyl)(naphthylphenyl)bicarbazole; (biphenylyl) (naphthylphenyl)bicarbazole; (biphenylyl)(phenanthrylphenyl)bicarbazole; (naphthyl)(biphenylyl)bicarbazole; di(biphenylyl)bicarbazole; di(biphenylyl)bicarbazole; di(biphenylyl)bicarbazole; (biphenylyl)(phenanthryl)bicarbazole; (biphenylyl)(anthryl)bicarbazole; (biphenylyl) (naphthylphenyl)bicarbazole; (biphenylyl)(naphthylphenyl) bicarbazole; (biphenylyl)(terphenylyl)bicarbazole; (biphenylyl)(anthrylphenyl)bicarbazole; (biphenylyl)(naphthylphenyl)bicarbazole; (biphenylyl)(anthrylphenyl)bicarbazole; (biphenylyl)(naphthylphenyl)bicarbazole; (biphenylyl)(terphenylyl)bicarbazole; (biphenylyl)(terphenylyl) bicarbazole; (biphenylyl)(terphenylyl)bicarbazole; (biphenylyl)(naphthylbiphenylyl)bicarbazole; (biphenylyl) (naphthylphenyl)bicarbazole; (biphenylyl)(naphthylphenyl) bicarbazole; (biphenylyl)(phenanthrylphenyl)bicarbazole; (biphenylyl)(terphenylyl)bicarbazole; (biphenylyl)(naphthylbiphenylyl)bicarbazole; (biphenylyl)(naphthylphenyl)bicarbazole; (biphenylyl)(naphthylphenyl)bicarbazole; (biphenylyl)(phenanthrylphenyl)bicarbazole; (biphenylyl) (terphenylyl)bicarbazole; (biphenylyl)(naphthylbiphenylyl) bicarbazole; (biphenylyl)(naphthylphenyl)bicarbazole; (biphenylyl)(naphthylphenyl)bicarbazole; (biphenylyl) (phenanthrylphenyl)bicarbazole; (phenyl)(biphenylyl)bicarbazole; (phenyl)(naphthylphenyl)bicarbazole; (phenyl) (naphthylphenyl)bicarbazole; (phenyl)(phenanthrylphenyl) bicarbazole; (phenyl)(terphenylyl)bicarbazole; (phenyl) (terphenylyl)bicarbazole; (phenyl)(terphenylyl)bicarbazole; (phenyl)(naphthylbiphenylyl)bicarbazole; (phenyl)(naphthylbiphenylyl)bicarbazole (Group 25A)

di(bipyridinyl)triphenylene; di(bipyridinyl)triphenylene; bis (dipyridinylphenyl)phenylpyrimidine; (phenylquinquephenylyl)diphenylpyrimidine; (phenylquarterphenylyl)diphenylpyrimidine; bis[(biphenylylpyrimidinyl)phenyl]ether; di(terphenylyl)sulfone; bis(diphenylterphenylyl)sulfone; phenyl(diphenylquinquephenylyl)sulfone; di(spirobifluorenyl)ketone; bis(diphenylfluorenyl)ketone; bis(dimethylfluorenyl)naphthyltriazine; bis(dimethylfluorenyl)biphenylyltriazine; bis(dimethylfluorenyl)terphenylyltriazine; biphenylyl (spirobifluorenyl)phenylpyridine; biphenylyl (spirobifluorenyl)phenylpyridine; biphenylyl (spirobifluorenyl)naphthylpyridine; di(terphenylyl) (spirobifluorenyl)pyridine; biphenylyl(spirobifluorenyl) phenylpyridine; biphenylyl(spirobifluorenyl) phenylpyridine; biphenylyl(spirobifluorenyl) naphthylpyridine; di(terphenylyl)(spirobifluorenyl)pyridine; biphenylyl(spirobifluorenyl)phenylpyridine; biphenylyl(spirobifluorenyl)phenylpyridine; biphenylyl(spirobifluorenyl) naphthylpyridine; biphenylyl(spirobifluorenyl)phenylpyrimidine; biphenylyl(spirobifluorenyl)phenylpyrimidine; di(biphenylyl)(spirobifluorenyl)phenylpyrimidine; biphenylyl(spirobifluorenyl)naphthylpyrimidine; terphenylyl(spirobifluorenyl)phenylpyrimidine; biphenylyl(spirobifluorenyl) phenylpyrimidine; biphenylyl(spirobifluorenyl) phenylpyrimidine; biphenylyl(spirobifluorenyl) naphthylpyrimidine; biphenylyl(spirobifluorenyl) naphthylpyrimidine; terphenylyl(spirobifluorenyl) phenylpyrimidine; biphenylyl(spirobifluorenyl) phenyltriazine; biphenylyl(spirobifluorenyl)phenyltriazine; (biphenyl-$d_1$)(spirobifluorenyl)phenyltriazine; (biphenyl-$d_5$)(spirobifluorenyl)phenyltriazine; biphenylyl(spirobifluorenyl)(phenyl-$d_5$)triazine; terphenylyl(spirobifluorenyl)phenyltriazine; terphenylyl(spirobifluorenyl)naphthyltriazine; biphenylyl(spirobifluorenyl)quinazoline; biphenylyl(spirobifluorenyl)quinazoline; terphenylyl(spirobifluorenyl)quinazoline; terphenylyl(spirobifluorenyl)quinazoline; (biphenyl-$d_1$)(spirobifluorenyl)quinazoline; terphenylyl (spirobifluorenyl)quinazoline; di(terphenylyl) diboraoxanaphthoanthracene; di(terphenylyl) diboraoxanaphthoanthracene; [(triphenylenyl)biphenylyl] diboraoxanaphthoanthracene; (quarterphenylyl) diboraoxanaphthoanthracene; (phenylquarterphenylyl) diboraoxanaphthoanthracene; di(dibenzofuranyl) diboraoxanaphthoanthracene; di(dibenzofuranyl) diboraoxanaphthoanthracene; di(biphenylyl) (dimethylfluorenyl)triazine; (terphenylyl)(biphenylyl) (dimethylfluorenyl)triazine; di(terphenylyl) (dimethylfluorenyl)triazine; (biphenylyl) (diphenylfluorenyl)phenyltriazine; (biphenylyl) (diphenylfluorenyl)phenyltriazine; bis(diphenylphosphoryl) dibenzothiophene; bis(diphenylphosphoryl)dibenzofuran; diphenyl(triphenylenylterphenylyl)amine; diphenyl(quinquephenylyl)amine; diphenyl(phenylquinquephenylyl) amine; diphenyl[(spirobifluorenyl)biphenylyl]amine; bis [(diphenylamino)phenyl]dibenzofuran; [(triphenylenyl) terphenylyl]indole; tris(indolylphenyl)benzene; (diphenylquinquephenylyl)carbazole; [(triphenylenyl)terphenylyl]carbazole; [(triphenylenyl)biphenylyl]carbazole; di(carbazolyl)quarterbenzene; (carbazolylbiphenylyl)[di(biphenylyl)]amine; terphenylylbicarbazole; quarterphenylylbicarbazole; bis(diphenylcarbazolyl)benzene; di(carbazolyl) terbenzene; di(carbazolyl)quarterbenzene; di(carbazolyl) quarterbenzene; di(carbazolyl)spirobifluorene; [(triphenylenyl)biphenylyl]carbazolyldibenzothiophene; di(carbazolyl)dibenzothiophene; di(carbazolyl)dibenzofuran; di(carbazolyl)(diphenylfluorene); di(carbazolyl)(biphenylyl)carbazole; (quarterphenylyl)bicarbazole; bis(bicarbazolyl)benzene; bis(bicarbazolyl)benzene; bis (bicarbazolyl)biphenyl; bis[di(carbazolyl)carbazolyl] benzene; bis[di(carbazolyl)carbazolyl]biphenyl; tris (carbazolyl)benzene; dimethyl(phenylquarterphenylyl) acridane; (phenylquarterphenylyl)phenoxazine; (phenylquarterphenylyl)phenothiazine; phenyl(phenylquarterphenylyl)phenazine; dimethyl[(terphenylyl)carbazolyl] acridane; dimethyl[(terphenylyl)carbazolyl]phenoxazine; dimethyl[(terphenylyl)carbazolyl]phenothiazine; phenyl (spirobifluorenyl)phenazine; bis(dimethylacridinyl)terbenzene; di(phenoxazinyl)terbenzene; di(phenoxazinyl)biphenyl; di(phenothiazinyl)terbenzene; bis(dimethylacridinyl) biphenyl; di(biphenylyl)bicarbazole; di(biphenylyl) bicarbazole; phenyl(terphenylyl)bicarbazole; di(biphenylyl) bicarbazole-$d_2$; phenyl(triphenylenyl)bicarbazole; biphenylyl(terphenylyl)bicarbazole; diphenyltercarbazole; phenyl(dibenzothiophenyl)bicarbazole; phenyl(dimethylfluorenyl)bicarbazole; di(biphenylyl)bicarbazole; phenyl (triphenylenyl)bicarbazole; di(biphenylyl)bicarbazole-$d_2$;

di(biphenylyl)bicarbazole-$d_2$; phenyl(terphenylyl)bicarbazole; phenyl(triphenylenyl)bicarbazole; di(biphenylyl)bicarbazole; diphenyltercarbazole; phenyl(triphenylenyl)bicarbazole-di; di(biphenylyl)bicarbazole; phenyl(triphenylenyl) bicarbazole; di(biphenylyl)bicarbazole; phenyl (triphenylenyl)bicarbazole; phenyl(dibenzofuranyl) bicarbazole; phenyl(terphenylyl)bicarbazole-$d_2$; di(biphenylyl)bicarbazole; phenyl(triphenylenyl)bicarbazole; (phenylcarbazolyl)[(triphenylenyl)carbazolyl]benzene; (phenylcarbazolyl)[(biphenylyl)carbazolyl]benzene; (phenylcarbazolyl)[(biphenylyl)carbazolyl]benzene; (phenylcarbazolyl)[(terphenylyl)carbazolyl]benzene; bis(phenylcarbazolyl)biphenyl; bis[(biphenylyl)carbazolyl]biphenyl; (phenylcarbazolyl)[(triphenylenyl)carbazolyl]biphenyl; (phenylcarbazolyl)[(terphenylyl)carbazolyl]biphenyl; bis (phenylcarbazolyl)biphenyl-$d_2$; terphenylyl(dimethylfluorenyl)carbazole; quarterphenylyl(dimethylfluorenyl)carbazole; terphenylyl(dimethylfluorenyl)carbazole; terphenylyl (diphenylfluorenyl)carbazole; quarterphenylyl (dibenzothiophenyl)carbazole; terphenylyl(dibenzofuranyl) carbazole; biphenylyl(dibenzofuranyl)bicarbazole; terphenylyl(dibenzothiophenyl)carbazole; di(biphenylyl)indolocarbazole; di(biphenylyl)indolocarbazole; phenyl(terphenylyl)indolocarbazole-$d_2$; bis(phenylindolocarbazolyl) benzene; di(biphenylyl)indolocarbazole; phenyl (terphenylyl)indolocarbazole; phenyl(terphenylyl) indolocarbazole-di; bis(phenylindolocarbazolyl)benzene; bis(phenylindolocarbazolyl)biphenyl; phenyl(dinaphthylphenyl)indolocarbazole; phenyl(spirobifluorenyl)indolocarbazole; di(biphenylyl)indolocarbazole; bis(phenylindolocarbazolyl)biphenyl; phenyl(terphenylyl)indolocarbazole; di(biphenylyl)indolocarbazole; bis(phenylindolocarbazolyl) biphenyl; di(terphenylyl)indolocarbazole; phenyl(quarterphenylyl)indolocarbazole; phenyl(terphenylyl)indolocarbazole-$d_2$; bis(phenylindolocarbazolyl)benzene; (quarterphenylyl)dimethylindenocarbazole; (quarterphenylyl)dimethylindenocarbazole; [(terphenylyl)carbazolyl]dimethylindenocarbazole; (terphenylyl)oxaazaindenofluorene; bis(oxaazaindenofluorenylbiphenyl); (quarterphenylyl) oxaazaindenofluorene; (quinquephenylyl)benzothienocarbazole; (terphenylyl)benzothienocarbazole; phenyl(terphenylyl)indolophenoxazine; phenyl(terphenylyl) indoloacridane; phenyl(terphenylyl)indolophenothiazine; di(biphenylyl)indolophenoxazine; di(biphenylyl)indolophenothiazine; di(biphenylyl)indoloacridane; phenyl(terphenylyl)indolophenoxazine; phenyl(terphenylyl)indolophenothiazine; phenyl(terphenylyl)indoloacridane; phenyl (terphenylyl)spiroindolo(acridinefluorene); phenyl (quarterphenylyl)indolophenothiazine; phenyl(terphenylyl) indolophenoxazine; phenyl(terphenylyl)indoloacridane; phenyl(biphenylyl)spiroindolo(phenothiazinefluorene); phenyl(terphenylyl)benzoindolocarbazole (Group 26A)

(phenyl)(biphenylyl)[(phenylbicarbazolyl)phenyl]triazine; di(phenyl)[(phenylbicarbazolyl)biphenylyl]triazine; di(phenyl)[(biphenylylbicarbazolyl)phenyl]triazine; di(phenyl) [(diphenylbicarbazolyl)phenyl]triazine; (phenyl)(cyanotriphenylenyl)bicarbazole; (methylphenyl) (cyanotriphenylenyl)bicarbazole; (tert-butylphenyl) (cyanotriphenylenyl)bicarbazole (Group 27A)

CBP(dicarbazolebiphenyl); PVK(poly(n-vinylcarbazone)); AD-N(di(naphthaleyl)anthracene); TCTA; TPBI(tris(phenylbenzimidazolyl)benzene)); $Ir(pq)_2(acac)$; PtOEP; $Ir(piq)_3$; $Btp_2$; Ir(acac); $Ir(ppy)_3$; $Ir(ppy)_2(acac)$; $Ir(mpyp)_3$; Flrpic; $(F2ppy)_2lrtmd)$; $Ir(dfppz)_3$; mCP(dicarbazolebenzene); mCBP(di(carbazolyl)biphenyl); CBP(bis(carbazolyl) biphenyl); TPBI(tris(phenylbenzimidazolyl)benzene)); BmPyPb(tri[(pyridyl)phenyl]benzene); TSPO1(diphenylphosphineoxidetriphenylsilylphenyl); Alq3(tris(quinolinolato)aluminum; COT(substituted cyclooctatetraene); TAZ; Bphen(diphenylphenanthroline)); BCP; Balq (Group 28A)

tris[(methylindolocarbazolyl)phenyl]amine; tris[(azaoxaindenofluorenyl)phenyl]amine; tris[(thiaazaindenobenzofluorenyl)phenyl]amine; tris[(indenocarbazolyl)phenyl]amine; bis[(methylindolocarbazolyl)phenyl][(azaoxaindenofluorenyl)phenyl]amine; tris[(azaoxaindenobenzofluorenyl)phenyl]amine; tris[(azaselenaindenobenzofluorenyl)phenyl] amine; tris[(thiaazaindenofluorenyl)phenyl]amine; [(methylindolocarbazolyl)phenyl]bis[(azaoxaindenofluorenyl)phenyl]amine; tris[(azaoxaindenonaphthofluorenyl) phenyl]amine; tris[(azaselenaindenobenzofluorenyl)phenyl] amine; tris[(phenylindolocarbazolyl)phenyl]amine; tris [(dimethylindolophenazinyl)phenyl]amine; [(dihydroindoloanthracenyl)phenyl]bis[(indolothioxanthenyl)phenyl]amine; tris[(indolophenoxazinyl)phenyl]amine; tris[(indoloxanthenyl)phenyl]amine; tris[(methylindolobenzophenoxazinyl)phenyl]amine; tris[(indenoacridinyl)phenyl]amine; tris[(benzofuroacridinyl)phenyl]amine; tris [(benzothiophenothiazinyl)phenyl]amine; tris [(phenylbenzothiophenazinyl)phenyl]amine; tris [(dihydrobenzofurophenanthridinyl)phenyl]amine; tetrakis [(methylindolocarbazolyl)phenyl]silane; tetrakis [(azaoxaindenofluorenyl)phenyl]silane; tetrakis [(azaselenaindenofluorenyl)phenyl]silane; tetrakis [(azaoxaindenofluorenyl)phenyl]silane; tetrakis [(azaoxaindenofluorenyl)phenyl]silane; tetrakis [(azaoxadithiapentacenyl)phenyl]silane; tetrakis [(azaoxaindenofluorenyl)phenyl]germane; tetrakis [(methylindolocarbazolyl)phenyl]germane; tetrakis [(methyldiazaoxathiapentacenyl)phenyl]germane; bis [(benzofurophenoxazinyl)phenyl]bis [(benzothienophenoxazinyl)phenyl]germane; (phenyl) (benzofurocarbazolyl)[(benzofurocarbazolyl)phenyl] phosphineoxide; (phenyl)(benzothienocarbazolyl) [(benzothienocarbazolyl)pyridyl]phosphineoxide; (pyridyl) (methylindolocarbazolyl)[(methylindolocarbazolyl)phenyl] phosphineoxide; (phenyl)(benzothienocarbazolyl) [(benzothienocarbazolyl)phenyl]phosphineoxide; (phenyl) (benzoselenocarbazolyl)[(benzoselenocarbazolyl)phenyl] phosphineoxide; (phenyl)(azaoxaindenobenzofluorenyl) [(azaoxaindenobenzofluorenyl)phenyl]phosphineoxide; (phenyl)(dimethylindolophenazinyl)[(dimethylindolophenazinyl)phenyl]phosphineoxide; (phenyl)(indolothioxanthenyl)[(indolothioxanthenyl)pyridyl]phosphineoxide; (phenyl)(methylindolophenothiazinyl)[(methylindolophenothiazinyl)pyridyl]phosphineoxide; bis[(azaoxaindenofluorenyl)phenyl]furan; bis[(methylindolophenothiazinyl) phenyl]furan; bis[(thiaazaindenofluorenyl)phenyl] thiophene; bis[(azaselenaindenofluorenyl)pyridyl] thiophene; bis[(thiaazaindenofluorenyl)phenyl] selenophene; bis[(phenylindoloacridinyl)phenyl] selenophene; dimethylbis[(thiaazaindenofluorenyl)phenyl] cyclopentadiene; dimethylbis [(phenylindolobenzocarbazolyl)pyridyl]cyclopentadiene; bis[(benzothienophenothiazinyl)phenyl]oxazole; bis[(benzofurophenoxazinyl)phenyl]oxadiazole; bis[(benzothienophenoxazinyl)phenyl]thiadiazole (Group 29A)

di(phenyl)[(phenylbicarbazolyl)phenyl]triazine; di(phenyl) [(phenylbicarbazolyl)phenyl]triazine; di(phenyl)[(phenylbicarbazolyl)phenyl]triazine; di(phenyl)(biphenylylbicarbazolyl)triazine; di(phenyl)(biphenylylbicarbazolyl)triazine;

di(phenyl)(biphenylylbicarbazolyl)triazine; (phenyl)(biphenylyl)(phenylbicarbazolyl)triazine; (phenyl)(biphenylyl)(phenylbicarbazolyl)triazine; (phenyl)(biphenylyl)(phenylbicarbazolyl)triazine; (phenyl)(biphenylyl)(phenylbicarbazolyl)triazine; (phenyl)(biphenylyl)(phenylbicarbazolyl)triazine; (phenyl)(biphenylyl)(phenylbicarbazolyl)triazine; di(phenyl)(biphenylylbicarbazolyl)triazine; di(phenyl)(biphenylylbicarbazolyl)triazine; di(phenyl)(biphenylylbicarbazolyl)triazine; di(phenyl)[(methylphenylbicarbazolyl)phenyl]triazine; di(phenyl)[(methylphenylbicarbazolyl)phenyl]triazine; di(phenyl)[methyl(phenylbicarbazolyl)phenyl]triazine; di(phenyl)[(fluorophenylbicarbazolyl)phenyl]triazine; di(phenyl)[fluoro(phenylbicarbazolyl)phenyl]triazine; (phenyl)(fluorophenyl)[(phenylbicarbazolyl)phenyl]triazine; di(phenyl)[(cyclohexylphenylbicarbazolyl)phenyl]triazine; di(phenyl)[(trimethylsilylphenylbicarbazolyl)phenyl]triazine; phenyl(cyanophenanthryl)bicarbazole (Group 30A)

dicarbazolylbenzene; dicarbazolylbiphenyl; bis[(oxodiphenylphosphino)phenyl]ether; bis[(dimethyldihydroacridinyl)phenyl]sulfone; di(carbazolyl)benzophosphone; bis(dimethoxycarbazolyl)benzophosphone (Group 31A)

(phenyl)(biphenylyl)(phenylindolocarbazolyl)triazine; (phenyl)(biphenylyl)(phenylindolocarbazolyl)triazine; di(phenyl)(biphenylylindolocarbazolyl)triazine; di(phenyl)(biphenylylindolocarbazolyl)triazine; (phenyl)(terphenylyl)(phenylindolocarbazolyl)triazine; (phenyl)(terphenylyl)(phenylindolocarbazolyl)triazine; (phenyl)(terphenylyl)(phenylindolocarbazolyl)triazine; (phenyl)(terphenylyl)(phenylindolocarbazolyl)triazine; di(phenyl)(terphenylylindolocarbazolyl)triazine; di(phenyl)(terphenylylindolocarbazolyl)triazine; di(phenyl)(terphenylylindolocarbazolyl)triazine; di(phenyl)(terphenyyllindolocarbazolyl)triazine; di(biphenylyl)(phenylindolocarbazolyl)triazine; di(biphenylyl)(phenylindolocarbazolyl)triazine; di(biphenylyl)(phenylindolocarbazolyl)triazine; (phenyl)(biphenylyl)(dibutylphenylindolocarbazolyl)triazine; (phenyl)(biphenylyl)[di(tert-butyl)phenylindolocarbazolyl]triazine; (phenyl)(terphenylyl)(dibutylphenylindolocarbazolyl)triazine; (phenyl)(terphenylyl)[di(tert-butyl)phenylindolocarbazolyl]triazine; (phenyl)(biphenylyl)(dibutylphenylindolocarbazolyl)triazine; (phenyl)(biphenylyl)[di(tert-butyl)phenylindolocarbazolyl]triazine; (phenyl)(terphenylyl)[di(tert-butyl)phenylindolocarbazolyl]triazine; (phenyl)(terphenylyl)(dibutylphenylindolocarbazolyl)triazine; (biphenylyl)(biphenylyl)(dibutylphenylindolocarbazolyl)triazine; (phenyl)(biphenylyl)(phenylindolocarbazolyl)triazine; (phenyl)(biphenylyl)(phenylindolocarbazolyl)triazine; di(phenyl)(biphenylylindolocarbazolyl)triazine; di(phenyl)(biphenylylindolocarbazolyl)triazine; (phenyl)(terphenylyl)(phenylindolocarbazolyl)triazine; (phenyl)(terphenylyl)(phenylindolocarbazolyl)triazine; (phenyl)(terphenylyl)(phenylindolocarbazolyl)triazine; (phenyl)(terphenylyl)(phenylindolocarbazolyl)triazine; di(phenyl)(terphenylylindolocarbazolyl)triazine; di(phenyl)(terphenylylindolocarbazolyl)triazine; di(phenyl)(terphenylylindolocarbazolyl)triazine; di(biphenylyl)(phenylindolocarbazolyl)triazine; di(biphenylyl)(phenylindolocarbazolyl)triazine; di(biphenylyl)(phenylindolocarbazolyl)triazine; di(biphenylyl)(phenylindolocarbazolyl)triazine; (phenyl)(biphenylyl)(dibutylphenylindolocarbazolyl)triazine; (phenyl)(biphenylyl)[di(tert-butyl)phenylindolocarbazolyl]triazine; (phenyl)(terphenylyl)(dibutylphenylindolocarbazolyl)triazine; (phenyl)(terphenylyl)[di(tert-butyl)phenylindolocarbazolyl]triazine; (phenyl)(biphenylyl)(dibutylphenylindolocarbazolyl)triazine; (phenyl)(biphenylyl)[di(tert-butyl)phenylindolocarbazolyl]triazine; (phenyl)(terphenylyl)[di(tert-butyl)phenylindolocarbazolyl]triazine; (phenyl)(terphenylyl)(dibutylphenylindolocarbazolyl)triazine; (biphenylyl)(terphenylyl)(dibutylphenylindolocarbazolyl)triazine; (phenyl)(biphenylyl)(phenylindolocarbazolyl)triazine; (phenyl)(biphenylyl)(phenylindolocarbazolyl)triazine; di(phenyl)(biphenylylindolocarbazolyl)triazine; di(phenyl)(biphenylylindolocarbazolyl)triazine; (phenyl)(terphenylyl)(phenylindolocarbazolyl)triazine; (phenyl)(terphenylyl)(phenylindolocarbazolyl)triazine; (phenyl)(terphenylyl)(phenylindolocarbazolyl)triazine; (phenyl)(terphenylyl)(phenylindolocarbazolyl)triazine; di(phenyl)(terphenylylindolocarbazolyl)triazine; di(phenyl)(terphenylylindolocarbazolyl)triazine; di(phenyl)(terphenylylindolocarbazolyl)triazine; di(phenyl)(terphenylylindolocarbazolyl)triazine; di(biphenylyl)(phenylindolocarbazolyl)triazine; di(biphenylyl)(phenylindolocarbazolyl)triazine; di(biphenyly;)(phenylindolocarbazolyl)triazine; (phenyl)(biphenylyl)(dibutylphenylindolocarbazolyl)triazine; (phenyl)(biphenylyl)[di(tert-butyl)phenylindolocarbazolyl]triazine; (phenyl)(terphenylyl)(dibutylphenylindolocarbazolyl)triazine; (phenyl)(terphenylyl)[di(tert-butyl)phenylindolocarbazolyl]triazine; (phenyl)(biphenylyl)(dibutylphenylindolocarbazolyl)triazine; (phenyl)(biphenylyl)[di(tert-butyl)phenylindolocarbazolyl]triazine; (phenyl)(terphenylyl)(dibutylphenylindolocarbazolyl)triazine; (phenyl)(terphenylyl)[di(tert-butyl)phenylindolocarbazolyl]triazine; (biphenylyl)(terphenylyl)[di(tert-butyl)phenylindolocarbazolyl]triazine; (phenyl)(biphenylyl)(phenylindolocarbazolyl)triazine; (phenyl)(biphenylyl)(phenylindolocarbazolyl)triazine; di(phenyl)(biphenylylindolocarbazolyl)triazine; di(phenyl)(biphenylylindolocarbazolyl)triazine; (phenyl)(terphenylyl)(phenylindolocarbazolyl)triazine; (phenyl)(terphenylyl)(phenylindolocarbazolyl)triazine; (phenyl)(terphenylyl)(phenylindolocarbazolyl)triazine; (phenyl)(terphenylyl)(phenylindolocarbazolyl)triazine; di(biphenylyl)(phenylindolocarbazolyl)triazine; di(biphenylyl)(phenylindolocarbazolyl)triazine; (phenyl)(biphenylyl)(phenylindolocarbazolyl)triazine; (phenyl)(biphenylyl)(phenylindolocarbazolyl)triazine; (phenyl)(terphenylyl)(phenylindolocarbazolyl)triazine; (phenyl)(terphenylyl)(phenylindolocarbazolyl)triazine; (phenyl)(terphenylyl)(phenylindolocarbazolyl)triazine; (phenyl)(terphenylyl)(phenylindolocarbazolyl)triazine; di(biphenylyl)(phenylindolocarbazolyl)triazine; di(biphenylyl)(phenylindolocarbazolyl)triazine; (phenyl)(biphenylyl)(phenylindolocarbazolyl)triazine; (phenyl)(biphenylyl)(phenylindolocarbazolyl)triazine; di(phenyl)(biphenylylindolocarbazolyl)triazine; di(phenyl)(biphenylylindolocarbazolyl)triazine; (phenyl)(terphenylyl)(phenylindolocarbazolyl)triazine; (phenyl)(terphenylyl)(phenylindolocarbazolyl)triazine; (phenyl)(terphenylyl)(phenylindolocarbazolyl)triazine; (phenyl)(terphenylyl)(phenylindolocarbazolyl)triazine; di(biphenylyl)(phenylindolocarbazolyl)triazine; di(biphenylyl)(phenylindolocarbazolyl)triazine; di(terphenylyl)(phenylindolocarbazolyl)triazine; di(terphenylyl)(phenylindolocarbazolyl)triazine; di(terphenylyl)(phenylindolocarbazolyl)triazine; di(terphenylyl)(phenylindolocarbazolyl)triazine; (phenyl)(biphenylyl)[phenyl(dibenzofuranyl)indolocarbazolyl]triazine; (phenyl)(biphenylyl)[phenyl(dibenzothiophenyl)indolocarbazolyl]

triazine; (phenyl)(terphenylyl)[phenyl(dibenzofuranyl)indolocarbazolyl]triazine; (phenyl)(terphenylyl)[phenyl (dibenzothiophenyl)indolocarbazolyl]triazine; (phenyl) (biphenylyl)(biphenylylindolocarbazolyl)triazine; (phenyl) (biphenylyl)(biphenylylindolocarbazolyl)triazine; (phenyl) (biphenylyl)(biphenylylindolocarbazolyl)triazine; (phenyl) (biphenylyl)(biphenylylindolocarbazolyl)triazine; (phenyl) (biphenylyl)(biphenylylindolocarbazolyl)triazine; (phenyl) (biphenylyl)(biphenylylindolocarbazolyl)triazine; (phenyl) (biphenylyl)(biphenylylindolocarbazolyl)triazine; (phenyl) (biphenylyl)(biphenylylindolocarbazolyl)triazine; (phenyl) (terphenylyl)(biphenylylindolocarbazolyl)triazine; (phenyl) (biphenylyl)bicarbazole; (phenyl)(biphenylyl)bicarbazole; di(biphenylyl)bicarbazole; (phenyl)(biphenylyl)bicarbazole; (phenyl)(biphenylyl)bicarbazole; di(biphenylyl)bicarbazole; (phenyl)(biphenylyl)bicarbazole; (phenyl)(biphenylyl)bicarbazole; (phenyl)(biphenylyl)bicarbazole; (phenyl) (biphenylyl)bicarbazole; di(biphenylyl)bicarbazole; (phenyl)(biphenylyl)bicarbazole; (phenyl)(biphenylyl)bicarbazole; (phenyl)(biphenylyl)bicarbazole; di(biphenylyl) bicarbazole; (phenyl)(biphenylyl)bicarbazole; (phenyl)(biphenylyl)bicarbazole; di(biphenylyl)bicarbazole; (phenyl) (biphenylyl)bicarbazole; (phenyl)(biphenylyl)bicarbazole; (phenyl)(biphenylyl)bicarbazole; (phenyl)(biphenylyl)bicarbazole; di(biphenylyl)bicarbazole; (phenyl)(biphenylyl) bicarbazole; (phenyl)(biphenylyl)bicarbazole; (phenyl)(biphenylyl)bicarbazole; di(biphenylyl)bicarbazole; (phenyl) (biphenylyl)bicarbazole; (phenyl)(biphenylyl)bicarbazole; di(biphenylyl)bicarbazole; (phenyl)(biphenylyl)bicarbazole; (phenyl)(biphenylyl)bicarbazole; (phenyl)(biphenylyl) bicarbazole; (phenyl)(biphenylyl)bicarbazole; (phenyl)(biphenylyl)bicarbazole; di(biphenylyl)bicarbazole; (phenyl) (terphenylyl)bicarbazole; (phenyl)(terphenylyl)bicarbazole; (biphenyl)(terphenylyl)bicarbazole; (phenyl)(terphenylyl) bicarbazole; (phenyl)(terphenylyl)bicarbazole; (biphenylyl) (terphenylyl)bicarbazole; di(biphenylyl)bicarbazole; di(biphenylyl)bicarbazole (Group 32A)

(phenyl)(carbazolylphenyl)(dibenzofuranyl)triazine; (biphenylyl)(carbazolylphenyl)(dibenzofuranyl)triazine; (terphenylyl)(carbazolylphenyl)(dibenzofuranyl)triazine; (biphenylyl)(carbazolylphenyl)(dibenzofuranyl)triazine; (terphenylyl)(carbazolylphenyl)(dibenzofuranyl)triazine; (phenyl)(phenylcarbazolylphenyl)(dibenzofuranyl)triazine; (terphenylyl)(carbazolylphenyl)(dibenzofuranyl)triazine; (terphenylyl)(carbazolylphenyl)(dibenzofuranyl)triazine; (phenyl)(phenylcarbazolylphenyl)(dibenzofuranyl)triazine; (phenyl)(phenylcarbazolylphenyl)(dibenzofuranyl)triazine; (phenyl)(diphenylcarbazolylphenyl)(dibenzofuranyl)triazine; (phenyl)(biphenylylcarbazolylphenyl)(dibenzofuranyl) triazine; (phenyl)(biphenylylcarbazolylphenyl)(dibenzofuranyl)triazine; (phenyl)(biphenylylcarbazolylphenyl) (dibenzofuranyl)triazine; (biphenylyl) (phenylcarbazolylphenyl)(dibenzofuranyl)triazine; (phenyl) (carbazolylbiphenylyl)(dibenzofuranyl)triazine; (phenyl) (phenylcarbazolylbiphenylyl)(dibenzofuranyl)triazine; (phenyl)(carbazolylterphenylyl)(dibenzofuranyl)triazine; (biphenylyl)(carbazolylbiphenylyl)(dibenzofuranyl)triazine; (phenyl)(phenylcarbazolylbiphenylyl)(dibenzofuranyl) triazine; (phenyl)(carbazolylbiphenylyl)(dibenzofuranyl)triazine; (biphenylyl)(carbazolylbiphenylyl)(dibenzofuranyl) triazine; (biphenylyl)(carbazolylbiphenylyl) (dibenzofuranyl)triazine; (terphenylyl) (carbazolylbiphenylyl)(dibenzofuranyl)triazine; (phenyl) (carbazolylterphenylyl)(dibenzofuranyl)triazine; (phenyl) (phenylcarbazolylbiphenylyl)(dibenzofuranyl)triazine; (phenyl)(phenylcarbazolylbiphenylyl)(dibenzofuranyl)triazine; (phenyl)(phenylcarbazolylbiphenylyl)(dibenzofuranyl)triazine; (biphenylyl)(carbazolylbiphenylyl)(dibenzofuranyl)triazine; (terphenylyl)(carbazolylbiphenylyl) (dibenzofuranyl)triazine; (phenyl) (diphenylcarbazolylbiphenylyl)(dibenzofuranyl)triazine; (phenyl)(carbazolylbiphenylyl)(dibenzofuranyl)triazine; (biphenylyl)(carbazolylbiphenylyl)(dibenzofuranyl)triazine; (phenyl)(phenylcarbazolylbiphenylyl)(dibenzofuranyl) triazine; (phenyl)(phenylcarbazolylbiphenylyl)(dibenzofuranyl)triazine; (biphenylyl)(phenylcarbazolylbiphenylyl) (dibenzofuranyl)triazine; (phenyl)(carbazolylterphenylyl) (dibenzofuranyl)triazine; (phenyl)(carbazotylterphenylyl) (dibenzofuranyl)triazine; (carbazolylphenyl)bis (dibenzofuranyl)triazine; (carbazolylbiphenylyl)bis (dibenzofuranyl)lriazine; (phenyl)(carbazolylphenyl) (dibenzothiophenyl)triazine; (biphenylyl) (carbazolylphenyl)(dibenzothiophenyl)triazine; (terphenylyl)(carbazolylphenyl)(dibenzothiophenyl)triazine; (biphenylyl)(carbazolylphenyl)(dibenzothiophenyl)triazine; (terphenylyl)(carbazolylphenyl)(dibenzothiophenyl) triazine; (terphenylyl)(carbazolylphenyl) (dibenzothiophenyl)triazine; (tetphenylyl) (carbazolylphenyl)(dibenzothiophenyl)triazine; (phenyl) (phenylcarbazolylphenyl)(dibenzothiophenyl)triazine; (phenyl)(phenylcarbazolylphenyl)(dibenzothiophenyl)triazine; (biphenylyl)(phenylcarbazolylphenyl)(dibenzothiophenyl)triazine; (phenyl)(diphenylcarbazolylphenyl)(dibenzothiophenyl)triazine; (phenyl)(biphenylylcarbazolylphenyl) (dibenzothiophenyl)triazine; (phenyl) (biphenylylcarbazolylphenyl)(dibenzothiophenyl)triazine; (phenyl)(biphenylylcarbazolylphenyl)(dibenzothiophenyl) triazine; (biphenylyl)(biphenylylcarbazolylphenyl)(dibenzothiophenyl)triazine; (phenyl)(carbazolylbiphenylyl) (dibenzothiophenyl)triazine; (biphenylyl) (carbazolylbiphenylyl)(dibenzothiophenyl)triazine; (phenyl)(carbazolylbiphenylyl)(dibenzothiophenyl)triazine; (phenyl)(carbazolylbiphenylyl)(dibenzothiophenyl)triazine; (phenyl)(carbazolylterphenylyl)(dibenzothiophenyl)triazine; (phenyl)(carbazotylbiphenylyl)(dibenzothiophenyi)triazine; (biphenylyl)(carbazolylbiphenylyl)(dibenzothiophenyl)triazine; (biphenylyl)(carbazolylbiphenylyl) (dibenzothiophenyl)triazine; (terphenylyl) (carbazolylbiphenylyl)(dibenzothiophenyl)triazine; (phenyl)(carbazolylterphenylyl)(dibenzothiophenyl)lriazine; (phenyl)(phenylcarbazolylbiphenylyl)(dibenzothiophenyl)triazine; (phenyl)(carbazolylbiphenylyl)(dibenzothiophenyl)triazine; (biphenylyl)(carbazolylbiphenylyl) (dibenzothiophenyl)triazine; (terphenylyl) (carbazolylbiphenylyl)(dibenzothiophenyl)triazine; (phenyl)(carbazolylterphenylyl)(dibenzothiophenyl)triazine; (phenyl)(phenylcarbazolylbiphenylyl)(dibenzothiophenyl)triazine; (phenyl)(phenylcarbazolylbiphenylyl)(dibenzothiophenyl)triazine; (phenyl) (phenylcarbazolylbiphenylyl)(dibenzothiophenyl)triazine; (phenyl)(diphenylcarbazolylbiphenylyl)(dibenzothiophenyl)triazine; (phenyl)(carbazolylbiphenylyl)(dibenzothiophenyl)triazine; (biphenylyl)(carbazolylbiphenylyl)(dibenzothiophenyl)triazine; (terphenylyl)(carbazolylbiphenylyl) (dibenzothiophenyl)triazine; (biphenylyl) (carbazolylbiphenylyl)(dibenzothiophenyl)triazine; (phenyl)(phenylcarbazolylbiphenylyl)(dibenzothiophenyl) triazine; (phenyl)(phenylcarbazolylbiphenylyl)(dibenzothiophenyl)triazine; (biphenylyl)(phenylcarbazolylbiphenylyl) (dibenzothiophenyl)triazine; (phenyl) (carbazolylterphenylyl)(dibenzothiophenyl)triazine; (phenyl)(carbazolylterphenylyl)(dibenzothiophenyl)triazine; (carbazolylphenyl)bis(dibenzothiophenyl)triazine; (carbazolylbiphenylyl)bis(dibenzothiophenyl)triazine; (diphenylpyridyl)(phenyl)bicarbazole; (diphenylpyridyl)(phenyl) bicarbazole; (diphenylpyridyl)(biphenylyl)bicarbazole; (diphenylpyridyl)(terphenylyl)bicarbazole; (terphenylyl) (phenyl)bicarbazole; (diphenylpyridyl)(naphthyl)bicarbazole; (diphenylpyridyl)(naphthyl)bicarbazole; (diphenylpyridyl)(triphenylenyl)bicarbazole; (diphenylpyridyl) (triphenylenyl)bicarbazole; bis(diphenylpyridyl) bicarbazole; bis(diphenylpyridyl)bicarbazole; bis (diphenylpyridyl)bicarbazole; (dimethylfluorenyl)(phenyl) bicarbazole; (dimethylfluorenyl)(biphenylyl)bicarbazole; (dimethylfluorenyl)(terphenylyl)bicarbazole; (dibenzofuranyl)(phenyl)bicarbazole; (dibenzofuranyl)(biphenylyl)bicarbazole; (dibenzofuranyl)(terphenylyl)bicarbazole; (dibenzothiophenyl)(phenyl)bicarbazole; (dibenzothiophenyl)(biphenylyl)bicarbazole; (dibenzothiophenyl)(terphenyl)bicarbazole; diphenylbicarbazole; dipyridylbicarbazole; dipyrimidylbicarbazole; (triphenylenyl)(phenyl)bicarbazole; (pyridyl)(triphenylenyl)bicarbazole; (phenyl)(triphenylenyl)bicarbazole; (pyridyl)(triphenylenyl)bicarbazole; (phenyl)(triphenylenyl)bicarbazole; (pyridyl)(triphenylenyl)bicarbazole; di(biphenylyl)bicarbazole; (biphenylyl) (terphenylyl)bicarbazole; (biphenylyl)(terphenylyl)bicarbazole; (dimethylfluorenyl)(phenyl)bicarbazole; (dimethylfluorenyl)(biphenylyl)bicarbazole; (dimethylfluorenyl)(biphenylyl)bicarbazole; (dimethylfluorenyl)(terphenylyl)bicarbazole; (dibenzofuranyl)(biphenylyl)bicarbazole; (dibenzothiophenyl)(biphenylyl)bicarbazole; diphenyltercarbazole; (dibenzofuranyl)(phenyl)bicarbazole; (dibenzofuranyl)(biphenylyl)bicarbazole; (dibenzofuranyl) (terphenylyl)bicarbazole; (dibenzofuranyl)(biphenylyl)bicarbazole; (dibenzothiophenyl)(phenyl)bicarbazole; (dibenzothiophenyl)(biphenylyl)bicarbazole; (dibenzothiophenyl) (terphenylyl)bicarbazole; (dibenzothiophenyl)(biphenylyl) bicarbazole; (dimethylfluorenyl)(diphenylpyridyl) bicarbazole; (dimethylfluorenyl)(diphenylpyridyl) bicarbazole; (dimethylfluorenyl)(pyridylbiphenylyl) bicarbazole; (dimethylfluorenyl)(pyridylbiphenylyl) bicarbazole; (dimethylfluorenyl)(pyridylbiphenylyl) bicarbazole; (dibenzofuranyl)(diphenylpyridyl)bicarbazole; (dibenzofuranyl)(pyridylbiphenylyl)bicarbazole; (dibenzofuranyl)(pyridylbiphenylyl)bicarbazole; (dibenzofuranyl) (pyridylbiphenylyl)bicarbazole; (dibenzothiophenyl)(diphenylpyridyl)bicarbazole; (dibenzothiophenyl) (pyridylbiphenylyl)bicarbazole; (dibenzothiophenyl) (pyridylbiphenylyl)bicarbazole; (dibenzothiophenyl) (pyridylbiphenylyl)bicarbazole; (diphenylpyridyl)(phenyl) bicarbazole; (pyridylbiphenylyl)(phenyl)bicarbazole; (diphenylpyridyl)(phenyl)bicarbazole; (diphenylpyridyl) (biphenylyl)bicarbazole; (pyridylbiphenylyl)(biphenylyl)bicarbazole; (diphenylpyridyl)(biphenylyl)bicarbazole; (diphenylpyridyl)(biphenylyl)bicarbazole; (diphenylpyridyl) (biphenylyl)bicarbazole; (pyridylbiphenylyl)(biphenylyl) bicarbazole; (diphenylpyridyl)(phenyl)bicarbazole; (diphenylpyridyl)(phenyl)bicarbazole; (pyridylbiphenylyl) (phenyl)bicarbazole; (diphenylpyridyl)(biphenylyl)bicarbazole; (diphenylpyridyl)(biphenylyl)bicarbazole; (pyridylbiphenylyl)(biphenylyl)bicarbazole; (diphenylpyridyl) (biphenylyl)bicarbazole; (diphenylpyridyl)(biphenylyl) bicarbazole; (pyridylbiphenylyl)(biphenylyl)bicarbazole; (dibenzofuranyl)(terphenylyl)bicarbazole; (dibenzofuranyl) (biphenylyl)bicarbazole; (dibenzofuranyl)(phenyl)bicarbazole; (dibenzofuranyl)(biphenylyl)bicarbazole; (dibenzothiophenyl)(terphenylyl)bicarbazole; (dibenzothiophenyl) (biphenylyl)bicarbazole; (dibenzothiophenyl)(phenyl) bicarbazole; (dibenzothiophenyl)(biphenylyl)bicarbazole; (diphenylpyridyl)(biphenylyl)bicarbazole; (diphenylpyridyl)(biphenylyl)bicarbazole; (diphenylpyridyl)(phenyl)bicarbazole; (diphenylpyridyl)(phenyl)bicarbazole; (diphenylpyridyl)(phenyl)bicarbazole; (diphenylpyridyl) (biphenylyl)bicarbazole; (diphenylpyridyl)(phenyl) bicarbazole; (diphenylpyridyl)(phenyl)bicarbazole; (diphenylpyridyl)(phenyl)bicarbazole; (diphenylpyridyl) (phenyl)bicarbazole; (diphenylpyridyl)(phenyl)bicarbazole; (diphenylpyridyl)(phenyl)bicarbazole; (diphenylpyridyl) (phenyl)bicarbazole; (diphenylpyridyl)(phenyl)bicarbazole; (diphenylpyridyl)(biphenylyl)bicarbazole; (diphenylpyridyl)(phenyl)bicarbazole; di(biphenylyl)bicarbazole; di(biphenylyl)bicarbazole; (biphenylyl)(phenyl)bicarbazole; bis(phenylcarbazolyl)benzene; (phenylcarbazolyl)(biphenylylcarbazolyl)benzene; bis(biphenylylcarbazolyl)benzene; bis(phenylcarbazolyl)benzene; (phenylcarbazolyl) (terphenylylcarbazolyl)benzene; bis(biphenylylcarbazolyl) benzene; (phenylcarbazolyl)(dimethylfluorenylcarbazolyl) benzene; (dibenzofuranyl)(phenylcarbazolyl)benzene; (dibenzothiophenyl)(phenylcarbazolyl)benzene; bis(phenylcarbazolyl)biphenyl; (phenylcarbazolyl)(biphenylylcarbazolyl)benzene; (biphenylylcarbazolyl)(terphenylylcarbazolyl)benzene; bis(phenylcarbazolyl)benzene; (phenylcarbazolyl)(terphenylylcarbazolyl)benzene; bis(biphenylylcarbazolyl)benzene; (phenylcarbazolyl)(dimethylfluorenylcarbazolyl)benzene; (phenylcarbazolyl)(terphenylylcarbazolyl)benzene; (dibenzothiophenyl) (phenylcarbazolyl)benzene; (biphenylyl)(terphenylyl) bicarbazole; (biphenylyl)(quarterphenylyl)bicarbazole; (terphenylyl)(quarterphenylyl)bicarbazole; (biphenylyl)(terphenylyl)bicarbazole; (terphenylyl)(quarterphenylyl)bicarbazole; di(quarterphenylyl)bicarbazole; (biphenylyl)(quarterphenylyl)bicarbazole; (phenyl)(quarterphenylyl) bicarbazole; (phenyl)(terphenylyl)bicarbazole; di(phenyl) (biphenylyl)bicarbazole; di(phenyl)(biphenylyl) bicarbazole; tri(phenyl)bicarbazole; tri(phenyl)bicarbazole; di(phenyl)(biphenylyl)bicarbazole; di(phenyl)(biphenylyl) bicarbazole; di(phenyl)(biphenylyl)bicarbazole; (phenyl) (biphenylyl)bicarbazole; (dibenzofuranylphenyl)(phenyl)bicarbazole; (dibenzothiophenylphenyl)(phenyl)bicarbazole; diphenylindolocarbazole; (biphenylyl)(phenyl)indolocarbazole; (biphenylyl)(phenyl)indolocarbazole; di(biphenylyl) indolocarbazole; di(biphenylyl)indolocarbazole; (biphenylyl)(terphenylyl)indolocarbazole; (biphenylyl)(terphenylyl) indolocarbazole; di(terphenylyl)indolocarbazole; (terphenylyl)(phenyl)indolocarbazole; (biphenylyl)(terphenylyl)indolocarbazole; (biphenylyl)(terphenylyl)indolocarbazole; di(terphenylyl)indolocarbazole; di(biphenylyl)(phenyl)indolocarbazole; di(phenyl)(biphenylyl) indolocarbazole; di(biphenylyl)(phenyl)indolocarbazole; di(biphenylyl)(phenyl)indolocarbazole; di(biphenylyl)(phenyl)indolocarbazole; di(phenyl)(biphenylyl)indolocarbazole; di(biphenylyl)(phenyl)indolocarbazole; di(biphenylyl) (phenyl)indolocarbazole; di(naphthyl)indolocarbazole; di(naphthyl)indolocarbazole; (naphthyl)(biphenylyl)indolocarbazole; (naphthyl)(biphenylyl)indolocarbazole; (naphthyl)(terphenylyl)indolocarbazole; (naphthyl)(terphenylyl)indolocarbazole; (naphthyl)(terphenylyl)indolocarbazole; (naphthyl)(terphenylyl)indolocarbazole; (naphthylphenyl) (phenyl)indolocarbazole; (naphthylphenyl)(phenyl)indolocarbazole; (naphthylphenyl)(phenyl)indolocarbazole; (naphthylphenyl)(phenyl)indolocarbazole; (naphthylphenyl)(biphenylyl)indolocarbazole; (naphthylphenyl)(biphenylyl)indolocarbazole; (naphthylphenyl)(biphenylyl)indolocarbazole; (naphthylphenyl)(biphenylyl)indolocarbazole; (phenylnaphthyl)(biphenylyl)indolocarbazole; (phenylnaphthyl)(biphenylyl)indolocarbazole; (phenylnaphthyl) (biphenylyl)indolocarbazole; (phenylnaphthyl)(biphenylyl)

indolocarbazole; di(phenyl)(phenylnaphthyl) indolocarbazole; di(phenyl)(phenylnaphthyl) indolocarbazole; di(phenyl)(phenylnaphthyl) indolocarbazole; di(phenyl)(phenylnaphthyl) indolocarbazole; di(phenyl)(naphthylphenyl) indolocarbazole; di(phenyl)(naphthylphenyl) indolocarbazole; di(phenyl)(naphthylphenyl) indolocarbazole; di(phenyl)(naphthylphenyl) indolocarbazole; (phenyl)(naphthyl)(naphthylphenyl) indolocarbazole; (phenyl)(biphenylyl)(naphthylphenyl) indolocarbazole; (phenyl)(naphthyl)(naphthylphenyl) indolocarbazole; (phenyl)(biphenylyl)(naphthylphenyl) indolocarbazole (Group 33A)

[bis(ditrifluoromethylphenyl)indenofluorenediylidene]bis(malononitrile); (diindenothiophenediylidene)bis(malononitrile); [bis(trifluoromethoxyphenyl)indenofluorenediylidene]bis(malononitrile); [bis(trifluoromethoxyphenyl) indenofluorenediylidene]bis(malononitrile); [bis[fluoro (trifluoromethyl)phenyl]diazaindenofluorenediylidene]bis (malononitrile); [bis(trifluoromethylphenyl) diazaindenofluorenediylidene]bis(malononitrile); [bis (trifluoromethylphenyl)diazaindenofluorenediylidene]bis (aminonitrile); [bis[fluoro(trifluoromethyl)phenyl] diazaindenofluorenediylidene]bis(malononitrile); [bis [fluoro(trifluoromethyl)phenyl] diazaindenofluorenediylidene]bis(aminonitrile); [bis (pentafluorophenyl)diazaindenofluorenediylidene]bis (malononitrile); [bis(pentafluorophenyl) diazaindenofluorenediylidene]bis(aminonitrile); [bis[fluoro (trifluoromethyl)phenyl]diazaindenofluorenediylidene]bis (malononitrile); [bis[fluoro(trifluoromethyl)phenyl] diazaindenofluorenediylidene]bis(aminonitrile); [bis[bis (trifluoromethyl)phenyl]diazaindenofluorenediylidene]bis (malononitrile); [bis[bis(trifluoromethyl)phenyl] diazaindenofluorenediylidene]bis(aminonitrile); [bis (trifluorophenyl)diazaindenofluorenediylidene]bis (malononitrile); [bis(trifluorophenyl) diazaindenofluorenediylidene]bis(aminonitrile); [bis [(trifluoromethoxy)phenyl]diazaindenofluorenediylidene] bis(malononitrile); [bis[(trifluoromethoxy)phenyl] diazaindenofluorenediylidene]bis(aminonitrile); [bis [(trifluoroacetyl)phenyl]diazaindenofluorenediylidene]bis (malononitrile); [bis[(trifluoroacetyl)phenyl] diazaindenofluorenediylidene]bis(aminonitrile); [bis[cyano (trifluoromethyl)phenyl]diazaindenofluorenediylidene]bis (malononitrile); [bis[cyano(trifluoromethyl)phenyl] diazaindenofluorenediylidene]bis(aminonitrile); [bis (trifluoromethyl)diazaindenofluorenediylidene]bis (malononitrile); [bis(trifluoromethyl) diazaindenofluorenediylidene]bis(aminonitrile); (difluorodiazaindenofluorenediylidene)bis(malononitrile); (difluorodiazaindenofluorenediylidene)bis(aminonitrile); (hexafluorodiazaindenofluorenediylidene)bis(malononitrile); (hexafluorodiazaindenofluorenediylidene)bis(aminonitrile); (tetrafluorodiazaindenofluorenediylidene)bis(malononitrile); (tetrafluorodiazaindenofluorenediylidene)bis (aminonitrile); [bis(trifluoromethyl) azaindenofluorenediylidene]bis(malononitrile); (diphenyldiazaindenofluorenediylidene)bis(malononitrile); (difluorodiazaindenofluorenediylidene)bis[(trifluoromethyl)ethyl acrylate]; (difluorodiazaindenofluorenediylidene)bis(methyleneindanedione); [bis[fluoro(trifluoromethyl) phenyl]diazaindenofluorenediylidene]bis(malononitrile); [bis[fluoro(trifluoromethyl)phenyl]diazaindenofluorenediylidene]bis(aminonitrile); [bis[bis(trifluoromethyl) phenyl]diazaindenofluorenediylidene]bis(malononitrile); [bis[bis(trifluoromethyl)phenyl]diazaindenofluorenediylidene]bis(aminonitrile); [bis[fluoro(trifluoromethyl)phenyl]diazaindenofluorenediylidene]bis(malononitrile); [bis[fluoro(trifluoromethyl)phenyl] diazaindenofluorenediylidene]bis(aminonitrile); [bis [(trifluoromethyl)phenyl]diazaindenofluorenediylidene]bis (malononitrile); [bis[(trifluoromethyl)phenyl] diazaindenofluorenediylidene]bis(aminonitrile); [bis [(trifluoromethoxy)phenyl]diazaindenofluorenediylidene] bis(malononitrile); [bis[(trifluoromethoxy)phenyl] diazaindenofluorenediylidene]bis(aminonitrile); [bis[cyano (fluoro)phenyl]diazaindenofluorenediylidene]bis (malononitrile); [bis[cyano(fluoro)phenyl] diazaindenofluorenediylidene]bis(aminonitrile); [bis (fluoropyridyl)diazaindenofluorenediylidene]bis (malononitrile); [bis(fluoropyridyl) diazaindenofluorenediylidene]bis(aminonitrile); [bis (difluoropyridyl)diazaindenofluorenediylidene]bis (malononitrile); [bis(difluoropyridyl) diazaindenofluorenediylidene]bis(aminonitrile); [bis [(trifluoromethyl)thiophenyl]diazaindenofluorenediylidene] bis(malononitrile); [bis[(trifluoromethyl)thiophenyl] diazaindenofluorenediylidene]bis(aminonitrile); (dinaphthyldiazaindenofluorenediylidene)bis(malononitrile); (dinaphthyldiazaindenofluorenediylidene)bis(aminonitrile); [bis(heptafluoronaphthyl)diazaindenofluorenediylidene]bis(malononitrile); [bis(heptafluoronaphthyl) diazaindenofluorenediylidene]bis(aminonitrile); [bis [(trifluoromethyl](phenyl]diazaindenofluorenediylidene]bis (malononitrile); [bis[(trifluoromethyl](phenyl] diazaindenofluorenediylidene]bis(aminonitrile); [tetrakis [(trifluoromethyl)phenyl]diazaindenofluorenediylidene]bis (malononitrile); [tetrakis[(trifluoromethyl)phenyl] diazaindenofluorenediylidene]bis(aminonitrile); [bis [(trifluoromethyl](phenyl]diazaindenofluorenediylidene]bis (malononitrile); [bis[(trifluoromethyl)phenyl] diazaindenofluorenediylidene]bis(aminonitrile); [bis [(trifluoromethyl](phenyl]diazaindenofluorenediylidene]bis (malononitrile); [bis[(trifluoromethyl](phenyl] diazaindenofluorenediylidene]bis(aminonitrile); [bis [(trifluoromethyl](phenyl]diazaindenofluorenediylidene]bis (malononitrile); [bis[(trifluoromethyl](phenyl] indenofluorenediylidene]bis(aminonitrile); [bis [(trifluoromethyl](phenyl]indenofluorenediylidene]bis (malononitrile); [bis[bis(trifluoromethyl)phenyl] indenofluorenediylidene]bis(aminonitrile); [bis[bis (trifluoromethyl)phenyl]indenofluorenediylidene]bis (malononitrile); [bis(trifluorophenyl) indenofluorenediylidene]bis(aminonitrile); [bis (trifluorophenyl)indenofluorenediylidene]bis (malononitrile); [bis(pentafluorophenyl) indenofluorenediylidene]bis(aminonitrile); [bis (pentafluorophenyl)indenofluorenediylidene]bis (malononitrile); [bis(cyanophenyl)indenofluorenediylidene] bis(aminonitrile); [bis(cyanophenyl) indenofluorenediylidene]bis(malononitrile); (diphenylindenofluorenediylidene)bis(aminonitrile); (diphenylindenofluorenediylidene]bis(malononitrile); (dinaphthylindenofluorenediylidene)bis(aminonitrile); (dinaphthylindenofluorenediylidene]bis(malononitrile); (difluoroindenofluorenediylidene)bis(aminonitrile); (difluoroindenofluorenediylidene]bis(malononitrile); (hexafluoroindenofluorenediylidene)bis(aminonitrile); (hexafluoroindenofluorenediylidene]bis(malononitrile); (tetrafluoroindenofluorenediylidene)bis(aminonitrile); (tetrafluoroindenofluorenediylidene]bis(malononitrile); [tetrakis(trifluoromethyhindenofluorenediylidene]bis(aminonitrile); [tetrakis(trifluoromethyl)indenofluorenediylidene]bis (malononitrile); (phenylindenofluorenediylidene)bis (aminonitrile); [phenyl(trifluoromethyl) indenofluorenediylidene]bis(aminonitrile); (diphenylindenofluorenediylidene)bis(aminonitrile); [diphenylbis(trifluoromethyl)indenofluorenediylidene]bis(aminonitrile); [diphenyl(difluoro)indenofluorenediylidene]bis (aminonitrile); [bis(trifluoromethylphenyl) indenofluorenediylidene]bis(aminonitrile); [dimethylbis (trifluoromethyl)indenofluorenediylidene]bis (malononitrfle); [bis[(trifluoromethyl](phenyl] indenofluorenediylidene]bis(malononitrile); [bis [(trifluoromethyl](phenyl]indenofluorenediylidene]bis (aminonitrile); [bis(fluoropyridyl)indenofluorenediylidene] bis(malononitrile); [bis(fluoropyridyl) indenofluorenediylidene]bis(aminonitrile); [bis (difluoropyridyl)indenofluorenediylidene]bis (malononitrile); [bis(difluoropyridyl) indenofluorenediylidene]bis(aminonitrile); [bis (cyanofluorophenyl)indenofluorenediylidene]bis (malononitrile); [bis(cyanofluorophenyl) indenofluorenediylidene]bis(aminonitrile); [bis (cyanophenyl)indenofluorenediylidene]bis(malononitrile); [bis(cyanophenyl)indenofluorenediylidene]bis(aminonitrile); [[(trifluoromethyl)phenyl]indenofluorenediylidene] bis(malononitrile); [[(trifluoromethyl)phenyl]indenofluorenediylidene]bis(aminonitrile); [fluoro[(trifluoromethyl] (phenyl]indenofluorenediylidene]bis(malononitrile); [fluoro [(trifluoromethyl](phenyl]indenofluorenediylidene]bis (aminonitrile); [(cyanophenyl)indenofluorenediylidene]bis (malononitrile); [(cyanophenyl)indenofluorenediylidene]bis (aminonitrile); [fluoro(cyanophenyl) indenofluorenediylidene]bis(malononitrile); [fluoro (cyanophenyl)indenofluorenediylidene]bis(aminonitrile); [tetrafluoro[(trifluoromethyl)phenyl]indenofluorenediylidene]bis(malononitrile); [tetrafluoro[(trifluoromethyl)phenyl]indenofluorenediylidene]bis(aminonitrile); [[fluoro(trifluoromethyl](phenyl]indenofluorenediylidene] bis(malononitrile); [[fluoro(trifluoromethyl)phenyl]indenofluorenediylidene]bis(aminonitrile); [[bis(trifluoromethyl) phenyl]indenofluorenediylidene]bis(malononitrile); [[bis (trifluoromethyl)phenyl]indenofluorenediylidene]bis (aminonitrile); [biphenylyl(trifluoromethyl) indenofluorenediylidene]bis(malononitrile); [biphenylyl (trifluoromethyl)indenofluorenediylidene]bis(aminonitrile); [naphthyl(trifluoromethyl)indenofluorenediylidene]bis(malononitrile); [naphthyl(trifluoromethyl)indenofluorenediylidene]bis(aminonitrile); [bis(fluorophenyl)indenofluorenediylidene]bis(malononitrile); [bis(fluorophenyl) indenofluorenediylidene]bis(aminonitrile); [bis (fluorophenyl)indenofluorenediylidene]bis(malononitrile); [bis(fluorophenyl)indenofluorenediylidene]bis(aminonitrile); [bis(difluorophenyl)indenofluorenediylidene]bis(malononitrile); [bis(difluorophenyl)indenofluorenediylidene] bis(aminonitrile); [bis(difluorophenyl) indenofluorenediylidene]bis(malononitrile); [bis (difluorophenyl)indenofluorenediylidene]bis(aminonitrile); [bis[fluoro(trifluoromethyl](phenyl]indenofluorenediylidene]bis(malononitrile); [bis[fluoro(trifluoromethyl](phenyl]indenofluorenediylidene]bis(aminonitrile); [bis [fluoro(trifluoromethyl](phenyl]indenofluorenediylidene] bis(malononitrile); [bis[fluoro(trifluoromethyl](phenyl] indenofluorenediylidene]bis(aminonitrile); [bis [(trifluoromethyl](phenyl]indenofluorenediylidene]bis (malononitrile); [bis[(trifluoromethyl](phenyl] indenofluorenediylidene]bis(aminonitrile); [bis[fluoro (trifluoromethyl](phenyl]indenofluorenediylidene]bis (malononitrile); [bis[fluoro(trifluoromethyl](phenyl]indenofluorenediylidene]bis(aminonitrile); [bis[bis (trifluoromethyl)phenyl]indenofluorenediylidene]bis (malononitrile); [bis[bis(trifluoromethyl)phenyl] indenofluorenediylidene]bis(aminonitrile); [bis[fluoro (trifluoromethyl](phenyl]indenofluorenediylidene]bis (malononitrile); [bis[fluoro(trifluoromethyl)phenyl] indenofluorenediylidene]bis(aminonitrile); [bis (trifluorophenyl)indenofluorenediylidene]bis (malononitrile); [bis(trifluorophenyl) indenofluorenediylidene]bis(aminonitrile); [bis (fluorophenyl)indenofluorenediylidene]bis(malononitrile); [bis(fluorophenyl)indenofluorenediylidene]bis(aminonitrile); [bis[(trifluoromethyl](phenyl]indenofluorenediylidene]bis(malononitrile); [bis[(trifluoromethyl] (phenyl]indenofluorenediylidene]bis(aminonitrile); [bis [fluoro(trifluoromethyl](phenyl]indenofluorenediylidene] bis(malononitrile); [bis[fluoro(trifluoromethyl](phenyl] indenofluorenediylidene]bis(aminonitrile); [bis[difluoro (trifluoromethyl](phenyl]indenofluorenediylidene]bis (malononitrile); [bis[difluoro(trifluoromethyl](phenyl] indenofluorenediylidene]bis(aminonitrile); [bis[difluoro (trifluoromethyl](phenyl]indenofluorenediylidene]bis (malononitrile); [bis[difluoro(trifluoromethyl](phenyl] indenofluorenediylidene]bis(aminonitrile); (dinaphthylindenofluorenediylidene)bis(malononitrile); (dinaphthylindenofluorenediylidene)bis(aminonitrile); (difluoroindenofluorenediylidene)bis(malononitrile); (difluoroindenofluorenediylidene)bis(aminonitrile); [bis (trifluoromethyl)indenofluorenediylidene]bis (malononitrile); [bis(trifluoromethyl) indenofluorenediylidene]bis(aminonitrile); (dicyanoindenofluorenediylidene)bis(malononitrile); (dicyanoindenofluorenediylidene)bis(aminonitrile); (hexafluoroindenofluorenediylidene)bis(malononitrile); (hexafluoroindenofluorenediylidene)bis(aminonitrile); [dicyanobis (trifluoromethyl)indenofluorenediylidene]bis (malononitrile); [dicyanobis(trifluoromethyl) indenofluorenediylidene]bis(aminonitrile); [tetrakis [(trifluoromethyl)phenyl]indenofluorenediylidene]bis (malononitrile); [tetrakis[(trifluoromethyl)phenyl] indenofluorenediylidene]bis(malononitrile); [tetrakis [(trifluoromethyl)phenyl]indenofluorenediylidene]bis (malononitrile); [bis[bis(trifluoromethyl](phenyl] azaindenofluorenediylidene]bis(malononitrile); [bis[bis (trifluoromethyl)phenyl]diazaindenofluorenediylidene]bis (malononitrile); [bis[fluoro(trifluoromethyl)phenyl] diazaindenofluorenediylidene]bis(malononitrile); [bis [fluoro(trifluoromethyl)phenyl] diazaindenofluorenediylidene]bis(malononitrile); [bis [(trifluoromethyl)phenyl]indenofluorenediylidene]bis (trifluoromethylacrylonitrile); [bis(trifluoromethoxy) indenofluorenediylidene]bis(malononitrile); [fluorobis (trifluoromethoxy)indenofluorenediylidene]bis (malononitrile); [bis[(trifluoromethoxy)phenyl] indenofluorenediylidene]bis(malononitrile); [bis[fluoro (trifluoromethoxy)phenyl]indenofluorenediylidene]bis (malononitrile); [(trifluoroethoxy)bis[(trifluoromethoxy) phenyl]indenofluorenediylidene]bis(malononitrile); [bis [(pentafluoroethoxy)phenyl]indenofluorenediylidene]bis (malononitrile); [bis[(pentafluoropropoxy)phenyl] indenofluorenediylidene]bis(malononitrile); [bis [(hexafluoroisopropoxy)phenyl]indenofluorenediylidene] bis(malononitrile); [(pentafluoropropoxy)bis (trifluoromethoxy)indenofluorenediylidene]bis (malononitrile); [(trifluoromethoxy)[fluoro(trifluoromethyl) phenyl]indenofluorenediylidene]bis(malononitrile);

[(trifluoromethoxy)[(trifluoromethoxy)phenyl]indenofluorenediylidene]bis(malononitrile); [fluoro[(trifluoromethoxy)phenyl]indenofluorenediylidene]bis(malononitrile); (dibenzoindenofluorenediylidene)bis(malononitrile); (azadibenzoindenofluorenediylidene)bis(malononitrile); (diazadibenzoindenofluorenediylidene)bis(malononitrile); [(trifluoromethoxy)benzoindenofluorenediylidene]bis(malononitrile); [[(trifluoromethoxy)phenyl]bis(trifluoromethoxy)indenofluorenediylidene]bis(malononitrile); [dithiophenylindenofluorenediylidene]bis(malononitrile); [bis(trifluoromethoxy)diazaindenofluorenediylidene]bis(malononitrile); [bis(trifluoromethoxy)hexaazaindenofluorenediylidene]bis(malononitrile); [tetrakis(trifluoromethoxy)indenofluorenediylidene]bis(malononitrile); [tetrakis(trifluoromethoxy)indenofluorenediylidene]bis(malononitrile); hexacyanohexaazatriphenylene; tris[cyano(cyanotetrafluorophenyl)methylene]cyclopropane; di(biphenylyl)(phenylspiroacridinefluorenyl)amine; (biphenylyl)(dimethylfluorenyl)(spiroindoloacridinefluorenyl)amine; (biphenylyl)(dibenzofuranyl)(phenylspiroacridinefluorenyl)amine; di(biphenylyl)(spirobenzoanthracenefluorenyl)amine; (biphenylyl)[(dibenzothiophenyl)phenyl](spirobenzoanthracenefluorenyl)amine; di(biphenylyl)(dibenzofuranyl)amine; (biphenylyl)(terphenylyl)(dibenzofuranyl)amine; (phenyl)(terphenylyl)(dibenzofuranyl)amine; (biphenylyl)(dibenzofuranyl)[(carbazolyl)phenyl]amine; (terphenylyl)(naphthyl)(dibenzofuranyl)amine; (phenyl)(dibenzofuranyl)[(dibenzofuranyl)phenyl]amine; (terphenylyl)(biphenylyl)(dibenzofuranyl)amine; (biphenylyl)(dibenzofuranyl)(dimethylfluorenyl)amine; (naphthyl)(biphenylyl)(dibenzofuranyl)amine; di(biphenylyl)[(phenyldibenzofuranyl)phenyl]amine; (naphthyl)(naphthylphenyl)[(phenyldibenzofuranyl)phenyl]amine; (naphthyl)(naphthylphenyl)[(phenyldibenzofuranyl)phenyl]amine; (biphenylyl)[(dimethylfluorenyl)phenyl][(dibenzofuranyl)phenyl]amine; (naphthyl)(biphenylyl)[(phenyldibenzofuranyl)biphenylyl]amine; (naphthyl)(biphenylyl)[(dibenzofuranyl)phenyl]amine; (phenyl)(naphthylphenyl)[(phenyldibenzofuranyl)phenyl]amine; (naphthylphenyl)bis[(dibenzofuranyl)phenyl]amine; di(terphenylyl)[(dibenzofuranyl)phenyl]amine; (phenyl)(biphenylyl)[(dibenzofuranyl)dimethylfluorenyl]amine; (phenyl)[(triphenylsilyl)phenyl](diphenylfluorenyl)amine; (phenyl)[(triphenylsilyl)phenyl](triphenylfluorenyl)amine; (diphenylfluorenyl)di(biphenylyl)amine; (diphenylfluorenyl)(biphenylyl)(naphthylphenyl)amine; (diphenylfluorenyl)(biphenylyl)(terphenyl)amine; (diphenylfluorenyl)(biphenylyl)(phenyldibenzofuranyl)amine; (phenyl)[(triphenylsilyl)phenyl](naphthylphenylfluorenyl)amine; (diphenylfluorenyl)(biphenylyl)(dibenzofuranyl)amine; (triphenylsilyldibenzothiophenyl)(phenyl)(diphenylfluorenyl)amine; (diphenylnaphthylsilylbiphenylyl)(phenyl)(diphenylyl)amine; (triphenylsilylphenyl)(phenyl)(naphthylphenylfluorenyl)amine; (diphenylfluorenyl)(biphenylyl)(phenyldibenzothiophenyl)amine; (diphenylfluorenyl)(biphenylyl)(dibenzothiophenyl)amine; (diphenylfluorenyl)(biphenylyl)(dibenzofuranylphenyl)amine; (diphenylfluorenyl)(biphenylyl)(phenyldibenzofuranylphenyl)amine; (diphenylfluorenyl)(biphenylyl)(phenyldibenzothiophenyl)amine; (dimethylfluorenyl)di(biphenylyl)amine; (dimethylfluorenyl)(terphenylyl)(biphenylyl)amine; (dimethylfluorenyl)(biphenylyl)(dibenzofuranylphenyl)amine; (dimethylfluorenyl)(biphenylyl)(dibenzothiophenylphenyl)amine; (dimethylfluorenyl)(biphenylyl)(phenyldibenzofuranyl)amine; (diphenylfluorenyl)bis(methylbiphenylyl)amine; (dimethylfluorenyl)di(biphenylyl)amine; (dimethylfluorenyl)di(biphenylyl)amine; (dibenzofuranylphenyl)(biphenylyl)(dimethylfluorenyl)amine; (quarterphenylyl)(dibenzofuranylphenyl)(phenylcarbazolylphenyl)amine; (quarterphenylyl)(dibenzofuranylphenyl)(phenylcarbazolylphenyl)amine; (quarterphenylyl)(dibenzofuranylphenyl)(phenylcarbazolylphenyl)amine; (quarterphenylyl)(dibenzofuranylphenyl)(phenylcarbazolylphenyl)amine; (quarterphenylyl)bis(dibenzofuranylphenyl)amine; (quarterphenylyl)bis(dibenzofuranylphenyl)amine; (quarterphenylyl)(dibenzofuranylphenyl)(phenylcarbazolylphenyl)amine; (quarterphenylyl)(dibenzofuranylphenyl)(phenylcarbazolylphenyl)amine; (quarterphenylyl)(biphenylyl)(dibenzofuranylphenyl)amine; (quarterphenylyl)(biphenylyl)(dibenzofuranylphenyl)amine; (terphenylyl)(naphthylphenyl)(dibenzofuranylbiphenylyl)amine; (terphenylyl)(phenylnaphthyl)(dibenzofuranylbiphenylyl)amine; (terphenylyl)(naphthyl)(dibenzofuranylbiphenylyl)amine; (dimethylfluorenyl)bis(spirobifluorenyl)amine; (biphenylyl)bis(spirobifluorenyl)amine; (dimethylfluorenyl)bis(spirobifluorenyl)amine; (spirobifluorenyl)(biphenylyl)(dimethylfluorenyl)amine; (spirobifluorenyl)di(biphenylyl)amine; (spirobifluorenyl)bis(dimethylfluorenyl)amine; (spirobifluorenyl)(biphenylyl)(dimethylfluorenyl)amine; (spirobifluorenyl)(terphenylyl)(dimethylfluorenyl)amine; (spirobifluorenyl)(biphenylyl)(dimethylfluorenyl)amine; (spirobifluorenyl)bis(dimethylfluorenyl)amine; (spirobifluorenyl)(biphenylyl)(dimethylfluorenyl)amine; (spirobifluorenyl)di(biphenylyl)amine; (spirobifluorenylphenyl)di(biphenylyl)amine; (spirobifluorenyl)di(biphenylyl)amine; (spirobifluorenyl)(biphenylyl)(dibenzofuranyl)amine; (spirobifluorenyl)(biphenylyl)(dibenzofuranyl)amine; (spirobifluorenyl)(dibenzofuranyl)(dimethylfluorenyl)amine; (spirobifluorenyl)(biphenylyl)(phenylcarbazolyl)amine; (spirobifluorenyl)(diphenylfluorenyl)(dibenzothiophenylphenyl)amine; (spirobifluorenyl)(dimethylfluorenyl)(dibenzothiophenyl)amine; (spirobifluorenyl)(biphenylyl)(phenylcarbazolyl)amine; (spirobifluorenyl)(biphenylyl)(diphenylfluorenyl)amine; (spirobifluorenyl)(biphenylyl)(dibenzofuranylphenyl)amine; (spirobifluorenyl)(biphenylyl)(dibenzothiophenylphenyl)amine; (spirobifluorenyl)(biphenylyl)(diphenylfluorenyl)amine; (biphenylyl)bis(dibenzofuranylphenyl)amine; (terphenylyl)bis(dibenzofuranylphenyl)amine; (dimethylfluorenyl)bis(dibenzofuranylphenyl)amine; (terphenylyl)bis(dibenzofuranylphenyl)amine; (quarterphenylyl)bis(dibenzofuranylphenyl)amine; (diphenylfluorenyl)(dibenzofuranylphenyl)(phenyl)amine; (diphenylfluorenyl)(dibenzofuranylphenyl)(biphenylyl)amine; (diphenylfluorenyl)(dibenzofuranylphenyl)(biphenylyl)amine; (diphenylfluorenyl)(dibenzofuranylphenyl)(biphenylyl)amine; (diphenylfluorenyl)(dibenzofuranylphenyl)(terphenylyl)amine; (diphenylfluorenyl)(dibenzofuranylphenyl)(terphenylyl)amine; (diphenylfluorenyl)(dibenzofuranylphenyl)(terphenylyl)amine; (diphenylfluorenyl)(dibenzofuranylphenyl)(terphenylyl)amine; (diphenylfluorenyl)(dibenzofuranylphenyl)(naphthyl)amine; (diphenylfluorenyl)(dibenzofuranylphenyl)(naphthyl)amine; (diphenylfluorenyl)(dibenzofuranylphenyl)(naphthylphenyl)amine; (diphenylfluorenyl)(dibenzofuranylphenyl)(naphthylphenyl)amine; (diphenylfluorenyl)(dibenzofuranylphenyl)(dimethylfluorenyl)amine; (diphenylfluorenyl)(dibenzofuranylphenyl)(phenylmethylfluorenyl)amine; bis(diphenylfluorenyl)(dibenzofuranylphenyl)amine; (diphenylfluorenyl)(dibenzothiophenylphenyl)(phenyl)amine; (diphenylfluorenyl)(dibenzothiophenylphenyl)(biphenylyl)amine; (diphenylfluorenyl)(dibenzothiophenylphenyl)(biphenylyl)amine; (diphenylfluorenyl)(dibenzothiophenylphenyl)(terphenylyl)amine; (diphenylfluorenyl)(dibenzothiophenylphenyl)(naphthyl)amine; (diphenylfluorenyl)(dibenzothiophenylphenyl)(naphthyl)amine; (diphenylfluorenyl)(dibenzothiophenylphenyl)(naphthylphenyl)amine; (diphenylfluorenyl)(dibenzothiophenylphenyl)(naphthylphenyl)amine; (phenyl)(diphenylfluorenyl)(dibenzofuranylphenyl)amine; (biphenylyl)(diphenylfluorenyl)(dibenzofuranylphenyl)amine; (biphenylyl)(diphenylfluorenyl)(dibenzofuranylphenyl)amine; (naphthylphenyl)(diphenylfluorenyl)(dibenzofuranylphenyl)amine; (naphthylphenyl)(diphenylfluorenyl)(dibenzofuranylphenyl)amine; (dimethylfluorenyl)(diphenylfluorenyl)(dibenzofuranylphenyl)amine; bis(diphenylfluorenyl)(dibenzofuranylphenyl)amine; (phenyl)(diphenylfluorenyl)(dibenzothiophenylphenyl)amine; (biphenylyl)(diphenylfluorenyl)(dibenzothiophenylphenyl)amine; (biphenylyl)(diphenylfluorenyl)(dibenzothiophenylphenyl)amine; (terphenylyl)(diphenylfluorenyl)(dibenzothiophenylphenyl)amine; (naphthylphenyl)(diphenylfluorenyl)(dibenzothiophenylphenyl)amine; (naphthylphenyl)(diphenylfluorenyl)(dibenzothiophenylphenyl)amine; (dimethylfluorenyl)(diphenylfluorenyl)(dibenzothiophenylphenyl)amine; (biphenylyl)(diphenylfluorenyl)(carbazolylphenyl)amine; (biphenylyl)(diphenylfluorenyl)(carbazolylphenyl)amine; (terphenylyl)(diphenylfluorenyl)(carbazolylphenyl)amine; (naphthylphenyl)(diphenylfluorenyl)(carbazolylphenyl)amine; (naphthylphenyl)(diphenylfluorenyl)(carbazolylphenyl)amine; (dimethylfluorenyl)(diphenylfluorenyl)(carbazolylphenyl)amine; (biphenylyl)(dibenzofuranyl)(diphenylfluorenyl)amine; (dibenzofuranyl)(dimethylfluorenyl)(diphenylfluorenyl)amine; (biphenylyl)(dibenzothiophenyl)(diphenylfluorenyl)amine; (dimethylfluorenyl)(dibenzothiophenyl)(diphenylfluorenyl)amine; (biphenylyl)(dibenzofuranyl)(diphenylfluorenyl)amine; (biphenylyl)(dibenzofuranyl)(diphenylfluorenyl)amine; (dimethylfluorenyl)(dibenzofuranyl)(diphenylfluorenyl)amine; (biphenylyl)(dibenzothiophenyl)(diphenylfluorenyl)amine; (biphenylyl)(dibenzothiophenyl)(diphenylfluorenyl)amine; (dimethylfluorenyl)(dibenzothiophenyl)(diphenylfluorenyl)amine; bis(dibenzofuranylphenyl)(diphenylfluorenyl)amine; bis(dibenzofuranylphenyl)(diphenylfluorenyl)amine; (dibenzofuranylphenyl)(dibenzothiophenylphenyl)(diphenylfluorenyl)amine; (dibenzofuranylphenyl)(carbazolylphenyl)(diphenylfluorenyl)amine; bis(dibenzofuranylphenyl)(diphenylfluorenyl)amine; (dibenzofuranylphenyl)(dibenzothiophenylphenyl)(diphenylfluorenyl)amine; (dibenzofuranylphenyl)(carbazolylphenyl)(diphenylfluorenyl)amine; (dibenzothiophenylphenyl)(carbazolylphenyl)(diphenylfluorenyl)amine; (methylbiphenylyl)(dibenzofuranylphenyl)(diphenylfluorenyl)amine; (tert- butylbiphenylyl)(dibenzofuranylphenyl)(diphenylfluorenyl)amine; (dimethylbiphenylyl)(dibenzofuranylphenyl)(diphenylfluorenyl)amine; (dimethylbiphenylyl)(dibenzofuranylphenyl)(diphenylfluorenyl)amine; (methylbiphenylyl)(dibenzofuranylphenyl)(diphenyffluorenyl)amine; (tert- butylbiphenylyl)(dibenzofuranylphenyl)(diphenylfluorenyl)amine; (methoxybiphenylyl)(dibenzofuranylphenyl)(diphenylfluorenyl)amine; (phenyl)(dimethylfluorenyl)(diphenylfluorenyl)amine; (biphenylyl)(dimethylfluorenyl)(diphenylfluorenyl)amine; (biphenylyl)(dimethylfluorenyl)(diphenylfluorenyl)amine; (biphenylyl)(dimethylfluorenyl)(diphenylfluorenyl)amine; (terphenylyl)(dimethylfluorenyl)(diphenylfluorenyl)amine; (terphenylyl)(dimethylfluorenyl)(diphenylfluorenyl)amine; (terphenylyl)(dimethylfluorenyl)(diphenylfluorenyl)amine; (terphenylyl)(dimethylfluorenyl)(diphenylfluorenyl)amine; (terphenylyl)(dimethylfluorenyl)(diphenylfluorenyl)amine; (naphthyl)(dimethylfluorenyl)(diphenylfluorenyl)amine; (naphthyl)(dimethylfluorenyl)(diphenylfluorenyl)amine; (naphthylphenyl)(dimethylfluorenyl)(diphenylfluorenyl)amine; (naphthylphenyl)(dimethylfluorenyl)(diphenylfluorenyl)amine; bis(dimethylfluorenyl)(diphenylfluorenyl)amine; (phenylmethylfluorenyl)(dimethylfluorenyl)(diphenylfluorenyl)amine; (dimethylfluorenyl)bis(diphenylfluorenyl)amine; (terphenylyl)(dimethylfluorenyl)(diphenylfluorenyl)amine; (terphenylyl)(dimethylfluorenyl)(diphenylfluorenyl)amine; (fluorophenyl)(dimethylfluorenyl)(diphenylfluorenyl)amine; (methylphenyl)(dimethylfluorenyl)(diphenylfluorenyl)amine; (tert-butylphenyl)(dimethylfluorenyl)(diphenylfluorenyl)amine; (methylbiphenylyl)(dimethylfluorenyl)(diphenylfluorenyl)amine; (tert-butylbiphenylyl)(dimethylfluorenyl)(diphenylfluorenyl)amine; (dimethylbiphenylyl)(dimethylfluorenyl)(diphenyffluorenyl)amine; (dimethylbiphenylyl)(dimethylfluorenyl)(diphenyffluorenyl)amine; (methylbiphenylyl)(dimethylfluorenyl)(diphenylfluorenyl)amine; (tert-butylbiphenylyl)(dimethylfluorenyl)(diphenylfluorenyl)amine; (methoxybiphenylyl)(dimethylfluorenyl)(diphenylfluorenyl)amine; (phenyl)bis(diphenylfluorenyl)amine; (biphenylyl)bis(diphenylfluorenyl)amine; (biphenylyl)bis(diphenylfluorenyl)amine; (biphenylyl)bis(diphenylfluorenyl)amine; (terphenylyl)bis(diphenylfluorenyl)amine; (terphenylyl)bis(diphenylfluorenyl)amine; (terphenylyl)bis(diphenylfluorenyl)amine; (terphenylyl)bis(diphenylfluorenyl)amine; (terphenylyl)bis(diphenylfluorenyl)amine; (terphenylyl)bis(diphenylfluorenyl)amine; (naphthyl)bis(diphenylfluorenyl)amine; (naphthyl)bis(diphenylfluorenyl)amine; (naphthylphenyl)bis(diphenylfluorenyl)amine; (naphthylphenyl)bis(diphenylfluorenyl)amine; (dimethylfluorenyl)bis(diphenylfluorenyl)amine; (phenylmethylfluorenyl)bis(diphenylfluorenyl)amine; tris(diphenylfluorenyl)amine; (terphenylyl)bis(diphenylfluorenyl)amine; (terphenylyl)bis(diphenylfluorenyl)amine; (methylbiphenylyl)bis(diphenylfluorenyl)amine; (tert-butylbiphenylyl)bis(diphenylfluorenyl)amine; (dimethylbiphenylyl)bis(diphenylfluorenyl)amine; (dimethylbiphenylyl)bis(diphenylfluorenyl)amine; (methylbiphenylyl)bis(diphenylfluorenyl)amine; (tert-butylbiphenylyl)bis(diphenylfluorenyl)amine; (methoxybiphenylyl)bis(diphenylfluorenyl)amine; (phenyl)(dimethylfluorenyl)(diphenylfluorenyl)amine; (biphenylyl)(dimethylfluorenyl)(diphenylfluorenyl)amine; (biphenylyl)(dimethylfluorenyl)(diphenylfluorenyl)amine; (phenyl)(dibenzofuranylphenyl)(diphenylfluorenyl)amine; (biphenylyl)(dibenzofuranylphenyl)(diphenylfluorenyl)amine; (biphenylyl)(dibenzofuranylphenyl)(diphenylfluorenyl)amine; (biphenylyl)(dibenzofuranylphenyl)[di(biphenylyl)fluorenyl]amine; (biphenylyl)(dimethylfluorenyl)[di(methylphenyl)fluorenyl]amine; (biphenylyl)(dimethylfluorenyl)[di(methylphenyl)fluorenyl]amine; (biphenylyl)(dimethylfluorenyl)[di(tert-butylphenyl)fluorenyl]amine; (biphenylyl)(dibenzofuranylphenyl)[di(methylphenyl)fluorenyl]amine; (biphenylyl)(dibenzofuranylphenyl)[di(methylphenyl)fluorenyl]amine; (biphenylyl)(dibenzofuranylphenyl)[di(tert-butylphenyl)fluorenyl]amine; (biphenylyl)(dimethylfluorenyl)(methyldiphenylfluorenyl)amine; (biphenylyl)(dimethylfluorenyl)(methyldiphenylfluorenyl)amine;

(biphenylyl)(dimethylfluorenyl)(tert-butyldiphenylfluorenyl)amine; (biphenylyl)(dimethylfluorenyl)(tert-butyldiphenylfluorenyl)amine; (biphenylyl)(dibenzofuranylphenyl)(methyldiphenylfluorenyl)amine; (biphenylyl)(dibenzofuranylphenyl)(methyldiphenylfluorenyl)amine; (biphenylyl)(dibenzofuranylphenyl)(tert-butyldiphenylfluorenyl)amine; (biphenylyl)(dibenzofuranylphenyl)(tert-butyldiphenylfluorenyl)amine; (biphenylyl)(dimethylfluorenyl)(triphenylfluorenyl)amine; (biphenylyl)(dimethylfluorenyl)(triphenylfluorenyl)amine; (biphenylyl)(dibenzofuranylphenyl)(triphenylfluorenyl)amine; (biphenylyl)(dibenzofuranylphenyl)(triphenylfluorenyl)amine; (biphenylyl)(methyldibenzofuranylphenyl)(diphenylfluorenyl)amine; (biphenylyl)(methyldibenzofuranylphenyl)(diphenylfluorenyl)amine; (biphenylyl)(phenyldibenzofuranylphenyl)(diphenylfluorenyl)amine; (biphenylyl)(phenyldibenzofuranylphenyl)(diphenylfluorenyl)amine; (biphenylyl)(methyldibenzofuranyl)(diphenylfluorenyl)amine; (biphenylyl)(methyldibenzofuranyl)(diphenylfluorenyl)amine; (biphenylyl)(phenyldibenzofuranyl)(diphenylfluorenyl)amine; (biphenylyl)(phenyldibenzofuranyl)(diphenylfluorenyl)amine; (dibenzofuranyl)bis(diphenylfluorenyl)amine; (dibenzothiophenyl)bis(diphenylfluorenyl)amine; (dibenzofuranylphenyl)bis(diphenylfluorenyl)amine; (dibenzothiophenylphenyl)bis(diphenylfluorenyl)amine; (dibenzofuranyl)bis(diphenylfluorenyl)amine; (dibenzothiophenyl)bis(diphenylfluorenyl)amine; (dibenzofuranylphenyl)bis(diphenylfluorenyl)amine; (dibenzothiophenylphenyl)bis(diphenylfluorenyl)amine; (dibenzothiophenyl)bis(diphenylfluorenyl)amine; (quarterphenylyl)bis(diphenylfluorenyl)amine; (dibenzothiophenylphenyl)(dimethylfluorenyl)(diphenylfluorenyl)amine; (quarterphenylyl)(dimethylfluorenyl)(diphenylfluorenyl)amine; (dibenzofuranylphenyl)(dimethylfluorenyl)(diphenylfluorenyl)amine; (dibenzothiophenylphenyl)(dimethylfluorenyl)(diphenylfluorenyl)amine; (dibenzofuranylphenyl)(dimethylfluorenyl)(diphenylfluorenyl)amine; (dibenzothiophenylphenyl)(dimethylfluorenyl)(diphenylfluorenyl)amine; (dibenzofuranylphenyl)(dimethylfluorenyl)(diphenylfluorenyl)amine; (dibenzothiophenylphenyl)(dimethylfluorenyl)(diphenylfluorenyl)amine; (dibenzofuranylphenyl)(dimethylfluorenyl)(diphenylfluorenyl)amine; (dibenzothiophenylphenyl)(dimethylfluorenyl)(diphenylfluorenyl)amine; (dibenzofuranylphenyl)(biphenylyl)(diphenylfluorenyl)amine; (dibenzothiophenylphenyl)(biphenylyl)(diphenylfluorenyl)amine; (dibenzofuranylphenyl)(biphenylyl)(diphenylfluorenyl)amine; (dibenzothiophenylphenyl)(biphenylyl)(diphenylfluorenyl)amine; (dibenzofuranylphenyl)(biphenylyl)(diphenylfluorenyl)amine; (dibenzothiophenylphenyl)(biphenylyl)(diphenylfluorenyl)amine; (dibenzofuranylphenyl)(biphenylyl)(diphenylfluorenyl)amine; (dibenzothiophenylphenyl)(biphenylyl)(diphenylfluorenyl)amine; (dibenzofuranylphenyl)(biphenylyl)(diphenylfluorenyl)amine; (dibenzothiophenylphenyl)(biphenylyl)(diphenylfluorenyl)amine; (dibenzofuranylphenyl)(biphenylyl)(diphenylfluorenyl)amine; (dibenzothiophenylphenyl)(biphenylyl)(diphenylfluorenyl)amine; (dibenzofuranylphenyl)(biphenylyl)(diphenylfluorenyl)amine; (dibenzothiophenylphenyl)(biphenylyl)(diphenylfluorenyl)amine; (dibenzothiophenylphenyl)(biphenylyl)(diphenylfluorenyl)amine; (dibenzofuranylphenyl)(biphenylyl)(diphenylfluorenyl)amine; (dibenzothiophenylphenyl)(biphenylyl)(diphenylfluorenyl)amine; (dibenzofuranylphenyl)(biphenylyl)(diphenylfluorenyl)amine; (dibenzothiophenylphenyl)(biphenylyl)(diphenylfluorenyl)amine; (dibenzofuranylphenyl)(biphenylyl)(diphenylfluorenyl)amine; (dibenzothiophenylphenyl)(biphenylyl)(diphenylfluorenyl)amine; (dibenzofuranylphenyl)(terphenylyl)(diphenylfluorenyl)amine; (dibenzothiophenylphenyl)(terphenylyl)(diphenylfluorenyl)amine; (dibenzothiophenylphenyl)(terphenylyl)(diphenylfluorenyl)amine; (dibenzofuranylphenyl)(terphenylyl)(diphenylfluorenyl)amine; (dibenzothiophenylphenyl)(terphenylyl)(diphenylfluorenyl)amine; (dibenzofuranylphenyl)(terphenylyl)(diphenylfluorenyl)amine; (dibenzothiophenylphenyl)(terphenylyl)(diphenylfluorenyl)amine; (phenyl)(dibenzofuranyl)(diphenylfluorenyl)amine; (phenyl)(dibenzothiophenyl)(diphenylfluorenyl)amine; (phenyl)(dibenzofuranyl)(diphenylfluorenyl)amine; (phenyl)(dibenzothiophenyl)(diphenylfluorenyl)amine; (phenyl)(dibenzofuranylphenyl)(diphenylfluorenyl)amine; (phenyl)(dibenzothiophenylphenyl)(diphenylfluorenyl)amine; (phenyl)(dibenzofuranylphenyl)(diphenylfluorenyl)amine; (phenyl)(dibenzothiophenylphenyl)(diphenylfluorenyl)amine; (phenyl)(dibenzofuranylphenyl)(diphenylfluorenyl)amine; (phenyl)(dibenzothiophenylphenyl)(diphenylfluorenyl)amine; (phenyl)(dibenzofuranylphenyl)(diphenylfluorenyl)amine; (phenyl)(dibenzothiophenylphenyl)(diphenylfluorenyl)amine; bis(dibenzofuranyl)(diphenylfluorenyl)amine; bis(dibenzothiophenyl)(diphenylfluorenyl)amine; (biphenylyldimethylfluorenyl)(phenyl)(diphenylfluorenyl)amine; (naphthyldimethylfluorenyl)(phenyl)(diphenylfluorenyl)amine; (naphthyldimethylfluorenyl)(phenyl)(diphenylfluorenyl)amine; (biphenylyldimethylfluorenyl)(biphenylyl)(diphenylfluorenyl)amine; (naphthyldimethylfluorenyl)(biphenylyl)(diphenylfluorenyl)amine; (naphthyldimethylfluorenyl)(biphenylyl)(diphenylfluorenyl)amine; (naphthyldimethylfluorenyl)(biphenylyl)(diphenylfluorenyl)amine; (phenyl)(dimethylfluorenylphenyl)(diphenylfluorenyl)amine; (phenyl)(dimethylfluorenylphenyl)(diphenylfluorenyl)amine; (biphenylyl)(dimethylfluorenylphenyl)(diphenylfluorenyl)amine; (biphenylyl)(dimethylfluorenylphenyl)(diphenylfluorenyl)amine; (biphenylyl)(dimethylfluorenylphenyl)(diphenylfluorenyl)amine; (biphenylyl)(dimethylfluorenylphenyl)(diphenylfluorenyl)amine; (biphenylyl)(dimethylfluorenylphenyl)(diphenylfluorenyl)amine; (biphenylyl)(dimethylfluorenylphenyl)(diphenylfluorenyl)amine; (dimethylfluorenylphenyl)bis(diphenylfluorenyl)amine; (dimethylfluorenylphenyl)bis(diphenylfluorenyl)amine; di(biphenylyl)(diphenylfluorenyl)amine; (biphenylyl)(methylbiphenylyl)(diphenylfluorenyl)amine; (methylphenyl)(biphenylyl)(diphenylfluorenyl)amine; di(biphenylyl)(diphenylfluorenyl)amine; bis(dimethylphenyl)(diphenylfluorenyl)amine; (biphenylyl)(terphenylyl)(diphenylfluorenyl)amine; bis(methylbiphenylyl)(diphenylfluorenyl)amine; (biphenylyl)(dimethylbiphenylyl)(diphenylfluorenyl)amine; (phenyl)(dibenzofuranylphenyl)(spirobifluorenyl)amine; (biphenylyl)(dibenzofuranylphenyl)(spirobifluorenyl)amine; (biphenylyl)(dibenzofuranylphenyl)(spirobifluorenyl)amine; (biphenylyl)(dibenzofuranylphenyl)(spirobifluorenyl)amine; (terphenylyl)(dibenzofuranylphenyl)(spirobifluorenyl)amine; (terphenylyl)(dibenzofuranylphenyl)(spirobifluorenyl)amine; (terphenylyl)(dibenzofuranylphenyl)(spirobifluorenyl)amine; (terphenylyl)(dibenzofuranylphenyl)(spirobifluorenyl)amine; (terphenylyl)(dibenzofuranylphenyl)(spirobifluorenyl)amine; (naphthyl)(dibenzofuranylphenyl)(spirobifluorenyl)amine; (naphthyl)(dibenzofuranylphenyl)(spirobifluorenyl)amine; (naphthylphenyl)(dibenzofuranylphenyl)(spirobifluorenyl)amine; (naphthylphenyl)(dibenzofuranylphenyl)(spirobifluorenyl)amine; (dimethylfluorenyl)(dibenzofuranylphenyl)(spirobifluorenyl)amine; (phenylmethylfluorenyl)(dibenzofuranylphenyl)(spirobifluorenyl)amine; (dibenzofuranylphenyl)(diphenylfluorenyl)(spirobifluorenyl)amine; (phenyl)(dibenzothiophenylphenyl)(spirobifluorenyl)amine; (biphenylyl)(dibenzothiophenylphenyl)(spirobifluorenyl)amine; (biphenylyl)(dibenzothiophenylphenyl)(spirobifluorenyl)amine; (terphenylyl)(dibenzothiophenylphenyl)(spirobifluorenyl)amine; (naphthyl)(dibenzothiophenylphenyl)(spirobifluorenyl)amine; (naphthyl)(dibenzothiophenylphenyl)(spirobifluorenyl)amine; (naphthylphenyl)(dibenzothiophenylphenyl)(spirobifluorenyl)amine; (naphthylphenyl)(dibenzothiophenylphenyl)(spirobifluorenyl)amine; (phenyl)(dibenzofuranylphenyl)(spirobifluorenyl)amine; (biphenylyl)(dibenzofuranylphenyl)(spirobifluorenyl)amine; (biphenylyl)(dibenzofuranylphenyl)(spirobifluorenyl)amine; (dibenzofuranylphenyl)(diphenylfluorenyl)(spirobifluorenyl)amine; (biphenylyl)(dibenzothiophenylphenyl)(spirobifluorenyl)amine; (biphenylyl)(dibenzothiophenylphenyl)(spirobifluorenyl)amine; (biphenylyl)(carbazolylphenyl)(spirobifluorenyl)amine; (biphenylyl)(carbazolylphenyl)(spirobifluorenyl)amine; (biphenylyl)(dibenzofuranyl)(spirobifluorenyl)amine; (biphenylyl)(dibenzofuranyl)(spirobifluorenyl)amine; (biphenylyl)(dibenzofuranyl)(spirobifluorenyl)amine; (dimethylfluorenyl)(dibenzofuranyl)(spirobifluorenyl)amine; (biphenylyl)(dibenzothiophenyl)(spirobifluorenyl)amine; (biphenylyl)(dibenzothiophenyl)(spirobifluorenyl)amine; (biphenylyl)(dibenzothiophenyl)(spirobifluorenyl)amine; (dimethylfluorenyl)(dibenzothiophenyl)(spirobifluorenyl)amine; (biphenylyl)(dibenzofuranyl)(spirobifluorenyl)amine; (biphenylyl)(dibenzofuranyl)(spirobifluorenyl)amine; (biphenylyl)(dibenzofuranyl)(spirobifluorenyl)amine; (dimethylfluorenyl)(dibenzofuranyl)(spirobifluorenyl)amine; (biphenylyl)(dibenzothiophenyl)(spirobifluorenyl)amine; (biphenylyl)(dibenzothiophenyl)(spirobifluorenyl)amine; (biphenylyl)(dibenzothiophenyl)(spirobifluorenyl)amine; (dimethylfluorenyl)(dibenzothiophenyl)(spirobifluorenyl)amine; bis(dibenzofuranylphenyl)(spirobifluorenyl)amine; (dibenzofuranylphenyl)(carbazolylphenyl)(spirobifluorenyl)amine; bis(dibenzofuranylphenyl)(spirobifluorenyl)amine; (dibenzofuranylphenyl)(carbazolylphenyl)(spirobifluorenyl)amine; (methylphenyl)(dibenzofuranylphenyl)(spirobifluorenyl)amine; (tert-butylphenyl)(dibenzofuranylphenyl)(spirobifluorenyl)amine; (methylbiphenylyl)(dibenzofuranylphenyl)(spirobifluorenyl)amine; (tert-butylbiphenylyl)(dibenzofuranylphenyl)(spirobifluorenyl)amine; (dimethylbiphenylyl)(dibenzofuranylphenyl)(spirobifluorenyl)amine; (dimethylbiphenylyl)(dibenzofuranylphenyl)(spirobifluorenyl)amine; (methylbiphenylyl)(dibenzofuranylphenyl)(spirobifluorenyl)amine; (tert-butylbiphenylyl)(dibenzofuranylphenyl)(spirobifluorenyl)amine; (phenyl)(dimethylfluorenyl)(spirobifluorenyl)amine; (biphenylyl)(dimethylfluorenyl)(spirobifluorenyl)amine; (biphenylyl)(dimethylfluorenyl)(spirobifluorenyl)amine; (biphenylyl)(dimethylfluorenyl)(spirobifluorenyl)amine; (terphenylyl)(dimethylfluorenyl)(spirobifluorenyl)amine; (terphenylyl)(dimethylfluorenyl)(spirobifluorenyl)amine; (terphenylyl)(dimethylfluorenyl)(spirobifluorenyl)amine; (terphenylyl)(dimethylfluorenyl)(spirobifluorenyl)amine; (terphenylyl)(dimethylfluorenyl)(spirobifluorenyl)amine; (naphthyl)(dimethylfluorenyl)(spirobifluorenyl)amine; (naphthyl)(dimethylfluorenyl)(spirobifluorenyl)amine; (naphthylphenyl)(dimethylfluorenyl)(spirobifluorenyl)amine; (naphthylphenyl)(dimethylfluorenyl)(spirobifluorenyl)amine; bis(dimethylfluorenyl)(spirobifluorenyl)amine; (phenylmethylfluorenyl)(dimethylfluorenyl)(spirobifluorenyl)amine; (diphenylfluorenyl)(dimethylfluorenyl)(spirobifluorenyl)amine; (terphenylyl)(dimethylfluorenyl)(spirobifluorenyl)amine; (terphenylyl)(dimethylfluorenyl)(spirobifluorenyl)amine; (methylphenyl)(dimethylfluorenyl)(spirobifluorenyl)amine; (tert-butylphenyl)(dimethylfluorenyl)(spirobifluorenyl)amine; (methylbiphenylyl)(dimethylfluorenyl)(spirobifluorenyl)amine; (tert-butylbiphenylyl)(dimethylfluorenyl)(spirobifluorenyl)amine; (dimethylbiphenylyl)(dimethylfluorenyl)(spirobifluorenyl)amine; (dimethylbiphenylyl)(dimethylfluorenyl)(spirobifluorenyl)amine; (methylbiphenylyl)(dimethylfluorenyl)(spirobifluorenyl)amine; (tert-butylbiphenylyl)(dimethylfluorenyl)(spirobifluorenyl)amine; (phenyl)(diphenylfluorenyl)(spirobifluorenyl)amine; (biphenylyl)(diphenylfluorenyl)(spirobifluorenyl)amine; (biphenylyl)(diphenylfluorenyl)(spirobifluorenyl)amine; (biphenylyl)(diphenylfluorenyl)(spirobifluorenyl)amine; (terphenylyl)(diphenylfluorenyl)(spirobifluorenyl)amine; (terphenylyl)(diphenylfluorenyl)(spirobifluorenyl)amine; (terphenylyl)(diphenylfluorenyl)(spirobifluorenyl)amine; (naphthyl)(diphenylfluorenyl)(spirobifluorenyl)amine; (naphthyl)(diphenylfluorenyl)(spirobifluorenyl)amine; (naphthylphenyl)(diphenylfluorenyl)(spirobifluorenyl)amine; (naphthylphenyl)(diphenylfluorenyl)(spirobifluorenyl)amine; (dimethylfluorenyl)(diphenylfluorenyl)(spirobifluorenyl)amine; (methylphenylfluorenyl)(diphenylfluorenyl)(spirobifluorenyl)amine; bis(diphenylfluorenyl)(spirobifluorenyl)amine; (terphenylyl)(diphenylfluorenyl)(spirobifluorenyl)amine; (terphenylyl)(diphenylfluorenyl)(spirobifluorenyl)amine; (methylphenyl)(diphenylfluorenyl)(spirobifluorenyl)amine; (tert-butylphenyl)(diphenylfluorenyl)(spirobifluorenyl)amine; (methylbiphenylyl)(diphenylfluorenyl)(spirobifluorenyl)amine; (tert-butylbiphenylyl)(diphenylfluorenyl)(spirobifluorenyl)amine; (dimethylbiphenylyl)(diphenylfluorenyl)(spirobifluorenyl)amine; (dimethylbiphenylyl)(diphenylfluorenyl)(spirobifluorenyl)amine; (methylbiphenylyl)(diphenylfluorenyl)(spirobifluorenyl)amine; (tert-butylbiphenylyl)(diphenylfluorenyl)(spirobifluorenyl)amine; (phenyl)(dimethylfluorenyl)(spirobifluorenyl)amine; (biphenylyl)(dimethylfluorenyl)(spirobifluorenyl)amine; (biphenylyl)(dimethylfluorenyl)(spirobifluorenyl)amine; (phenyl)(dibenzofuranylphenyl)(spirobifluorenyl)amine; (biphenylyl)(dibenzofuranylphenyl)(spirobifluorenyl)amine; (biphenylyl)(dibenzofuranylphenyl)(spirobifluorenyl)amine; (phenyl)(dimethylfluorenyl)(spirobifluorenyl)amine; (biphenylyl)(dimethylfluorenyl)(spirobifluorenyl)amine; (biphenylyl)(dimethylfluorenyl)(spirobifluorenyl)amine; (phenyl)(dimethylfluorenyl)(phenylspirobifluorenyl)amine; (biphenylyl)(dimethylfluorenyl)(phenylspirobifluorenyl)amine; (biphenylyl)(dimethylfluorenyl)(phenylspirobifluorenyl)amine; (biphenylyl)(dimethylfluorenyl)(phenylspirobifluorenyl)amine; (biphenylyl)(dimethylfluorenyl)(methylspirobifluorenyl)amine; (biphenylyl)(dimethylfluorenyl)(methylspirobifluorenyl)amine; (biphenylyl)(dimethylfluorenyl)(tert-butylspirobifluorenyl)amine; (biphenylyl)(dimethylfluorenyl)(tert-butylspirobifluorenyl)amine; (biphenylyl)(dimethylfluorenyl)(methylspirobifluorenyl)amine; (biphenylyl)(dimethylfluorenyl)(tert-butylspirobifluorenyl)amine; (biphenylyl)(dimethylfluorenyl)(methylspirobifluorenyl)amine; (biphenylyl)(dimethylfluorenyl)(methylspirobifluorenyl)amine; (biphenylyl)(dimethylfluorenyl)(tert-butylspirobifluorenyl)amine; (biphenylyl)(dimethylfluorenyl)(tert-butylspirobifluorenyl)amine; (biphenylyl)(dibenzofuranylphenyl)(methylspirobifluorenyl)amine; (biphenylyl)(dibenzofuranylphenyl)(methylspirobifluorenyl)amine; (biphenylyl)(dibenzofuranylphenyl)(tert-butylspirobifluorenyl)amine; (biphenylyl)(dibenzofuranylphenyl)(tert-butylspirobifluorenyl)amine; (biphenylyl)(dimethylfluorenyl)(phenylspirobifluorenyl)amine; (biphenylyl)(dimethylfluorenyl)(phenylspirobifluorenyl)amine; (biphenylyl)(dibenzofuranylphenyl)(phenylspirobifluorenyl)amine; (biphenylyl)(dibenzofuranylphenyl)(phenylspirobifluorenyl)amine; (biphenylyl)(methyldibenzofuranylphenyl)(spirobifluorenyl)amine; (biphenylyl)(methyldibenzofuranylphenyl)(spirobifluorenyl)amine; (biphenylyl)(phenyldibenzofuranylphenyl)(spirobifluorenyl)amine; (biphenylyl)(phenyldibenzofuranylphenyl)(spirobifluorenyl)amine; (biphenylyl)(methyldibenzofuranyl)(spirobifluorenyl)amine; (biphenylyl)(methyldibenzofuranyl)(spirobifluorenyl)amine; (biphenylyl)(phenyldibenzofuranyl)(spirobifluorenyl)amine; (biphenylyl)(phenyldibenzofuranyl)(spirobifluorenyl)amine; (dibenzofuranylphenyl)bis(spirobifluorenyl)amine; (dibenzothiophenylphenyl)bis(spirobifluorenyl)amine; (dibenzofuranyl)bis(spirobifluorenyl)amine; (dibenzothiophenyl)bis(spirobifluorenyl)amine; (dibenzofuranylphenyl)bis(spirobifluorenyl)amine; (dibenzothiophenylphenyl)bis(spirobifluorenyl)amine; (dibenzofuranylphenyl)bis(spirobifluorenyl)amine; (dibenzothiophenylphenyl)bis(spirobifluorenyl)amine; (dibenzofuranylphenyl)bis(spirobifluorenyl)amine; (dibenzothiophenylphenyl)bis(spirobifluorenyl)amine; (dibenzothiophenylphenyl)(dimethylfluorenyl)(spirobifluorenyl)amine; (dibenzofuranylphenyl)(dimethylfluorenyl)(spirobifluorenyl)amine; (dibenzothiophenylphenyl)(dimethylfluorenyl)(spirobifluorenyl)amine; (dibenzofuranylphenyl)(dimethylfluorenyl)(spirobifluorenyl)amine; (dibenzothiophenylphenyl)(dimethylfluorenyl)(spirobifluorenyl)amine; (dibenzofuranylphenyl)(dimethylfluorenyl)(spirobifluorenyl)amine; (dibenzothiophenylphenyl)(dimethylfluorenyl)(spirobifluorenyl)amine; (dibenzofuranylphenyl)(dimethylfluorenyl)(spirobifluorenyl)amine; (dibenzothiophenylphenyl)(dimethylfluorenyl)(spirobifluorenyl)amine; (dibenzofuranylphenyl)(biphenylyl)(spirobifluorenyl)amine; (dibenzothiophenylphenyl)(biphenylyl)(spirobifluorenyl)amine; (dibenzofuranylphenyl)(biphenylyl)(spirobifluorenyl)amine; (dibenzothiophenylphenyl)(biphenylyl)(spirobifluorenyl)amine; (dibenzofuranylphenyl)(biphenylyl)(spirobifluorenyl)amine; (dibenzothiophenylphenyl)(biphenylyl)(spirobifluorenyl)amine; (dibenzofuranylphenyl)(phenyl)(spirobifluorenyl)amine; (dibenzothiophenylphenyl)(phenyl)(spirobifluorenyl)amine; bis(dibenzofuranyl)(spirobifluorenyl)amine; bis(dibenzothiophenyl)(spirobifluorenyl)amine; (phenyl)(biphenylyldimethylfluorenyl)(spirobifluorenyl)amine; (phenyl)(naphthyldimethylfluorenyl)(spirobifluorenyl)amine; (phenyl)(naphthyldimethylfluorenyl)(spirobifluorenyl)amine; (biphenylyl)(biphenylyldimethylfluorenyl)(spirobifluorenyl)amine; (biphenylyl)(naphthyldimethylfluorenyl)(spirobifluorenyl)amine; (biphenylyl)(biphenylyldimethylfluorenyl)(spirobifluorenyl)amine; (biphenylyl)(naphthyldimethylfluorenyl)(spirobifluorenyl)amine; (dimethylfluorenyl)(biphenylyldimethylfluorenyl)(spirobifluorenyl)amine; (dimethylfluorenyl)(naphthyldimethylfluorenyl)(spirobifluorenyl)amine; (dimethylfluorenyl)(naphthyldimethylfluorenyl)(spirobifluorenyl)amine; (phenyl)(dimethylfluorenylphenyl)(spirobifluorenyl)amine; (biphenylyl)(dimethylfluorenylphenyl)(spirobifluorenyl)amine; (biphenylyl)(dimethylfluorenylphenyl)(spirobifluorenyl)amine; (biphenylyl)(dimethylfluorenylphenyl)(spirobifluorenyl)amine; (biphenylyl)(dimethylfluorenylphenyl)(spirobifluorenyl)amine; (terphenylyl)(dimethylfluorenylphenyl)(spirobifluorenyl)amine; (terphenylyl)(dimethylfluorenylphenyl)(spirobifluorenyl)amine; (dimethylfluorenyl)(dimethylfluorenylphenyl)(spirobifluorenyl)amine; (dimethylfluorenyl)(dimethylfluorenylphenyl)(spirobifluorenyl)amine; di(biphenylyl)(spirobifluorenyl)amine; (biphenylyl)(methylbiphenylyl)(spirobifluorenyl)amine; (methylphenyl)(biphenylyl)(spirobifluorenyl)amine; di(biphenylyl)(spirobifluorenyl)amine; (biphenylyl)(terphenylyl)(spirobifluorenyl)amine; bis(methylbiphenylyl)(spirobifluorenyl)amine; (biphenylyl)(dimethylbiphenylyl)(spirobifluorenyl)amine; (phenyl)(naphthyl)(biphenylyldimethylfluorenyl)amine; (phenyl)(naphthyl)(biphenylyldimethylfluorenyl)amine; (phenyl)(phenanthrenyl)(biphenylyldimethylfluorenyl)amine; (phenyl)(biphenylyl)(biphenylyldimethylfluorenyl)amine; (phenyl)(naphthylphenyl)(biphenylyldimethylfluorenyl)amine; (phenyl)(naphthylphenyl)(biphenylyldimethylfluorenyl)amine; (phenyl)(terphenylyl)(biphenylyldimethylfluorenyl)amine; (phenyl)(terphenylyl)(biphenylyldimethylfluorenyl)amine; bis(methylphenyl)(biphenylyldimethylfluorenyl)amine; bis(methylphenyl)(biphenylyldimethylfluorenyl)amine; (naphthyl)(methylphenyl)(biphenylyldimethylfluorenyl)amine; (naphthyl)(methylphenyl)(biphenylyldimethylfluorenyl)amine; (phenanthrenyl)(methylphenyl)(biphenylyldimethylfluorenyl)amine; (biphenylyl)(methylphenyl)(biphenylyldimethylfluorenyl)amine; (naphthylphenyl)(methylphenyl)(biphenylyldimethylfluorenyl)amine; bis(methylphenyl)(biphenylyldimethylfluorenyl)amine; (naphthyl)(methylphenyl)(biphenylyldimethylfluorenyl)amine; (naphthyl)(methylphenyl)(biphenylyldimethylfluorenyl)amine; (phenanthrenyl)(methylphenyl)(biphenylyldimethylfluorenyl)amine; (biphenylyl)(methylphenyl)(biphenylyldimethylfluorenyl)amine; (naphthylphenyl)(methylphenyl)(biphenylyldimethylfluorenyl)amine; di(naphthyl)(biphenylyldimethylfluorenyl)amine; di(naphthyl)(biphenylyldimethylfluorenyl)amine; (naphthyl)(phenanthrenyl)(biphenylyldimethylfluorenyl)amine; (naphthyl)(biphenylyl)(biphenylyldimethylfluorenyl)amine; (naphthyl)(naphthylphenyl)(biphenylyldimethylfluorenyl)amine; (naphthyl)(naphthylphenyl)(biphenylyldimethylfluorenyl)amine; (naphthyl)(terphenylyl)(biphenylyldimethylfluorenyl)amine; (naphthyl)(terphenylyl)(biphenylyldimethylfluorenyl)amine; di(naphthyl)(biphenylyldimethylfluorenyl)amine; (naphthyl)(phenanthrenyl)(biphenylyldimethylfluorenyl)amine; (naphthyl)(biphenylyl)(biphenylyldimethylfluorenyl)amine; (naphthyl)(naphthylphenyl)(biphenylyldimethylfluorenyl)amine; (naphthyl)(naphthylphenyl)(biphenylyldimethylfluorenyl)amine; (naphthyl)(terphenylyl)(biphenylyldimethylfluorenyl)amine; (naphthyl)(terphenylyl)(biphenylyldimethylfluorenyl)amine; di(phenanthrenyl)(biphenylyldimethylfluorenyl)amine; (biphenylyl)(phenanthrenyl)(biphenylyldimethylfluorenyl)amine; (naphthylphenyl)(phenanthrenyl)(biphenylyldimethylfluorenyl)amine; (naphthylphenyl)(phenanthrenyl)(biphenylyldimethylfluorenyl)amine; (terphenylyl)(phenanthrenyl)(biphenylyldimethylfluorenyl)amine; (terphenylyl)(phenanthrenyl)(biphenylyldimethylfluorenyl)amine; di(biphenylyl)(biphenylyldimethylfluorenyl)amine; (phenyl)(dimethylfluorenyl)(biphenylyldimethylfluorenyl)amine; (methylphenyl)(dimethylfluorenyl)(biphenylyldimethylfluorenyl)amine; (methylphenyl)(dimethylfluorenyl)(biphenylyldimethylfluorenyl)amine; (naphthyl)(dimethylfluorenyl)(biphenylyldimethylfluorenyl)amine; (naphthyl)(dimethylfluorenyl)(biphenylyldimethylfluorenyl)amine; (phenanthrenyl)(dimethylfluorenyl)(biphenylyldimethylfluorenyl)amine; (biphenylyl)(dimethylfluorenyl)(biphenylyldimethylfluorenyl)amine; (naphthylphenyl)(dimethylfluorenyl)(biphenylyldimethylfluorenyl)amine; (naphthylphenyl)(dimethylfluorenyl)(biphenylyldimethylfluorenyl)amine; bis(dimethylfluorenyl)(biphenylyldimethylfluorenyl)amine; di(biphenylyl)(biphenylyldimethylbenzofluorenyl)amine; di(biphenylyl)(biphenylyldimethylbenzofluorenyl)amine; di(biphenylyl)(biphenylyldimethyldibenzofluorenyl)amine; di(biphenylyl)(biphenylyldiphenylfluorenyl)amine; di(biphenylyl)(biphenylylphenylmethylfluorenyl)amine; (phenyl)(naphthyl)(biphenylylspirobifluorenyl)amine; (phenyl)(biphenylyl)(biphenylylspirobifluorenyl)amine; di(biphenylyl)(biphenylylspirobifluorenyl)amine; di(phenyl)(biphenylylspirobifluorenyl)amine; (phenyl)(methylphenyl)(biphenylylspirobifluorenyl)amine; di(methylphenyl)(biphenylylspirobifluorenyl)amine; (phenyl)(triphenylenyl)(biphenylyldimethylfluorenyl)amine; (naphthyl)(triphenylenyl)(biphenylyldimethylfluorenyl)amine; (phenyl)(naphthyl)(terphenylyldimethylfluorenyl)amine; (phenyl)(naphthyl)(terphenylyldimethylfluorenyl)amine; (phenyl)(biphenylyl)(terphenylyldimethylfluorenyl)amine; (phenyl)(naphthylphenyl)(terphenylyldimethylfluorenyl)amine; (phenyl)(naphthylphenyl)(terphenylyldimethylfluorenyl)amine; di(phenyl)bis(phenylthiophenylphenyl)biphenyldiamine; di(biphenylyl)bis(phenylthiophenylphenyl)biphenyldiamine; di(phenyl)bis(phenylthiophenylbiphenylyl)biphenyldiamine; di(phenyl)bis(phenylthiophenyldimethylfluorenyl)biphenyldiamine; di(phenyl)bis(phenylthiophenylphenyl)terphenyldiamine; di(phenyl)bis(phenylthiophenylphenyl)dimethylfluorenyldiamine; bis(dimethylfluorenyl)bis(phenylthiophenylphenyl)biphenyldiamine; di(naphthyl)bis(phenylthiophenylphenyl)biphenyldiamine; di(phenyl)bis(naphthylthiophenylphenyl)biphenyldiamine; di(phenyl)bis(phenylthiophenylnaphthyl)biphenyldiamine; tri(biphenylyl)(phenylthiophenylphenyl)biphenyldiamine; (phenyl)di(biphenylyl)(phenylthiophenylphenyl)biphenyldiamine; di(biphenylyl)(naphthyl)(phenylthiophenylphenyl)biphenyldiamine; di(biphenylyl)bis(phenylthiophenylphenyl)biphenyldiamine; (phenylthiophenylphenyl)bis(diphenylaminobiphenylyl)amine; (phenylthiophenylphenyl)bis(diphenylaminoterphenylyl)amine; (phenylthiophenylphenyl)bis(diphenylaminodimethylfluorenyl)amine; (terphenylyl)bis[phenyl(phenylthiophenylphenyl)aminobiphenylyl]amine; (phenylthiophenylphenyl)bis(phenylnaphthylaminobiphenylyl)amine; (phenyl)bis(diphenylaminophenyl)(phenylthiophenylphenyl)biphenyldiamine; bis(phenylthiophenylphenyl)bis(diphenylaminophenyl)biphenyldiamine; di(phenyl)bis[phenyl(phenylthiophenylphenyl)aminophenyl]biphenyldiamine; di(phenyl)bis[phenyl(phenylthiophenylphenyl)aminophenyl]terphenyldiamine; bis(phenylthiophenylphenyl)bis(diphenylaminobiphenylyl)biphenyldiamine; tris[phenyl(phenylthiophenylphenyl)aminobiphenylyl]amine; tris[phenyl(phenylthiophenylphenyl)aminophenyl]amine; (phenyl)bis(diphenylaminophenyl)(phenylthiophenylphenyl)biphenyldiamine; (phenyl)(naphthyl)[(phenylcarbazolyl)dimethylfluorenyl]amine; (phenyl)(naphthyl)[(phenylcarbazolyl)biphenylyl]amine; (phenyl)(naphthyl)[(phenylcarbazolyl)phenyl]amine; di(biphenylyl)[(phenylcarbazolyl)dimethylfluorenyl]amine; (phenyl)(naphthyl)[(diphenylcarbazolyl)dimethylfluorenyl]amine; di(biphenylyl)[(phenylcarbazolyl)phenyl]amine; (biphenylyl)(diphenylaminophenyl)[(phenylcarbazolyl)phenyl]amine; bis(diphenylaminophenyl)[(phenylcarbazolyl)phenyl]amine; (phenyl)(biphenylyl)[(phenylcarbazolyl)biphenylyl]amine; (phenyl)(naphthyl)[(phenylcarbazolyl)terphenylyl]amine; di(phenyl)[(phenylcarbazolyl)phenanthrenyl]amine; di(phenyl)[(phenylcarbazolyl)biphenylyl]amine; di(biphenylyl)[(phenylcarbazolyl)naphthyl]amine; bis(naphthylphenyl)[(phenylcarbazolyl)phenyl]amine; (phenyl)(biphenylyl)[(diphenylcarbazolyl)phenyl]amine; di(biphenylyl)[(phenylcarbazolyl)thiophenylphenyl]amine; di(biphenylyl)[(phenylcarbazolyl)dibenzothiophenylphenyl]amine; di(biphenylyl)[(phenylcarbazolyl)furanylphenyl]amine; (biphenylyl)(phenanthrenyl)[(phenylcarbazolyl)phenyl]amine; di(biphenylyl)[(naphthylmethylcarbazolyl)phenyl]amine; (phenyl)(biphenylyl)[(phenylcarbazolyl)dibenzofuranylphenyl]amine; di(biphenylyl)[(phenylbiphenylylcarbazolyl)phenyl]amine; (phenyl)(terphenylyl)[(phenylbiphenylylcarbazolyl)phenyl]amine; (phenyl)(terphenylyl)[(phenylbiphenylylcarbazolyl)phenyl]amine; bis(methylbiphenylyl)[(tert-butylphenylcarbazolyl)phenyl]amine; (biphenylyl)(diphenylaminobiphenylyl)[(phenylcarbazolyl)phenyl]amine; (phenyl)(phenyldimethylfluorenylaminobiphenylyl)[(phenylcarbazolyl)phenyl]amine; (phenyl)(phenylbiphenylylaminobiphenylyl)[(phenylcarbazolyl)biphenylyl]amine; (phenyl)[phenyl(diphenylaminophenyl)aminobiphenylyl][(phenylcarbazolyl)phenyl]amine; (diphenylaminophenyl)(diphenylaminobiphenylyl)[(phenylcarbazolyl)phenyl]amine; (diphenylaminophenyl)[phenyl(dimethylfluorenyl)aminophenyl][(phenylcarbazolyl)phenyl]amine; bis(dibenzofuranylphenyl)[(phenylcarbazolyl)phenyl]amine; bis(phenylthiophenylphenyl)[(diphenylcarbazolyl)phenyl]amine; bis(dibenzothiophenylphenyl)[(phenylcarbazolyl)phenyl]amine; bis(dibenzothiophenylphenyl)[(biphenylylcarbazolyl)phenyl]amine; di(terphenylyl)[(phenylcarbazolyl)phenyl]amine; di(biphenylyl)[(biphenylylcarbazolyl)phenyl]amine; di(biphenylyl)[(naphthylcarbazolyl)phenyl]amine; (naphthyl)(biphenylyl)[(phenylcarbazolyl)phenyl]amine; tri(phenyl)[(phenylcarbazolyl)phenyl]biphenyldiamine; (phenyl)bis[(phenylcarbazolyl)phenyl]amine; (biphenylyl)bis[(phenylcarbazolyl)phenyl]amine; (naphthyl)bis[(phenylcarbazolyl)phenyl]amine; di(biphenylyl)[(phenylcarbazolyl)biphenylyl]amine; di(phenyl)(carbazolylbiphenylyl)amine; (phenyl)(biphenylyl)(carbazolylbiphenylyl)amine; (phenyl)(biphenylyl)(carbazolylbiphenylyl)amine; (phenyl)(biphenylyl)(carbazolylbiphenylyl)amine; di(biphenylyl)(carbazolylbiphenylyl)amine; (phenyl)(naphthyl)(carbazolylbiphenylyl)amine; (naphthyl)(biphenylyl)(carbazolylbiphenylyl)amine; (phenyl)(naphthyl)(diphenylcarbazolylbiphenylyl)amine; di(biphenylyl)(carbazolyldimethylfluorenyl)amine; (phenyl)(naphthyl)(carbazolyldimethylfluorenyl)amine; (phenyl)(phenanthrenyl)(carbazolyldimethylfluorenyl)amine; (biphenylyl)(naphthyl)(carbazolyldimethylfluorenyl)amine;

(phenyl)(naphthyl)(carbazolyldimethylfluorenyl)amine; di(naphthyl)(carbazolyldimethylfluorenyl)amine; (phenyl)(naphthyl)(diphenylcarbazolyldimethylfluorenyl)amine; (phenyl)(biphenylyl)(carbazolyldimethylfluorenyl)amine; (phenyl)(biphenylyl)(carbazolylbiphenylyl)amine; (phenyl)(biphenylyl)(carbazolylbiphenylyl)amine; (phenyl)(biphenylyl)(carbazolylbiphenylyl)amine; di(biphenylyl)(carbazolylbiphenylyl)amine; di(biphenylyl)(carbazolylbiphenylyl)amine; di(biphenylyl)(carbazolylbiphenylyl)amine; (phenyl)bis(carbazolylbiphenylyl)amine; (phenyl)bis(carbazolyldimethylfluorenyl)amine; phenylbis[(diphenylamino)phenyl]carbazole; phenylbis[(phenyl(naphthyl)amino)phenyl]carbazole; di(terphenylyl)(carbazolyldimethylfluorenyl)amine; bis(naphthylphenyl)(carbazolyldimethylfluorenyl)amine; di(biphenylyl)(diphenylcarbazolyldimethylfluorenyl)amine; (phenyl)(biphenylyl)(carbazolyldimethylfluorenyl)amine; (phenyl)(dimethylfluorenyl)(carbazolyldimethylfluorenyl)amine; (biphenylyl)(dimethylfluorenyl)(carbazolyldimethylfluorenyl)amine; bis(dimethylfluorenyl)(carbazolyldimethylfluorenyl)amine; (naphthyl)(dimethylfluorenyl)(carbazolyldimethylfluorenyl)amine; di(biphenylyl)(carbazolylphenyl)amine; di(biphenylyl)(carbazolylphenyl)amine; di(naphthyl)(carbazolylphenyl)amine; (phenyl)(naphthyl)(carbazolylbiphenylyl)amine; di(biphenylyl)(carbazolyldimethylbiphenylyl)amine; (phenyl)(naphthyl)(carbazolylterphenylyl)amine; (phenyl)(naphthyl)(carbazolylterphenylyl)amine; tetra(biphenylyl)biphenyldiamine; di(phenyl)di(naphthyl)biphenyldiamine; di(naphthyl)di(biphenylyl)biphenyldiamine; (phenyl)(biphenylyl)di(naphthyl)biphenyldiamine; (phenyl)(naphthyl)di(biphenylyl)biphenyldiamine; di(biphenylyl)di(terphenylyl)biphenyldiamine; di(biphenylyl)di(terphenylyl)biphenyldiamine; di(phenyl)di(terphenylyl)biphenyldiamine; di(phenyl)di(terphenylyl)biphenyldiamine; (phenyl)di(biphenylyl)(terphenylyl)biphenyldiamine; tri(biphenylyl)(terphenylyl)biphenyldiamine; (phenyl)di(biphenylyl)(terphenylyl)biphenyldiamine; tri(biphenylyl)(terphenylyl)biphenyldiamine; di(biphenylyl)bis(naphthylphenyl)biphenyldiamine; tri(biphenylyl)(naphthylphenyl)biphenyldiamine; di(biphenylyl)bis(naphthylphenyl)biphenyldiamine; tri(biphenylyl)(naphthylphenyl)biphenyldiamine; di(biphenylyl)bis(dimethylfluorenyl)biphenyldiamine; tetrakis(dimethylfluorenyl)biphenyldiamine; tetrakis(dimethylfluorenyl)dimethylfluorenyldiamine; di(phenyl)bis(dimethylfluorenyl)biphenyldiamine; di(phenyl)di(naphthyl)dimethylfluorenyldiamine; (phenyl)bis(diphenylaminobiphenylyl)amine; (phenyl)bis[phenyl(biphenylyl)aminobiphenylyl]amine; (phenyl)bis[phenyl(naphthyl)aminobiphenylyl]amine; (biphenylyl)bis[diphenylaminobiphenylyl]amine; (biphenylyl)bis[diphenylaminoterphenylyl]amine; di(phenyl)bis(diphenylaminobiphenylyl)biphenyldiamine; di(phenyl)bis[phenyl(naphthyl)aminophenyl]biphenyldiamine; di(naphthyl)bis(diphenylaminobiphenylyl)biphenyldiamine; di(phenyl)bis(phenylthiophenylphenyl)biphenyldiamine; (biphenylyl)(dimethylfluorenyl)(phenylcarbazolylphenyl)amine; (phenyl)(diphenylfluorenyl)(phenylcarbazolylphenyl)amine; (phenyl)(dimethylfluorenyl)(phenylcarbazolylbiphenylyl)amine; (phenyl)(terphenylyl)(biphenylyldimethylfluorenyl)amine; di(biphenylyl)(biphenylyldimethylfluorenyl)amine; di(biphenylyl)(naphthyldimethylfluorenyl)amine; (biphenylyl)(dimethylfluorenyl)(phenylcarbazolylphenyl)amine; di(biphenylyl)(phenylcarbazolylphenyl)amine; (biphenylyl)(terphenylyl)(phenylcarbazolylphenyl)amine; (naphthyl)(dimethylfluorenyl)(phenylcarbazolylbiphenylyl)amine; (biphenylyl)(dibenzothiophenyl)(phenylcarbazolylbiphenylyl)amine; bis(naphthylphenyl)(phenanthrenylphenyl)amine; (biphenylyl)(phenylnaphthylphenyl)(naphthylphenyl)amine; (biphenylyl)(dibenzofuranylbiphenylyl)(naphthylphenyl)amine; di(biphenylyl)(dibenzofuranylbiphenylyl)amine; di(biphenylyl)(dibenzothiophenylbiphenylyl)amine; di(biphenylyl)(triphenylsilylbiphenylyl)amine; di(biphenylyl)(triphenylsilylbiphenylyl)amine; (phenyl)(diphenylfluorenyl)(triphenylsilylbiphenylyl)amine; (biphenylyl)bis(naphthylphenyl)amine; tris(naphthylphenyl)amine; (phenyl)bis(carbazolylbiphenylyl)amine; bis(dibenzofuranylphenyl)(carbazolylbiphenylyl)amine; (biphenylyl)(dibenzofuranylphenyl)(carbazolylbiphenylyl)amine; (terphenylyl)(dibenzofuranylphenyl)(carbazolylbiphenylyl)amine; (biphenylyl)(dibenzofuranylphenyl)(carbazolylbiphenylyl)amine; (biphenylyl)(dimethylfluorenyl)(carbazolylbiphenylyl)amine; (biphenylyl)(dibenzofuranyl)(carbazolylbiphenylyl)amine; (phenyl)(biphenylyl)(carbazolylbiphenylyl)amine; di(biphenylyl)(carbazolylbiphenylyl)amine; (phenyl)(diphenylfluorenyl)(triphenylsilylbiphenylyl)amine; (dimethylfluorenyl)(biphenylyl)(carbazolylphenyl)amine; (biphenylyl)bis(diphenylfluorenyl)amine; (biphenylyl)bis(spirobifluorenyl)amine In one embodiment, one or more compounds selected from each of the following groups (Group 1B) to (Group 33B) may also be independently used as the first organic compound and the second organic compound. Note that the first organic compound and the second organic compound in this specification are not limited to one or more compounds independently selected from each of the following groups (Group 1B) to (Group 33B), and may not be one or more compounds independently selected from each of the following groups (Group 1B) to (Group 33B).

(Group 1B)

9,10-di(2-naphthyl)anthracene (ADN); 2-tert-butyl-9,10-di(2-naphthyl)anthracene (TBADN); 5,6,11,12-tetraphenyltetracene (rubrene); 2,5,8,11-tetra-tert-butylperylene (TBP)

(Group 2B)

4,4'-bis[N-phenylamino]biphenyl; 4,4'-bis[(1-naphthyl)-N-phenylamino]biphenyl(NBP); 5,6,11,12-tetraphenyltetracene (rubrene); 9,10-bis[N-(1-phenylamino)biphenyl]; 2,5,8,11-tetra-tert-butylperylene (TBP); tris(8-quinolinato-N1,O8)aluminium ($Alq_3$); coumarin 545T (Group 3B)

N,N'-di(1-naphthyl)-N,N'-diphenyl-(1,1'-biphenyl)-4,4'-diamine (NPD); Alq3; 10-(2-benzothiazolyl)-1,1,7,7-tetramethyl-2,3,6,7-tetrahydro-1H,5H,11H-[1]benzopyrano[6,7,8-ij]quinolizine-11-one (C545T); rubrene (5,6,11,12-tetraphenyltetracene); 4,4'-bis(2,2-diphenylvinyl)biphenyl (DPVBi)

(Group 4B)

TBADN; TBP (Group 5B)

TBADN; Alq3; TBP; 5,6,11,12-tetraphenyltetracene (rubrene); 4-(dicyanomethylene)-2-tert-butyl-6-(1,1,7,7-tetramethyljulolidin-4-yl-vinyl)-4H-pyran (DCJTB)

(Group 6B)

tetracene; tetrafluoro-tetracyano-quinodimethane (F4-TCNQ); 4,4',4"-tris[phenyl(m-tolyl)amino]triphenylamine; naphthalene tetracarboxylic Dianhydride (NTCDA); Leuco-Crystal Violet (LCV); N,N'-bis(3-methylphenyl)-N,N'-bis(phenyl)-benzidine (TPD)

(Group 9B)

1-(2,2'-binaphthalene-6-yl)-3-(phenanthrene-9-yl)benzene (hereinafter also referred to as “compound 9-1”); iridium (III)bis(2-phenylquinolyl-N,$C^{2'}$)acetylacetonate (hereinafter also referred to as “compound 9-2”); 9-{3-[6-phenyl-2-phenylpyrimidine-4-yl]-5-(9H-carbazole-9-yl)phenyl}-9H-carbazole (hereinafter also referred to as “compound 9-3”); tris[2-phenylpyridinato-$C^2$,N]iridium(III) (hereinafter also referred to as “compound 9-4”)

(Group 10B)

1,3-di(9H-carbazole-9-yl)benzene (hereinafter also referred to as “compound 10-1”); [2,2'-bis(2',4'-difluoro-2,3'-bipyridinato-2-yl)propane-C,N,N,C]platinum(II) (hereinafter also referred to as “compound 10-2”); 4,4',4"-tris[2-naphthyl (phenyl)amino]triphenylamine (2-TNATA); 2,3,5,6-tetrafluoro-7,7,8,8-tetracyano-quinodimethane (F4-TCNQ); 3,3'-di(9H-carbazole-9-yl)-1,1'-biphenyl(hereinafter also referred to as “compound 10-5”); [2-(2',4'-difluoro-2,3'-bipyridinato-2-yl)-2-{6-(5-trifluoromethyl-1H-pyrazole-1-yl)pyridinato-2-yl-C,N,N,C}propane-C,N,N,C]platinum(II) (hereinafter also referred to as “compound 10-6”); [2,2'-bis (2,3'-bipyridinato-2-yl)propane-C,N,N,C]platinum(II) (hereinafter also referred to as “compound 10-7”); iridium (III)bis(2-phenylquinolyl-N,$C^{2'}$)acetylacetonate (hereinafter also referred to as “compound 10-8”); 9,10-di(2-naphthyl) anthracene (hereinafter also referred to as “compound 10-9”); 2,5,8,11-tetra-tert-butylperylene (hereinafter also referred to as “compound 10-10”); 10-(2-benzothiazolyl)-1, 1,7,7-tetramethyl-11-oxo-1,2,3,5,6,7-hexahydro-11H-[1] benzopyrano[6,7,8-ij]quinolizine-9-yde (hereinafter also referred to as “compound 10-11”); 2-[6-[2-[(2,3,6,7-tetrahydro-1H,5H-benzo[ij]quinolizine)-9-yl]ethenyl]-2-methyl-4H-pyran-4-ilidene]propane dinitrile (hereinafter also referred to as “compound 10-12”)

(Group 12B)

2-{4'-triphenylenyl-[1,1'-biphenyl]-3-yl}-4,6-diphenyl-1,3,5-triazine (hereinafter also referred to as “compound 12-1”); 9-[4,6-diphenyl-2-pyridyl]-9'-phenyl-3,3'-bis[9H-carbazole] (hereinafter also referred to as “compound 12-2”); 9-(1,1'-biphenyl-3-yl)-9'-(1,1'-biphenyl-4-yl)-3,3'-bis[9H-carbazole] (hereinafter also referred to as “compound 12-3”)

(Group 13B)

9-[3'-(triphenylene-2-yl)-1,1'-biphenyl]-9H-carbazole (hereinafter also referred to as “compound 13-1”); 11-(4,6-diphenyl-1,3,5-triazine-2-yl)-12-(4'-phenyl-1,1'-biphenyl-4-yl)-11H,12H-indolo[2,3-a]carbazole (hereinafter also referred to as “compound 13-2”)

(Group 14B)

2-(1-(1,1'-biphenyl-4-yl)-9H-carbazole-9-yl)-4,6-diphenyl-1,3,5-triazine (hereinafter also referred to as “compound 14-1”); iridium(III)bis(2-(3,5-dimethylphenyl)-5-(2-methylpropyl)quinolyl-N,$C^{2'}$)acetylacetonate (hereinafter also referred to as “compound 14-2”); 2-(1-(9,9'-dimethylfluorene-2-yl)-9H-carbazole-9-yl)-4,6-diphenyl-1,3,5-triazine (hereinafter also referred to as “compound 14-3”); iridium (III)bis(2-(3,5-dimethylphenyl)quinolyl-N,$C^{2'}$)acetylacetonate (hereinafter also referred to as “compound 14-4”); 2-(1-phenyl-9H-carbazole-9-yl)-4-(9,9'-dimethylfluorene-2-yl)-6-phenyl-1,3,5-triazine (hereinafter also referred to as “compound 14-5”); iridium(III)bis(2-(3,5-dimethylphenyl) quinolyl-N,$C^2$)2,2,8,8-tetramethyl-4,6-nonanedionate (hereinafter also referred to as “compound 14-6”); 2-(1-(1,1'-biphenyl-4-yl)-9H-carbazole-9-yl)-4,6-diphenyl-1,3,5-triazine (hereinafter also referred to as “compound 14-7”); iridium(III)bis(2-(3,5-dimethylphenyl)-7-(2-methylpropyhquinolyl-N,$C^{2'}$)acetylacetonate (hereinafter also referred to as “compound 14-8”); 2-(1-phenyl-9H-carbazole-9-yl)-4-(9,9'-dimethylfluorene-2-yl)-6-phenyl-1,3,5-triazine (hereinafter also referred to as “compound 14-9”); iridium(III)bis(2-(3,5-dimethylphenyl)-5-cyclopentylquinolyl-N,$C^{2'}$) acetylacetonate (hereinafter also referred to as “compound 14-10”); 2-(1-(1,1'-biphenyl-3-yl)-9H-carbazole-9-yl)-4,6-diphenyl-1,3,5-triazine (hereinafter also referred to as “compound 14-11”); iridium(III)bis(2-(3,5-dimethylphenyl)-6-(2-methylpropyhquinolyl-N,$C^{2'}$)acetylacetonate (hereinafter also referred to as “compound 14-12”); 11-(1, 1'-biphenyl-4-yl)-12-(4,6-diphenyl-1,3,5-triazine-2-yl)-11H,12H-indolo[2,3-a]carbazole (hereinafter also referred to as “compound 14-13”); iridium(III)bis(2-phenylpyridyl-N,$C^{2'}$) (4-methyl-5-(4-fluorophenyl)-2-phenylpyridyl-N, $C_2'$) (hereinafter also referred to as “compound 14-14”); 11-phenyl-12-(4-(1,1'-biphenyl-4-yl)-6-phenyl-1,3,5-triazine-2-yl)-11H,12H-indolo[2,3-a]carbazole (hereinafter also referred to as “compound 14-15”); iridium(III)bis(2-phenylpyridyl-N,$C^{2'}$) (2,5-diphenylpyridyl-N,$C_2'$) (hereinafter also referred to as “compound 14-16”); 12-(4,6-diphenyl-1,3,5-triazine-2-yl)-12H-[1]benzothieno[2,3-a]carbazole (hereinafter also referred to as “compound 14-17”); iridium (III)bis(2-phenylpyridyl-N,$C^{2'}$) (4-isopropyl-2,5-diphenylpyridyl-N,$C_2'$) (hereinafter also referred to as “compound 14-18”); 11-phenyl-12-(4-(9,9-dimethylfluorene-2-yl)-6-phenyl-1,3,5-triazine-2-yl)-11H,12H-indolo[2,3-a]carbazole (hereinafter also referred to as “compound 14-19”); iridium(III)bis(2-phenylpyridyl-N,$C^{2'}$) (5-(4-fluorophenyl)-2-phenylpyridyl-N,$C_2'$) (hereinafter also referred to as “compound 14-20”); 5-phenyl-11-(4,6-diphenyl-1,3,5-triazine-2-yl)-5H,11H-indolo[3,2-b]carbazole (hereinafter also referred to as “compound 14-21”); iridium(III)bis(2-phenylpyridyl-N,$C^{2'}$) (4-methyl-2,5-diphenylpyridyl-N,$C_2'$) (hereinafter also referred to as “compound 14-22”); iridium (III)bis(2-phenylpyridyl-N,$C^{2'}$) (4-(methyl-$d_3$)-2,5-diphenylpyridyl-N,$C_2'$) (hereinafter also referred to as “compound 14-23”); 5-phenyl-11-(4-(9,9-dimethylfluorene-2-yl)-6-phenyl-1,3,5-triazine-2-yl)-5H,11H-indolo[3,2-b]carbazole (hereinafter also referred to as “compound 14-24”); iridium (III)bis(2-phenylpyridyl-N,$C^{2'}$) (4-(4-methylphenyl)-2-phenylpyridyl-N,$C_2'$) (hereinafter also referred to as “compound 14-25”); 2-(7,7-dimethylindeno[2,1-b]carbazole-5-yl)-4-(1, 1'-biphenyl-4-yl)-6-phenyl-1,3,5-triazine (hereinafter also referred to as “compound 14-26”); iridium(III)bis(2-phenylpyridyl-N,$C^{2'}$) (4-(4-fluorophenyl)-2-phenylpyridyl-N, $C_2'$) (hereinafter also referred to as “compound 14-27”); 5-phenyl-12-(4,6-diphenyl-1,3,5-triazine-2-yl)-5H,12H-indolo[3,2-a]carbazole (hereinafter also referred to as “compound 14-28”); iridium(III)bis(5-methyl-2-phenylpyridyl-N,$C^{2'}$) (4-methyl-2,5-diphenylpyridyl-N,$C_2'$) (hereinafter also referred to as “compound 14-29”); iridium(III)bis(5-(methyl-$d_3$)-2-phenylpyridyl-N,$C^{2'}$) (4-(methyl-$d_3$)-5-phenyl-2-phenylpyridyl-N,$C_2'$) (hereinafter also referred to as “compound 14-30”)

(Group 15B)

4-[3-(triphenylene-2-yl)phenyl]-6-phenyldibenzothiophene (hereinafter also referred to as “compound 15-1”); 2-(6-(1, 1'-biphenyl-4-yl)-dibenzothiophene-4-yl)-4,6-diphenyl-1,3,5-triazine (hereinafter also referred to as “compound 15-2”); iridium(III)bis(2-phenylpyridyl-N,$C^{2'}$) (4-methyl-2,5-diphenylpyridyl-N,$C_2'$) (hereinafter also referred to as “compound 15-3”); 2-(6-(4'-phenyl-1,1'-biphenyl-3-yl)-dibenzothiophene-4-yl)-4,6-diphenyl-1,3,5-triazine (hereinafter also referred to as “compound 15-4”); 2-{3-(6-(4'-phenyl-1,1'-biphenyl-3-yl)-dibenzothiophene-4-yl)phenyl}-4,6-diphenyl-1,3,5-triazine (hereinafter also referred to as “compound 15-5”); 2-{3-(6-(1,1'-biphenyl-3-yl)-dibenzothiophene-4-yl) phenyl}-4,6-diphenyl-1,3,5-triazine (hereinafter also referred to as "compound 15-6"); 2-{3-(dibenzothiophene-4-yl)phenyl}-4,6-diphenyl-1,3,5-triazine (hereinafter also referred to as "compound 15-7"); 2-{3-(dibenzothiophene-4-yl)-5-(1,1'-biphenyl-4-yl)-phenyl}-4,6-diphenyl-1,3,5-triazine (hereinafter also referred to as "compound 15-8"); 2-{3-(dibenzothiophene-4-yl)-5-(9,9-dimethylfluorene-2-yl)-phenyl}-4,6-diphenyl-1,3,5-triazine (hereinafter also referred to as "compound 15-9"); 2-{3-(6-(1,1'-biphenyl-4-yl)-dibenzothiophene-4-yl)phenyl}-4,6-diphenyl-1,3,5-triazine (hereinafter also referred to as "compound 15-10"); 2,4,6-tri(1,1'-biphenyl-4-yl)-1,3,5-triazine (hereinafter also referred to as "compound 15-11"); 2,4-bis(terphenyl -4-yl)-6-phenyl-1,3,5-triazine (hereinafter also referred to as "compound 15-12"); 2-(3-(3-pyridyl)-5-(phenanthrene-9-yl)-phenyl)-4,6-diphenyl-1,3,5-triazine (hereinafter also referred to as "compound 15-13"); 2-(9,9-dimethylfluorene-2-yl)-4,6-bis(1,1'-biphenyl-3-yl)-1,3,5-triazine (hereinafter also referred to as "compound 15-14"); 2-(3-(dibenzothiophene-4-yl)-phenyl)-4,6-bis(1,1'-biphenyl-3-yl)-1,3,5-triazine (hereinafter also referred to as "compound 15-15"); 2-(3-(9-(2-pyridyl)-9H-carbazole-3-yl)-5-(dibenzothiophene-4-yl)-phenyl)-4,6-diphenyl-1,3,5-triazine (hereinafter also referred to as "compound 15-16"); 2-(9H-carbazole-9-yl)-4-phenyl-6-(triphenylene-2-yl)-1,3,5-triazine (hereinafter also referred to as "compound 15-17"); 2-{5-(6-phenyl-dibenzofuran-4-yl)-1,1'-biphenyl-3-yl}-4,6-diphenyl-1,3,5-triazine (hereinafter also referred to as "compound 15-18"); 2-{5-(6-phenyldibenzothiophene-4-yl)-1,1'-biphenyl-3-yl}-4,6-diphenyl-1,3,5-triazine (hereinafter also referred to as "compound 15-19"); 2-{5-(6-(1,1'-biphenyl-4-yl)-dibenzothiophene-4-yl)-1,1'-biphenyl-3-yl}-4,6-diphenyl-1,3,5-triazine (hereinafter also referred to as "compound 15-20"); 2-{5-(6-(1,1'-biphenyl-3-yl)-dibenzothiophene-4-yl)-1,1'-biphenyl-3-yl}-4,6-diphenyl-1,3,5-triazine (hereinafter also referred to as "compound 15-21"); 2-(5-(dibenzothiophene-4-yl)-1,1'-biphenyl-3-yl)-4-(1,1'-biphenyl-4-yl)-6-phenyl-1,3,5-triazine (hereinafter also referred to as "compound 15-22"); 2-(5-(dibenzothiophene-4-yl)-1,1'-biphenyl-3-yl)-4-(9,9-dimethylfluorene-2-yl)-6-phenyl-1,3,5-triazine (hereinafter also referred to as "compound 15-23"); 2-(5-(6-phenyldibenzothiophene-4-yl)-1,1'-biphenyl-3-yl)-4-(9,9-dimethylfluorene-2-yl)-6-phenyl-1,3,5-triazine (hereinafter also referred to as "compound 15-24"); 2-{3'-phenyl-5'-(dibenzothiophene-4-yl)-1,1'-biphenyl-3-yl}-4,6-diphenyl-1,3,5-triazine (hereinafter also referred to as "compound 15-25"); 2-{5-phenyl-5'-(dibenzothiophene-4-yl)-1,1'-biphenyl-3-yl}-4,6-diphenyl-1,3,5-triazine (hereinafter also referred to as "compound 15-26"); 2-{5-(9,9-dimethylfluorene-2-yl)-4'-phenyl-1,1'-biphenyl-3-yl}-4,6-diphenyl-1,3,5-triazine (hereinafter also referred to as "compound 15-27"); bis(9,9-dimethylfluorene-2-yl)-phenyl}-4,6-diphenyl-1,3,5-triazine (hereinafter also referred to as "compound 15-28"); 2-(3-(6-phenyldibenzothiophene-4-yl)-phenyl)-4-(1,1'-biphenyl-3-yl)-6-phenyl-1,3,5-triazine (hereinafter also referred to as "compound 15-29"); 2-{4-(6-phenyldibenzothiophene-4-yl)-phenyl}-4,6-diphenyl-1,3,5-triazine (hereinafter also referred to as "compound 15-30"); 2-{3'-(6-phenyldibenzothiophene-4-yl)-1,1'-biphenyl-4-yl}-4,6-diphenyl-1,3,5-triazine (hereinafter also referred to as "compound 15-31"); 2-{4'-(6-phenyldibenzothiophene-4-yl)-1,1'-biphenyl-3-yl}-4,6-diphenyl-1,3,5-triazine (hereinafter also referred to as "compound 15-32"); 2-(6-(1,1'-biphenyl-4-yl)-dibenzothiophene-4-yl)-4-(1,1'-biphenyl-3-yl)-6-phenyl-1,3,5-triazine (hereinafter also referred to as "compound 15-33"); 2-{4-(6-(1,1'-biphenyl-4-yl)-dibenzothiophene-4-yl)-phenyl)-4,6-diphenyl-1,3,5-triazine (hereinafter also referred to as "compound 15-34"); 2-{4-(6-(1,1'-biphenyl-3-yl)-dibenzothiophene-4-yl)-phenyl}-4,6-diphenyl-1,3,5-triazine (hereinafter also referred to as "compound 15-35"); 2-(6-phenyldibenzothiophene-4-yl)-4-(9,9-dimethylfluorene-2-yl)-6-phenyl-1,3,5-triazine (hereinafter also referred to as "compound 15-36"); 2-{ (6-(1,1'-biphenyl-4-yl)-dibenzothiophene-4-yl}-4-(9,9-dimethylfluorene-2-yl)-6-phenyl-1,3,5-triazine (hereinafter also referred to as "compound 15-37"); 2-{3-(6-(1,1'-biphenyl-4-yl)-dibenzothiophene-4-yl)-phenyl)-4-(9,9-dimethylfluorene-2-yl)-6-phenyl-1,3,5-triazine (hereinafter also referred to as "compound 15-38"); 2-{3-(2,7-diphenyldibenzothiophene-4-yl)-phenyl}-4,6-diphenyl-1,3,5-triazine (hereinafter also referred to as "compound 15-39"); 2-{4'-(6-(1,1'-biphenyl-4-yl)-dibenzothiophene-4-yl)-1,1'-biphenyl-3-yl}-4,6-diphenyl-1,3,5-triazine (hereinafter also referred to as "compound 15-40"); 2-(9,9-dimethylfluorene-2-yl)-4,6-bis(4'-phenyl-1,1'-biphenyl-3-yl)-1,3,5-triazine (hereinafter also referred to as "compound 15-41"); 2-(dibenzothiophene-4-yl)-4-(9,9-dimethylfluorene-2-yl)-6-(4'-phenyl-1,1'-biphenyl-3-yl)-1,3,5-triazine (hereinafter also referred to as "compound 15-42"); 2-[3'-(triphenylene-2-yl)-1,1'-biphenyl-4-yl]-4,6-diphenyl-1,3,5-triazine (hereinafter also referred to as "compound 15-43"); 2-[4'-(dibenzofuran-4-yl)-1,1'-biphenyl-3-yl]-4,6-diphenyl-1,3,5-triazine (hereinafter also referred to as "compound 15-44"); 4-(triphenylene-2-yl)-dibenzofuran (hereinafter also referred to as "compound 15-45"); 4-(triphenylene-2-yl)-dibenzothiophene (hereinafter also referred to as "compound 15-46"); 4-(3-(triphenylene-2-yl)phenyl)-dibenzothiophene (hereinafter also referred to as "compound 15-47"); 4-(3-phenyl-5-(triphenylene-2-yl)phenyl)-dibenzothiophene (hereinafter also referred to as "compound 15-48"); 4-(1,1'-biphenyl-4-yl)-5-(triphenylene-2-yl)-dibenzothiophene (hereinafter also referred to as "compound 15-49"); 4-(9H-carbazole-9-yl)-5-(triphenylene-2-yl)-dibenzofuran (hereinafter also referred to as "compound 15-50"); 4-(9H-carbazole-9-yl)-5-(triphenylene-2-yl)-dibenzothiophene (hereinafter also referred to as "compound 15-51"); 9-(3'-(triphenylene-2-yl)-1,1'-biphenyl-3-yl)-9H-carbazole (hereinafter also referred to as "compound 15-52"); 9-(3'-(triphenylene-2-yl)-1,1'-biphenyl-4-yl)-9H-carbazole (hereinafter also referred to as "compound 15-53"); [2-{3-(triphenylene-2-yl)phenyl}pyridine-3-yl]-9H-carbazole (hereinafter also referred to as "compound 15-54"); 2-(6-phenyldibenzofuran-4-yl)-4,6-diphenyl-1,3,5-triazine (hereinafter also referred to as "compound 15-55"); 2-(6-phenyldibenzothiophene-4-yl)-4,6-diphenyl-1,3,5-triazine (hereinafter also referred to as "compound 15-56"); 2-(6-(1,1'-biphenyl-4-yl) dibenzothiophene-4-yl)-4,6-diphenyl-1,3,5-triazine (hereinafter also referred to as "compound 15-57"); 2-[3-(6-(1,1'-biphenyl-4-yl)dibenzofuran-4-yl)phenyl]-4,6-diphenyl-1,3,5-triazine (hereinafter also referred to as "compound 15-58"); 2-(6-phenyldibenzothiophene-4-yl)-4,6-bis(1,1'-biphenyl-3-yl)-1,3,5-triazine (hereinafter also referred to as "compound 15-59"); 2-[3-(6-(1,1'-biphenyl-4-yl)dibenzofuran-4-yl)phenyl]-4,6-bis(phenyl-$d_5$)-1,3,5-triazine (hereinafter also referred to as "compound 15-60"); 2-{3-(dibenzothiophene-4-yl)-5-(1,1'-biphenyl-4-yl)phenyl}-4,6-diphenyl-1,3,5-triazine (hereinafter also referred to as "compound 15-61"); 9-[3-(9-(4'-phenyl-1,1'-biphenyl-3-yl)-9H-carbazole-3-yl)phenyl]-9H-carbazole (hereinafter also referred to as "compound 15-62"); 9-[3-(9-(4'-phenyl-1,1'-biphenyl-3-yl)-9H-carbazole-2-yl)phenyl]-9H-carbazole (hereinafter also referred to as "compound 15-63"); 9-[3-(9-(triphenylene-2-yl)-9H-carbazole-3-yl)phenyl]-9H-carbazole (hereinafter also referred to as "compound 15-64"); 9-[3-(9-(triphenylene-2-yl)-9H-carbazole-2-yl)phenyl]-9H- carbazole (hereinafter also referred to as "compound 15-65"); 9-[3-(9-(dibenzothiophene-4-yl)-9H-carbazole-3-yl)phenyl]-9H-carbazole (hereinafter also referred to as "compound 15-66"); 2-(dibenzofuran-4-yl)-4-(1,1'-biphenyl-4-yl)-6-(4'-phenyl-1,1'-biphenyl-3-yl)-1,3,5-triazine (hereinafter also referred to as "compound 15-67"); 2-(dibenzothiophene-4-yl)-4-(1,1'-biphenyl-4-yl)-6-(4'-phenyl-1,1'-biphenyl-3-yl)-1,3,5-triazine (hereinafter also referred to as "compound 15-68"); 2-(dibenzothiophene-4-yl)-4-(9,9-dimethylfluorene-2-yl)-6-(4'-phenyl-1,1'-biphenyl-3-yl)-1,3,5-triazine (hereinafter also referred to as "compound 15-69"); 2-(biphenylene-3-yl)-4-(9,9-dimethylfluorene-2-yl)-6-(4'-phenyl-1,1'-biphenyl-3-yl)-1,3,5-triazine (hereinafter also referred to as "compound 15-70")

(Group 16B)

11-(4-(1,1'-biphenyl-4-yl)-6-phenyl-1,3,5-triazine-2-yl)-12-phenyl-11H,12H-indolo[2,3-a]carbazole (hereinafter also referred to as "compound 16-1"); 5-phenyl-12-(6-(9H-carbazole-9-yl)pyridine-2-yl)-5H,12H-indolo[3,2-a]carbazole (hereinafter also referred to as "compound 16-2"); 5-(9-phenylcarbazole-3-yl)-12-phenyl-5H,12H-indolo[3,2-a]carbazole (hereinafter also referred to as "compound 16-3"); 2-(3-(triphenylene-2-yl)phenyl)-dibenzothiophene (hereinafter also referred to as "compound 16-4"); 5,11-bis(2-phenyl-pyridine-6-yl)-5H,11H-indolo[3,2-b]carbazole (hereinafter also referred to as "compound 16-5"); 3,3'-di(9H-carbazole-9-yl)-1,1'-biphenyl(hereinafter also referred to as "compound 16-6")

(Group 17B)

9-(dibenzothiophene-4-yl)-9'-phenyl-3,3'-bi[9H-carbazole] (hereinafter also referred to as "compound 17-1"); 2-[3-(6-(1,1'-biphenyl-4-yl)dibenzofuran-4-yl)phenyl]-4,6-diphenyl-1,3,5-triazine (hereinafter also referred to as "compound 17-2"); 2-[3-(6-(1,1'-biphenyl-4-yl)dibenzofuran-4-yl)phenyl]-4,6-bis(phenyl-$d_5$)-1,3,5-triazine (hereinafter also referred to as "compound 17-3")

(Group 18B)

5-(1,1'-biphenyl-4-yl)-8-(4'-phenyl-1,1'-biphenyl-4-yl)-5H,8H-indolo[2,3-c]carbazole (hereinafter also referred to as "compound 18-1"); iridium(III)bis(2-phenylpyridyl-N,$C^{2'}$)(4-methyl-2,5-diphenylpyridyl-N,$C_2'$) (hereinafter also referred to as "compound 18-2"); 5,8-bis(1,1'-biphenyl-4-yl)-5H,8H-indolo[2,3-c]carbazole (hereinafter also referred to as "compound 18-3"); 5-(4'-phenyl-1,1'-biphenyl-3-yl)-12-(9,9-dimethylfluorene-2-yl)-5H,12H-indolo[3,2-a]carbazole (hereinafter also referred to as "compound 18-4"); 5-(1,1'-biphenyl-4-yl)-12-(9,9-dimethylfluorene-2-yl)-5H,12H-indolo[3,2-a]carbazole (hereinafter also referred to as "compound 18-5"); 2-{3-(dibenzothiophene-4-yl)-5-(1,1'-biphenyl-4-yl)-phenyl}-4,6-diphenyl-1,3,5-triazine (hereinafter also referred to as "compound 18-6"); 5-(1,1'-biphenyl-4-yl)-8-(4'-phenyl-1,1'-biphenyl-3-yl)-5H,8H-indolo[2,3-c]carbazole (hereinafter also referred to as "compound 18-7"); 5-(4'-phenyl-1,1'-biphenyl-4-yl)-8-(1,1'-biphenyl-3-yl)-5H,8H-indolo[2,3-c]carbazole (hereinafter also referred to as "compound 18-8"); 2-{5-(6-phenyldibenzothiophene-4-yl)-1,1'-biphenyl-3-yl}-4,6-diphenyl-1,3,5-triazine (hereinafter also referred to as "compound 18-9"); 5-(4'-phenyl-1,1'-biphenyl-4-yl)-12-(1,1'-biphenyl-4-yl)-5H,12H-indolo[3,2-a]carbazole (hereinafter also referred to as "compound 18-10"); 5-(4'-phenyl-1,1'-biphenyl-3-yl)-8-(dibenzothiophene-4-yl)-5H,8H-indolo[2,3-c]carbazole (hereinafter also referred to as "compound 18-11"); 2-{5-(6-(1,1'-biphenyl-4-yl)dibenzothiophene-4-yl)-1,1'-biphenyl-3-yl}-4,6-diphenyl-1,3,5-triazine (hereinafter also referred to as "compound 18-12"); 5-(4'-phenyl-1,1'-biphenyl-4-yl)-8-(triphenylene-2-yl)-5H,8H-indolo[2,3-c]carbazole (hereinafter also referred to as "compound 18-13"); 5-(4'-phenyl-1,1'-biphenyl-4-yl)-8-(3-(dibenzothiophene-4-yl)phenyl)-5H ,8H-indolo[2,3-c]carbazole (hereinafter also referred to as "compound 18-14"); 5-(4'-phenyl-1,1'-biphenyl-3-yl)-8-(3-(9H-carbazole-9-yl)phenyl)-5H,8H-indolo[2,3-c]carbazole (hereinafter also referred to as "compound 18-15"); 5-(4'-phenyl-1,1'-biphenyl-4-yl)-8-(dibenzofuran-2-yl)-5H,8H-indolo[2,3-c]carbazole (hereinafter also referred to as "compound 18-16"); 5-(4'-phenyl-1,1'-biphenyl-4-yl)-12-(4'-phenyl-1,1'-biphenyl-3-yl)-5H,12H-indolo[3,2-a]carbazole (hereinafter also referred to as "compound 18-17"); 2-{3-(6-(1,1'-biphenyl-4-yl)dibenzothiophene-4-yl)phenyl}-4,6-diphenyl-1,3,5-triazine (hereinafter also referred to as "compound 18-18"); 5-(4'-(phenyl-$d_5$)-1,1'-biphenyl-4-yl)-8-(phenyl-$d_5$)-5H,8H-indolo[2,3-c]carbazole (hereinafter also referred to as "compound 18-19"); 5-(4'-phenyl-1,1'-biphenyl-3-yl)-12-phenyl-5H,12H-indolo[3,2-a]carbazole (hereinafter also referred to as "compound 18-20"); 2-{4-(6-(1,1'-biphenyl-4-yl)dibenzothiophene-4-yl)phenyl}-4,6-diphenyl-1,3,5-triazine (hereinafter also referred to as "compound 18-21"); 2-{3-(6-(1,1'-biphenyl-4-yl)dibenzothiophene-4-yl)phenyl}-4,6-bis(phenyl-$d_5$)-1,3,5-triazine (hereinafter also referred to as "compound 18-22"); 5-(3'-(phenyl-$d_5$)-1,1'-biphenyl-4-yl)-8-(phenyl-$d_5$)-5H,8H-indolo[2,3-c]carbazole (hereinafter also referred to as "compound 18-23"); 2-{3-(6-(9,9-dimethylfluorene-2-yl)dibenzothiophene-4-yl)phenyl}-4,6-diphenyl-1,3,5-triazine (hereinafter also referred to as "compound 18-24"); 5-(4'-phenyl-1,1'-biphenyl-4-yl)-12-phenyl-5H,12H-indolo[3,2-a]carbazole (hereinafter also referred to as "compound 18-25"); 2-{5-(6-(9,9-dimethylfluorene-2-yl)dibenzothiophene-4-yl)-1,1'-biphenyl-3-yl}-4,6-diphenyl-1,3,5-triazine (hereinafter also referred to as "compound 18-26"); 5-(4'-phenyl-1,1'-biphenyl-3-yl)-12-(triphenylene-2-yl)-5H,12H-indolo[3,2-a]carbazole (hereinafter also referred to as "compound 18-27")

(Group 19B)

11-(4-(1,1'-biphenyl-4-yl)-6-phenyl-1,3,5-triazine-2-yl)-12-phenyl-11H,12H-indolo[2,3-a]carbazole (hereinafter also referred to as "compound 19-1"); 9-(2-naphthyl)-9'-phenyl-3,3'-bis[9H-carbazole] (hereinafter also referred to as "compound 19-2"); 11-(4,6,-bis(1,1'-biphenyl-4-yl)-1,3,5-triazine-2-yl)-12-phenyl-11H,12H-indolo[2,3-a]carbazole (hereinafter also referred to as "compound 19-3"); 9-(9-phenanthrenyl)-9'-phenyl-3,3'-bis[9H-carbazole] (hereinafter also referred to as "compound 19-4")

(Group 20B)

2-{5-(dibenzothiophene-4-yl)-4'-phenyl-1,1'-biphenyl-3-yl}-4,6-diphenyl-1,3,5-triazine (hereinafter also referred to as "compound 20-1"); 2-{5-(6-phenyldibenzothiophene-4-yl)-1,1'-biphenyl-3-yl}-4,6-diphenyl-1,3,5-triazine (hereinafter also referred to as "compound 20-2"); 2-{5-(6-(1,1'-biphenyl-4-yl)dibenzothiophene-4-yl)-1,1'-biphenyl-3-yl}-4,6-diphenyl-1,3,5-triazine (hereinafter also referred to as "compound 20-3"); 2-{5-(6-(1,1'-biphenyl-3-yl)dibenzothiophene-4-yl)-1,1'-biphenyl-3-yl}-4,6-diphenyl-1,3,5-triazine (hereinafter also referred to as "compound 20-4"); 2-{3-(6-(1,1'-biphenyl-4-yl)dibenzothiophene-4-yl)phenyl}-4,6-diphenyl-1,3,5-triazine (hereinafter also referred to as "compound 20-5"); 2-{4-(6-(1,1'-biphenyl-4-yl)dibenzothiophene-4-yl)phenyl}-4,6-diphenyl-1,3,5-triazine (hereinafter also referred to as "compound 20-6"); 2-{3-(6-(1,1'-biphenyl-4-yl)dibenzothiophene-4-yl)phenyl}-4,6-bis(phenyl-$d_5$)-1,3,5-triazine (hereinafter also referred to as "compound 20-7"); 2-{3-(6-(9,9-dimethylfluorene-2-yl)dibenzothiophene-4-yl)phenyl}-4,6-diphenyl-1,3,5-triazine (hereinafter also referred to as “compound 20-8”); 2-{5-(6-(9,9-dimethylfluorene-2-yl)dibenzothiophene-4-yl)-1,1'-biphenyl-3-yl}-4,6-diphenyl-1,3,5-triazine (hereinafter also referred to as “compound 20-9”); 6,6',9,9'-tetraphenyl-3,3'-bis[9H-carbazole] (hereinafter also referred to as “compound 20-10”); 9-(9,9-dimethylfluorene-2-yl)-9'-phenyl-3,3'-bis[9H-carbazole] (hereinafter also referred to as “compound 20-11”); 9-(1,1'-biphenyl-4-yl)-9'-phenyl-3,3'-bis[9H-carbazole] (hereinafter also referred to as “compound 20-12”); 9-phenyl-9'-(triphenylene-2-yl)-3,3'-bis[9H-carbazole] (hereinafter also referred to as “compound 20-13”); 9-(1,1'-biphenyl-4-yl)-9'-(dibenzothiophene-2-yl)-3,3'-bis[9H-carbazole] (hereinafter also referred to as “compound 20-14”); 9-(dibenzothiophene-2-yl)-9'-(9,9-dimethylfluorene-2-yl)-3,3'-bis[9H-carbazole] (hereinafter also referred to as “compound 20-15”); 9,9'-bis(1,1'-biphenyl-4-yl)-3,3'-bis[9H-carbazole] (hereinafter also referred to as “compound 20-16”); 9-(dibenzothiophene-2-yl)-9'-phenyl-3,3'-bis[9H-carbazole] (hereinafter also referred to as “compound 20-17”); 9-(dibenzothiophene-4-yl)-9'-phenyl-3,3'-bis[9H-carbazole] (hereinafter also referred to as “compound 20-18”); 9-(dibenzothiophene-4-yl)-9'-phenyl-3,4'-bis[9H-carbazole] (hereinafter also referred to as “compound 20-19”)

(Group 21B)

4-{3-(1,1'-biphenyl-4-yl)phenyl}-6-phenyl-dibenzothiophene (hereinafter also referred to as “compound 21-1”); 2-{3-(6-(1,1'-biphenyl-4-yl)dibenzothiophene-4-yl)phenyl}-4,6-diphenyl-1,3,5-triazine (hereinafter also referred to as “compound 21-2”); 4-(triphenylene-2-yl)-6-(1,1'-biphenyl-4-yl)-dibenzothiophene (hereinafter also referred to as “compound 21-3”); 4-{3-(1,1'-biphenyl-4-yl)phenyl}-dibenzothiophene (hereinafter also referred to as “compound 21-4”); 1,6-bis(9H-carbazole-9-yl)-[1]benzothieno[2,3-c]pyridine (hereinafter also referred to as “compound 21-5”); iridium(III)bis(2-phenylpyridyl-N,$C^{2\prime}$) (4-ethyl-2,5-diphenylpyridyl-N,$C_2'$) (hereinafter also referred to as “compound 21-6”)

(Group 22B)

2-{5-(dibenzothiophene-4-yl)-1,1'-biphenyl-3-yl}-4,6-diphenyl-1,3,5-triazine (hereinafter also referred to as “compound 22-1”); 2-{5-(6-phenyldibenzothiophene-4-yl)-1,1'-biphenyl-3-yl}-4,6-diphenyl-1,3,5-triazine (hereinafter also referred to as “compound 22-2”); 2-{5-(6-(1,1'-biphenyl-4-yl)dibenzothiophene-4-yl)-1,1'-biphenyl-3-yl}-4,6-diphenyl-1,3,5-triazine (hereinafter also referred to as “compound 22-3”); 2-{5-(6-(1,1'-biphenyl-3-yl)dibenzothiophene-4-yl)-1,1'-biphenyl-3-yl}-4,6-diphenyl-1,3,5-triazine (hereinafter also referred to as “compound 22-4”); 2-{5-(dibenzothiophene-3-yl)-1,1'-biphenyl-3-yl}-4,6-diphenyl-1,3,5-triazine (hereinafter also referred to as “compound 22-5”); 2-{5-(dibenzothiophene-3-yl)-4'-phenyl-1,1'-biphenyl-3-yl}-4,6-diphenyl-1,3,5-triazine (hereinafter also referred to as “compound 22-6”); 2-{3-(6-(1,1'-biphenyl-4-yl)dibenzothiophene-4-yl)phenyl}-4,6-bis(phenyl-$d_5$)-1,3,5-triazine (hereinafter also referred to as “compound 22-7”); 2-{3-(6-(9,9-dimethylfluorene-2-yl)dibenzothiophene-4-yl)phenyl}-4,6-diphenyl-1,3,5-triazine (hereinafter also referred to as “compound 22-8”); 2-{5-(6-(9,9-dimethylfluorene-2-yl)dibenzothiophene-4-yl)-1,1'-biphenyl-3-yl}-4,6-diphenyl-1,3,5-triazine (hereinafter also referred to as “compound 22-9”); 2-{3'-triphenylenyl-[1,1'-biphenyl]-3-yl}-4,6-diphenyl-1,3,5-triazine (hereinafter also referred to as “compound 22-10”); 2-(6-(4'-phenyl-1,1'-biphenyl-4-yl)dibenzothiophene-4-yl)-4-(1,1'-biphenyl-3-yl)-6-phenyl-1,3,5-triazine (hereinafter also referred to as “compound 22-11”); 5-{4-(4,6-diphenyl-1,3,5-triazine-2-yl)phenyl}-8-phenyl-5H,8H-indolo[2,3-c]carbazole (hereinafter also referred to as “compound 22-12”); 5-(1,1'-biphenyl-4-yl)-8-(4'-phenyl-1,1'-biphenyl-3-yl)-5H,8H-indolo[2,3-c]carbazole (hereinafter also referred to as “compound 22-13”); 5-(1,1'-biphenyl-3-yl)-8-(4'-phenyl-1,1'-biphenyl-4-yl)-5H,8H-indolo[2,3-c]carbazole (hereinafter also referred to as “compound 22-14”); 5-(4'-phenyl-1,1'-biphenyl-4-yl)-12-(1,1'-biphenyl-4-yl)-5H,12H-indolo[3,2-a]carbazole (hereinafter also referred to as “compound 22-15”); 5-(dibenzothiophene-4-yl)-8-(4'-phenyl-1,1'-biphenyl-3-yl)-5H,8H-indolo[2,3-c]carbazole (hereinafter also referred to as “compound 22-16”); 5-(triphenylene-2-yl)-8-(4'-phenyl-1,1'-biphenyl-4-yl)-5H,8H-indolo[2,3-c]carbazole (hereinafter also referred to as “compound 22-17”); 5-{3-(dibenzothiophene-4-yl)phenyl}-8-(4'-phenyl-1,1'-biphenyl-4-yl)-5H,8H-indolo[2,3-c]carbazole (hereinafter also referred to as “compound 22-18”); 5-{3-(9H-carbazole-9-yl)phenyl}-8-(4'-phenyl-1,1'-biphenyl-3-yl)-5H,8H-indolo[2,3-c]carbazole (hereinafter also referred to as “compound 22-19”); 5-(4'-phenyl-1,1'-biphenyl-4-yl)-12-(4'-phenyl-1,1'-biphenyl-3-yl)-5H,12H-indolo[3,2-a]carbazole (hereinafter also referred to as “compound 22-20”); 5-(4'-(phenyl-$d_5$)-1,1'-biphenyl-4-yl)-8-(phenyl-$d_5$)-5H,8H-indolo[2,3-c]carbazole (hereinafter also referred to as “compound 22-21”); 5-(4'-phenyl-1,1'-biphenyl-3-yl)-12-phenyl-5H,12H-indolo[3,2-a]carbazole (hereinafter also referred to as “compound 22-22”); 5-(3'-(phenyl-$d_5$)-1,1'-biphenyl-4-yl)-8-(phenyl-$d_5$)-5H,8H-indolo[2,3-c]carbazole (hereinafter also referred to as “compound 22-23”); 5-(4'-phenyl-1,1'-biphenyl-4-yl)-12-phenyl-5H,12H-indolo[3,2-a]carbazole (hereinafter also referred to as “compound 22-24”); 5-(4'-phenyl-1,1'-biphenyl-3-yl)-12-(triphenylene-2-yl)-5H,12H-indolo[3,2-a]carbazole (hereinafter also referred to as “compound 22-25”); 5-{3-phenyl(1,1'-biphenyl-3-yl)}-8-(4'-phenyl-1,1'-biphenyl-3-yl)-5H,8H-indolo[2,3-c]carbazole (hereinafter also referred to as “compound 22-26”)

(Group 23B)

2,4-bis(1,1'-biphenyl-3-yl)-6-(10H-[1]benzothieno[3,2-b]indole-10-yl)-1,3,5-triazine (hereinafter also referred to as “compound 23-1”); 3-(10-phenyl-5,10-dimethyl-5,10-dihydroindolo[3,2-b]indole-5-yl)phenyl-1,3,5-triazine (hereinafter also referred to as “compound 23-2”); 2-(1,1'-biphenyl-3-yl)-4-(10H-benzofuro[3,2-b]indole-10-yl)-6-phenyl-1,3,5-triazine (hereinafter also referred to as “compound 23-3”); 9-(2-naphthyl)-9'-phenyl-3,3'-bis[9H-carbazole] (hereinafter also referred to as “compound 23-4”); 9-(1,1'-biphenyl-3-yl)-9'-phenyl-3,3'-bis[9H-carbazole] (hereinafter also referred to as “compound 23-5”); 3-(dibenzofuran-2-yl)-9-(5-phenyl(1,1'-biphenyl-3-yl))-9H-carbazole (hereinafter also referred to as “compound 23-6”); 3-(dibenzothiophene-2-yl)-9-(2-naphthylbenzene-3-yl)-9H-carbazole (hereinafter also referred to as “compound 23-7”); 11-(4,6-diphenyl-1,3,5-triazine-2-yl)-12-phenyl-11H,12H-indolo[2,3-a]carbazole (hereinafter also referred to as “compound 23-8”); 9,9'-diphenyl-3,3'-bis[9H-carbazole] (hereinafter also referred to as “compound 23-9”)

(Group 24B)

11-(4-(1,1':3',1"-terbenzene-3-yl)-6-phenyl-1,3,5-triazine-2-yl)-12-phenyl-11H,12H-indolo[2,3-a]carbazole (hereinafter also referred to as “compound 24-1”); 11-(4-(1,1'-biphenyl-3-yl)-6-phenyl-1,3,5-triazine-2-yl)-12-phenyl-11H,12H-indolo[2,3-a]carbazole (hereinafter also referred to as “compound 24-2”); 11-(4-(1,1'-biphenyl-4-yl)-6-phenyl-1,3,5-triazine-2-yl)-12-phenyl-11H,12H-indolo[2,3-a]carbazole (hereinafter also referred to as “compound 24-3”); 9-(1,1'-biphenyl-2-yl)-9'-(1,1'-biphenyl-3-yl)-3,3'-bis[9H-carbazole] (hereinafter also referred to as “compound 24-4”);

9,9'-bis(1,1'-biphenyl-2-yl)-3,3'-bis[9H-carbazole] (hereinafter also referred to as “compound 24-5”)

(Group 25B)

2-(1,1'-biphenyl-4-yl)-4-phenyl-6-(9,9'-spirobifluorene-4-yl)-1,3,5-triazine (hereinafter also referred to as “compound 25-1”); 9-(1,1'-biphenyl-3-yl)-9'-(1,1'-biphenyl-4-yl)-3,3'-bis[9H-carbazole] (hereinafter also referred to as “compound 25-2”); 9-phenyl-9'-(triphenylene-2-yl)-3,3'-bis[9H-carbazole] (hereinafter also referred to as “compound 25-3”); 2-(1,1'-biphenyl-3-yl)-4-phenyl-6-(9,9'-spirobifluorene-4-yl)-1,3,5-triazine (hereinafter also referred to as “compound 25-4”); 2,4,6-tri(1,1'-biphenyl-3-yl)-1,3,5-triazine (hereinafter also referred to as “compound 25-5”); N,N'-diphenyl-N,N'-bis(1-naphthyl)benzidine (hereinafter also referred to as “compound 25-6”); 4,7-diphenyl-1,10-phenanthroline (hereinafter also referred to as “compound 25-7”); (9,9-dimethylfluorene-3-yl) (9-phenyl-9H-carbazole-3-yl) (1,1':3',1"-terbenzene-5'-yl)amine (hereinafter also referred to as “compound 25-8”)

(Group 26B)

9-(7-cyanotriphenylene-2-yl)-9'-phenyl-3,3'-bis[9H-carbazole] (hereinafter also referred to as “compound 26-1”); 9-(4'-cyano-1,1'-biphenyl-4-yl)-9'-phenyl-3,3'-bis[9H-carbazole] (hereinafter also referred to as “compound 26-2”); 9-(5-(4,6-diphenyl-1,3,5-triazine-2-yl)-1,1'-biphenyl-3-yl)-9'-phenyl-2,3'-bis[9H-carbazole] (hereinafter also referred to as “compound 26-3”); 9-(3-(4-(1,1'-biphenyl-3-yl)-6-phenyl-1,3,5-triazine-2-yl)phenyl)-9'-phenyl-2,3'-bis[9H-carbazole] (hereinafter also referred to as “compound 26-4”); 9-(3'-(4,6-diphenyl-1,3,5-triazine-2-yl)-1 ,1'-biphenyl-3-yl)-9'-phenyl-2,3'-bis[9H-carbazole] (hereinafter also referred to as “compound 26-5”); 9-(3-(4,6-diphenyl-1,3,5-triazine-2-yl)phenyl)-9'-phenyl-2,3'-bis[9H-carbazole] (hereinafter also referred to as “compound 26-6”)

(Group 28B)

tris(4-(6H-6-aza-12-oxaindeno[1,2-b]fluorene-6-yl)phenyl)amine (hereinafter also referred to as “compound 28-1”); 5-methyl-8-((4-(5-methyl-5H,8H-indolo[2,3-c]carbazole-8-yl)-phenyl) (2-pyridyl)phosphoryl)-5H,8H-indolo[2,3-c]carbazole (hereinafter also referred to as “compound 28-2”); tetrakis (4-(6H-6-aza-8-oxaindeno[2,3-b]fluorene-6-yl)-phenyl)silane (hereinafter also referred to as “compound 28-3”); 2,5-bis(4-(6H-6-aza-12-oxaindeno[1,2-b]fluorene-6-yl)phenyl)furan (hereinafter also referred to as “compound 28-4”); tetrakis (4-(6H-6-aza-8-oxaindeno[2,3-b]fluorene-6-yl)-phenyl)germane (hereinafter also referred to as “compound 28-5”); 1,4-bis(4-(7-aza-7H-12-thiaindeno[1,2-a]fluorene-7-yl)phenyl)-5,5-dimethyl-1,3-cyclopentadiene (hereinafter also referred to as “compound 28-6”)

(Group 29B)

9-(7-cyanotriphenylene-2-yl)-9'-phenyl-3,3'-bis[9H-carbazole] (hereinafter also referred to as “compound 29-1”); 9-(3-(4,6-diphenyl-1,3,5-triazine-2-yl)phenyl)-9'-phenyl-2,3'-bis[9H-carbazole] (hereinafter also referred to as “compound 29-2”); 9-(4'-cyano-1,1'-biphenyl-4-yl)-9'-phenyl-3,3'-bis[9H-carbazole] (hereinafter also referred to as “compound 29-3”)

(Group 30B)

1,3-bis(9H-carbazole-9-yl)benzene (hereinafter also referred to as “compound 30-1”); bis[4-[9,9-dimethylacridine-10 (9H)-yl]phenyl]sulfone (hereinafter also referred to as “compound 30-2”); 4,4'-bis(9-carbazolyl)-1,1'-biphenyl (hereinafter also referred to as “compound 30-3”); 4,4'-bis(9-carbazolyl)-1,1'-benzophenone (hereinafter also referred to as “compound 30-4”); bis(2-((oxo)diphenylphosphino)phenyl)ether (hereinafter also referred to as “compound 30-5”); 4,4'-bis(9-dimethoxycarbazole)-1,1'-benzophenone (hereinafter also referred to as “compound 30-6”)

(Group 31B)

11-(4-(1,1'-biphenyl-4-yl)-6-phenyl-1,3,5-triazine-2-yl)-12-phenyl-11H,12H-indolo[2,3-a]carbazole (hereinafter also referred to as “compound 31-1”); 11-(4-(3'-phenyl-1,1'-biphenyl-3-yl)-6-phenyl-1,3,5-triazine-2-yl)-12-phenyl-11H,12H-indolo[2,3-a]carbazole (hereinafter also referred to as “compound 31-2”); 11-(4-(3'-phenyl-1,1'-biphenyl-4-yl)-6-phenyl-1,3,5-triazine-2-yl)-12-phenyl-11H,12H-indolo[2,3-a]carbazole (hereinafter also referred to as “compound 31-3”); 11-(4,6-diphenyl-1,3,5-triazine-2-yl)-12-(4'-phenyl-1,1'-biphenyl-4-yl)-11H,12H-indolo[2,3-a]carbazole (hereinafter also referred to as “compound 31-4”); 11-(4,6-bis(1,1'-biphenyl-4-yl)-1,3,5-triazine-2-yl)-12-phenyl-11H,12H-indolo[2,3-a]carbazole (hereinafter also referred to as “compound 31-5”); 11-(4-(1,1'-biphenyl-4-yl)-6-phenyl-1,3,5-triazine-2-yl)-12-(1,1'-biphenyl-3-yl)-11H,12H-indolo[2,3-a]carbazole (hereinafter also referred to as “compound 31-6”); 9-(1,1'-biphenyl-3-yl)-9'-phenyl-3,3'-bis[9H-carbazole] (hereinafter also referred to as “compound 31-7”); 9-(1,1'-biphenyl-4-yl)-9'-phenyl-3,3'-bis[9H-carbazole] (hereinafter also referred to as “compound 31-8”); 9-(1,1'-biphenyl-3-yl)-9'-(1,1'-biphenyl-4-yl)-3,3'-bis[9H-carbazole] (hereinafter also referred to as “compound 31-9”)

(Group 32B)

2-(1,1'-biphenyl-3-yl)-4-[3-(9H-carbazole-9-yl)phenyl]-6-(dibenzofuran-3-yl)-1,3,5-triazine (hereinafter also referred to as “compound 32-1”); iridium(III)tris(5'-phenyl-2-phenylpyridyl-N,$C_2$') (hereinafter also referred to as “compound 32-2”); 8-(4-(4,6-di(naphthalene-2-yl)-1,3,5-triazine-2-yl)phenyl)quinoline (hereinafter also referred to as “compound 32-3”); Liq (hereinafter also referred to as “compound 32-4”); 2-(1,1'-biphenyl-3-yl)-4-[3-(9H-carbazole-9-yl)phenyl]-6-(dibenzofuran-4-yl)-1,3,5-triazine (hereinafter also referred to as “compound 32-5”); 2-[3'-(9H-carbazole-9-yl)-1,1'-biphenyl-4-yl]-4-(dibenzofuran-3-yl)-6-phenyl-1,3,5-triazine (hereinafter also referred to as “compound 32-6”); 2-[4'-(9H-carbazole-9-yl)-1,1'-biphenyl-3-yl]-4-(dibenzofuran-3-yl)-6-phenyl-1,3,5-triazine (hereinafter also referred to as “compound 32-7”); 2-(1,1'-biphenyl-4-yl)-4-[3-(9H-carbazole-9-yl)phenyl]-6-(dibenzofuran-3-yl)-1,3,5-triazine (hereinafter also referred to as “compound 32-8”); 2-(1,1'-biphenyl-4-yl)-4-[4-(9H-carbazole-9-yl)phenyl]-6-(dibenzofuran-3-yl)-1,3,5-triazine (hereinafter also referred to as “compound 32-9”); 2-[3-(9H-carbazole-9-yl)phenyl]-4-(dibenzofuran-3-yl)-6-phenyl-1,3,5-triazine (hereinafter also referred to as “compound 32-10”); 2-[4-(9H-carbazole-9-yl)phenyl]-4-(dibenzofuran-3-yl)-6-phenyl-1,3,5-triazine (hereinafter also referred to as “compound 32-11”); 2-[3-(3-phenyl-9H-carbazole-9-yl)phenyl]-4-(dibenzofuran-3-yl)-6-phenyl-1,3,5-triazine (hereinafter also referred to as “compound 32-12”); 2-[4-(3-phenyl-9H-carbazole-9-yl)phenyl]-4-(dibenzofuran-3-yl)-6-phenyl-1,3,5-triazine (hereinafter also referred to as “compound 32-13”); 9,9'-bis(1,1'-biphenyl-4-yl)-3,3'-bis[9H-carbazole] (hereinafter also referred to as “compound 32-14”); 5,8-bis(1,1'-biphenyl-4-yl)-5H,8H-indolo[2,3-c]carbazole (hereinafter also referred to as “compound 32-15”); 2-(3-phenyl-9H-carbazole-9-yl)-4-(dibenzofuran-3-yl)-6-phenyl-1,3,5-triazine (hereinafter also referred to as “compound 32-16”); 2-[3-(9H-carbazole-9-yl)phenyl]-4-phenyl-6-(dibenzofuran-3-yl)-pyrimidine (hereinafter also referred to as “compound 32-17”)

(Group 33B)

2,8-bis(trifluoromethoxy)-10,12-bis(dicyanomethylene)-10,12-dihydroindeno[2,1-b]fluorene (hereinafter also referred to as “compound 33-1”); N-phenyl-N-(1,1':4',1"-terphenyl- 4-yl)-N',N'-bis(1,1'-biphenyl-4-yl)-1,1'-biphenyl-4,4'-diamine (hereinafter also referred to as "compound 33-2"); N,N-bis(4-(dibenzofuran-4-yl)phenyl)[1,1':4',1"-terphenyl]-4-amine (hereinafter also referred to as "compound 33-3"); biphenyl-2-yl-bis(9,9'-spirobi[9H-fluorene]-2-yl)amine (hereinafter also referred to as "compound 33-4"); 2,8-bis(3,5-bis(trifluoromethyl)phenyl)-10,12-bis(dicyanomethylene)-10,12-dihydroindeno[1,2-b]fluorene (hereinafter also referred to as "compound 33-5"); N-(naphthalene-1-yl)-N-phenyl-N',N'-bis(1,1'-biphenyl-4-yl)-1,1'-biphenyl-4,4'-diamine (hereinafter also referred to as "compound 33-6"); N,N-bis(1,1'-biphenyl-4-yl)-4-(9-phenyl-9H-carbazole-3-yl)aniline; (hereinafter also referred to as "compound 33-7"); N,N-bis(biphenyl-4-yl)-3'-(9H-carbazole-9-yl)-1,1'-biphenyl-4-amine (hereinafter also referred to as "compound 33-8"); N-biphenyl-2-yl-N-9,9-dimethylfluorene-2-yl-(9,9'-spirobi[9H-fluorene]-2-yl)amine (hereinafter also referred to as "compound 33-9"); 6,12-bis(dicyanomethylene)-2,8-bis(3-trifluoromethyl-4-fluorophenyl)-5,11-diazaindeno[1,2-b]fluorene (hereinafter also referred to as "compound 33-10"); biphenyl-2-yl-bis(9,9'-diphenyl-9H-fluorene-2-yl)amine (hereinafter also referred to as "compound 33-11"); N-(1,1'-biphenyl-4-yl)-N-(9,9-dimethylfluorene-2-yl)-4-(9-phenyl-9H-carbazole-3-yl)aniline (hereinafter also referred to as "compound 33-12")

In one embodiment, one or more combinations of the first organic compound and the second organic compound selected from the following may also be used. "(AA; BB)" below means a combination of a compound AA and a compound BB. The combination of the first organic compound and the second organic compound in this specification may not be independently one or more combinations selected from the following.

(ADN; TBADN; TBP)
(TBADN; TBP)
(TBADN; 5,6,11,12-tetraphenyltetracene)
(4,4'-bis[N-phenylamino]biphenyl; 5,6,11,12-tetraphenyltetracene)
(NBP; 5,6,11,12-tetraphenyltetracene)
(9,10-bis[N-(1-phenylamino)biphenyl]; TBP)
(TBADN; TBP)
(Alq; coumarin 545T)
(NPD; Alq3)
(NPD; Alq3; C545T)
(NPD; Alq3; 5,6,11,12-tetraphenyltetracene)
(NPD; DPVBi)
(NPD; 5,6,11,12-tetraphenyltetracene; DPVBi)
(NPD; C545T; 5,6,11,12-tetraphenyltetracene; DPVBi)
(TBADN; TBP)
(TBADN; TBP)
(TBADN; Alq3)
(5,6,11,12-tetraphenyltetracene; DCJTB)
(tetracene; F4-TCNQ)
(NTCDA; LCV)
(F4-TCNQ; 4,4',4"-tris[phenyl(m-tolyl)amino]triphenylamine)
(F4-TCNQ; TPD)
(compound 9-1; compound 9-2)
(compound 9-3; compound 9-4)
(compound 10-1; compound 10-2)
(2-TNATA; F4-TCNQ)
(compound 10-5; compound 10-6; compound 10-7; compound 10-8)
(compound 10-9; compound 10-10; compound 10-11; compound 10-12)
(compound 12-1; compound 12-2)
(compound 12-1; compound 12-3)
(compound 13-1; compound 13-2)
(compound 14-1; compound 14-2)
(compound 14-3; compound 14-4)
(compound 14-5; compound 14-6)
(compound 14-7; compound 14-8)
(compound 14-9; compound 14-10)
(compound 14-11; compound 14-12)
(compound 14-13; compound 14-14)
(compound 14-15; compound 14-16)
(compound 14-17; compound 14-18)
(compound 14-19; compound 14-20)
(compound 14-21; compound 14-22)
(compound 14-21; compound 14-23)
(compound 14-24; compound 14-25)
(compound 14-26; compound 14-27)
(compound 14-28; compound 14-29)
(compound 14-28; compound 14-30)
(compound 15-1; compound 15-2; compound 15-3)
(compound 15-1; compound 15-4; compound 15-3)
(compound 15-3; compound 15-5)
(compound 15-3; compound 15-6)
(compound 15-1; compound 15-7; compound 15-3)
(compound 15-1; compound 15-8; compound 15-3)
(compound 15-1; compound 15-9; compound 15-3)
(compound 15-1; compound 15-10; compound 15-3)
(compound 15-11; compound 15-3)
(compound 15-42; compound 15-3)
(compound 15-1; compound 15-43; compound 15-3)
(compound 15-1; compound 15-44; compound 15-3)
(compound 16-1; compound 16-2)
(compound 16-1; compound 16-3)
(compound 16-4; compound 16-5)
(compound 16-1; compound 16-6)
(compound 17-1; compound 17-2)
(compound 17-1; compound 17-3)
(compound 18-1; compound 18-2)
(compound 18-3; compound 18-2)
(compound 18-4; compound 18-2)
(compound 18-5; compound 18-2)
(compound 18-6; compound 18-7)
(compound 18-6; compound 18-8)
(compound 18-9; compound 18-10)
(compound 18-9; compound 18-11)
(compound 18-12; compound 18-13)
(compound 18-12; compound 18-14)
(compound 18-12; compound 18-15)
(compound 18-16; compound 18-8)
(compound 18-16; compound 18-7)
(compound 18-16; compound 18-17)
(compound 18-18; compound 18-19)
(compound 18-18; compound 18-20)
(compound 18-21; compound 18-7)
(compound 18-21; compound 18-8)
(compound 18-22; compound 18-23)
(compound 18-24; compound 18-25)
(compound 18-26; compound 18-27)
(compound 19-1; compound 19-2)
(compound 19-3; compound 19-4)
(compound 19-1; compound 19-4)
(compound 20-1; compound 20-10)
(compound 20-2; compound 20-11)
(compound 20-2; compound 20-12)
(compound 20-3; compound 20-13)
(compound 20-3; compound 20-14)
(compound 20-3; compound 20-15)
(compound 20-3; compound 20-16)
(compound 20-4; compound 20-17)

(compound 20-4; compound 20-16)
(compound 20-4; compound 20-10)
(compound 20-5; compound 20-18)
(compound 20-5; compound 20-19)
(compound 20-6; compound 20-17)
(compound 20-6; compound 20-10)
(compound 20-7; compound 20-18)
(compound 20-8; compound 20-18)
(compound 20-9; compound 20-16)
(compound 21-1; compound 21-2)
(compound 21-3; compound 21-2)
(compound 21-4; compound 21-5)
(compound 21-4; compound 21-5; compound 21-6)
(compound 22-1; compound 22-13)
(compound 22-1; compound 22-13)
(compound 22-2; compound 22-15)
(compound 22-2; compound 22-16)
(compound 22-3; compound 22-17)
(compound 22-3; compound 22-18)
(compound 22-3; compound 22-19)
(compound 22-4; compound 22-14)
(compound 22-4; compound 22-13)
(compound 22-4; compound 22-20)
(compound 22-5; compound 22-21)
(compound 22-5; compound 22-22)
(compound 22-6; compound 22-13)
(compound 22-6; compound 22-14)
(compound 22-7; compound 22-23)
(compound 22-8; compound 22-24)
(compound 22-9; compound 22-25)
(compound 22-10; compound 22-13)
(compound 22-11; compound 22-26)
(compound 22-12; compound 22-13)
(compound 23-1; compound 23-4)
(compound 23-1; compound 23-5)
(compound 23-1; compound 23-6)
(compound 23-1; compound 23-7)
(compound 23-2; compound 23-4)
(compound 23-2; compound 23-5)
(compound 23-2; compound 23-6)
(compound 23-3; compound 23-4)
(compound 23-3; compound 23-5)
(compound 23-8; compound 23-9)
(compound 24-1; compound 24-4)
(compound 24-2; compound 24-5)
(compound 24-3; compound 24-5)
(compound 25-1; compound 25-2)
(compound 25-1; compound 25-3)
(compound 25-4; compound 25-2)
(compound 25-4; compound 25-3)
(compound 25-5; compound 25-6)
(compound 25-7; compound 25-8)
(compound 26-1; compound 26-3)
(compound 26-1; compound 26-4)
(compound 26-1; compound 26-5)
(compound 26-2; compound 26-6)
(compound 28-1; compound 28-2)
(compound 28-3; compound 28-4)
(compound 28-5; compound 28-6)
(compound 29-1; compound 29-2)
(compound 29-3; compound 29-2)
(compound 30-1; compound 30-2)
(compound 30-3; compound 30-4)
(compound 30-5; compound 30-6)
(compound 31-1; compound 31-7)
(compound 31-2; compound 31-8)
(compound 31-3; compound 31-8)
(compound 31-3; compound 31-9)
(compound 31-4; compound 31-8)
(compound 31-5; compound 31-9)
(compound 31-6; compound 31-8)
(compound 32-1; compound 32-2)
(compound 32-3; compound 32-4)
(compound 32-5; compound 32-2)
(compound 32-6; compound 32-2)
(compound 32-7; compound 32-2)
(compound 32-8; compound 32-2)
(compound 32-9; compound 32-2)
(compound 32-10; compound 32-2)
(compound 32-11; compound 32-2)
(compound 32-12; compound 32-2)
(compound 32-13; compound 32-2)
(compound 32-8; compound 32-14; compound 32-2)
(compound 32-9; compound 32-14; compound 32-2)
(compound 32-12; compound 32-14; compound 32-2)
(compound 32-13; compound 32-14; compound 32-2)
(compound 32-6; compound 32-14; compound 32-2)
(compound 32-7; compound 32-14; compound 32-2)
(compound 32-12; compound 32-15; compound 32-2)
(compound 32-16; compound 32-15; compound 32-2)
(compound 32-10; compound 32-14; compound 32-2)
(compound 32-17; compound 32-14; compound 32-2)
(compound 33-1; compound 33-2)
(compound 33-1; compound 33-3)
(compound 33-1; compound 33-4)
(compound 33-5; compound 33-2)
(compound 33-5; compound 33-6)
(compound 33-5; compound 33-3)
(compound 33-5; compound 33-7)
(compound 33-5; compound 33-8)
(compound 33-5; compound 33-9)
(compound 33-10; compound 33-6)
(compound 33-5; compound 33-11)
(compound 33-10; compound 33-6)
(compound 33-10; compound 33-3)
(compound 33-10; compound 33-11)
(compound 33-10; compound 33-7)
(compound 33-5; compound 33-12)

In one embodiment, one or more compounds selected from the first organic compound and the second organic compound in mixture A may also be independently used as the first organic compound and the second organic compound. Note that the first organic compound and the second organic compound in this specification may not be one or more compounds selected from the first organic compound and the second organic compound in mixture A.

<Other Components, Etc.>

The mixed powder according to an aspect of the invention may or may not contain a component other than the first component and the second component.

In one embodiment, the mixed powder consists of the first component and the second component, or consists essentially of the first component and the second component. In the latter case, the mixed powder may contain inevitable impurities.

In one embodiment, the mixed powder contains the first component and the second component in an amount of 80% by mass or more, 85% by mass or more, 90% by mass or more, 95% by mass or more, 99% by mass or more, 99.5% by mass or more, 99.9% by mass or more, 99.99% by mass or more, or 100% by mass.

In one embodiment, the mixed powder contains the first component and the second component in an amount of 80% mol % or more, 85% mol % or more, 90% mol % or more, 95% mol % or more, 99% mol % or more, 99.5% mol % or more, 99.9% mol % or more, 99.99% mol % or more, or 100% mol %.

In one embodiment, the mixed powder consists of the first component, the second component and a third component or consists essentially of the first component, the second component and the third component. In the latter case, the mixed powder may contain inevitable impurities. The third component is an arbitrary organic compound (third organic compound).

In one embodiment, the mixed powder contains the first component, the second component and the third component in an amount of 80% by mass or more, 85% by mass or more, 90% by mass or more, 95% by mass or more, 99% by mass or more, 99.5% by mass or more, 99.9% by mass or more, 99.99% by mass or more, or 100% by mass.

In one embodiment, the mixed powder contains the first component, the second component and the third component in an amount of 80% mol % or more, 85% mol % or more, 90% mol % or more, 95% mol % or more, 99% mol % or more, 99.5% mol % or more, 99.9% mol % or more, 99.99% mol % or more, or 100% mol %.

<Method of Selecting First Organic Compound and Second Organic Compound]

The method of selecting organic compounds according to an aspect of the invention may be expressed as follow:

A method of selecting a first organic compound and a second organic compound comprised in a mixed powder which is solid at normal temperature and pressure, and is for an organic electroluminescence device, comprising:

selecting the first organic compound and the second organic compound so as to satisfy the following formulas (1) and (2):

$$0<MOL2/(MOL1+MOL2)\leq 0.2 \quad (1)$$

$$-20^\circ\ C.\leq T1-T2\leq 40^\circ\ C. \quad (2)$$

wherein in the formulas (1) and (2),

MOL1 [mol %] is a molar concentration of the first organic compound in the mixed powder, MOL2 [mol %] is a molar concentration of the second organic compound in the mixed powder, T1 [° C.] is a temperature of the first organic compound when $P1/M1^{1/2}=0.04\times\{MOL1/(MOL1+MOL2)\}$ is satisfied, T2 [° C.] is a temperature of the second organic compound when $P2/M2^{1/2}=0.04\times\{MOL2/(MOL1+MOL2)\}$ is satisfied, M1 [kg/mol] is the molecular weight of the first organic compound, P1 [Pa] is a vapor pressure of the first organic compound obtained by simultaneous thermogravimetry and differential thermal analysis at an arbitrary temperature, M2 [kg/mol] is the molecular weight of the second organic compound, P2 [Pa] is a vapor pressure of the second organic compound obtained by simultaneous thermogravimetry and differential thermal analysis at an arbitrary temperature.

Each condition in the above method of selecting is as described in the mixed powder according to an aspect of the invention described above.

In the method of selecting organic compounds according to an aspect of the invention, generally, for a first component having a vapor deposition characteristic, a second component of which a vapor deposition characteristic curve (of temperature and $P/M^{1/2}$) appears in a high-temperature side in a certain degree is selected and combined. Specifically, they may be selected considering a mole ratio thereof and formula (2).

<Mixed Powder and Method of Producing Mixed Powder>

The mixed powder according to an aspect of the invention may be composed of particles containing the first component and the second component in one particle, or may be a mixture composed of a powder of the first component and a powder of the second component.

As a method of producing the mixed powder according to an aspect of the invention, for example, a method wherein the first component and the second component are pulverized and mixed using a mortar or the like. When the amount of material used is large, such as when pulverizing and mixing, or when using for a large-scale vapor deposition machine, pulverizing and mixing using a pulverizer may be used.

The powder may be produced by a method wherein the first organic compound and the second organic compound is placed in a container or the like, heated and melted in a chemically inert environment, followed by cooling to an ambient temperature, and the obtained mixture may be pulverized by a mixer or the like to obtain a powder may be given. By the latter method, the first component and the second component can be mixed at the molecular level. As a result, it is possible to prevent a problem such as uneven mixing that may occur during conveyance of the mixed powder.

The mixed powder may be formed into pellets by a compression molding.

[Method of Vapor-Depositing]

The method of vapor-depositing according to one aspect of the invention includes heating and vaporizing the above-mentioned mixed powder according to one aspect of the invention from a single vapor deposition source to form a film on a surface to be vapor-deposited of an opposing base material located above the vapor deposition source. The other conditions are not particularly limited, a general vapor deposition equipment and general conditions for vapor deposition may be employed.

Vapor deposition is usually carried out under vacuum (under a pressure lower than atmospheric pressure). The pressure inside the equipment during the vapor deposition is preferably 5.0 Pa or lower, more preferably 1.0 Pa or lower. The heating temperature during the vapor deposition is usually 150° C. to 400° C., and preferably 200° C. to 350° C.

In the method of vapor-depositing according to one aspect of the invention, a mixed powder which is obtained by melt-mixing a powder of a first component and a powder of a second component to obtain a solidified material, and pulverizing the solidified material, may be used to the vapor deposition.

Alternatively, as described above, the mixed powder may be compressed in advance to form pellets, and the pellets may be put into a vapor deposition source to perform the vapor deposition.

[Applicable Technical Field]

The mixed powder and method of vapor-depositing according to one aspect of the invention can be applied to any technical field including vapor deposition of an organic compound to form a film, and can be applied to, for example, fabrication of organic semiconductor devices such as an organic EL device, an organic transistor, an organic solar cell, and the like. As an example, a method of fabricating an organic EL device using the mixed powder according to one aspect of the invention will be described below.

[Method of Fabricating Organic EL Device]

The method of fabricating an organic EL device according to an aspect of the invention may be expressed as follow:

A method of fabricating an organic electroluminescence device comprising a cathode, an anode, and one or two or more organic layers disposed between the cathode and the anode, the organic layers comprising an emitting layer; comprising:

heating and vaporizing a mixed powder from a vapor deposition source to deposite at least one layer of the one or two or more organic layers, wherein the mixed powder comprises a first organic compound and a second organic compound, the mixed powder is solid at normal temperature and pressure, and the following formulas (1) and (2) are satisfied for the mixed powder:

$$0<MOL2/(MOL1+MOL2)\leq 0.2 \quad (1)$$

$$-20°\ C.\leq T1-T2\leq 40°\ C. \quad (2)$$

wherein in the formulas (1) and (2),

MOL1 [mol %] is a molar concentration of the first organic compound in the mixed powder, MOL2 [mol %] is a molar concentration of the second organic compound in the mixed powder, T1 [° C.] is a temperature of the first organic compound when $P1/M1^{1/2}=0.04\times\{MOL1/(MOL1+MOL2)\}$ is satisfied, T2 [° C.] is a temperature of the second organic compound when $P2/M2^{1/2}=0.04\times\{MOL2/(MOL1+MOL2)\}$ is satisfied, M1 [kg/mol] is the molecular weight of the first organic compound, P1 [Pa] is a vapor pressure of the first organic compound obtained by simultaneous thermogravimetry and differential thermal analysis at an arbitrary temperature, M2 [kg/mol] is the molecular weight of the second organic compound, P2 [Pa] is a vapor pressure of the second organic compound obtained by simultaneous thermogravimetry and differential thermal analysis at an arbitrary temperature, provided that the first organic compound and the second organic compound are different compounds.

The mixed powder and the method of vapor-depositing in the above method of fabrication are as described above in the mixed powder and method of vapor-depositing in one aspect of the invention.

As the device configuration of the organic EL device, the structures obtained by stacking structures represented by each of the following (1) to (4) on a substrate are exemplified.

(1) anode/emitting layer/cathode
(2) anode /hole-transporting zone/emitting layer/cathode
(3) anode/emitting layer/electron-transporting zone/cathode
(4) anode/hole-transporting zone/emitting layer/electron-transporting zone/cathode "/" indicates that the layers are stacked directly adjacent to each other.

The electron-transporting zone is a region composed of one, or two or more organic layers containing an electron-transporting compound (also referred to as an "electron-transport layer" and/or an "electron-injecting layer"), and the hole-transporting zone is a region composed of one, or two or more organic layers containing a hole-transporting compound (also referred to as a "hole-transporting layer" and/or a "hole-injecting layer").

Figure 2:
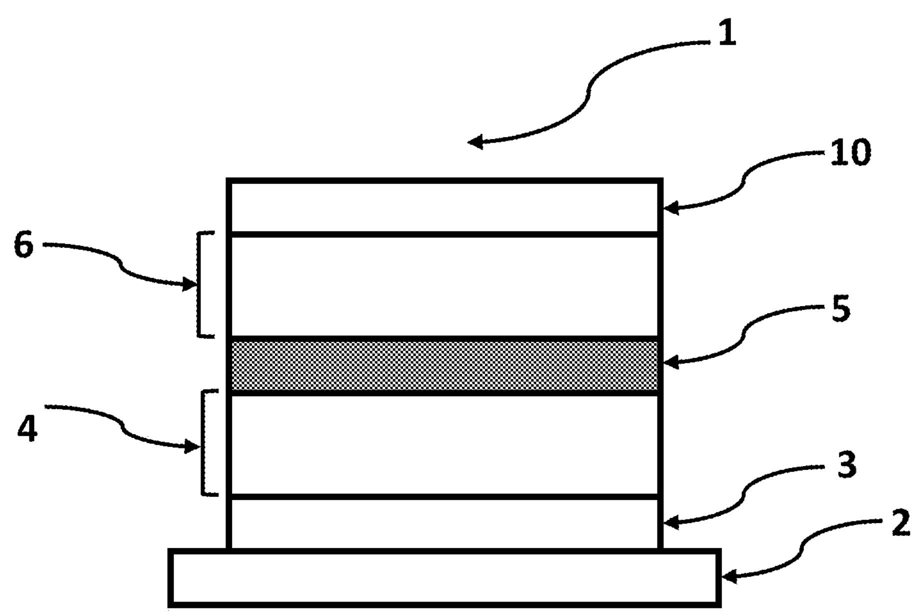
FIG. 2 is a diagram showing a schematic configuration of an organic EL device obtained by a method of fabricating an organic EL device according to an aspect of the invention.

The schematic configuration of the organic EL device will be described with reference to FIG. 2. The organic EL device 1 includes a substrate 2, an anode 3, an emitting layer 5, a cathode 10, a hole transport zone 4 between the anode 3 and the emitting layer 5, and an electron-transporting zone 6 between the emitting layer 5 and the cathode 10.

In the method of fabricating an organic EL device according to one aspect of the invention, at least one layer in the organic layers of the organic EL device is formed by a vapor deposition process using the mixed powder. The layer to be formed by the use of the mixed powder is not particularly limited, and may be any organic layer. Two or more layers of the organic layers may be formed by a vapor deposition process using the mixed powder.

Examples of the combinations of a first component and a second component [first component, second component] in the mixed powder used for the film formation of an organic layer include, but are not limited to, [a host material for an emitting layer, and a dopant material for an emitting layer], [a host material for an fluorescent emitting layer, a dopant material for an fluorescent emitting layer], [a hole-injecting material, a hole-transporting material], [a host material for an fluorescent emitting layer, a host material for an fluorescent emitting layer], and the like.

Note that the method of forming each layer other than the layer to be formed by the vapor deposition of the above-mentioned mixed powder is not particularly limited, and a method of film formation by a vacuum deposition process using a single material, a spin coating process, or the like can be used.

Each layer of the organic EL device will be described below.

(Substrate)

A substrate is used as a support of an emitting device. As the material for the substrate, glass, quartz, plastics or the like can be used, for example. Further, a flexible substrate may be used. The "flexible substrate" means a bendable (flexible) substrate, and specific examples thereof include plastic substrates formed each of polycarbonate, polyvinyl chloride, and the like.

(Anode)

For the anode formed on the substrate, metals, alloys, electrically conductive compounds, mixtures thereof, and the like, which have a large work function (specifically 4.0 eV or larger) are preferably used. Specific examples include indium oxide-tin oxide (ITO: Indium Tin Oxide), indium oxide-tin oxide containing silicon or silicon oxide, indium oxide-zinc oxide, tungsten oxide, indium oxide containing zinc oxide, graphene, and the like. In addition thereto, gold (Au), platinum (Pt), a nitride of a metallic material (for example, titanium nitride), and the like may be given.

(Hole-Injecting Layer)

The hole-injecting layer is a layer containing a substance having a high hole-injecting property. As such a substance having a high hole-injecting property, molybdenum oxide, titanium oxide, vanadium oxide, rhenium oxide, ruthenium oxide, chromium oxide, zirconium oxide, hafnium oxide, tantalum oxide, silver oxide, tungsten oxide, manganese oxide, an aromatic amine compound, or a polymer compound (oligomers, dendrimers, polymers, etc.) can be given.

(Hole-Transporting Layer)

The hole-transporting layer is a layer containing a substance having a high hole-transporting property. For the hole-transporting layer, an aromatic amine compound, a carbazole derivative, an anthracene derivative, or the like can be used. A polymer compound such as poly(N-vinylcarbazole) (abbreviation: PVK) and poly(4-vinyltriphenylamine) (abbreviation: PVTPA) can also be used. However, substances other than the above-described substances may be used as long as they have a hole-transporting property higher than an electron-transporting property. It should be noted that the layer containing the material having a high hole-transporting property may be formed into not only a monolayer, but also a stacked layer in which two or more layers formed each of the above-described materials are stacked.

(Guest (Dopant) Material for Emitting Layer)

The emitting layer is a layer containing a substance having a high emitting property, and can be formed of various substances. For example, as the substance having a high emitting property, a fluorescent compound which emits fluorescence and a phosphorescent compound which emits phosphorescence can be used. The fluorescent compound is a compound which can emit from a singlet excited state, and the phosphorescent compound is a compound which can emit from a triplet excited state.

As a blue fluorescent emitting material which can be used for an emitting layer, pyrene derivatives, styrylamine derivatives, chrysene derivatives, fluoranthene derivatives, fluorene derivatives, diamine derivatives, triarylamine derivatives, and the like may be given. As a green fluorescent emitting material which can be used for an emitting layer, aromatic amine derivatives and the like may be given. As a red fluorescent emitting material which can be used for an emitting layer, tetracene derivatives, diamine derivatives and the like may be given.

As a blue phosphorescent emitting material which can be used for an emitting layer, metal complexes such as iridium complexes, osmium complexes, platinum complexes and the like may be given. As a green phosphorescent emitting material which can be used for an emitting layer, iridium complexes and the like may be given. As a red phosphorescent emitting material which can be used for an emitting layer, metal complexes such as iridium complexes, platinum complexes, terbium complexes, europium complexes and the like may be given.

(Host Material for Emitting Layer)

The emitting layer may have a constitution in which the above-mentioned substance having a high emitting property (guest material) is dispersed in another substance (host material). As a substance for dispersing the substance having a high emitting property, a variety of substances can be used, and it is preferable to use a substance which has a lowest unoccupied orbital level (LUMO level) higher than that of the substance having a high emitting property, and a highest occupied orbital level (HOMO level) lower than the substance having a high emitting property.

As a substance (host material) for dispersing a substance having a high emitting property, 1) metal complexes such as aluminum complexes, beryllium complexes, and zinc complexes, 2) heterocyclic compounds such as oxadiazole derivatives, benzimidazole derivatives, and phenanthroline derivatives, 3) fused aromatic compounds such as carbazole derivatives, anthracene derivatives, phenanthrene derivatives, pyrene derivatives, and chrysene derivatives, and 4) aromatic amine compounds such as triarylamine derivatives and condensed polycyclic aromatic amine derivatives are used.

(Electron-Transporting Layer)

An electron-transporting layer is a layer containing a substance having high electron-transporting property. For the electron-transporting layer, 1) metal complexes such as aluminum complexes, beryllium complexes, zinc complexes, or the like; 2) heteroaromatic complexes such as imidazole derivatives, benzimidazole derivatives, azine derivatives, carbazole derivatives, phenanthroline derivatives, or the like; and 3) polymer compounds can be used.

In one embodiment of the invention, the electron-transporting layer may or may not contain other substances described above in addition to the first organic compound and the second organic compound described above.

(Electron-Injecting Layer)

An electron-injecting layer is a layer containing a substance having a high electron-injecting property. For the electron-injecting layer, lithium (Li), ytterbium (Yb), lithium fluoride (LiF), cesium fluoride (CsF), calcium fluoride ($CaF_2$), metal complex compounds such as 8-hydroxyquinolinolato-lithium (Liq); alkali metal, alkaline earth metals and a compound thereof such as lithium oxide ($LiO_x$) can be used.

(Cathode)

For the cathode, metals, alloys, electrically conductive compounds, mixtures thereof, and the like which have a small work function (specifically, 3.8 eV or smaller) are preferably used. Specific examples of the cathode material include elements belonging to Group 1 or Group 2 of the Periodic Table of the Elements, i.e., alkali metals such as lithium (Li) and cesium (Cs), alkaline earth metals such as magnesium (Mg), calcium (Ca) and strontium (Sr), and alloys containing these metals (e.g., MgAg and AlLi); rare earth metals such as europium (Eu) and ytterbium (Yb), and alloys containing these metals.

The cathode is usually formed by a vacuum vapor deposition process or a sputtering method. Further, in the case of using a silver paste or the like, a coating method, an inkjet method, or the like can be employed.

Moreover, when the electron-injecting layer is provided, the cathode may be formed of a material selected from various electrically conductive materials such as aluminum, silver, ITO, graphene, indium oxide-tin oxide containing silicon or silicon oxide, regardless of large or small of the work function.

The thickness of each layer is not particularly limited, but is generally preferable that the thickness be in the range of several nm to 1 μm, in order to suppress defects such as pinholes, to decrease applied voltage to be low, and to increase luminous efficiency.

[Composition]

The composition according to an aspect of the invention may be expressed as follow: A composition for a vapor deposition process, comprising a first organic compound and a second organic compound, wherein the following formulas (1) and (2) are satisfied:

$$0 < MOL2/(MOL1+MOL2) \leq 0.2 \quad (1)$$

$$-20° C. \leq T1-T2 \leq 40° C. \quad (2)$$

wherein in the formulas (1) and (2),

MOL1 [mol %] is a molar concentration of the first organic compound in the mixed powder, MOL2 [mol %] is a molar concentration of the second organic compound in the mixed powder, T1 [° C.] is a temperature of the first organic compound when $P1/M1^{1/2}=0.04\times\{MOL1/(MOL1+MOL2)\}$ is satisfied, T2 [° C.] is a temperature of the second organic compound when $P2/M2^{1/2}=0.04\times\{MOL2/(MOL1+MOL2)\}$ is satisfied, M1 [kg/mol] is the molecular weight of the first organic compound, P1 [Pa] is a vapor pressure of the first organic compound obtained by simultaneous thermogravimetry and differential thermal analysis at an arbitrary temperature, M2 [kg/mol] is the molecular weight of the second organic compound, P2 [Pa] is a vapor pressure of the second organic compound obtained by simultaneous thermogravimetry and differential thermal analysis at an arbitrary temperature, provided that the first organic compound and the second organic compound are different compounds.

As the above-mentioned composition, a mixed powder described in the mixed powder in an aspect of the invention described above can be used, and is not limited thereto. That is, the above-mentioned composition may not have the form of a mixed powder in some cases.

In one embodiment, the above-mentioned composition is a composition for a vapor deposition. The term "for a vapor deposition" can also be referred to as being usable in a vapor deposition process, that is, the above-mentioned composition can be applied to any technical field including vapor depositing an organic compound to form a film. The vapor deposition process includes a vacuum vapor deposition process. That is, "composition for a vapor deposition" includes "composition for a vacuum vapor deposition"

The above-mentioned composition is the same as the mixed powder according to an aspect of the invention described above except that its form is not specified as a mixed powder. In other words, the form of the above-mentioned composition may be a mixed powder or may not be a mixed powder. The matter described with respect to the mixed powder according to an aspect of the invention can be applied to the above-mentioned composition, and the matter relating to the form when the above-mentioned composition is a mixed powder can be applied to the matter described with the mixed powder according to an aspect of the invention.

[Method of Vapor-Depositing Using Composition]

The method of vapor-depositing according to an aspect of the invention includes a step of heating and vaporizing the composition according to the above-mentioned an aspect of the invention from the same vapor deposition source to form a film on the vapor deposition surface of the opposing base material disposed above. The other conditions of the method of vapor-depositing are not particularly limited, and general vapor deposition equipment and vapor deposition conditions can be employed.

Further, the above-described "method of vapor-depositing using a composition" is the same as the method of vapor deposition according to an aspect of the invention described above, except that the form of the composition used is not specified in the mixed powder. In other words, the form of the composition used in the above "method of vapor deposition using composition" may be a mixed powder or may not be a mixed powder. The matter described with respect to the method of vapor-depositing according to an aspect of the invention can also be applied to the above-described "method of vapor-depositing using composition," and the matter relating to the form when the composition used is a mixed powder can be applied to the matter described in the method of vapor deposition according to an aspect of the invention.

[Applicable Technical Field]

As described above, the composition according to an aspect of the invention can be applied to any technical field including vapor depositing an organic compound to form a film, and can be applied to, for example, fabrication of an organic semiconductor device such as an organic EL device, an organic transistor, an organic solar cell, or the like.

EXAMPLES

Hereinafter, Examples according to the invention will be described. The invention is not limited in any way by these Examples. BH-1 to BH-3 used in Examples and Comparative Examples are host materials (fluorescence) of an emitting layer of an organic EL device, BD-1 to BD-3 are dopant materials (fluorescence) of an emitting layer of an organic EL device, HI-1 is a hole-injecting material used in an organic EL device, and HT-1 is a hole-transporting material used in an organic EL device.

<Compounds>

Compounds used in Examples and Comparative Examples are shown below.

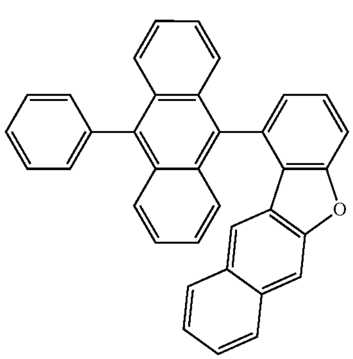

BH-1

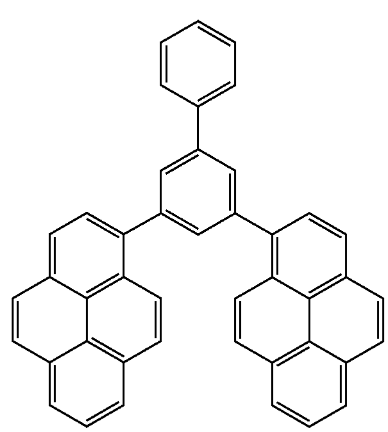

BH-2

-continued
BH-3
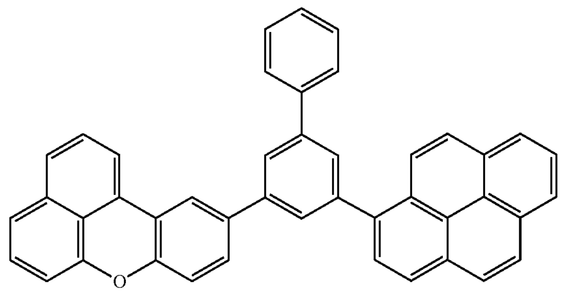
BD-1
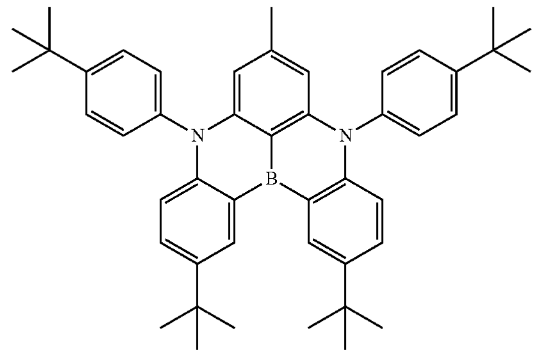
BD-2
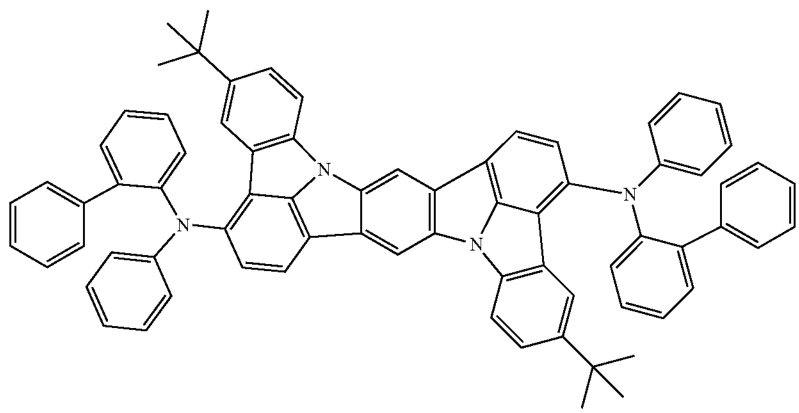
BD-3
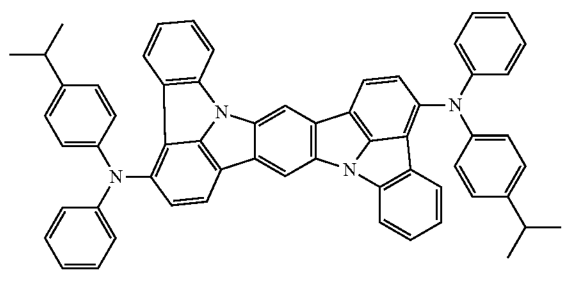
HI-1
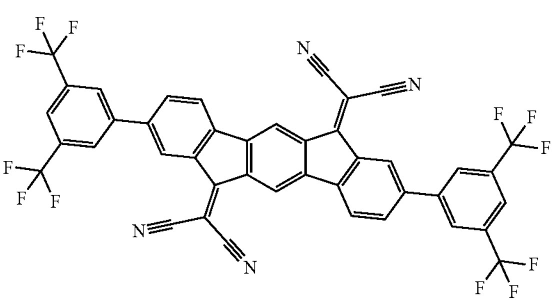
HT-1
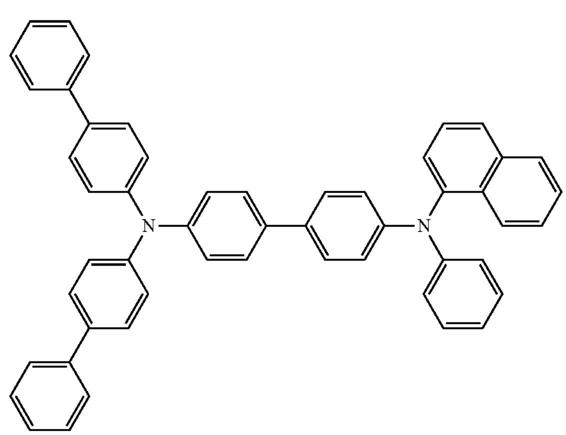

<Method of Production of Mixed Powders>

The mixed powders in Examples and Comparative Examples were produced by weighing each of the compounds of the first component and the second component to a total of 2 g in the solid state while satisfying a desired molar ratio, and milling and mixing them in a mortar.

Example 1-1

<Production of a Mixed Powder and Measurement of T1 and T2>

Figure 3:
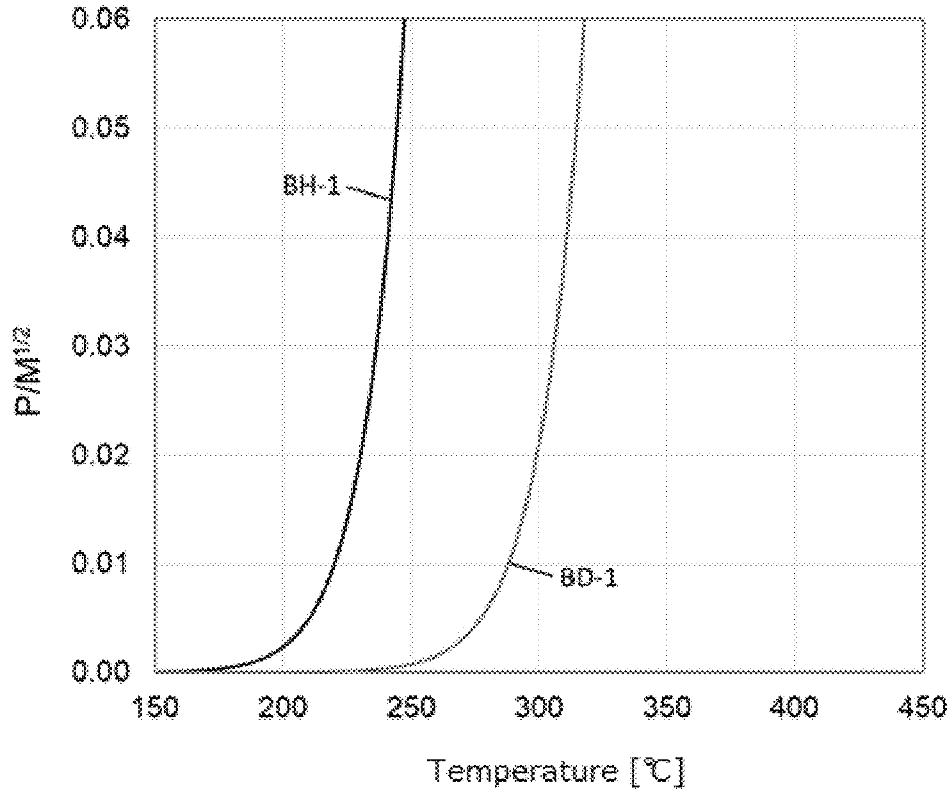
FIG. 3 shows vapor deposition characteristics curves showing the relationship between temperature and $P/M^{1/2}$ for BH-1 and BD-1 used in Examples 1-1 and 1-2.

The compounds shown in Table 1 were mixed in the ratio shown in Table 1 to obtain a mixed powder. Temperature T1 when $P1/M1^{1/2}$ becomes $0.04\times\{MOL1/(MOL1+MOL2)\}$ and temperature T2 when $P2/M2^{1/2}$ becomes $0.04\times\{MOL2/(MOL1+MOL2)\}$ were respectively obtained on the basis of the vapor deposition characteristics curve showing the relationship between temperature and $P1/M1^{1/2}$ of BH-1 and the vapor deposition characteristic curve showing the relationship between temperature and $P2/M2^{1/2}$ of BD-1 obtained by the above methods. T1, T2, and T1−T2 are shown in Table 1. Vapor deposition characteristics curves of both BH-1 and BD-1 showing the relationship between temperature and $P/M^{1/2}$ are shown in FIG. 3. In the above, P1 is a saturated vapor pressure at an arbitrary temperature of BH-1, P2 is a saturated vapor pressure at an arbitrary temperature of BD-1, M1 is a molecular weight of BH-1, M2 is a molecular weight of BD-1, MOL1 is a molar concentration [mol %] of BH-1 in the mixed powder, and MOL2 is a molar concentration [mol %] of BD-1 in the mixed powder.

A simultaneous thermogravimetry and differential thermal analysis equipment (model number "STA2500/HV") manufactured by NETZSCH Japan K.K. was used as a measuring equipment for simultaneous thermogravimetry and differential thermal analysis.

TABLE 1

| | |
|---|---|
| First component | BH-1 |
| Second component | BD-1 |
| MOL1 | 98.51 mol % |
| MOL2 | 1.49 mol % |
| M1 | 470.57 |
| M2 | 658.78 |
| T1 | 241° C. |
| T2 | 247° C. |
| T1-T2 | −6° C. |

<Continuous Vapor Deposition Test>

Using the obtained mixed powder, a continuous vapor deposition test was carried out as follows.

In a vacuum vapor deposition equipment, a crucible containing a total of 0.6 g of the mixed powder was heated under a vacuum of $1\times10^{-4}$ Pa or less and a film was formed on a glass substrate by vapor deposition while adjusting temperature so that the deposition rate becomes 2 Å/sec. The film formation was continued while replacing the glass substrate with new ones appropriately. The substrate on which the first film was formed is referred to as a substrate "No. 1", and the following substrates are referred to as "No. 2", "No. 3", and so on.

Evaluations were conducted for the following items. The results are shown in Table 2.

Component Ratio in Vapor-Deposited Films

The molar mixing ratio of the first component and the second component in each of the vapor-deposited films formed on the substrates was measured as follows. A mass when a specific gravity was assumed to be 1 was calculated from a film area and a film thickness of a vapor-deposited film formed on a glass substrate, and a solution was prepared with a tetrahydrofuran (THF) solvent so that a concentration of a total of a mixture of the first component and the second component becomes 100 ppm. HPLC measurement was performed for the obtained solution using a high-performance liquid chromatography (HPLC) equipment (equipment name: "LC-2040C Plus" manufactured by Shimadzu Corporation) to calculate HPLC area of each of the first component and the second component.

Separately, a standard solution was prepared with THF solvent so that a concentration of the first component becomes 100 ppm and a concentration of the second component becomes 100 ppm, and respective peak areas were calculated by HPLC measurement. The mass concentration in the solution of the first component and the second component in the mixed film was calculated from the peak area value of the standard solution, and the mass mixing ratio contained in the film was calculated therefrom. The molar mixture ratio of each component in the mixed film was calculated by converting the mass mixing ratio with the molecular weight of each component.

In the the second component sections in Table 2, the numerical value shown in parentheses indicates the proportion of the molar ratio of the second component in the vapor-deposited film to the molar ratio of the second component in the mixed powder.

Stability of Vapor Deposition Ratio

Using the molar ratio of the first component in substrate No. 1 as a standard, the molar ratios of the first component in each of substrate No. 2 and subsequent substrates were calculated and evaluated as a stability of the vapor deposition ratio by setting the molar ratio of the first component in substrate No. 1 as 100.0%. The same evaluation was conducted for the second component. That is, using the molar ratio of the second component in substrate No. 1 as a standard, the molar ratios of the second component in each of substrate No. 2 and subsequent substrates were calculated and evaluated as a stability of the vapor deposition ratio by setting the molar ratio of the second component in substrate the No. 1 as 100.0%. The total thickness of the vapor-deposited films on the substrates No. 1 to No. 4 was 604 nm.

TABLE 2

| Substrate No. | Cumulative usage (mass %) | Molar ratio: First component | Molar ratio: Second component | Stability of vapor deposition rate of first component | Stability of vapor deposition rate of second component |
|---|---|---|---|---|---|
| Before vapor deposition (Mixed powder) | 0% | 98.51% | 1.49% | — | — |
| No. 1 | 0-34% | 99.40% | 0.60%(0.40) | 100.0% | 100.0% |
| No. 2 | 34-51% | 99.38% | 0.62%(0.41) | 100.0% | 102.4% |
| No. 3 | 51-67% | 99.35% | 0.65%(0.44) | 99.9% | 108.4% |
| No. 4 | 67-83% | 99.25% | 0.75%(0.51) | 99.8% | 125.1% |

Example 1-2

The same compounds as in Example 1-1 were mixed in the ratio shown in Table 3 to obtain a mixed powder. T1, T2, and T1−T2 in this Example are shown in Table 3.

TABLE 3

| | |
|---|---|
| First component | BH-1 |
| Second component | BD-1 |
| MOL1 | 96.49 mol % |
| MOL2 | 3.51 mol % |
| M1 | 470.57 |
| M2 | 658.78 |
| T1 | 241° C. |
| T2 | 259° C. |
| T1-T2 | −18° C. |

Using the obtained powder, continuous vapor deposition and evaluation were performed in the same manner as in Example 1-1. The results are shown in Table 4. The total thickness of the vapor-deposited films on the substrates No. 1 to No. 4 was 584 nm.

TABLE 4

| Substrate No. | Cumulative usage (mass %) | Molar ratio First component | Molar ratio Second component | Stability of vapor deposition rate of first component | Stability of vapor deposition rate of second component |
|---|---|---|---|---|---|
| Before vapor deposition (Mixed powder) | 0% | 96.49% | 3.51% | — | — |
| No. 1 | 0-34% | 99.18% | 0.82%(0.23) | 100.0% | 100.0% |
| No. 2 | 34-51% | 99.21% | 0.79%(0.22) | 100.0% | 96.5% |
| No. 3 | 51-68% | 99.19% | 0.81%(0.23) | 100.0% | 99.1% |
| No. 4 | 68-86% | 98.92% | 1.08%(0.31) | 99.7% | 131.7% |

Example 2-1

Figure 4:
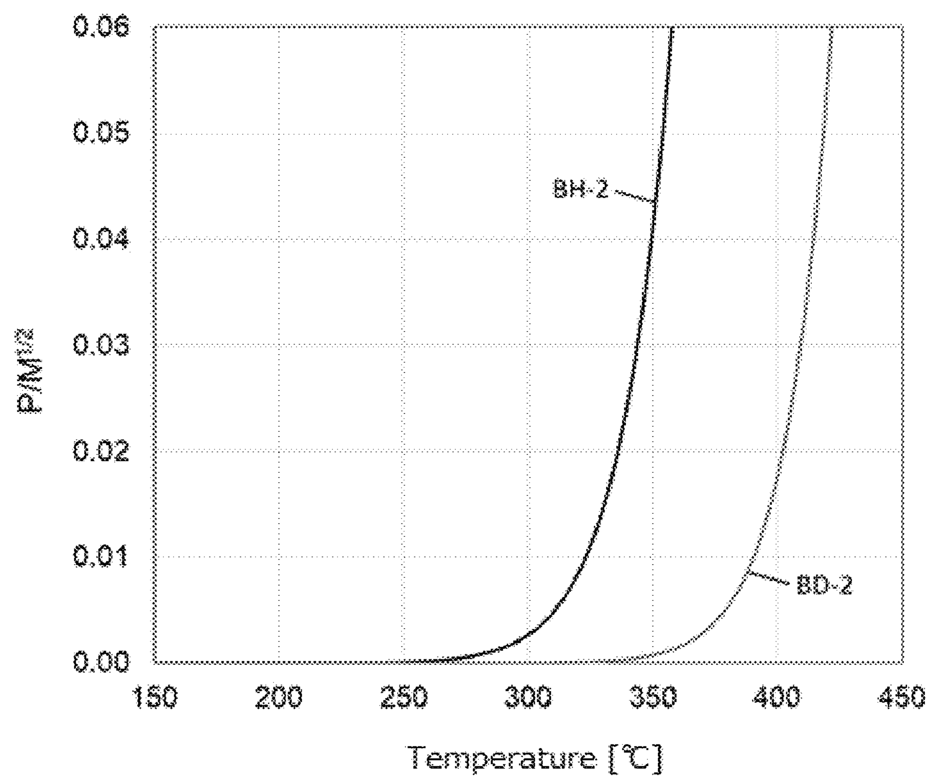
FIG. 4 shows vapor deposition characteristics curves showing the relationship between temperature and $P/M^{1/2}$ for BH-2 and BD-2 used in Examples 2-1 and 2-2.

The compounds shown in Table 5 were mixed in the ratio shown in Table 5 to obtain a mixed powder. T1, T2, and T1−T2 in this Example are shown in Table 5. Vapor deposition characteristics curves of both BH-2 and BD-2 showing the relationship between temperature and $P/M^{1/2}$ are shown in FIG. 4.

TABLE 5

| | |
|---|---|
| First component | BH-2 |
| Second component | BD-2 |
| MOL1 | 99.13 mol % |
| MOL2 | 0.87 mol % |
| M1 | 554.69 |
| M2 | 1003.31 |
| T1 | 349° C. |
| T2 | 339° C. |
| T1-T2 | 10° C. |

Using the obtained powder, continuous vapor deposition and evaluation were performed in the same manner as in Example 1-1. The results are shown in Table 6. The total thickness of the vapor-deposited films on the substrates No. 1 to No. 4 was 503 nm.

TABLE 6

| Substrate No. | Cumulative usage (mass %) | Molar ratio First component | Molar ratio Second component | Stability of vapor deposition rate of first component | Stability of vapor deposition rate of second component |
|---|---|---|---|---|---|
| Before vapor deposition (Mixed powder) | 0% | 99.13% | 0.87% | — | — |
| No. 1 | 0-25% | 99.87% | 0.13%(0.15) | 100.0% | 100.0% |
| No. 2 | 25-37% | 99.84% | 0.16%(0.18) | 100.0% | 126.1% |
| No. 3 | 37-49% | 99.86% | 0.14%(0.16) | 100.0% | 108.7% |
| No .4 | 49-62% | 99.85% | 0.15%(0.17) | 100.0% | 117.4% |

Example 2-2

The same compounds as in Example 2-1 were mixed in the ratio shown in Table 7 to obtain a mixed powder. T1, T2, and T1−T2 in this Example are shown in Table 7.

TABLE 7

| | |
|---|---|
| First component | BH-2 |
| Second component | BD-2 |
| MOL1 | 97.36 mol % |
| MOL2 | 2.64 mol % |
| M1 | 554.69 |
| M2 | 1003.31 |
| T1 | 349° C. |
| T2 | 356° C. |
| T1-T2 | −7° C. |

Using the obtained powder, continuous vapor deposition and evaluation were performed in the same manner as in Example 1-1. The results are shown in Table 8. The total thickness of the vapor-deposited films on the substrates No. 1 to No. 4 was 511 nm.

TABLE 8

| Substrate No. | Cumulative usage (mass %) | Molar ratio First component | Molar ratio Second component | Stability of vapor deposition rate of first component | Stability of vapor deposition rate of second component |
|---|---|---|---|---|---|
| Before vapor deposition (Mixed powder) | 0% | 97.36% | 2.64% | — | — |
| No. 1 | 0-27% | 99.76% | 0.24%(0.09) | 100.0% | 100.0% |
| No. 2 | 27-41% | 99.77% | 0.23%(0.09) | 100.0% | 97.7% |
| No. 3 | 41-55% | 99.77% | 0.23%(0.09) | 100.0% | 97.7% |
| No. 4 | 55-68% | 99.72% | 0.28%(0.11) | 100.0% | 118.6% |

Example 3

Figure 5:
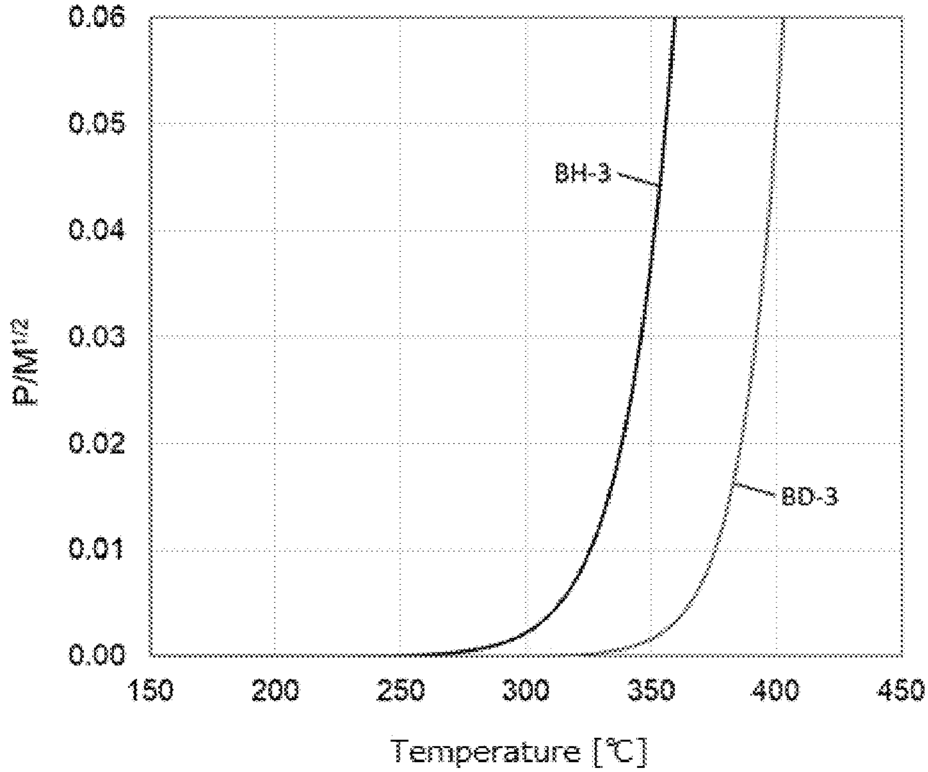
FIG. 5 shows vapor deposition characteristics curves showing the relationship between temperature and $P/M^{1/2}$ for BH-3 and BD-3 used in Example 3.

The compounds shown in Table 9 were mixed in the ratio shown in Table 9 to obtain a mixed powder. T1, T2, and T1−T2 in this Example are shown in Table 9. Vapor deposition characteristics curves of both BH-3 and BD-3 showing the relationship between temperature and $P/M^{1/2}$ are shown in FIG. 5.

TABLE 9

| | |
|---|---|
| First component | BH-3 |
| Second component | BD-3 |
| MOL1 | 98.69 mol % |
| MOL2 | 1.31 mol % |
| M1 | 570.69 |
| M2 | 823.06 |
| T1 | 351° C. |
| T2 | 335° C. |
| T1-T2 | 16° C. |

Using the obtained powder, continuous vapor deposition and evaluation were performed in the same manner as in Example 1-1. The results are shown in Table 10. The total thickness of the vapor-deposited films on the substrates No. 1 to No. 5 was 579 nm.

TABLE 10

| Substrate No. | Cumulative usage (mass %) | Molar ratio First component | Molar ratio Second component | Stability of vapor deposition rate of first component | Stability of vapor deposition rate of second component |
|---|---|---|---|---|---|
| Before vapor deposition (Mixed powder) | 0% | 98.69% | 1.31% | — | — |
| No. 1 | 0-11% | 99.85% | 0.15%(0.12) | 100.0% | 100.0% |
| No. 2 | 11-22% | 99.72% | 0.28%(0.22) | 99.9% | 183.5% |
| No. 3 | 22-33% | 99.69% | 0.31%(0.24) | 99.8% | 202.2% |
| No. 4 | 33-44% | 99.60% | 0.40%(0.31) | 99.8% | 260.0% |
| No. 5 | 44-55% | 99.49% | 0.51%(0.39) | 99.6% | 332.9% |

Comparative Example 1

Figure 6:
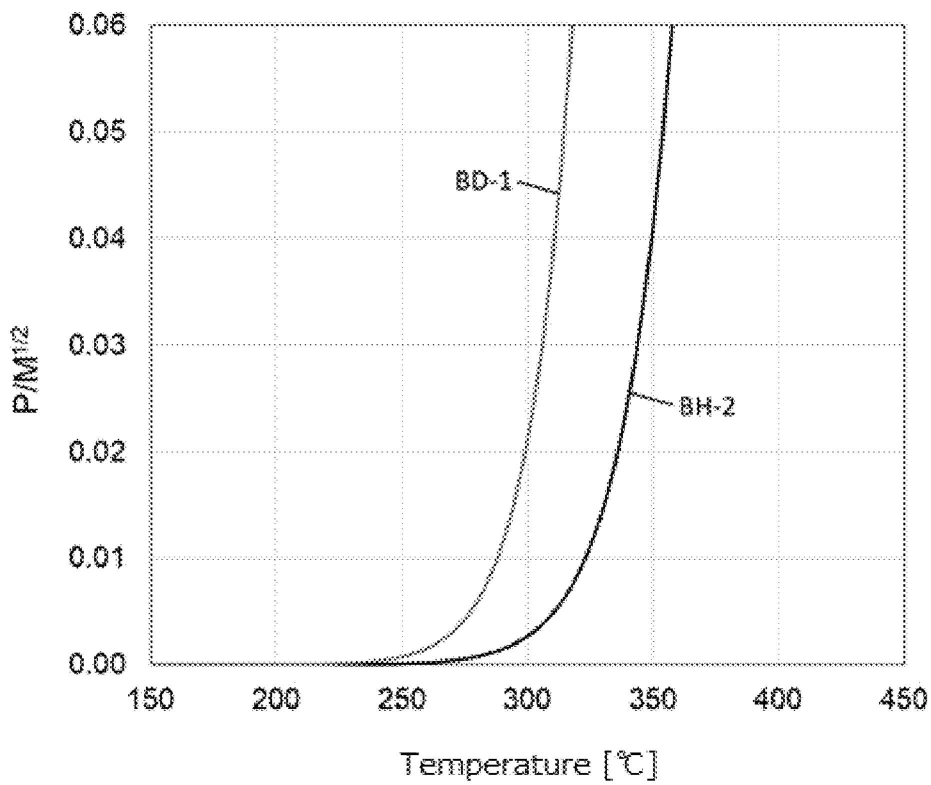
FIG. 6 shows vapor deposition characteristics curves showing the relationship between temperature and $P/M^{1/2}$ for BH-2 and BD-1 used in Comparative Example 1.

The compounds shown in Table 11 were mixed in the ratio shown in Table 11 to obtain a mixed powder. T1, T2, and T1−T2 in this example are shown in Table 11. Vapor deposition characteristics curves of both BH-2 and BD-1 showing the relationship between temperature and $P/M^{1/2}$ are shown in FIG. 6.

TABLE 11

| | |
|---|---|
| First component | BH-2 |
| Second component | 3D-1 |
| MOL1 | 98.31 mol % |
| MOL2 | 1.69 mol % |
| M1 | 554.69 |
| M2 | 658.78 |
| T1 | 349° C. |
| T2 | 246° C. |
| T1-T2 | 103° C. |

Using the obtained powder, continuous vapor deposition and evaluation were performed in the same manner as in Example 1-1. The results are shown in Table 12. The total thickness of the vapor-deposited films on the substrates No. 1 to No. 4 was 490 nm.

TABLE 12

| Substrate No. | Cumulative usage (mass %) | Molar ratio | | Stability of vapor deposition rate of first component | Stability of vapor deposition rate of second component |
|---|---|---|---|---|---|
| | | First component | Second component | | |
| Before vapor deposition (Mixed powder) | 0% | 98.31% | 1.69% | — | — |
| No. 1 | 0-26% | 94.40% | 5.60%(3.31) | 100.0% | 100.0% |
| No. 2 | 26-38% | 99.42% | 0.58%(0.34) | 105.3% | 10.4% |
| No. 3 | 38-50% | 99.96% | 0.04%(0.02) | 105.9% | 0.8% |
| No. 4 | 50-62% | 100.00% | 0.00%(0.00) | 105.9% | 0.0% |

Comparative Example 2

Figure 7:
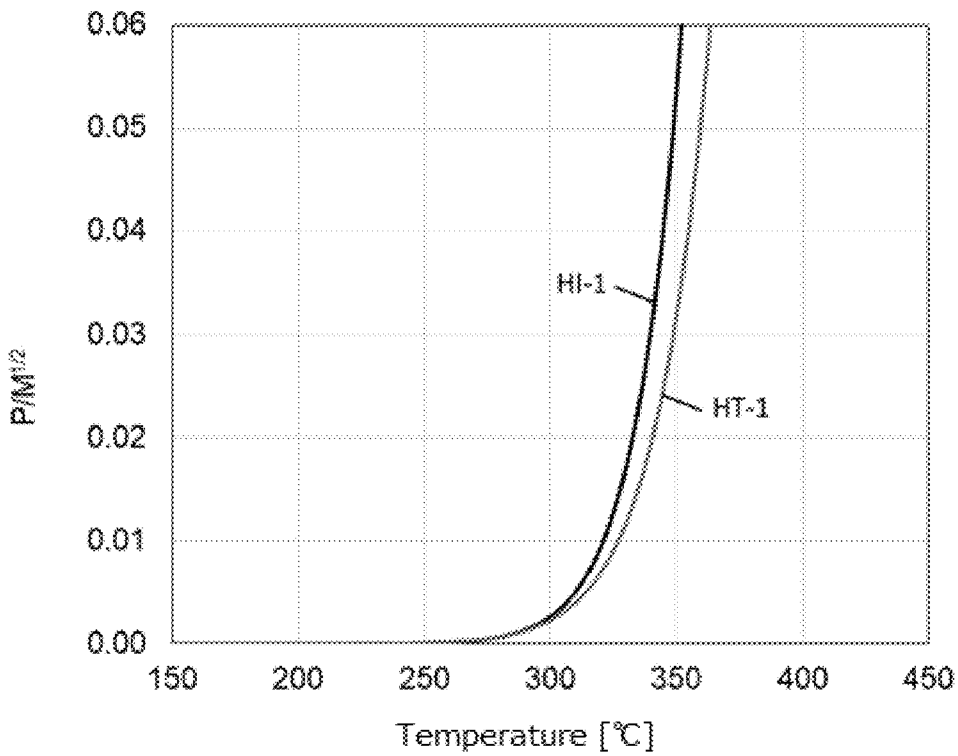
FIG. 7 shows vapor deposition characteristics curves showing the relationship between temperature and $P/M^{1/2}$ for HI-1 and HT-1 used in Comparative Example 2.

The compounds shown in Table 13 were mixed in the ratio shown in Table 13 to obtain a mixed powder. T1, T2, and T1−T2 in this Example are shown in Table 13. Vapor deposition characteristics curves of both HI-1 and HT-1 showing the relationship between temperature and $P/M^{1/2}$ are shown in FIG. 7.

TABLE 13

| | |
|---|---|
| First component | HI-1 |
| Second component | HT-1 |
| MOL1 | 97.23 mol % |
| MOL2 | 2.77 mol % |
| M1 | 802.58 |
| M2 | 690.89 |
| T1 | 344° C. |
| T2 | 287° C. |
| T1-T2 | 57° C. |

Using the obtained powder, continuous vapor deposition and evaluation were performed in the same manner as in Example 1-1. The results are shown in Table 14. The total thickness of the vapor-deposited films on the substrates No. 1 to No. 5 was 467 nm.

TABLE 14

| Substrate No. | Cumulative usage (mass %) | Molar ratio | | Stability of vapor deposition rate of first component | Stability of vapor deposition rate of second component |
|---|---|---|---|---|---|
| | | First component | Second component | | |
| Before vapor deposition (Mixed powder) | 0% | 97.23% | 2.77% | — | — |
| No. 1 | 0-16% | 86.51% | 13.49%(4.88) | 100.0% | 100.0% |
| No. 2 | 16-30% | 90.79% | 9.21%(3.33) | 105.0% | 68.3% |
| No .3 | 30-45% | 96.96% | 3.04%(1.10) | 112.1% | 22.5% |
| No. 4 | 45-61% | 99.96% | 0.04%(0.02) | 115.5% | 0.3% |
| No. 5 | 61-76% | 99.98% | 0.02%(0.01) | 115.6% | 0.1% |

(1) In Examples 1-1, 1-2, 2-1, 2-2, and 3, it can be seen that the component ratios in the vapor-deposited film in each substrate do not vary significantly, and vapor deposition with a stable component ratio over a long time was achieved. On the other hand, in Comparative Examples 1 and 2, it can be seen that most of the second component was vaporized in the initial stage of the continuous vapor deposition process, and the difference in the component ratios in each substrate (i.e., fluctuation in component ratios) are large. When it is considered as the fabrication of an actual organic EL device, the number of vapor-deposited films that can be used for the device are very few, and the yield is extremely low.

(2) By comparing Examples 1-1 and 1-2, it can be seen that the former having T1−T2 of −6° C. has a smaller difference in the component ratio between the mixed powder and the vapor-deposited film, and has higher reproducibility of the component ratio compared with the latter having T1−T2 of −18° C. By comparing Examples 2-1 and 2-2, it can be seen that the former having T1−T2 of 10° C. has higher reproducibility of the component ratio compared with the latter having T1−T2 of −7° C.

(3) When vapor deposition is performed using a mixed powder containing two components having different vaporization characteristics, it is expected that a ratio of a component of which the vapor deposition characteristics curve appears on the higher temperature side among the two components (component which is relatively difficult to vaporize) in a vapor-deposited film would be significantly lower than desired, particularly in an initial stage of a continuous vapor deposition, because of the delayed start of vaporization of the component. However, contrary to the expectation, in Examples 1-1, 1-2, 2-1, 2-2, and 3, it can be seen that the second component (component which is relatively difficult to vaporize) is stably vaporized and deposited at a certain ratio from the initial stage (substrate No. 1). Although BD-2 is a material which is particularly difficult to vaporize, the component ratio thereof in substrate No. 1 is sufficiently high. The reason for this is not necessarily clear, but the appropriate degree of difference in the vapor deposition characteristics of the first component and the second component and so on can be considered as the reason.

[Definition]

In this specification, a hydrogen atom includes its isotopes different in the number of neutrons, namely, a protium, a deuterium and a tritium.

In this specification, at a bondable position in a chemical formula where a symbol such as "R", or "D" representing a deuterium atom is not indicated, a hydrogen atom, that is, a protium atom, a deuterium atom or a tritium atom is bonded.

In this specification, the number of ring carbon atoms represents the number of carbon atoms forming a subject ring itself among the carbon atoms of a compound having a structure in which atoms are bonded in a ring form (for example, a monocyclic compound, a fused ring compound, a cross-linked compound, a carbocyclic compound, or a heterocyclic compound). When the subject ring is substituted by a substituent, the carbon contained in the substituent is not included in the number of ring carbon atoms. The same shall apply to "the number of ring carbon atoms" described below, unless otherwise specified. For example, a benzene ring has 6 ring carbon atoms, a naphthalene ring includes 10 ring carbon atoms, a pyridine ring includes 5 ring carbon atoms, and a furan ring includes 4 ring carbon atoms. Further, for example, a 9,9-diphenylfluorenyl group includes 13 ring carbon atoms, and a 9,9'-spirobifluorenyl group includes 25 ring carbon atoms.

When a benzene ring is substituted by, for example, an alkyl group as a substituent, the number of carbon atoms of the alkyl group is not included in the number of ring carbon atoms of the benzene ring. Therefore, the number of ring carbon atoms of the benzene ring substituted by the alkyl group is 6. When a naphthalene ring is substituted by, for example, an alkyl group as a substituent, the number of carbon atoms of the alkyl group is not included in the number of ring carbon atoms of the naphthalene ring. Therefore, the number of ring carbon atoms of the naphthalene ring substituted by the alkyl group is 10.

In this specification, the number of ring atoms represents the number of atoms forming a subject ring itself among the atoms of a compound having a structure in which atoms are bonded in a ring form (for example, the structure includes a monocyclic ring, a fused ring and a ring assembly) (for example, a monocyclic compound, a fused ring compound, a cross-linked compound, a carbocyclic compound and a heterocyclic compound). The number of ring atoms does not include atoms which do not form the ring (for example, a hydrogen atom which terminates a bond of the atoms forming the ring), or atoms contained in a substituent when the ring is substituted by the substituent. The same shall apply to "the number of ring atoms" described below, unless otherwise specified. For example, the number of atoms of a pyridine ring is 6, the number of atoms of a quinazoline ring is 10, and the number of a furan ring is 5. For example, hydrogen atoms bonded to a pyridine ring and atoms constituting a substituent substituted on the pyridine ring are not included in the number of ring atoms of the pyridine ring. Therefore, the number of ring atoms of a pyridine ring with which a hydrogen atom or a substituent is bonded is 6. For example, hydrogen atoms and atoms constituting a substituent which are bonded with a quinazoline ring is not included in the number of ring atoms of the quinazoline ring. Therefore, the number of ring atoms of a quinazoline ring with which a hydrogen atom or a substituent is bonded is 10.

In this specification, "XX to YY carbon atoms" in the expression "a substituted or unsubstituted ZZ group including XX to YY carbon atoms" represents the number of carbon atoms in the case where the ZZ group is unsubstituted by a substituent, and does not include the number of carbon atoms of a substituent in the case where the ZZ group is substituted by the substituent. Here, "YY" is larger than "XX", and "XX" means an integer of 1 or more and "YY" means an integer of 2 or more.

In this specification, "XX to YY atoms" in the expression "a substituted or unsubstituted ZZ group including XX to YY atoms" represents the number of atoms in the case where the ZZ group is unsubstituted by a substituent, and does not include the number of atoms of a substituent in the case where the ZZ group is substituted by the substituent. Here, "YY" is larger than "XX", and "XX" means an integer of 1 or more and "YY" means an integer of 2 or more.

In this specification, the unsubstituted ZZ group represents the case where the "substituted or unsubstituted ZZ group" is a "ZZ group unsubstituted by a substituent", and the substituted ZZ group represents the case where the "substituted or unsubstituted ZZ group" is a " ZZ group substituted by a substituent."

In this specification, a term "unsubstituted" in the case of "a substituted or unsubstituted ZZ group" means that hydrogen atoms in the ZZ group are not substituted by a substituent. Hydrogen atoms in a term "unsubstituted ZZ group" are a protium atom, a deuterium atom, or a tritium atom.

In this specification, a term "substituted" in the case of "a substituted or unsubstituted ZZ group" means that one or more hydrogen atoms in the ZZ group are substituted by a substituent. Similarly, a term "substituted" in the case of "a BB group substituted by an AA group" means that one or more hydrogen atoms in the BB group are substituted by the AA group.

The "heterocyclic group" described in this specification is a ring group having at least one hetero atom in the ring atom. Specific examples of the hetero atom include a nitrogen atom, an oxygen atom, a sulfur atom, a silicon atom, a phosphorus atom, and a boron atom. The "heterocyclic group" in this specification is a monocyclic group or a fused ring group. The "heterocyclic group" in this specification is an aromatic heterocyclic group or a non-aromatic heterocyclic group.

In this specification, the case where "form a substituted or unsubstituted monocycle by bonding with each other, form a substituted or unsubstituted fused ring by bonding with each other, or do not bond with each other" means the case where "form a substituted or unsubstituted monocycle by bonding with each other"; the case where "form a substituted or unsubstituted fused ring by bonding with each other"; and the case where "do not bond with each other."

The "monocycle" or "fused ring" formed may be a saturated ring or an unsaturated ring, as a structure of the formed ring alone. Even when the "one pair of adjacent two" forms a "monocycle" or a "fused ring," the "monocycle" or the "fused ring" may form a saturated ring or an unsaturated ring.

The "unsaturated ring" includes, in addition to an aromatic hydrocarbon ring and an aromatic heterocycle, an aliphatic hydrocarbon ring with an unsaturated bond, i.e., double and/or triple bonds in the ring structure (e.g., cyclohexene, cyclohexadiene, etc.), and a non-aromatic heterocycle with an unsaturated bond (e.g., dihydropyran, imidazoline, pyrazoline, quinolizine, indoline, isoindoline, etc.). The "saturated ring" includes an aliphatic hydrocarbon ring without an unsaturated bond and a non-aromatic heterocycle without an unsaturated bond.

The term "to form a ring" means forming a ring only with plural atoms of the mother skeleton, or with plural atoms of the mother skeleton and one or more arbitrary atoms in addition.

The "arbitrary atom" is at least one atom selected from the group consisting of a carbon atom, a nitrogen atom, an oxygen atom, and a sulfur atom, unless otherwise specified in this specification. In the arbitrary atom (for example, a carbon atom or a nitrogen atom), a bond which does not form a ring may be terminated with a hydrogen atom or the like, or may be substituted with "arbitrary substituent" described below. When an arbitrary atom other than a carbon atom is contained, the ring formed is a heterocycle. The number of "one or more arbitrary atom(s)" constituting a monocycle or a fused ring is preferably 2 or more and 15 or less.

The substituent in the case where the above-mentioned "monocycle" or "fused ring" has a substituent is, for example, an "arbitrary substituent" described below. Specific examples of the substituent which the above-mentioned "monocycle" or "fused ring" has include the substituent described above in the "Substituent described in this specification" section.

The substituent in the case where the above-mentioned "saturated ring" or "unsaturated ring" has a substituent is, for example, an "arbitrary substituent" described below. Specific examples of the substituent which the above-mentioned "monocycle" or "fused ring" has include the substituent described above in the "Substituent described in this specification" section.

In one embodiment in this specification, the substituent (in this specification, sometimes referred to as an "arbitrary substituent") in the case of "substituted or unsubstituted" is, for example, a group selected from the group consisting of:

an unsubstituted alkyl group including 1 to 50 carbon atoms, an unsubstituted alkenyl group including 2 to 50 carbon atoms, an unsubstituted alkynyl group including 2 to 50 carbon atoms, an unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$)($R_{907}$), a halogen atom, a cyano group, a nitro group, an unsubstituted aryl group including 6 to 50 ring carbon atoms, and an unsubstituted heterocyclic group including 5 to 50 ring atoms, wherein, $R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted heterocyclic group including 5 to 50 ring atoms.

When two or more $R_{901}$'s are present, the two or more $R_{901}$'s may be the same as or different from each other.

When two or more $R_{902}$'s are present, the two or more $R_{902}$'s may be the same as or different from each other.

When two or more $R_{903}$'s are present, the two or more $R_{903}$'s may be the same as or different from each other.

When two or more $R_{904}$'s are present, the two or more $R_{904}$'s may be the same as or different from each other.

When two or more $R_{905}$'s are present, the two or more $R_{905}$'s may be the same as or different from each other.

When two or more $R_{906}$'s are present, the two or more $R_{906}$'s may be the same as or different from each other.

When two or more $R_{907}$'s are present, the two or more $R_{907}$'s may be the same as or different from each other.

Specific examples of each of the arbitrary substituents include specific examples of substituent described in the section "Substituent described in this specification" above.

Unless otherwise specified in this specification, adjacent arbitrary substituents may form a "saturated ring" or an "unsaturated ring."

Unless otherwise specified in this specification, the arbitrary substituent may further have a substituent. The substituent which the arbitrary substituent further has is the same as that of the above-mentioned arbitrary substituent.

In this specification, the numerical range represented by "AA to BB" means the range including the numerical value AA described on the front side of "AA to BB" as the lower limit and the numerical value BB described on the rear side of "AA to BB" as the upper limit.

In this specification, "normal temperature and pressure" refers to an environment of 1 bar and 0° C.

In this specification, the numerical range represented by "AA≥BB" means that the numerical value AA is equal to or greater than the numerical value BB, and "AA≤BB" that the numerical value AA is equal to or less than the numerical value BB.

Several embodiments and/or examples of the present invention have been described in detail above. However, without substantially departing from novel teachings and effects of the present invention, the person skilled in the art can readily make a number of modifications to the embodiments and/or examples which are exemplifications of these teachings and effects. Thus, these modifications are included in the scope of the present invention.

The documents described in this specification and the contents of the application that serves as the basis of priority claim under Paris convention are incorporated herein by reference in its entirety.

The invention claimed is:

1. A mixed powder for an organic electroluminescence device, comprising a first organic compound and a second organic compound, wherein the mixed powder is solid at normal temperature and pressure, and the following formulas (1) and (2) are satisfied:

$$0<MOL2/(MOL1+MOL2)\leq 0.2 \quad (1)$$

$$-20°\ C.\leq T1-T2<40°\ C. \quad (2)$$

wherein in the formulas (1) and (2),

MOL1 [mol %] is a molar concentration of the first organic compound in the mixed powder, MOL2 [mol %] is a molar concentration of the second organic compound in the mixed powder, T1 [° C.] is a temperature of the first organic compound when $P1/M1^{1/2}=0.04\times\{MOL1/(MOL1+MOL2)\}$ is satisfied, T2 [° C.] is a temperature of the second organic compound when $P2/M2^{1/2}=0.04\times\{MOL2/(MOL1+MOL2)\}$ is satisfied, M1 [kg/mol] is the molecular weight of the first organic compound, P1 [Pa] is a vapor pressure of the first organic compound obtained by simultaneous thermogravimetry and differential thermal analysis at an arbitrary temperature, M2 [kg/mol] is the molecular weight of the second organic compound, P2 [Pa] is a vapor pressure of the second organic compound obtained by simultaneous thermogravimetry and differential thermal analysis at an arbitrary temperature, provided that the first organic compound and the second organic compound are different compounds.

2. The mixed powder according to claim 1, wherein 99.9 mol % or more of the mixed powder is the first organic compound and the second organic compound.

3. The mixed powder according to claim 1, wherein the mixed powder consists essentially of the first organic compound and the second organic compound.

4. The mixed powder according to claim 1, wherein the mixed powder consists of the first organic compound and the second organic compound.

5. The mixed powder according to claim 1, wherein the following formula (1-1) is satisfied:

$$0<MOL2/(MOL1+MOL2)\leq 0.15 \quad (1\text{-}1).$$

6. The mixed powder according to claim 1, wherein the following formula (1-2) is satisfied:

$$0<MOL2/(MOL1+MOL2)\leq 0.10 \quad (1\text{-}2).$$

7. The mixed powder according to claim 1, wherein the following formula (1-3) is satisfied:

$$0<MOL2/(MOL1+MOL2)\leq 0.05 \quad (1\text{-}3).$$

8. The mixed powder according to claim 1, wherein the mixed powder is in a solid state.

9. The mixed powder according to claim 1, wherein the mixed powder is in a pellet state.

10. A mixed body obtained by heating, melting, and solidifying the mixed powder according to claim 1.

11. A method of fabricating an organic electroluminescence device comprising a cathode, an anode, and one or two or more organic layers disposed between the cathode and the anode, the organic layers comprising an emitting layer; comprising:

heating and vaporizing a mixed powder from a vapor deposition source to deposit at least one layer of the one or two or more organic layers, wherein the mixed powder is the mixed powder according to claim 1.

12. A method of selecting a first organic compound and a second organic compound comprised in a mixed powder which is solid at normal temperature and pressure, and is for an organic electroluminescence device, comprising:

selecting the first organic compound and the second organic compound so as to satisfy the following formulas (1) and (2):

$$0<MOL2/(MOL1+MOL2)\leq 0.2 \quad (1)$$

$$-20°\ C.\leq T1-T2\leq 40°\ C. \quad (2)$$

wherein in the formulas (1) and (2),

MOL1 [mol %] is a molar concentration of the first organic compound in the mixed powder, MOL2 [mol %] is a molar concentration of the second organic compound in the mixed powder, T1 [° C.] is a temperature of the first organic compound when $P1/M1^{1/2}=0.04\times\{MOL1/(MOL1+MOL2)\}$ is satisfied, T2 [° C.] is a temperature of the second organic compound when $P2/M2^{1/2}=0.04\times\{MOL2/(MOL1+MOL2)\}$ is satisfied, M1 [kg/mol] is the molecular weight of the first organic compound, P1 [Pa] is a vapor pressure of the first organic compound obtained by simultaneous thermogravimetry and differential thermal analysis at an arbitrary temperature, M2 [kg/mol] is the molecular weight of the second organic compound, P2 [Pa] is a vapor pressure of the second organic compound obtained by simultaneous thermogravimetry and differential thermal analysis at an arbitrary temperature.

13. A method for producing a mixed powder for an organic electroluminescence device, the mixed powder comprising a first organic compound and a second organic compound, and the mixed powder being solid at normal temperature and pressure, comprising;

mixing the first organic compound and the second organic compound so as to satisfy the following formulas (1) and (2):

$$0<MOL2/(MOL1+MOL2)\leq 0.2 \quad (1)$$

$$-20°\ C.\leq T1-T2\leq 40°\ C. \quad (2)$$

wherein in the formulas (1) and (2),

MOL1 [mol %] is a molar concentration of the first organic compound in the mixed powder, MOL2 [mol %] is a molar concentration of the second organic compound in the mixed powder, T1 [° C.] is a temperature of the first organic compound when $P1/M1^{1/2}=0.04\times\{MOL1/(MOL1+MOL2)\}$ is satisfied, T2 [° C.] is a temperature of the second organic compound when $P2/M2^{1/2}=0.04\times\{MOL2/(MOL1+MOL2)\}$ is satisfied, M1 [kg/mol] is the molecular weight of the first organic compound, P1 [Pa] is a vapor pressure of the first organic compound obtained by simultaneous thermogravimetry and differential thermal analysis at an arbitrary temperature, M2 [kg/mol] is the molecular weight of the second organic compound, P2 [Pa] is a vapor pressure of the second organic compound obtained by simultaneous thermogravimetry and differential thermal analysis at an arbitrary temperature, provided that the first organic compound and the second organic compound are different compounds.

14. A composition for a vapor deposition process, comprising a first organic compound and a second organic compound, wherein the following formulas (1) and (2) are satisfied:

$$0<MOL2/(MOL1+MOL2)\leq 0.2 \quad (1)$$

$$-20°\ C.\leq T1-T2\leq 40°\ C. \quad (2)$$

wherein in the formulas (1) and (2),

MOL1 [mol %] is a molar concentration of the first organic compound in the mixed powder, MOL2 [mol %] is a molar concentration of the second organic compound in the mixed powder, T1 [° C.] is a temperature of the first organic compound when $P1/M1^{1/2}=0.04\times\{MOL1/(MOL1+MOL2)\}$ is satisfied, T2 [° C.] is a temperature of the second organic compound when $P2/M2^{1/2}=0.04\times\{MOL2/(MOL1+MOL2)\}$ is satisfied, M1 [kg/mol] is the molecular weight of the first organic compound, P1 [Pa] is a vapor pressure of the first organic compound obtained by simultaneous thermogravimetry and differential thermal analysis at an arbitrary temperature, M2 [kg/mol] is the molecular weight of the second organic compound, P2 [Pa] is a vapor pressure of the second organic compound obtained by simultaneous thermogravimetry and differential thermal analysis at an arbitrary temperature, provided that the first organic compound and the second organic compound are different compounds.

* * * * *